US011670664B2

(12) United States Patent
Maruyama et al.

(10) Patent No.: US 11,670,664 B2
(45) Date of Patent: Jun. 6, 2023

(54) LIGHT-RECEIVING ELEMENT AND DISTANCE MEASUREMENT MODULE USING INDIRECT TIME OF FLIGHT

(71) Applicant: SONY SEMICONDUCTOR SOLUTIONS CORPORATION, Kanagawa (JP)

(72) Inventors: Takuya Maruyama, Kanagawa (JP); Yuji Isogai, Kanagawa (JP); Tsutomu Imoto, Kanagawa (JP); Takuro Murase, Kanagawa (JP); Ryota Watanabe, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/631,940

(22) PCT Filed: Jul. 4, 2019

(86) PCT No.: PCT/JP2019/026574
§ 371 (c)(1),
(2) Date: Jan. 17, 2020

(87) PCT Pub. No.: WO2020/017339
PCT Pub. Date: Jan. 23, 2020

(65) Prior Publication Data
US 2021/0225907 A1    Jul. 22, 2021

(30) Foreign Application Priority Data
Jul. 18, 2018  (JP) .............................. JP2018-135351

(51) Int. Cl.
*H01L 27/146* (2006.01)

(52) U.S. Cl.
CPC .... *H01L 27/1464* (2013.01); *H01L 27/14623* (2013.01); *H01L 27/14629* (2013.01)

(58) Field of Classification Search
CPC ......... H01L 27/14627; H01L 27/14629; H01L 27/14603–14607; H01L 27/14609–14616; H01L 27/1463
See application file for complete search history.

(56) References Cited

U.S. PATENT DOCUMENTS 5,856,667 A * 1/1999 Spirig ................... G01S 17/894
                                                348/E3.018
8,665,422 B2 * 3/2014 Mase ................ H01L 27/14612
                                                356/3.01
(Continued)

FOREIGN PATENT DOCUMENTS

EP     3193190     7/2017
EP     3193369     7/2017
(Continued)

OTHER PUBLICATIONS

Partial European Search Report for European Patent Application No. 19832538.3, dated May 20, 2020, 14 pages.
(Continued)

*Primary Examiner* — Scott B Geyer
(74) *Attorney, Agent, or Firm* — Sheridan Ross P.C.

(57) ABSTRACT

The present technology relates to a light-receiving element and a distance measurement module. A light-receiving element includes: a first voltage application unit to which a voltage is applied; a first charge detection unit that is disposed at a periphery of the first voltage application unit; a second voltage application unit to which a voltage is applied; a second charge detection unit that is disposed at a periphery of the second voltage application unit; a third voltage application unit to which a first voltage is applied; and a voltage control unit that applies a second voltage to
(Continued)

one of the first voltage application unit and the second a voltage application unit and causes the other to be in a floating state, the second voltage being different from the first voltage. The present technology is applicable to a light-receiving element.

11 Claims, 92 Drawing Sheets

(56) References Cited

U.S. PATENT DOCUMENTS

| | | | |
|---|---|---|---|
| 9,117,712 B1* | 8/2015 | Oggier | H01L 27/14609 |
| 10,840,284 B2* | 11/2020 | Ennoji | H01L 27/1463 |
| 11,378,659 B2* | 7/2022 | Isogai | H01L 27/1461 |
| 2010/0201834 A1* | 8/2010 | Maruyama | H01L 27/14612 |
| | | | 257/E31.127 |
| 2011/0199602 A1* | 8/2011 | Kim | G01C 3/08 |
| | | | 257/225 |
| 2012/0012965 A1 | 1/2012 | Maeda | |
| 2012/0086093 A1* | 4/2012 | Otsuka | H01L 27/14627 |
| | | | 257/E31.127 |
| 2015/0028405 A1 | 1/2015 | Minami et al. | |
| 2016/0163897 A1* | 6/2016 | Sakai | H01L 27/14689 |
| | | | 257/446 |
| 2016/0269668 A1 | 9/2016 | Oshiyama et al. | |
| 2017/0194367 A1* | 7/2017 | Fotopoulou | G01S 7/4863 |
| 2018/0106892 A1 | 4/2018 | Parascandola et al. | |
| 2018/0190698 A1* | 7/2018 | Na | H01L 27/14612 |
| 2018/0308881 A1* | 10/2018 | Hynecek | G01S 7/4813 |
| 2019/0025414 A1 | 1/2019 | Van Der Tempel et al. | |
| 2019/0082128 A1* | 3/2019 | Oh | H01L 27/14643 |
| 2019/0252449 A1* | 8/2019 | Ebiko | H01L 27/1464 |
| 2019/0342510 A1* | 11/2019 | Sano | H01L 27/1461 |
| 2020/0003874 A1* | 1/2020 | Moriyama | G01S 7/4863 |
| 2020/0264308 A1* | 8/2020 | Brady | G01S 7/4863 |
| 2021/0293956 A1* | 9/2021 | Ogita | H01L 27/14627 |

FOREIGN PATENT DOCUMENTS

| | | | | |
|---|---|---|---|---|
| EP | | 2330637 B1 | 7/2019 | |
| JP | | 2011-086904 | 4/2011 | |
| JP | | 2012-023207 | 2/2012 | |
| JP | | 2017-522727 | 8/2017 | |
| JP | | 2018-088488 | 6/2018 | |
| WO | WO 2015/079944 | | 6/2015 | |
| WO | WO 2017/121820 | | 7/2017 | |
| WO | WO-2018135320 A1 * | | 7/2018 | G01C 3/06 |

OTHER PUBLICATIONS

International Search Report and Written Opinion prepared by the Japanese Patent Office dated Sep. 9, 2019, for International Application No. PCT/JP2019/026574.

* cited by examiner

LIGHT-RECEIVING ELEMENT AND DISTANCE MEASUREMENT MODULE USING INDIRECT TIME OF FLIGHT

CROSS REFERENCE TO RELATED APPLICATIONS

This application is a national stage application under 35 U.S.C. 371 and claims the benefit of PCT Application No. PCT/JP2019/026574 having an international filing date of 4 Jul. 2019, which designated the United States, which PCT application claimed the benefit of Japanese Patent Application No. 2018-135351 filed 18 Jul. 2018, the entire disclosures of each of which are incorporated herein by reference.

TECHNICAL FIELD

The present technology relates to a light-receiving element and a distance measurement module, and particularly to, a light-receiving element and a distance measurement module which are capable of improving characteristics.

BACKGROUND ART

In the related art, a distance measurement system using an indirect time of flight (ToF) method is known. In such a distance measurement system, there is necessity for a sensor capable of distributing signal charges, which are obtained by receiving reflected light of active light emitted by using a light emitting diode (LED) or a laser at an arbitrary phase to a target object, to another region at a high speed.

In this regard, for example, a technology in which a voltage is directly applied to a substrate of a sensor to generate currents in the substrate, and which can modulate a wide region inside the substrate at a high speed is suggested (see, for example, Patent Literature 1). This sensor is also referred to as a current assisted photonic demodulator (CAPD) sensor.

CITATION LIST

Patent Literature

Patent Literature 1: Japanese Patent Application Laid-open No. 2011-86904

DISCLOSURE OF INVENTION

Technical Problem

However, in the above-mentioned technology, it is difficult to obtain a CAPD sensor with sufficient characteristics.

For example, the above-mentioned CAPD sensor is a front-illuminated type sensor in which an interconnection or the like is disposed on a surface of the substrate on a side in which light is received from the outside.

It is desirable that an object such as an interconnection that blocks an optical path of incident light does not exist on a light-receiving surface side of a photodiode (PD), that is, a photoelectric conversion unit from the viewpoint of securement of a photoelectric conversion region. However, in the front-illuminated type CAPD sensor, it is necessary to dispose a charge extraction interconnection, various control lines, and signal lines on the light-receiving surface side of the PD in accordance with a structure, and thus the photoelectric conversion region is limited. That is, it is difficult to secure a sufficient photoelectric conversion region, and characteristics such as pixel sensitivity may deteriorate.

In addition, when considering that the CAPD sensor is used in a location in which external light exists, external light components become noise components in an indirect ToF method that performs distance measurement by using active light, and thus it is necessary to secure a sufficient saturation signal amount (Qs) to obtain distance information by securing a sufficient signal to noise ratio (SN ratio). However, in the front-illuminated type CAPD sensor, an interconnection layout is limited, and thus it is necessary to examine use of a method other than wiring capacitance, for example, a method in which an additional transistor is provided to secure capacitance.

In addition, in the front-illuminated type CAPD sensor, a signal extraction unit that is called a tap is disposed on a light incident side inside the substrate. Meanwhile, when considering photoelectric conversion in a Si substrate, a difference of an attenuation rate exists between wavelengths of light, but a ratio of occurrence of photoelectric conversion is higher on the light incident surface side. Accordingly, in the front-illuminated type CAPD sensor, there is a possibility that a probability of occurrence of photoelectric conversion in an inactive tap region that is a signal charge non-distribution tap region in a signal-extraction-unit-provided tap region becomes higher. In the indirect ToF sensor, light measurement information is obtained by using signals which are distributed to respective charge accumulation regions in correspondence with a phase of active light, a component that is directly photoelectrically converted in the inactive tap region becomes noise, and as a result, there is a possibility that distance measurement accuracy deteriorates. That is, there is a possibility that characteristics of the CAPD sensor may deteriorate.

The present technology has been made in view of the above-mentioned circumstances and it is an object thereof to make it possible to improve characteristics.

Solution to Problem

A light-receiving element according to a first aspect of the present technology includes:

a first voltage application unit to which a voltage is applied;

a first charge detection unit that is disposed at a periphery of the first voltage application unit;

a second voltage application unit to which a voltage is applied;

a second charge detection unit that is disposed at a periphery of the second voltage application unit;

a third voltage application unit to which a first voltage is applied; and a voltage control unit that applies a second voltage to one of the first voltage application unit and the second a voltage application unit and causes the other to be in a floating state, the second voltage being different from the first voltage.

In the first aspect of the present technology, a first voltage application unit to which a voltage is applied;

a first charge detection unit that is disposed at a periphery of the first voltage application unit;

a second voltage application unit to which a voltage is applied;

a second charge detection unit that is disposed at a periphery of the second voltage application unit; and a third voltage application unit to which a first voltage is applied are provided to a light-receiving element, and a second voltage is applied to one of the first voltage application unit and the second a voltage application unit and the other is caused to be in a floating state, the second voltage being different from the first voltage.

A distance measurement module according to a second aspect of the present technology includes:
a light-receiving element including
a first voltage application unit to which a voltage is applied,
a first charge detection unit that is disposed at a periphery of the first voltage application unit,
a second voltage application unit to which a voltage is applied,
a second charge detection unit that is disposed at a periphery of the second voltage application unit,
a third voltage application unit to which a first voltage is applied, and
a voltage control unit that applies a second voltage to one of the first voltage application unit and the second a voltage application unit and causes the other to be in a floating state, the second voltage being different from the first voltage;
a light source that emits irradiation light of which brightness periodically fluctuates; and
a light-emission control unit that controls an irradiation timing of the irradiation light.

In the second aspect of the present technology,
a light-receiving element including
a first voltage application unit to which a voltage is applied,
a first charge detection unit that is disposed at a periphery of the first voltage application unit,
a second voltage application unit to which a voltage is applied,
a second charge detection unit that is disposed at a periphery of the second voltage application unit, and
a third voltage application unit to which a first voltage is applied; and
a light source that emits irradiation light of which brightness periodically fluctuates
are provided to a distance measurement module, an irradiation timing of the irradiation light is controlled, and
a second voltage is applied to one of the first voltage application unit and the second a voltage application unit and the other is caused to be in a floating state, the second voltage being different from the first voltage.

Advantageous Effects of Invention

In accordance with the first and second aspects of the present technology, it is possible to improve characteristics.

It should be noted that the effect described here is not limited, and may be any one effect described in the present disclosure.

BRIEF DESCRIPTION OF DRAWINGS

FIG. 77 is a cross-sectional view of the multiple pixels.

MODE(S) FOR CARRYING OUT THE INVENTION

Hereinafter, an embodiment to which the present technology is applied will be described with reference to the drawings.

First Embodiment

Configuration Example of Light-Receiving Element

The present technology constructs a CAPD sensor in a back-illuminated type to improve characteristics such as pixel sensitivity.

For example, the present technology is applicable to a light-receiving element that constitutes a distance measurement system that performs distance measurement by an indirect ToF method, an imaging device that includes such a light-receiving element, or the like.

For example, the distance measurement system is applicable to an in-vehicle system that is mounted on a vehicle and measures a distance up to a target object, a gesture recognition system that measures a distance up to a target object such as hands of a user and recognizes a user's gesture on the basis of the measurement result, or the like. In this case, a gesture recognition result can be used, for example, in an operation of a car navigation system.

Figure 1:
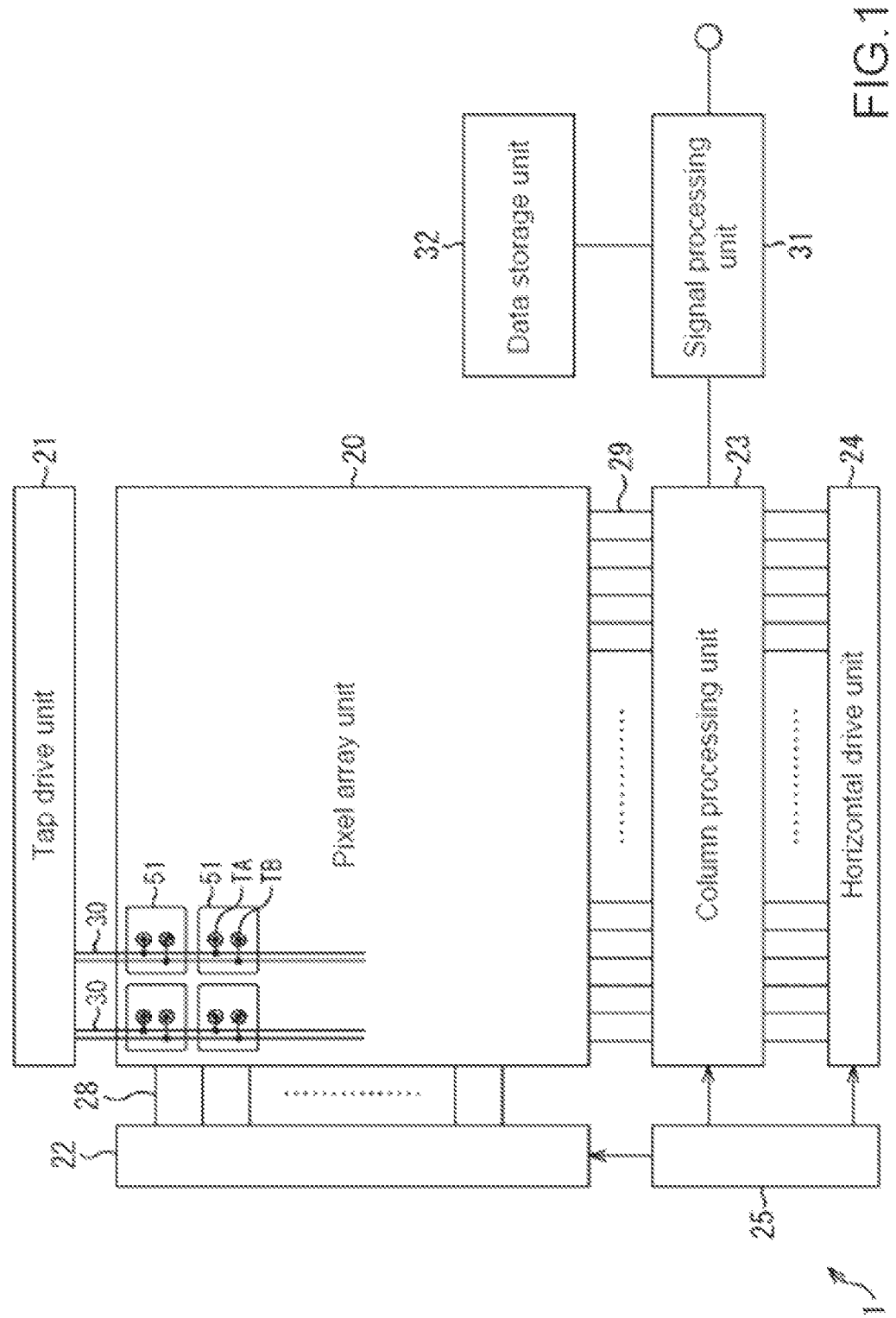
FIG. 1 is a block diagram illustrating a configuration example of a light-receiving element.

FIG. 1 is a block diagram illustrating a configuration example of an embodiment of the light-receiving element to which the present technology is applied.

A light-receiving element 1 illustrated in FIG. 1 is a back-illuminated type CAPD sensor, and is provided, for example, in an imaging device having a distance measurement function.

The light-receiving element 1 includes a pixel array unit 20 that is formed on a semiconductor substrate (not illustrated), and a peripheral circuit unit that is integrated on the same semiconductor substrate as in the pixel array unit 20.

For example, the peripheral circuit unit includes a tap drive unit 21, a vertical drive unit 22, a column processing unit 23, a horizontal drive unit 24, and a system control unit 25.

A signal processing unit 31 and a data storage unit 32 are also provided in the light-receiving element 1. Note that the signal processing unit 31 and the data storage unit 32 may be mounted on the same substrate as in the light-receiving element 1, or may be disposed on a substrate different from the substrate as in the light-receiving element 1 in an imaging device.

The pixel array unit 20 generates charges corresponding to the amount of light received, and has a configuration in which pixels 51 which output signals corresponding to the charges are two-dimensionally arranged in a matrix shape in a row direction and a column direction. That is, the pixel array unit 20 includes multiple pixels 51 which photoelectrically convert incident light and output signals corresponding to charges obtained as a result of the photoelectric conversion. Here, the row direction represents an arrangement direction of the pixels 51 in a horizontal direction, and the column direction represents an arrangement direction of the pixels 51 in a vertical direction. The row direction is the horizontal direction in the drawing and the column direction is the vertical direction in the drawing.

Each of the pixels 51 receives and photoelectrically converts incident light from the outside, particularly, infrared light and, and outputs pixel signals corresponding to charges obtained as a result of the photoelectric conversion. The pixel 51 includes a first tap TA that applies a predetermined voltage MIX0 (a first voltage) and detects photoelectrically converted charges, and a second tap TB that applies a predetermined voltage MIX1 (a second voltage) and detects photoelectrically converted charges.

The tap drive unit 21 supplies the predetermined voltage MIX0 to the first tap TA of the pixel 51 of the pixel array unit 20 through a predetermined voltage supply line 30, and supplies the predetermined voltage MIX1 to the second tap TB through a predetermined voltage supply line 30. Accordingly, two voltage supply lines 30 including the voltage supply line 30 that transfers the voltage MIX0 and the voltage supply line 30 that transfers the voltage MIX1 are wired in one pixel column of the pixel array unit 20.

In the pixel array unit 20, with respect to a matrix-shaped pixel arrangement, a pixel drive line 28 is wired in a row direction for every pixel row, and two vertical signal lines 29 are wired along a column direction for every pixel column. For example, the pixel drive line 28 transfers a drive signal for performing driving when reading out a signal from a pixel. Note that in FIG. 1, the pixel drive line 28 is illustrated as one interconnection, but there is no limitation to the one piece. One end of the pixel drive line 28 is connected to an output end corresponding to each row of the vertical drive unit 22.

The vertical drive unit 22 is constituted by a shift register, an address decoder, or the like, and drives pixels of the pixel array unit 20 simultaneously or in a row unit. That is, the vertical drive unit 22 constitutes a drive unit that controls an operation of each of the pixels of the pixel array unit 20 in combination with the system control unit 25 that controls the vertical drive unit 22.

A signal that is output from each of the pixels 51 in a pixel row in correspondence with drive control by the vertical drive unit 22 is input to the column processing unit 23 through the vertical signal line 29. The column processing unit 23 performs predetermined signal processing with respect to the pixel signal that is output from the pixel 51 through the vertical signal line 29, and temporarily stores the pixel signal after signal processing.

Specifically, the column processing unit 23 performs noise removal processing, analog to digital (AD) conversion processing, or the like as the signal processing.

The horizontal drive unit 24 is constituted by a shift register, an address decoder, or the like, and sequentially selects a unit circuit corresponding to a pixel column of the column processing unit 23. A pixel signal that is subjected to signal processing for every unit circuit in the column processing unit 23 is sequentially output due to selective scanning by the horizontal drive unit 24.

The system control unit 25 is constituted by a timing generator that generates various timing signals, or the like, and performs drive control of the tap drive unit 21, the vertical drive unit 22, the column processing unit 23, the horizontal drive unit 24, or the like on the basis of the various timing signals generated in the timing generator.

The signal processing unit 31 has at least a computation processing function, and performs various kinds of signal processing such as computation processing on the basis of the pixel signal output from the column processing unit 23. At the time of the signal processing in the signal processing unit 31, the data storage unit 32 temporarily stores data necessary for the processing.

Configuration Example of Pixel

Next, a configuration example of the pixels provided in the pixel array unit 20 will be described. For example, the pixels provided in the pixel array unit 20 have a configuration as illustrated in FIG. 2.

Figure 2:
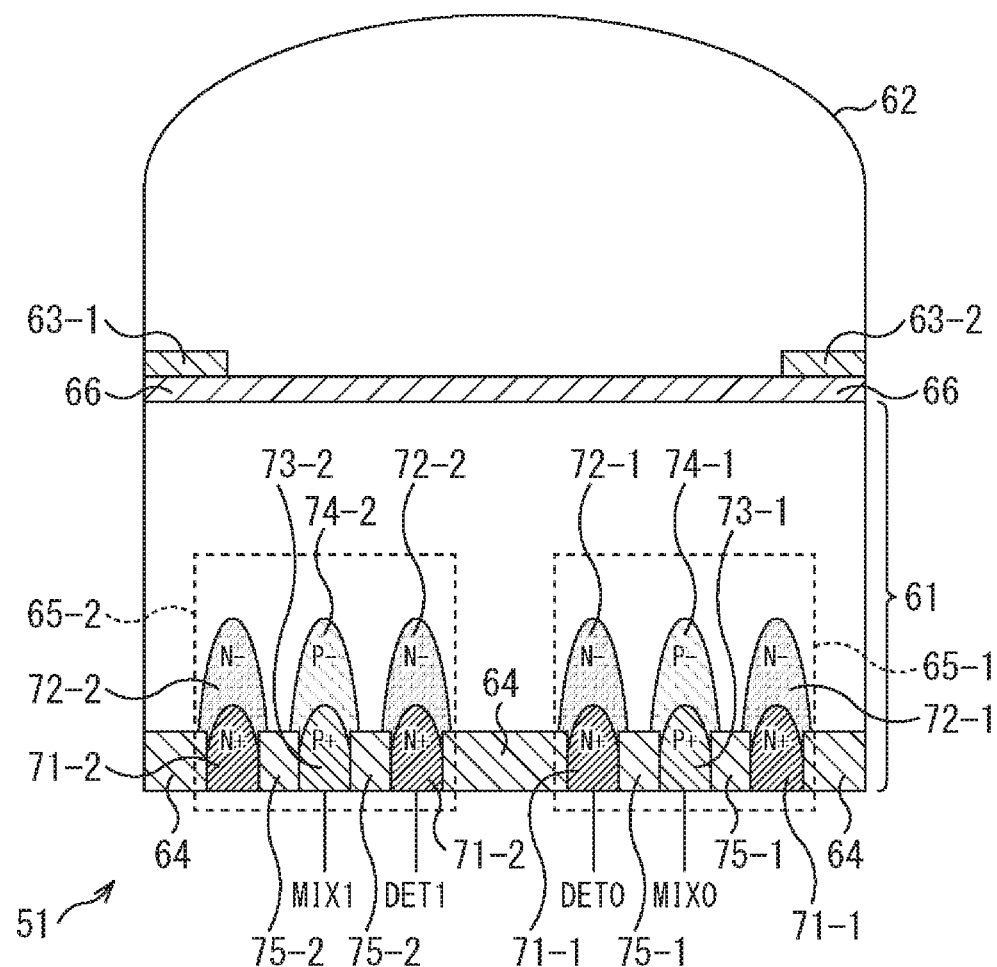
FIG. 2 is a view illustrating a configuration example of a pixel.

FIG. 2 illustrates a cross-section of one pixel 51 that is provided in the pixel array unit 20, and the pixel 51 photoelectrically receives and photoelectrically converts incident light from the outside, particularly, infrared light, and outputs signals corresponding to charges obtained as a result of the photoelectrical conversion.

For example, the pixel 51 includes a substrate 61 constituted by a P-type semiconductor layer such as a silicon substrate, and an on-chip lens 62 that is formed on the substrate 61.

For example, in the substrate 61, the thickness in a vertical direction in the drawing, that is, the thickness perpendicular to a surface of the substrate 61 is set to 20 μm or less. Note that the thickness of the substrate 61 may be 20 μm or greater, and the thickness may be determined in correspondence with target characteristics of the light-receiving element 1, or the like.

In addition, for example, the substrate 61 is set to a high-resistance P-Epi substrate of which a substrate concentration is set to the order of 1E+13 or less, and resistance (resistivity) of the substrate 61 is set to, for example, 500 [Ωcm] or greater.

Here, with regard to a relationship between the substrate concentration and the resistance of the substrate 61, for example, the resistance is set to 2000 [Ωcm] when the substrate concentration is 6.48E+12 [$cm^3$], the resistance is set to 1000 [Ωcm] when the substrate concentration is 1.30E+13 [$cm^3$], the resistance is set to 500 [Ωcm] when the substrate concentration is 2.59E+13 [$cm^3$], and the resistance is set to 100 [Ωcm] when the substrate concentration is 1.30E+14 [$cm^3$].

In FIG. 2, an upper surface of the substrate 61 is a rear surface of the substrate 61, and is a light incident surface when light is incident to the substrate 61 from the outside. Meanwhile, a lower surface of the substrate 61 is a front surface of the substrate 61, and a multilayer interconnection layer (not illustrated) is formed in the front surface. A fixed charge film 66 constituted by a single film or a laminated film which has a positive fixed charge is formed on the light incident surface of the substrate 61, and an on-chip lens 62 that condenses the incident light from the outside and allows the incident light to be incident into the substrate 61 is formed on an upper surface of the fixed charge film 66. The fixed charge film 66 sets the light incident surface side of the substrate 61 to a hole accumulation state, and suppress occurrence of a dark current.

In addition, in the pixel 51, an interpixel light-shielding film 63-1 and an interpixel light-shielding film 63-2 for preventing cross-talk between adjacent pixels are respectively formed at end portions of the pixel 51 on an upper side of the fixed charge film 66. Hereinafter, in a case where it is not necessary to particularly distinguish the interpixel light-shielding film 63-1 and the interpixel light-shielding film 63-2, the films are also referred to simply as interpixel light-shielding film 63.

In this example, light incident from the outside is incident into the substrate 61 through the on-chip lens 62, but the interpixel light-shielding film 63 is formed not to allow the light incident from the outside to be incident to a region of another pixel that is provided adjacently to the pixel 51 in the substrate 61. That is, light that is incident to the on-chip lens 62 from the outside and propagates toward the inside of the other pixel that is adjacent to the pixel 51 is shielded by the interpixel light-shielding film 63-1 or the interpixel light-shielding film 63-2, and is prevented from being incident into the adjacent other pixel.

The light-receiving element 1 is the back-illuminated type CAPD sensor, and thus the light incident surface of the substrate 61 becomes a so-called rear surface, and an interconnection layer including an interconnection or the like is not formed on the rear surface. In addition, an interconnection layer, in which an interconnection for driving a transistor or the like that is formed in the pixel 51, an interconnection for reading out a signal from the pixel 51, and the like are formed, is formed on a portion of a surface opposite to the light incident surface in the substrate 61 through lamination.

In the substrate 61, at a portion on an inner side of the surface opposite to the light incident surface, that is, the lower surface in the drawing, an oxide film 64, a signal extraction unit 65-1, and a signal extraction unit 65-2 are formed. The signal extraction unit 65-1 corresponds to the first tap TA described in FIG. 1, and the signal extraction unit 65-2 corresponds to the second tap TB described in FIG. 1.

In this example, the oxide film 64 is formed at the central portion of the pixel 51 in the vicinity of the surface opposite to the light incident surface of the substrate 61, and the signal extraction unit 65-1 and the signal extraction unit 65-2 are respectively formed on both ends of the oxide film 64.

Here, the signal extraction unit 65-1 includes an N+ semiconductor region 71-1 that is an the N-type semiconductor region 1641, an N− semiconductor region 72-1 in which a concentration of donor impurities is lower in comparison to the N+ semiconductor region 71-1, a P+ semiconductor region 73-1 that is a P-type semiconductor region, and a P− semiconductor region 74-1 in which a concentration of acceptor impurities is lower in comparison to the P+ semiconductor region 73-1. Here, with regard to Si, examples of the donor impurities include elements such as phosphorous (P) and arsenic (As) which pertain to Group 5 in the periodic table of elements. With regard to Si, examples of the acceptor impurities include elements such as boron (B) that pertains to Group 3 in the periodic table of elements. An element that becomes a donor impurity is referred to as a donor element, and an element that becomes an acceptor impurity is referred to as an acceptor element.

In FIG. 2, the N+ semiconductor region 71-1 is formed at a location adjacent to the right side of the oxide film 64 at a portion on an inner side of the surface opposite to the light incident surface of the substrate 61. In addition, the N− semiconductor region 72-1 is formed on an upper side of the N+ semiconductor region 71-1 in the drawing to cover (to surround) the N+ semiconductor region 71-1.

In addition, the P+ semiconductor region 73-1 is formed on the right side of the N+ semiconductor region 71-1. In addition, the P− semiconductor region 74-1 is formed on an upper side of the P+ semiconductor region 73-1 in the drawing to cover (to surround) the P+ semiconductor region 73-1.

In addition, the N+ semiconductor region 71-1 is formed on the right side of the P+ semiconductor region 73-1. In addition, the N− semiconductor region 72-1 is formed on an upper side of the N+ semiconductor region 71-1 in the drawing to cover (to surround) the N+ semiconductor region 71-1.

Similarly, the signal extraction unit 65-2 includes an N+ semiconductor region 71-2 that is an the N-type semiconductor region 1641, an N− semiconductor region 72-2 in which a concentration of donor impurities is lower than in comparison to the N+ semiconductor region 71-2, a P+ semiconductor region 73-2 that is a P-type semiconductor region, and a P− semiconductor region 74-2 in which a concentration of acceptor impurities is lower in comparison to the P+ semiconductor region 73-2.

In FIG. 2, the N+ semiconductor region 71-2 is formed at a location adjacent to the left side of the oxide film 64 at the portion on the inner side of the surface opposite to the light incident surface of the substrate 61. In addition, the N− semiconductor region 72-2 is formed on an upper side of the N+ semiconductor region 71-2 in the drawing to cover (to surround) the N+ semiconductor region 71-2.

In addition, the P+ semiconductor region 73-2 is formed on the left side of the N+ semiconductor region 71-2. In addition, the P− semiconductor region 74-2 is formed on an upper side of the P+ semiconductor region 73-2 in the drawing to cover (to surround) the P+ semiconductor region 73-2.

In addition, the N+ semiconductor region 71-2 is formed on the left side of the P+ semiconductor region 73-2. In addition, the N− semiconductor region 72-2 is formed on an upper side of the N+ semiconductor region 71-2 in the drawing to cover (to surround) the N+ semiconductor region 71-2.

The same oxide film 64 as in the central portion of the pixel 51 is formed at an end portion of the pixel 51 in a portion on an inner side of the surface opposite to the light incident surface of the substrate 61.

Hereinafter, in a case where it is not necessary to particularly distinguish the signal extraction unit 65-1 and the signal extraction unit 65-2, the units are also referred to simply as a signal extraction unit 65.

In addition, hereinafter, in a case where it is not necessary to particularly distinguish the N+ semiconductor region 71-1 and the N+ semiconductor region 71-2, the regions are also referred to simply as an N+ semiconductor region 71, and in a case where it is not necessary to particularly distinguish the N-semiconductor region 72-1 and the N− semiconductor region 72-2, the regions are also referred to simply as an N− semiconductor region 72.

In addition, in a case where it is not necessary to particularly distinguish the P+ semiconductor region 73-1 and the P+ semiconductor region 73-2, the regions are also referred to simply as a P+ semiconductor region 73, and in a case where it is not necessary to particularly distinguish the P− semiconductor region 74-1 and the P− semiconductor region 74-2, the regions are referred to simply as a P− semiconductor region 74.

In addition, in the substrate 61, an isolation portion 75-1 constituted by an oxide film or the like is provided between the N+ semiconductor region 71-1 and the P+ semiconductor region 73-1 to isolate the regions from each other. Similarly, an isolation portion 75-2 constituted by an oxide film or the like is also provided between the N+ semiconductor region 71-2 and the P+ semiconductor region 73-2 to isolate the regions from each other. Hereinafter, in a case where it is not necessary to particularly distinguish the isolation portion 75-1 and the isolation portion 75-2, the portions also referred to simply as an isolation portion 75.

The N+ semiconductor region 71 formed in the substrate 61 functions as a charge detection unit that detects a light amount of light incident to the pixel 51 from the outside, that is, the amount of signal carriers generated due to photoelectric conversion by the substrate 61. Note that in addition to the N+ semiconductor region 71, the N− semiconductor region 72 in which the concentration of the donor impurities is low may also be recognized as the charge detection unit. In addition, the P+ semiconductor region 73 functions as a voltage application unit that injects a lot of carrier currents to the substrate 61, that is, generates an electric field in the substrate 61 by directly applying a voltage to the substrate 61. Note that in addition to the P+ semiconductor region 73, the P− semiconductor region 74 in which the concentration of the acceptor impurities is low may also be recognized as the voltage application unit.

In the pixel 51, a floating diffusion (FD) portion that is a floating diffusion region (not illustrated) (hereinafter, also referred to as an FD portion A) is directly connected to the N+ semiconductor region 71-1, and the FD portion A is connected to the vertical signal line 29 through an amplification transistor (not illustrated) or the like.

Similarly, another FD portion (hereinafter, also referred to particularly as an FD portion B) different from the FD portion A is directly connected to the N+ semiconductor region 71-2, and the FD portion B is connected to the vertical signal line 29 through an amplification transistor (not illustrated) or the like. Here, the FD portion A and the FD portion B are respectively connected to vertical signal lines 29 different from each other.

For example, in the case of measuring a distance up to a target object by the indirect ToF method, infrared light is emitted toward the target object from an imaging device in which the light-receiving element 1 is provided. In addition, when the infrared light is reflected from the target object, and returns to the imaging device as reflected light, the substrate 61 of the light-receiving element 1 receives and photoelectrically converts the incident reflected light (infrared light). The tap drive unit 21 drives the first tap TA and the second tap TB of the pixel 51, and distributes signals corresponding to charges DET obtained through the photoelectric conversion to the FD portion A and the FD portion B.

For example, at an arbitrary timing, the tap drive unit 21 applies a voltage to two pieces of the P+ semiconductor regions 73 through a contact or the like. Specifically, for example, the tap drive unit 21 applies a voltage of MIX0=1.5 V to the P+ semiconductor region 73-1 that is the first TAP TA, and applies a voltage of MIX1=0 V to the P+ semiconductor region 73-2 that is the second tap TB.

In this state, an electric field occurs between the two pieces of P+ semiconductor regions 73 in the substrate, and currents flow from the P+ semiconductor region 73-1 to the P+ semiconductor region 73-2. In this case, holes inside the substrate 61 migrate in a direction of the P+ semiconductor region 73-2, and electrons migrate in a direction of the P+ semiconductor region 73-1.

Accordingly, in this state, when infrared light (reflected light) from the outside is incident to the substrate 61 from the outside through the on-chip lens 62, and the infrared light is photoelectrically converted into pairs of an electron and a hole at the inside of the substrate 61, obtained electrons are guided in the direction of the P+ semiconductor region 73-1 due to the electric field between the P+ semiconductor regions 73, and migrate into the N+ semiconductor region 71-1.

In this case, electrons generated in the photoelectric conversion can be used as signal carriers for detecting signals corresponding to the amount of infrared light incident to the pixel 51, that is, a light amount of infrared light received.

Accordingly, charges corresponding to electrons which migrate into the N+ semiconductor region 71-1 are accumulated in the N+ semiconductor region 71-1, and the charges are detected by the column processing unit 23 through the FD portion A, the amplification transistor, the vertical signal line 29, and the like.

That is, accumulated charges DET0 of the N+ semiconductor region 71-1 are transferred to the FD portion A that is directly connected to the N+ semiconductor region 71-1, and signals corresponding to the charges DET0 transferred to the FD portion A are read out by the column processing unit 23 through the amplification transistor or the vertical signal line 29. In addition, processing such as AD conversion processing is performed in the column processing unit 23 with respect to the read out signals, and pixel signals obtained as a result thereof are supplied to the signal processing unit 31.

The pixel signals become signals indicating a charge amount corresponding to electrons detected in the N+ semiconductor region 71-1, that is, the amount of charges DET0 accumulated in the FD portion A. In other words, the pixel signals may also referred to as signals indicating a light amount of infrared light received by the pixel 51.

Note that in a same manner as in the case of the N+ semiconductor region 71-1, pixel signals corresponding to electrons detected in the N+ semiconductor region 71-2 may be used in distance measurement in an appropriate manner.

In addition, at a next timing, a voltage is applied to two pieces of the P+ semiconductor regions 73 by the tap drive unit 21 through a contact or the like so that an electric field in a direction opposite to that of the electric field occurred in the substrate 61 up to now occurs. Specifically, for example, a voltage of MIX0=0 V is applied to the P+ semiconductor region 73-1 that is the first tap TA, and a voltage of MIX1=1.5 V is applied to the P+ semiconductor region 73-2 that is the second tap TB.

Accordingly, an electric field occurs between the two pieces of P+ semiconductor regions 73 in the substrate 61, and currents flow from the P+ semiconductor region 73-2 to the P+ semiconductor region 73-1.

In this state, when infrared light (reflected light) is incident into the substrate 61 from the outside through the on-chip lens 62, and the infrared light is photoelectrically converted into pairs of an electron and a hole at the inside of the substrate 61, obtained electrons are guided in a direction of the P+ semiconductor region 73-2 due to the electric field between the P+ semiconductor regions 73, and migrate into the N+ semiconductor region 71-2.

Accordingly, charges corresponding to electrons which migrate into the N+ semiconductor region 71-2 are accumulated in the N+ semiconductor region 71-2, and the charges are detected by the column processing unit 23 through the FD portion B, the amplification transistor, the vertical signal line 29, and the like.

That is, accumulated charges DET1 in the N+ semiconductor region 71-2 are transferred to the FD portion B that is directly connected to the N+ semiconductor region 71-2, and signals corresponding to the charges DET1 transferred to the FD portion B are read out by the column processing unit 23 through the amplification transistor or the vertical signal line 29. In addition, processing such as AD conversion processing is performed in the column processing unit 23 with respect to the read out signals, and pixel signals obtained as a result thereof are supplied to the signal processing unit 31.

Note that in a similar manner as in the case of the N+ semiconductor region 71-2, pixel signals corresponding to electrons detected in the N+ semiconductor region 71-1 may be used in distance measurement in an appropriate manner.

As described above, when pixel signals obtained in photoelectric conversion in periods different from each other in the same pixel 51 are obtained, the signal processing unit 31 calculates distance information indicating a distance to a target object on the basis of the pixel signals, and outputs the distance information to a rear stage.

As described above, a method in which the signal carriers are distributed to the N+ semiconductor regions 71 different from each other, and the distance information is calculated on the basis of signals corresponding to the signal carriers is referred to as the indirect ToF method.

Figure 3:
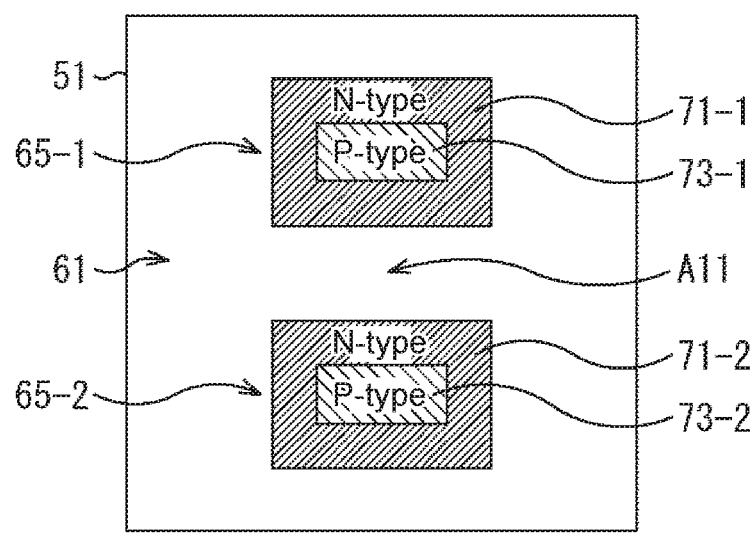
FIG. 3 is a view illustrating a configuration example of a portion of a signal extraction unit of the pixel.

When the portion of the signal extraction unit 65 in the pixel 51 is viewed from an upper side toward a downward side in FIG. 2, that is, in a direction perpendicular to the surface of the substrate 61, for example, as illustrated in FIG. 3, the periphery of the P+ semiconductor region 73 has a structure surrounded by the N+ semiconductor region 71. Note that in FIG. 3, the same reference symbol will be given to a portion corresponding to the case of FIG. 2, and description thereof will be appropriately omitted.

In an example illustrated in FIG. 3, the oxide film 64 (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction units 65, the P+ semiconductor region 73 is formed in a rectangular shape at the central position, and in a state in which the P+ semiconductor region 73 is set as the center, the periphery of the P+ semiconductor region 73 is surrounded by the N+ semiconductor region 71 in a rectangular shape, more specifically, a rectangular frame shape. That is, the N+ semiconductor region 71 is formed to surround the periphery of the P+ semiconductor region 73.

In addition, in the pixel 51, the on-chip lens 62 is formed at the central portion of the pixel 51, that is, at a portion indicated by an arrow A11 so that infrared light incident from the outside is condensed. In other words, infrared light incident to the on-chip lens 62 from the outside is condensed by the on-chip lens 62 to a position indicated by the arrow A11, that is, at a position on an upper side of the oxide film 64 in FIG. 2.

Accordingly, infrared light is condensed to a position between the signal extraction unit 65-1 and the signal extraction unit 65-2. Accordingly, occurrence of cross-talk due to incidence of the infrared light to a pixel adjacent to the pixel 51 is suppressed, and direct incidence of the infrared light into the signal extraction unit 65 is also suppressed.

For example, when the infrared light is incident to the signal extraction unit 65, charge separation efficiency, that is, contrast between active and inactive taps (Cmod) or modulation contrast deteriorates.

Here, it is assumed that the signal extraction unit 65 on a side in which read-out of signals corresponding to the charges DET obtained in the photoelectric conversion is performed, that is, the signal extraction unit 65 in which the charges DET obtained in the photoelectric conversion are to be detected is also referred to as an active tap.

In contrast, basically, it is assumed that the signal extraction unit 65 in which read-out of signals corresponding to the charges DET obtained in the photoelectric conversion is not performed, that is, the signal extraction unit 65 that is not the active tap is also referred to as an inactive tap.

In the above-described example, the signal extraction unit 65 on a side in which a voltage of 1.5 V is applied to the P+ semiconductor region 73 is the active tap, and the signal extraction unit 65 on a side in which a voltage of 0 V is applied to the P+ semiconductor region 73 is the inactive tap.

The Cmod is an index that is calculated in accordance with the following Expression (1) and indicates that charges of how many percentages among charges generated in the photoelectric conversion of incident infrared light can be detected in the N+ semiconductor region 71 of the signal extraction unit 65 that is the active tap, that is, signals corresponding to the charges are extracted, and indicates charge separation efficiency. In Expression (1), I0 represents a signal that is detected on one side between two charge detection units (P+ semiconductor regions 73), and I1 represents a signal that is detected on the other side.

$$Cmod = \{|I0-I1|/|I0+I1|\} \times 100 \qquad (1)$$

Accordingly, for example, when infrared light incident from the outside is incident to the region of the inactive tap, and photoelectric conversion is performed in the inactive tap, there is a high possibility that electrons which are signal carriers generated through the photoelectric conversion migrate to the N+ semiconductor region 71 inside the inactive tap. In this case, charges of partial electrons obtained through the photoelectric conversion are not detected in the N+ semiconductor region 71 in the active tap, and the Cmod, that is, the charge separation efficiency deteriorates.

Here, in the pixel 51, infrared light is condensed to the vicinity of the center of the pixel 51 which is located at approximately the same distance from two pieces of the signal extraction units 65, and thus a probability that infrared light incident from the outside is photoelectrically converted the region of the inactive tap is reduced. As a result, it is possible to improve the charge separation efficiency. In addition, in the pixel 51, it is also possible to improve the modulation contrast. In other words, it is possible to allow electrons obtained through the photoelectric conversion to be easily guided to the N+ semiconductor region 71 inside the active tap.

In accordance with the above-described light-receiving element 1, it is possible to obtain the following effect.

Specifically, first, the light-receiving element 1 is a back-illuminated type, and thus it is possible to maximize quantum efficiency (QE)×opening rate (fill factor) (FF), and thus it is possible to improve distance measurement characteristics by the light-receiving element 1.

Figure 4:
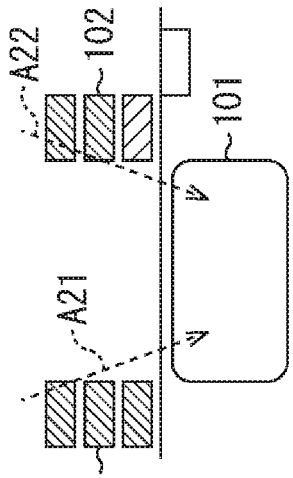
FIG. 4 is a view describing sensitivity improvement.

For example, as illustrated by an arrow W11 in FIG. 4, a typical front-illuminated type image sensor has a structure in which an interconnection 102 and an interconnection 103 are formed on a light incident surface side, to which light is incident from the outside, in a PD 101 that is a photoelectric conversion unit.

Accordingly, for example, a part of light that is obliquely incident to the PD 101 from the outside at an angle of a certain extent as illustrated by an arrow A21 or an arrow A22 is blocked by the interconnection 102 or the interconnection 103, and is not incident to the PD 101.

In contrast, for example, as indicated by an arrow W12, a back-illuminated type image sensor has a structure in which the interconnection 105 and the interconnection 106 are formed on a surface on a side opposite to the light incident surface, to which light is incident from the outside, in a PD 104 that is a photoelectric conversion unit.

Accordingly, it is possible to secure a sufficient opening rate in comparison to a case in the front-illuminated type. That is, for example, a part of light that is obliquely incident to the PD 104 from the outside at an angle of a certain extent as illustrated by an arrow A23 or an arrow A24 is not blocked by an interconnection, and is not incident to the PD 104. Accordingly, a lot of light beams are received and thus it is possible to improve sensitivity of a pixel.

The effect of improving the pixel sensitivity due to the back-illuminated type can also be obtained in the light-receiving element 1 that is a back-illuminated type CAPD sensor.

In addition, for example, in the front-illuminated type CAPD sensor, as indicated by an arrow W13, a signal extraction unit 112 that is called a tap, more specifically, a P+ semiconductor region or a N+ semiconductor region of a tap is formed on a light incident surface side to which light is incident from the outside at the inside of a PD 111 that is a photoelectric conversion unit. In addition, the front-illuminated type CAPD sensor has a structure in which an interconnection 113, and an interconnection 114 such as a contact and a metal that is connected to the signal extraction unit 112 are formed on a light incident surface side.

Accordingly, for example, a part of light that is obliquely incident from the outside to the PD 111 at an angle of a certain extent as indicated by an arrow A25 or an arrow A26 is blocked by the interconnection 113 or the like, and is not incident to the PD 111, and light that is vertically incident to the PD 111 as indicated by an arrow A27 is blocked by the interconnection 114 and is not incident to the PD 111.

In contrast, for example, as indicated by an arrow W14, the back-illuminated type CAPD sensor has a structure in which a signal extraction unit 116 is formed in a portion of a surface opposite to a light incident surface to which light is incident from the outside in a PD 115 that is a photoelectric conversion unit. In addition, an interconnection 117 and an interconnection 118 such as a contact and a metal that is connected to the signal extraction unit 116 are formed on a surface opposite to the light incident surface in the PD 115.

Here, the PD 115 corresponds to the substrate 61 illustrated in FIG. 2, and the signal extraction unit 116 corresponds to the signal extraction unit 65 illustrated in FIG. 2.

In the back-illuminated type CAPD sensor having the above-described structure, it is possible to secure a sufficient opening rate in comparison to the front-illuminated type. Accordingly, it is possible to maximize quantum efficiency (QE)×opening rate (FF), and thus it is possible to improve distance measurement characteristics.

That is, for example, light that is obliquely incident from the outside to the PD 115 at an angle of a certain extent as indicated by an arrow A28 or an arrow A29 is not blocked by an interconnection, and is incident to the PD 115. Similarly, as light that is vertically incident to the PD 115 as indicated by an arrow A30 is not also blocked by an interconnection or the like, and is incident to the PD 115.

As described above, the back-illuminated type CAPD sensor can receive not only light that is incident at an angle of a certain extent but also light that is vertically incident to the PD 115 and was reflected by an interconnection or the like that is connected to a signal extraction unit (tap) in the front-illuminated type. Accordingly, a lot of light beams are received and thus it is possible to improve sensitivity of a pixel. In other words, it is possible to maximize quantum efficiency (QE)×opening rate (FF), and as a result, it is possible to improve distance measurement characteristics.

Particularly, in a case where a tap is disposed in the vicinity of the center of a pixel instead of an outer edge of the pixel, in the front-illuminated type CAPD sensor, it is difficult to secure a sufficient opening rate, and sensitivity of the pixel deteriorates. However, in the light-receiving element 1 that is the back-illuminated type CAPD sensor, it is possible to secure a sufficient opening rate regardless of a disposition position of the tap, and it is possible to improve sensitivity of the pixel.

In addition, in the back-illuminated type light-receiving element 1, the signal extraction unit 65 is formed in the vicinity of a surface opposite to a light incident surface, to which infrared light is incident from the outside, in the substrate 61, and thus it is possible to reduce occurrence of photoelectric conversion of the infrared light in the region of the inactive tap. Accordingly, it is possible to improve the Cmod, that is, the charge separation efficiency.

Figure 5:
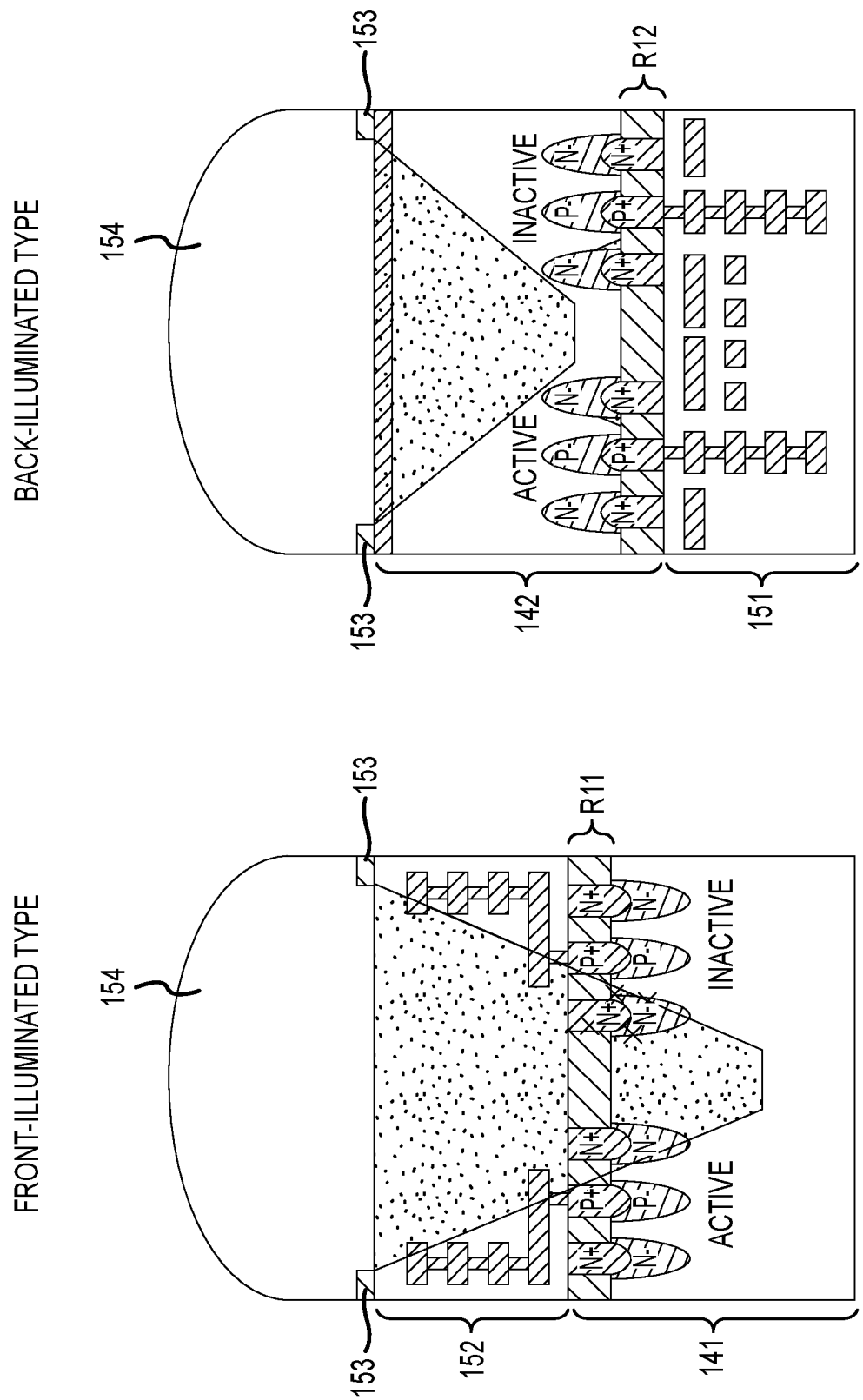
FIG. 5 is a view describing an improvement of charge separation efficiency.

FIG. 5 illustrates a pixel cross-sectional view of the front-illuminated type and the back-illuminated type CAPD sensors.

In the front-illuminated type CAPD sensor on the left side in FIG. 5, an upper side of a substrate 141 in the drawing is a light incident surface, and an interconnection layer 152 including a multilayer interconnection, an interpixel light-shielding portion 153, and an on-chip lens 154 are laminated on the light incident surface side of the substrate 141.

In the back-illuminated type CAPD sensor on the right side of FIG. 5, the interconnection layer 152 including the multilayer interconnection is formed on a lower side of the substrate 142 which is opposite to the light incident surface, and the interpixel light-shielding portion 153 and the on-chip lens 154 are laminated on an upper side of the substrate 142 that is a light incident surface side.

Note that a gray trapezoidal shape in FIG. 5 represents a region in which optical intensity is strong when infrared light is condensed by the on-chip lens 154.

For example, in the front-illuminated type CAPD sensor, a region R11 in which an inactive tap and an active tap exist is located on the light incident surface side of the substrate 141. Accordingly, a lot of components are directly incident to the inactive tap, and when photoelectric conversion is performed in a region of the inactive tap, signal carriers obtained through the photoelectric conversion are not detected in an N+ semiconductor region of the active tap.

In the front-illuminated type CAPD sensor, in the region R11 in the vicinity of the light incident surface of the substrate 141, intensity of infrared light is strong, and thus there is a high probability that photoelectric conversion of infrared light is performed in the region R11. That is, a light amount of infrared light incident to the vicinity of the inactive tap is large, and thus signal carriers which cannot be detected by the active tap increase, and thus charge separation efficiency deteriorate.

In contrast, in the back-illuminated type CAPD sensor, a region R12 in which an inactive tap and an active tap exist is located at a position that is distant from a light incident surface of a substrate 142, that is, at a position near a surface opposite to the light incident surface side. Here, the substrate 142 corresponds to the substrate 61 illustrated in FIG. 2.

In this example, the region R12 exists in a portion of the surface opposite to the light incident surface side of the substrate 142, and the region R12 is located at a position distant from the light incident surface, and thus the intensity of infrared light that is incident is relatively weak in the vicinity of the region R12.

In a region such as the vicinity of the center of the substrate 142 and the vicinity of the light incident surface in which the intensity of infrared light is strong, signal carriers obtained through photoelectric conversion are guided to the active tap due to an electric field that occurs within the substrate 142, and are detected in an N+ semiconductor region of the active tap.

Meanwhile, in the vicinity of the region R12 including the inactive tap, the intensity of incident infrared light is relatively weak, and thus there is a low probability that photoelectric conversion of infrared light is performed in the region R12. That is, a light amount of infrared light incident to the vicinity of the inactive tap is small, and thus the number of signal carriers which are generated due to photoelectric conversion in the vicinity of the inactive tap and migrate to the N+ semiconductor region of the inactive tap decreases. Accordingly, it is possible to improve charge separation efficiency. As a result, it is possible to improve distance measurement characteristics.

In addition, in the back-illuminated type light-receiving element 1, it is possible to realize a reduction in thickness of the substrate 61, and thus it is possible to improve electron extraction efficiency of electrons (charges) which are signal carriers.

Figure 6:
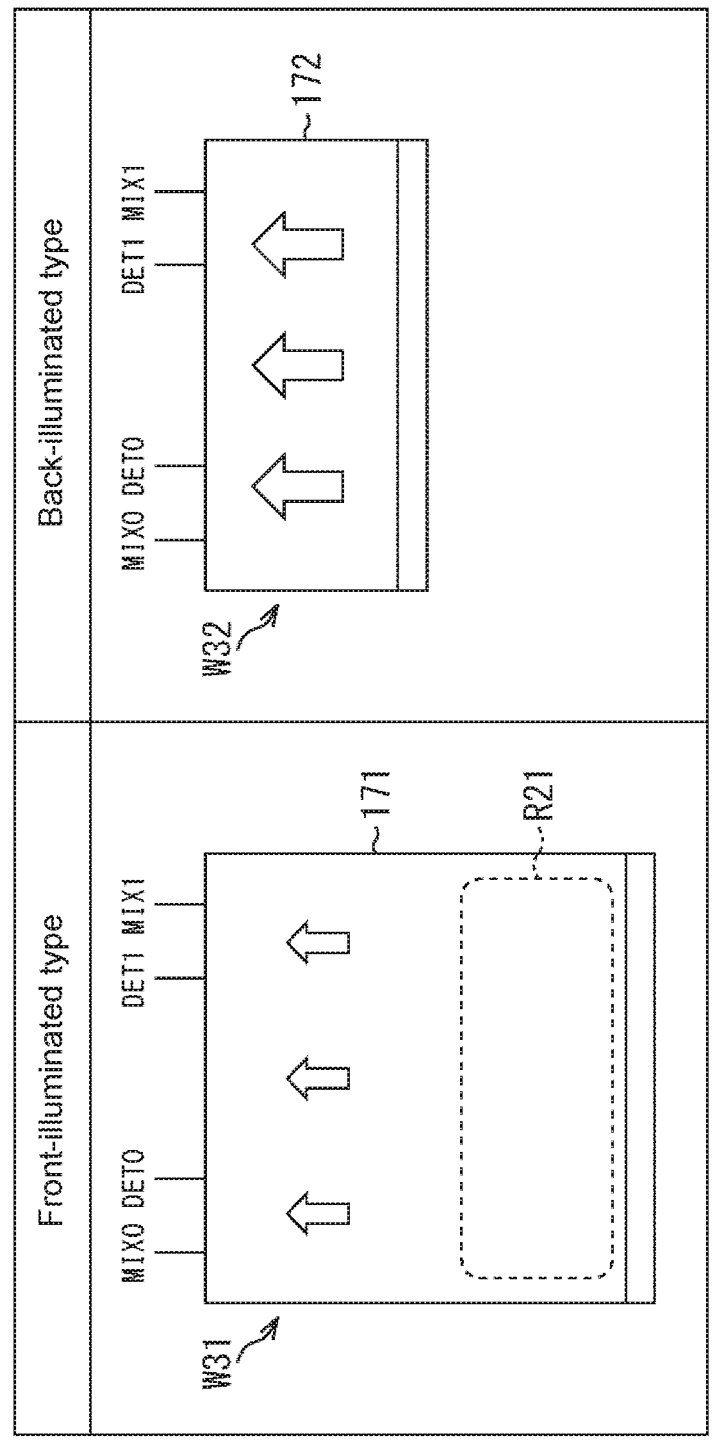
FIG. 6 is a view describing an improvement of electron extraction efficiency.

For example, in the front-illuminated type CAPD sensor, it is difficult to secure a sufficient opening rate, and thus it is necessary to enlarge the thickness of a substrate 171 to a certain extent to secure high quantum efficiency and to suppress a decrease in quantum efficiency×opening rate as indicated by an arrow W31 in FIG. 6.

In this case, an inclination of a potential becomes gentle in a region near a surface opposite to a light incident surface at the inside of the substrate 171, for example, at a portion of a region R21, and thus an electric field in a direction perpendicular to the substrate 171 substantially becomes weak. In this case, a migration speed of signal carriers becomes slow, and thus a time taken until the signal carriers are detected in the N+ semiconductor region of the active tap after photoelectric conversion is performed is lengthened. Note that in FIG. 6, an arrow inside the substrate 171 indicates the electric field in the substrate 171 in a direction perpendicular to the substrate 171.

In addition, when the substrate 171 is thick, a migration distance of the signal carriers from a position distant from the active tap inside the substrate 171 to the N+ semiconductor region inside the active tap is lengthened. Accordingly, at a position distant from the active tap, a time taken until the signal carriers are detected in the N+ semiconductor region of the active tap after photoelectric conversion is performed is also lengthened.

Figure 7:
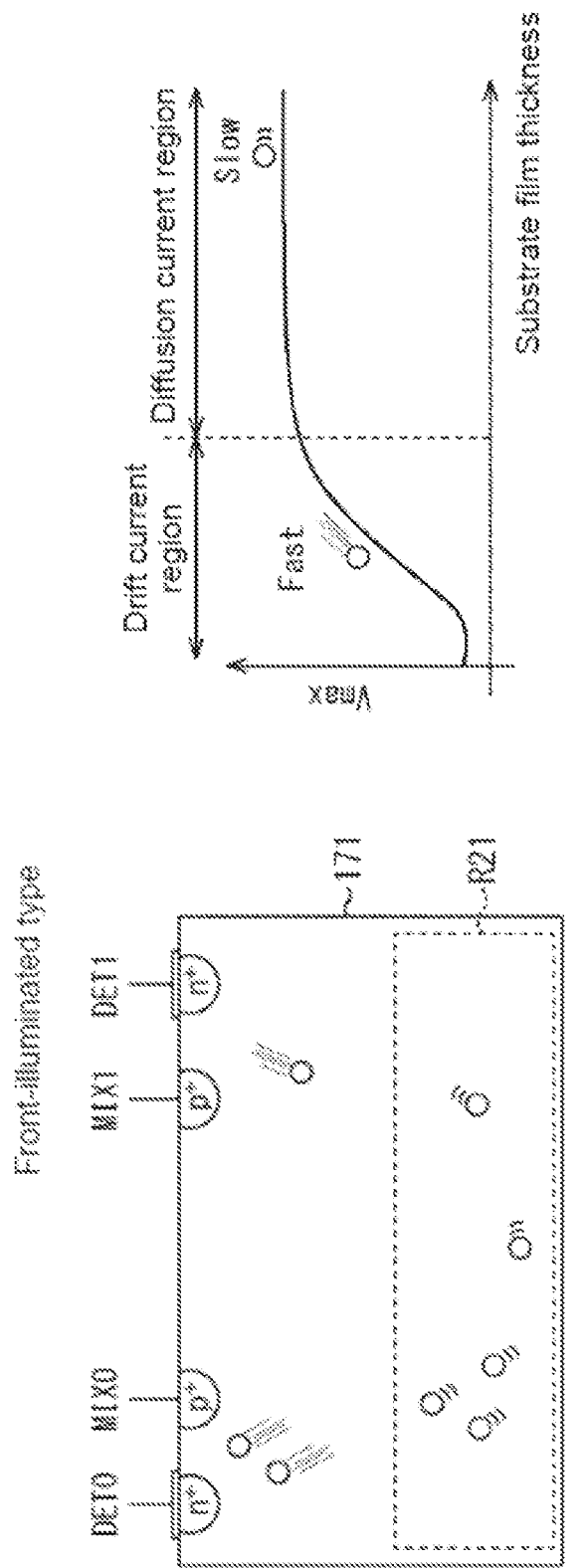
FIG. 7 is a view describing a movement speed of a signal carrier in a front-illuminated type.

FIG. 7 illustrates a relationship between a position in a thickness direction of the substrate 171, and the migration speed of the signal carriers. A region R21 corresponds to a diffusion current region.

As described above, if the thickness of the substrate 171 is large, for example, when a drive frequency is high, that is, when switching between active and inactive of the tap (signal extraction unit) is performed at a high speed, it is difficult to completely inject electrons generated at a position such as the region R21 distant from the active tap into the N+ semiconductor region of the active tap. That is, in a case where a time for which the tap is active is short, it may be difficult to detect electrons (charges) generated inside the region R21 in the N+ semiconductor region of the active tap, and thus electron extraction efficiency deteriorates.

In contrast, in the back-illuminated type CAPD sensor, it is possible to secure a sufficiently opening rate. Accordingly, for example, when the substrate 172 is made to be thin as indicated by an arrow W32 in FIG. 6, it is possible to secure sufficient quantum efficiency×opening rate. Here, the substrate 172 corresponds to the substrate 61 in FIG. 2, and an arrow inside the substrate 172 indicates an electric field in a direction perpendicular to the substrate 172.

Figure 8:
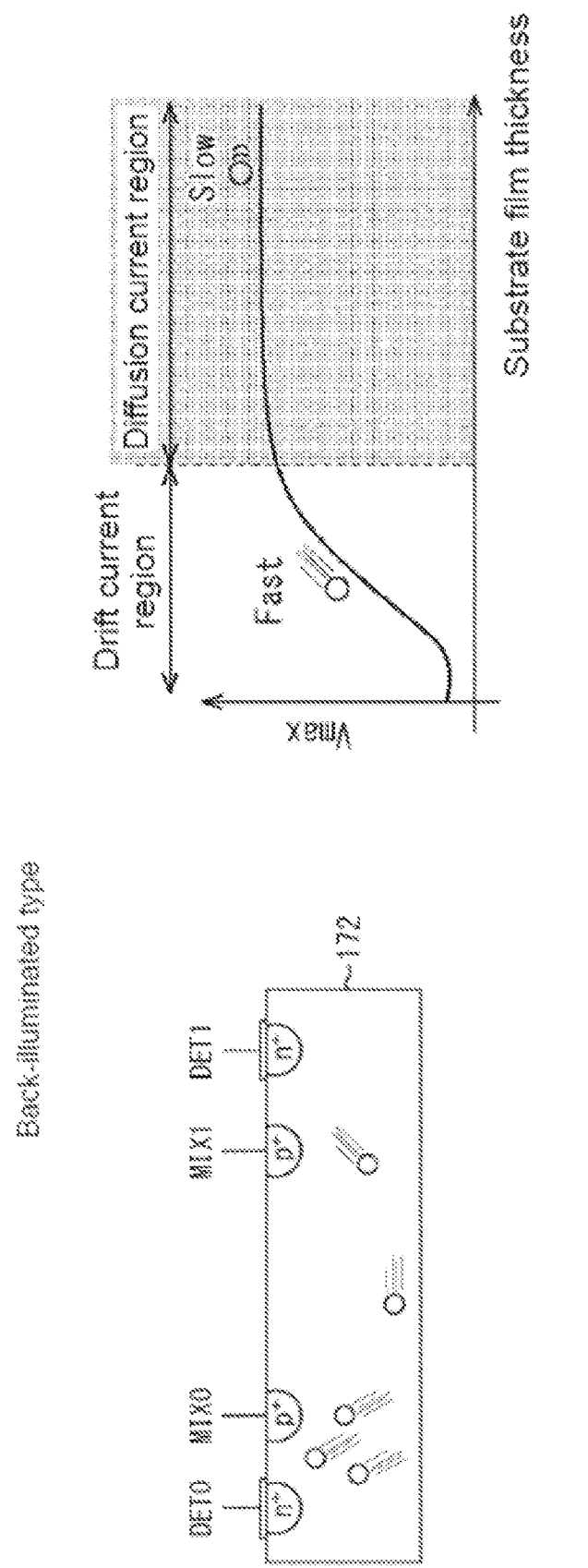
FIG. 8 is a view describing a movement speed of a signal carrier in a back-illuminated type.

FIG. 8 illustrates a relationship between a position in a thickness direction of the substrate 172 and the migration speed of the signal carriers.

As described above, when the thickness of the substrate 172 in a direction perpendicular to the substrate 172 is made to be small, an electric field in the direction perpendicular to the substrate 172 substantially becomes strong, only electrons (charges) only in a drift current region in which the migration speed of the signal carriers is fast is used, and electrons in a diffusion current region in which the migration speed of the signal carriers is slow is not used. Since only the electrons (charges) only in the drift current region are used, a time taken until the signal carriers are detected in the N+ semiconductor region of the active tap after photoelectric conversion is performed is shortened. In addition, when the thickness of the substrate 172 becomes small, a migration distance of the signal carriers up to the N+ semiconductor region inside the active tap is also shortened.

Accordingly, in the back-illuminated type CAPD sensor, even when the drive frequency is high, the signal carriers (electrons) generated in each region inside the substrate 172 can be sufficiently injected into the N+ semiconductor region of the active tap, and thus it is possible to improve electron extraction efficiency.

In addition, it is possible to secure sufficient electron extraction efficiency due to a reduction in the thickness of the substrate 172 even in a high drive frequency, and it is possible to improve high-speed drive tolerance.

Particularly, in the back-illuminated type CAPD sensor, it is possible to directly apply a voltage to the substrate 172, that is, the substrate 61, and thus a response speed for switching between active and inactive of the tap is fast, and thus it is possible to drive the sensor at a high drive frequency. In addition, since it is possible to directly apply a voltage to the substrate 61, a modulation possible region inside the substrate 61 is widened.

In addition, in the back-illuminated type light-receiving element 1 (CAPD sensor), it is possible to obtain a sufficient opening rate, and thus it is possible to miniaturize a pixel in proportion to the opening rate, and it is possible to improve miniaturization tolerance of the pixel.

In addition, in the light-receiving element 1, the freedom of back end of line (BEOL) capacity design is possible due to the back-illuminated type, and thus it is possible to improve the degree of freedom in design of a saturation signal amount (Qs).

Modification Example 1 of First Embodiment

Configuration Example of Pixel

Note that description has been given of a case where in a portion of the signal extraction unit 65 inside the substrate 61, the N+ semiconductor region 771 and the P+ semiconductor region 73 are set to rectangular regions as illustrated in FIG. 3 as an example. However, the shape of the N+ semiconductor region 71 and the P+ semiconductor region 73 when viewed from a direction perpendicular to the substrate 61 may be an arbitrary shape.

Figure 9:
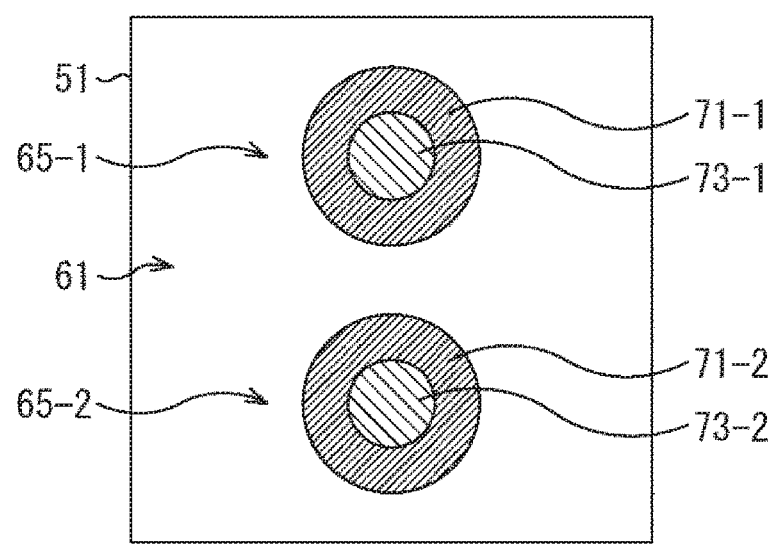
FIG. 9 is a view illustrating another configuration example of the portion of the signal extraction unit of the pixel.

Specifically, for example, as illustrated in FIG. 9, the N+ semiconductor region 71 and the P+ semiconductor region 73 may be set to a circular shape. Note that in FIG. 9, the same reference symbol will be given to a portion corresponding to the case in FIG. 3, and description thereof will be appropriately omitted.

FIG. 9 illustrates the N+ semiconductor region 71 and the P+ semiconductor region 73 when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction units 65, the P+ semiconductor region 73 having a circular shape is formed at the central position, and in a state in which the P+ semiconductor region 73 is set as the center, the periphery of the P+ semiconductor region 73 is surrounded by the N+ semiconductor region 71 having a circular shape, more specifically, an annular shape.

Figure 10:
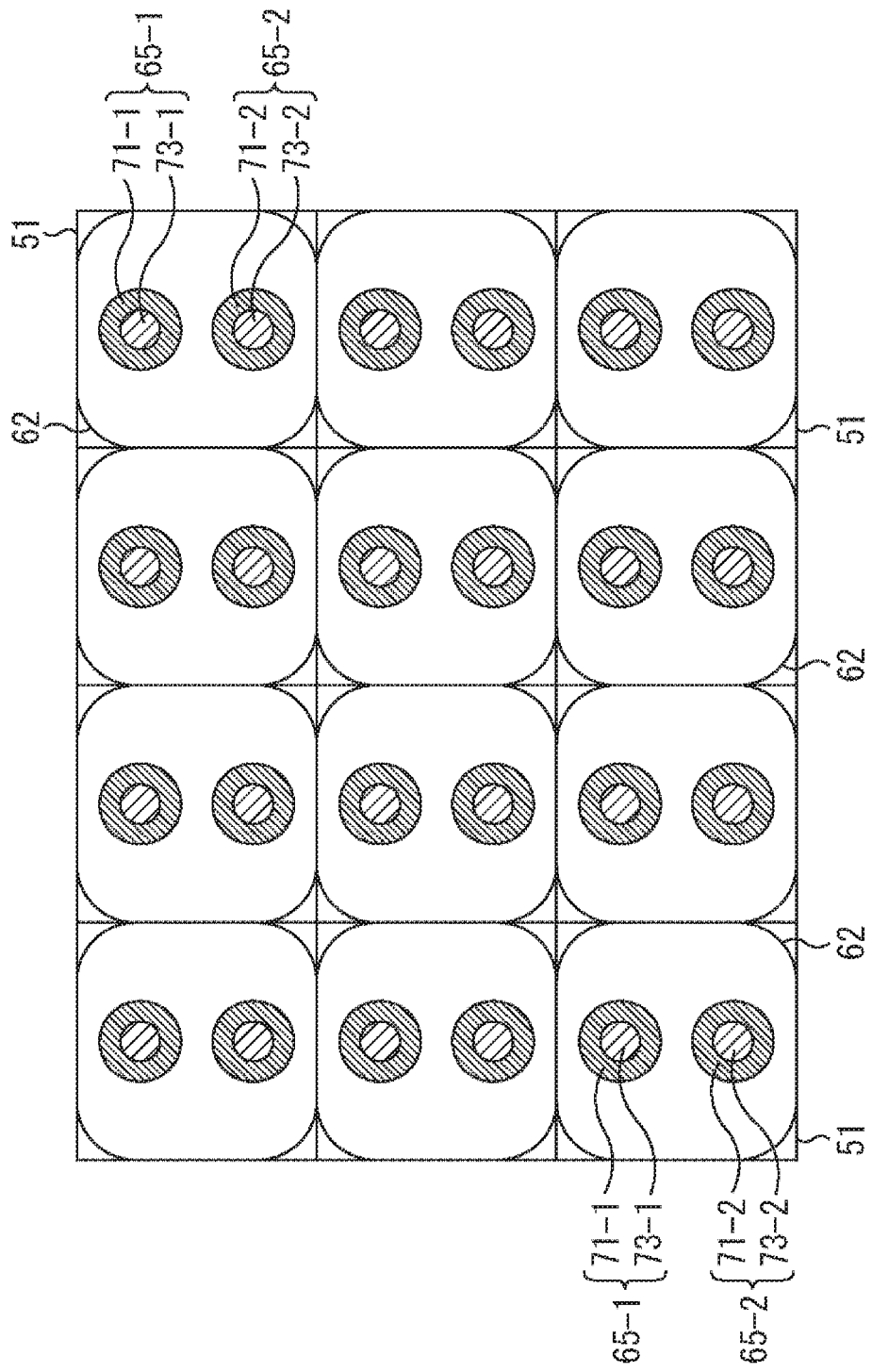
FIG. 10 is a view describing a relationship between the pixel and an on-chip lens.

FIG. 10 is a plan view in which the on-chip lens 62 is superimposed on a part of the pixel array unit 20 in which the pixels 51 including the signal extraction unit 65 illustrated in FIG. 9 are two-dimensionally arranged in a matrix shape.

The on-chip lens 62 is formed in a pixel unit as illustrated in FIG. 10. In other words, a unit region in which one piece of the on-chip lens 62 is formed corresponds to one pixel.

Note that in FIG. 2, the isolation portion 75 constituted by an oxide film or the like is disposed between the N+ semiconductor region 71 and the P+ semiconductor region 73, but the isolation portion 75 may be present or absent.

Modification Example 2 of First Embodiment

Configuration Example of Pixel

Figure 11:
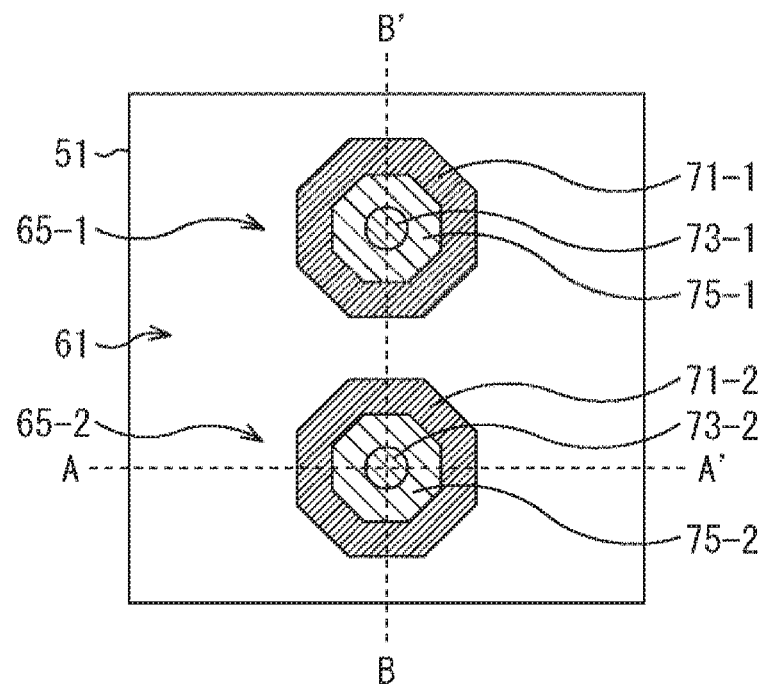
FIG. 11 is a view illustrating still another configuration example of the portion of the signal extraction unit of the pixel.

FIG. 11 is a plan view illustrating a modification example of a planar shape of the signal extraction unit 65 in the pixel 51.

The planar shape of the signal extraction unit 65 may be set to a shape other than the rectangular shape illustrated in FIG. 3 and the circular shape illustrated in FIG. 9, for example, an octagonal shape as illustrated in FIG. 11.

In addition, FIG. 11 illustrates a plan view in a case where the isolation portion 75 constituted by an oxide film or the like is formed between the N+ semiconductor region 71 and the P+ semiconductor region 73.

A line A-A' illustrated in FIG. 11 represents a cross-sectional line in FIG. 37 to be described later, and a line B-B' represents a cross-sectional line in FIG. 36 to be described later.

Second Embodiment

Configuration Example of Pixel

In addition, description has been given of a configuration in which in the signal extraction unit 65, the periphery of the P+ semiconductor region 73 is surrounded by the N+ semiconductor region 71 as an example, but the periphery of the N+ semiconductor region may be surrounded by the P+ semiconductor region.

Figure 12:
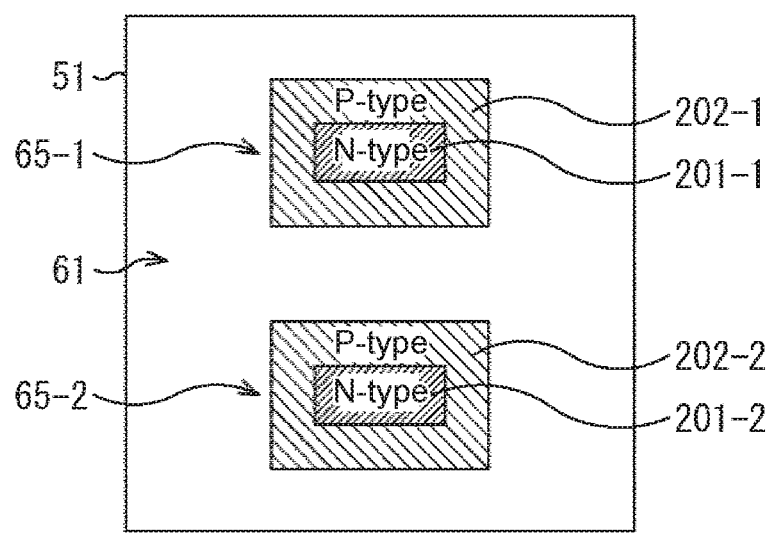
FIG. 12 is a view illustrating still another configuration example of the portion of the signal extraction unit of the pixel.

In this case, for example, the pixel 51 is configured as illustrated in FIG. 12. Note that in FIG. 12, the same reference symbol will be given to a portion corresponding to the case in FIG. 3, and description thereof will be appropriately omitted.

FIG. 12 illustrates an arrangement of the N+ semiconductor region and the P+ semiconductor region when a portion of the signal extraction unit 65 is viewed from a direction perpendicular to the substrate 61.

In this example, the oxide film 64 (not illustrated) is formed at the central portion of the pixel 51, and the signal extraction unit 65-1 is formed at a portion on a slightly upper side from the center of the pixel 51 in the drawing, and the signal extraction unit 65-2 is formed at a portion on a slightly lower side from the center of the pixel 51 in the drawing. Particularly, in this example, a formation position of the signal extraction unit 65 in the pixel 51 is set to the same position as in the case of FIG. 3.

In the signal extraction unit 65-1, a rectangular N+ semiconductor region 201-1 corresponding to the N+ semiconductor region 71-1 illustrated in FIG. 3 is formed at the center of the signal extraction unit 65-1. In addition, the periphery of the N+ semiconductor region 201-1 is surrounded by a P+ semiconductor region 202-1 that corresponds to the P+ semiconductor region 73-1 illustrated in FIG. 3 and has a rectangular shape, more specifically, a rectangular frame shape. That is, the P+ semiconductor region 202-1 is formed to surround the periphery of the N+ semiconductor region 201-1.

Similarly, In the signal extraction unit 65-2, a rectangular N+ semiconductor region 201-2 corresponding to the N+ semiconductor region 71-2 illustrated in FIG. 3 is formed at the center of the signal extraction unit 65-2. In addition, the periphery of the N+ semiconductor region 201-2 is surrounded by a P+ semiconductor region 202-2 that corresponds to the P+ semiconductor region 73-2 illustrated in FIG. 3 and has a rectangular shape, more specifically, a rectangular frame shape.

Note that hereinafter, in a case where it is not necessary to particularly distinguish the N+ semiconductor region 201-1 and the N+ semiconductor region 201-2, the regions are simply referred to as an N+ semiconductor region 201. In addition, hereinafter, in a case where it is not necessary to distinguish the P+ semiconductor region 202-1 and the P+ semiconductor region 202-2, the regions are simply referred to as a P+ semiconductor region 202.

Even in a case where the signal extraction unit 65 has the configuration illustrated in FIG. 12, as in the case of the configuration illustrated in FIG. 3, the N+ semiconductor region 201 functions as a charge detection unit that detects the amount of signal carriers, and the P+ semiconductor region 202 functions a voltage application unit that generates an electric field by directly applying a voltage to the substrate 61.

Modification Example 1 of Second Embodiment

Configuration Example of Pixel

In addition, as in the example illustrated in FIG. 9, even in an arrangement in which the periphery of the N+ semiconductor region 201 is surrounded by the P+ semiconductor region 202, the shape of the N+ semiconductor region 201 and the P+ semiconductor region 202 may be set to an arbitrary shape.

Figure 13:
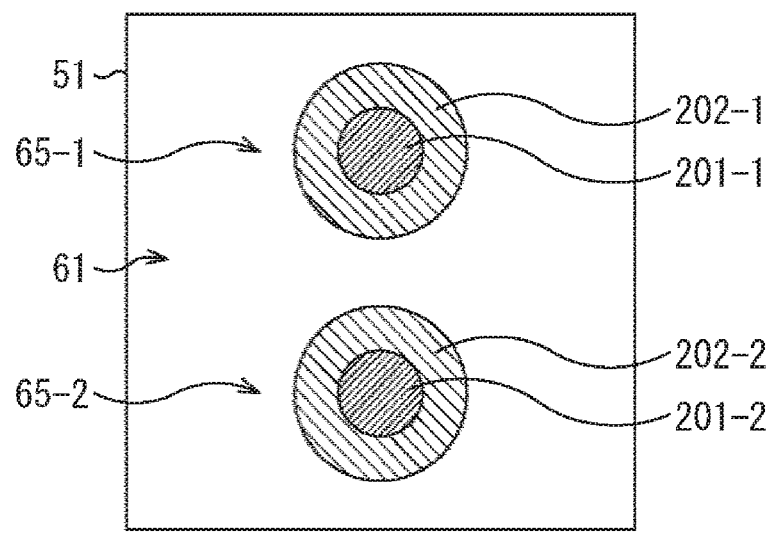
FIG. 13 is a view illustrating still another configuration example of the portion of the signal extraction unit of the pixel.

That is, for example, as illustrated in FIG. 13, the N+ semiconductor region 201 and the P+ semiconductor region 202 may be set to a circular shape. Note that in FIG. 13, the same reference symbol will be given to a portion corresponding to the case in FIG. 12, and description thereof will be appropriately omitted.

FIG. 13 illustrates the N+ semiconductor region 201 and the P+ semiconductor region 202 when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, here, two pieces of the signal extraction units 65 are formed in the pixel 51.

In addition, in the signal extraction unit 65, the N+ semiconductor region 201 having a circular shape is formed at the central position, and in a state in which the N+ semiconductor region 201 is set as the center, the periphery of the N+ semiconductor region 201 is surrounded by the P+ semiconductor region 202 having a circular shape, more specifically, an annular shape.

Third Embodiment

Configuration Example of Pixel

In addition, the N+ semiconductor region and the P+ semiconductor region which are formed inside the signal extraction unit 65 may be set to a line shape (rectangular shape).

Figure 14:
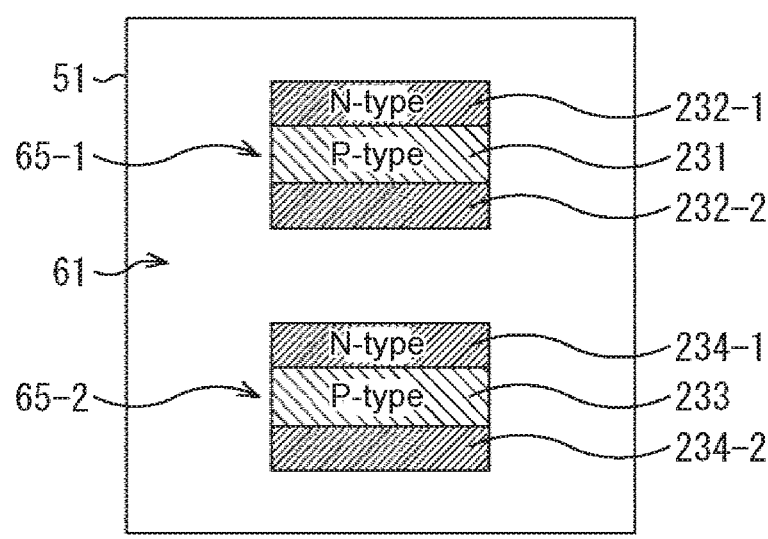
FIG. 14 is a view illustrating still another configuration example of the portion of the signal extraction unit of the pixel.

In this case, for example, the pixel 51 is configured as illustrated in FIG. 14. Note that in FIG. 14, the same reference number is given to a portion corresponding to the case in FIG. 3, and description thereof will be appropriately omitted.

FIG. 14 illustrates an arrangement of the N+ semiconductor region and the P+ semiconductor region when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65-1 is formed at a portion on a slightly upper side from the center of the pixel 51 in the drawing, and the signal extraction unit 65-2 is formed at a portion on a slightly lower side from the center of the pixel 51 in the drawing. Particularly, in this example, a formation position of the signal extraction unit 65 in the pixel 51 is the same position as in the case of FIG. 3.

In the signal extraction unit 65-1, a line-shaped P+ semiconductor region 231 corresponding to the P+ semiconductor region 73-1 illustrated in FIG. 3 is formed at the center of the signal extraction unit 65-1. In addition, a line-shaped N+ semiconductor region 232-1 and a line-shaped N+ semiconductor region 232-2 which correspond to the N+ semiconductor region 71-1 illustrated in FIG. 3 are formed at the periphery of the P+ semiconductor region 231 with the P+ semiconductor region 231 interposed therebetween. That is, the P+ semiconductor region 231 is formed at a position that is interposed between the N+ semiconductor region 232-1 and the N+ semiconductor region 232-2.

Note that hereinafter, in a case where it is not necessary to particularly distinguish the N+ semiconductor region 232-1 and the N+ semiconductor region 232-2, the regions are also referred to simply as an N+ semiconductor region 232.

The example illustrated in FIG. 3 has a structure in which the P+ semiconductor region 73 is surrounded by the N+ semiconductor region 71, but the example illustrated in FIG. 14 has a structure in which the P+ semiconductor region 231 is interposed between two N+ semiconductor regions 232 which are provided to be adjacent to the P+ semiconductor region 231.

Similarly, in the signal extraction unit 65-2, a line-shaped P+ semiconductor region 233 corresponding to the P+ semiconductor region 73-2 illustrated in FIG. 3 is formed at the center of the signal extraction unit 65-2. In addition, a line-shaped N+ semiconductor region 234-1 and a line-shaped N+ semiconductor region 234-2 which correspond to the N+ semiconductor region 71-2 illustrated in FIG. 3 are formed at the periphery of the P+ semiconductor region 233 with the P+ semiconductor region 233 interposed therebetween.

Note that hereinafter, in a case where it is not necessary to particularly distinguish the N+ semiconductor region 234-1 and the N+ semiconductor region 234-2, the regions are also referred to simply as an N+ semiconductor region 234.

In the signal extraction unit 65 illustrated in FIG. 14, the P+ semiconductor region 231 and the P+ semiconductor region 233 function as a voltage application unit that corresponds to the P+ semiconductor region 73 illustrated in FIG. 3, and the N+ semiconductor region 232 and the N+ semiconductor region 234 function as a charge detection unit corresponding to the N+ semiconductor region 71 illustrated in FIG. 3. In this case, for example, both regions of the N+ semiconductor region 232-1 and the N+ semiconductor region 232-2 are connected to the FD portion A.

In addition, the length of each of the P+ semiconductor region 231, the N+ semiconductor region 232, the P+ semiconductor region 233, and the N+ semiconductor region 234, which have a line shape, in a horizontal direction in the drawing may be set to an arbitrary length, and the respective regions may not have the same length.

Fourth Embodiment

Configuration Example of Pixel

In addition, in the example illustrated in FIG. 14, description has been given of a structure in which the P+ semiconductor region 231 or the P+ semiconductor region 233 is inserted between the N+ semiconductor regions 232 or the N+ semiconductor regions 234 as an example, but a shape in which an N+ semiconductor region is interposed between P+ semiconductor regions may be employed.

Figure 15:
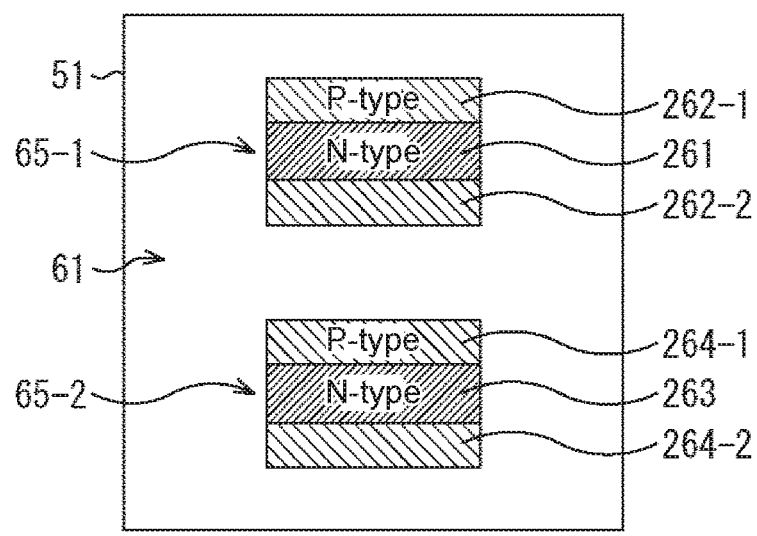
FIG. 15 is a view illustrating still another configuration example of the portion of the signal extraction unit of the pixel.

In this case, for example, the pixel 51 is configured as illustrated in FIG. 15. Note that in FIG. 15, the same reference symbol will be given to a portion corresponding to the case in FIG. 3, and description thereof will be appropriately omitted.

FIG. 15 illustrates an arrangement of the N+ semiconductor region and the P+ semiconductor region when a portion of the signal extraction unit 65 in the pixel 51 is viewed from a direction perpendicular to the substrate 61.

In this example, the oxide film 64 (not illustrated) is formed at the central portion of the pixel 51, and the signal extraction unit 65 is formed at a portion on a slightly end side from the center of the pixel 51. Particularly, in this example, a formation position of two pieces of the signal extraction units 65 in the pixel 51 is the same position as in the case of FIG. 3.

In the signal extraction unit 65-1, a line-shaped N+ semiconductor region 261 corresponding to the N+ semiconductor region 71-1 illustrated in FIG. 3 is formed at the center of the signal extraction unit 65-1. In addition, a line-shaped P+ semiconductor region 262-1 and a line-shaped P+ semiconductor region 262-2 which correspond to the P+ semiconductor region 73-1 illustrated in FIG. 3 are formed at the periphery of the N+ semiconductor region 261 with the N+ semiconductor region 261 interposed therebetween. That is, the N+ semiconductor region 261 is formed at a position that is interposed between the P+ semiconductor region 262-1 and the P+ semiconductor region 262-2.

Note that in a case where it is not necessary to particularly distinguish the P+ semiconductor region 262-1 and the P+ semiconductor region 262-2, the regions are also referred to simply as a P+ semiconductor region 262.

Similarly, in the signal extraction unit 65-2, a line-shaped N+ semiconductor region 263 corresponding to the N+ semiconductor region 71-2 illustrated in FIG. 3 is formed at the center of the signal extraction unit 65-2. In addition, a line-shaped P+ semiconductor region 264-1 and a line-shaped P+ semiconductor region 264-2 which correspond to the P+ semiconductor region 73-2 illustrated in FIG. 3 are formed at the periphery of the N+ semiconductor region 263 with the N+ semiconductor region 263 interposed therebetween.

Note that hereinafter, in a case where it is not necessary to particularly distinguish the P+ semiconductor region 264-1 and the P+ semiconductor region 264-2, the regions are also referred to simply as a P+ semiconductor region 264.

In the signal extraction unit 65 illustrated in FIG. 15, the P+ semiconductor region 262 and the P+ semiconductor region 264 function as a voltage application unit corresponding to the P+ semiconductor region 73 illustrated in FIG. 3, and the N+ semiconductor region 261 and the N+ semiconductor region 263 function as a charge detection unit corresponding to the N+ semiconductor region 71 illustrated in FIG. 3. Note that the length of each of the N+ semiconductor region 261, the P+ semiconductor region 262, the N+ semiconductor region 263, and the P+ semiconductor region 264, which have a line shape, in a horizontal direction in the drawing may be set to an arbitrary length, and the respective regions may not have the same length.

Fifth Embodiment

Configuration Example of Pixel

In addition, description has been given of an example in which two pieces of the signal extraction units 65 are provided in each pixel that constitutes the pixel array unit 20, but the number of the signal extraction units provided in the pixel may be one or three or more.

Figure 16:
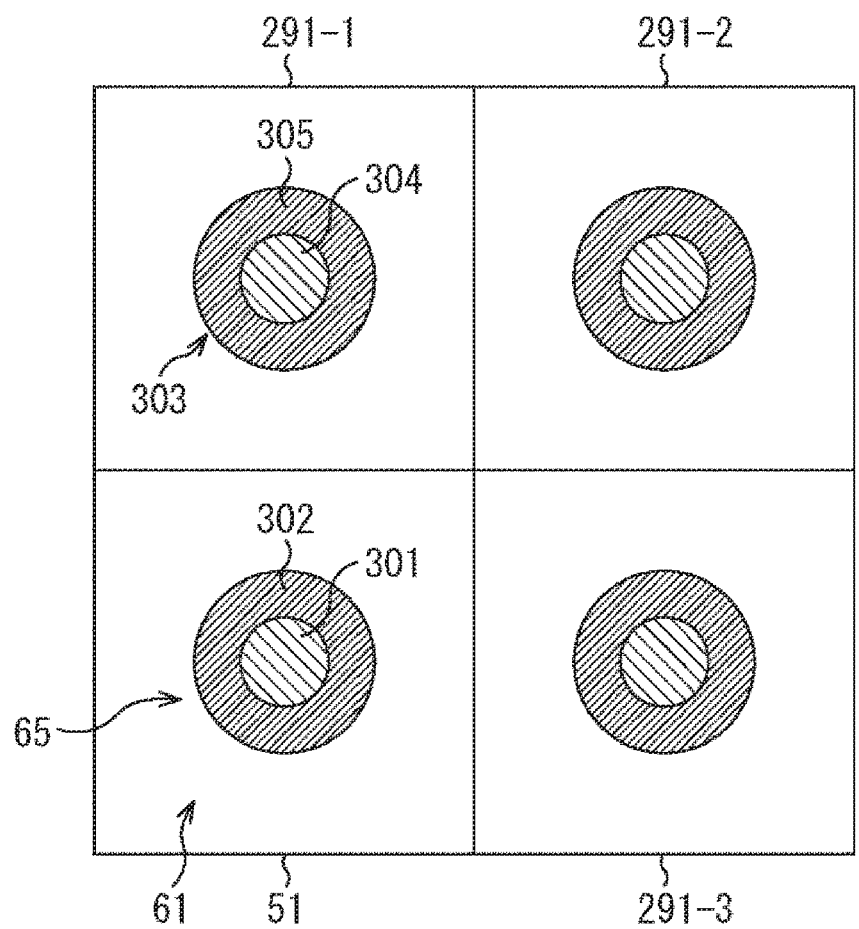
FIG. 16 is a view illustrating another configuration example of the pixel.

For example, in a case where one signal extraction unit is formed in the pixel 51, for example, the pixel has a configuration as illustrated in FIG. 16. Note that in FIG. 16, the same reference symbol will be given to a portion corresponding to the case in FIG. 3, and description thereof will be appropriately omitted.

FIG. 16 illustrates an arrangement of the N+ semiconductor region and the P+ semiconductor region when a portion of the signal extraction unit in partial pixels provided in the pixel array unit 20 is viewed from a direction perpendicular to the substrate.

In this example, the pixel 51 provided in the pixel array unit 20, and as pixels 51 adjacent to the pixel 51, a pixel 291-1 to a pixel 291-3 to which different reference symbols are given are illustrated, and one piece of the signal extraction unit is formed in each of the pixels.

That is, one piece of the signal extraction unit 65 is formed at the central portion of the pixel 51. In addition, in the signal extraction unit 65, a P+ semiconductor region 301 having a circular shape is formed at the central position, and in a state in which the P+ semiconductor region 301 is set as the center, the periphery of the P+ semiconductor region 301 is surrounded by an N+ semiconductor region 302 having a circular shape, more specifically, an annular shape.

Here, the P+ semiconductor region 301 corresponds to the P+ semiconductor region 73 illustrated in FIG. 3, and functions as a voltage application unit. In addition, the N+ semiconductor region 302 corresponds to the N+ semiconductor region 71 illustrated in FIG. 3, and functions as a charge detection unit. Note that the P+ semiconductor region 301 and the N+ semiconductor region 302 may have an arbitrary shape.

In addition, the pixel 291-1 to the pixel 291-3 located at the periphery of the pixel 51 have the same structure as in the pixel 51.

That is, for example, one signal extraction unit 303 is formed at the central portion of the pixel 291-1. In addition, in the signal extraction unit 303, a P+ semiconductor region 304 having a circular shape is formed at the central position, and in a state in which the P+ semiconductor region 304 is set as the center, the periphery of the P+ semiconductor region 304 is surrounded by an N+ semiconductor region 305 having a circular shape, more specifically, an annular shape.

The P+ semiconductor region 304 and the N+ semiconductor region 305 respectively correspond to the P+ semiconductor region 301 and the N+ semiconductor region 302.

Note that in a case where it is not necessary to particularly distinguish the pixel 291-1 to the pixel 291-3, the pixels are also referred to simply as a pixel 291.

As described above, in a case where in one signal extraction unit (tap) is formed in each pixel, when measuring a distance up to a target object by the indirect ToF method, several pixels adjacent to each other are used, and distance information is calculated on the basis of pixel signals obtained with respect to the pixels.

For example, when focus is given to the pixel 51, in a state in which the signal extraction unit 65 of the pixel 51 is set as an active tap, for example, pixels are driven so that multiple signal extraction units 303 of several pixels 291 which include the pixel 291-1 and are adjacent to the pixel 51 become an inactive tap.

As an example, for example, signal extraction units of pixels such as the pixel 291-1 and the pixel 291-3, which are adjacent to the pixel 51 on upper and lower sides and right and left sides in the drawing, are driven to become an inactive tap.

Then, when an application voltage is switched so that the signal extraction unit 65 of the pixel 51 becomes the inactive tap, at this time, the signal extraction units 303 of several pieces of the pixels 291 which include the pixel 291-1 and are adjacent to the pixel 51 are set to be the active tap.

In addition, distance information is calculated on the basis of a pixel signal read out from the signal extraction unit 65 in a state in which the signal extraction unit 65 is set to the active tap, and a pixel signal read out from the signal extraction unit 303 in a state in which the signal extraction unit 303 is set to the active tap.

As described above, even in a case where one piece of the signal extraction unit (tap) is provided in a pixel, it is possible to perform distance measurement in accordance with the indirect ToF method by using pixels adjacent to each other.

Sixth Embodiment

Configuration Example of Pixel

In addition, as described above, three or more signal extraction units (taps) may be provided in each pixel.

Figure 17:
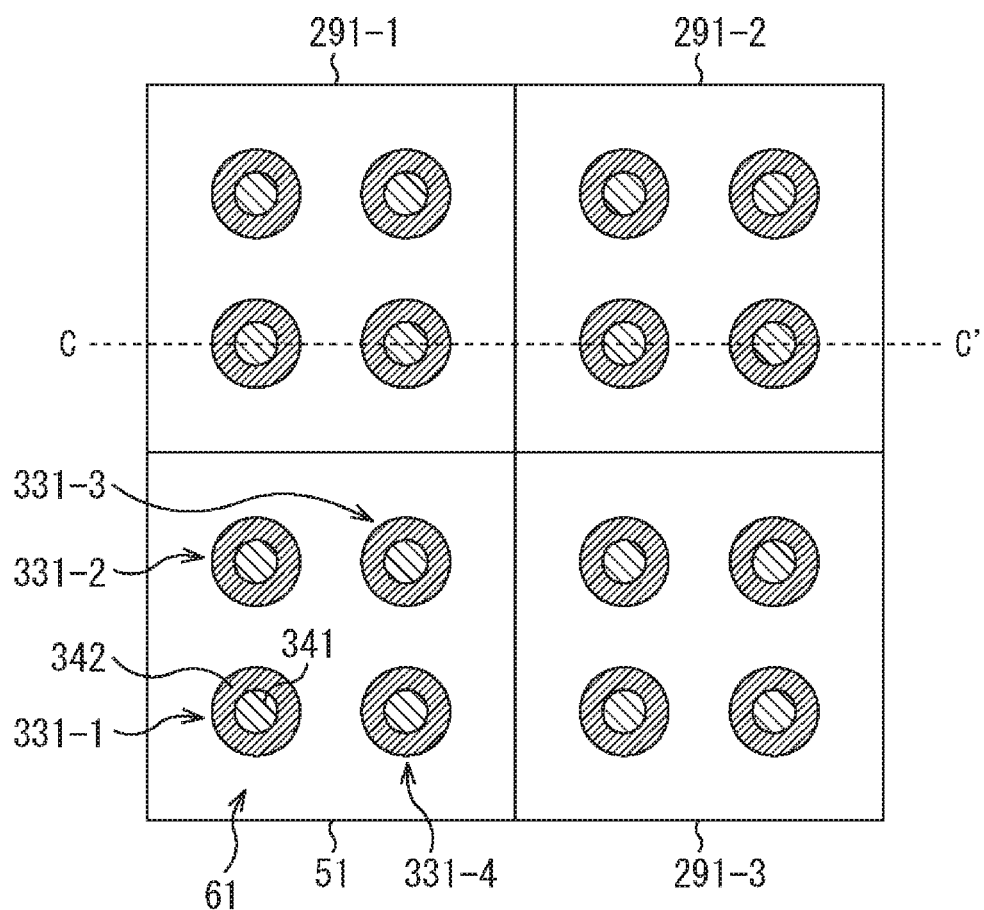
FIG. 17 is a view illustrating still another configuration example of the pixel.

For example, in a case where four signal extraction units (taps) are provided in the pixel, each pixel of the pixel array unit 20 is configured as illustrated in FIG. 17. Note that in FIG. 17, the same reference symbol will be given to a portion corresponding to the case in FIG. 16, and description thereof will be appropriately omitted.

FIG. 17 illustrates an arrangement of the N+ semiconductor region and the P+ semiconductor region when a portion of the signal extraction unit in partial pixels provided in the pixel array unit 20 is viewed from a direction perpendicular to the substrate.

A cross-sectional view taken along line C-C' in FIG. 17 becomes FIG. 36 to be described later.

In this example, the pixel 51 and the pixels 291 which are provided in the pixel array unit 20 are illustrated, and four signal extraction units are formed in each of the pixels.

That is, in the pixel 51, a signal extraction unit 331-1, a signal extraction unit 331-2, a signal extraction unit 331-3, and a signal extraction unit 331-4 are respectively formed at positions between the center of the pixel 51 and end portions of the pixel 51, that is, a position on a lower left side, a position on upper left side, a position on an upper and right side, and a position on a lower right side of the center of the pixel 51 in the drawing.

The signal extraction unit 331-1 to the signal extraction unit 331-4 correspond to the signal extraction unit 65 illustrated in FIG. 16.

For example, in the signal extraction unit 331-1, a P+ semiconductor region 341 having a circular shape is formed at the central position, and in a state in which the P+ semiconductor region 341 is set as the center, the periphery of the P+ semiconductor region 341 is surrounded by an N+ semiconductor region 342 having a circular shape, more specifically, an annular shape.

Here, the P+ semiconductor region 341 corresponds to the P+ semiconductor region 301 illustrated in FIG. 16, and functions as a voltage application unit. In addition, the N+ semiconductor region 342 corresponds to the N+ semiconductor region 302 illustrated in FIG. 16, and functions as a charge detection unit. Note that the P+ semiconductor region 341 and the N+ semiconductor region 342 may have an arbitrary shape.

In addition, the signal extraction unit 331-2 to the signal extraction unit 331-4 have the same configuration as in the signal extraction unit 333-1, and include the P+ semiconductor region that functions as a voltage application unit and the N+ semiconductor region that functions as a charge detection unit. In addition, the pixels 291 formed at the periphery of the pixel 51 have the same structure as in the pixel 51.

Note that in a case where it is not necessary to particularly distinguish the signal extraction unit 331-1 to the signal extraction unit 331-4, the units are also referred to simply as a signal extraction unit 331.

As described above, in a case where the four signal extraction units are provided in each pixel, when performing distance measurement, for example, according to the indirect ToF method, the four signal extraction units in the pixel are used, and distance information is calculated.

As an example, when focus is given to the pixel 51, for example, in a state in which the signal extraction unit 331-1 and the signal extraction unit 331-3 are set to an active tap, the pixel 51 is driven so that the signal extraction unit 331-2 and the signal extraction unit 331-4 become an inactive tap.

Then, a voltage that is applied to the signal extraction unit 331 is switched. That is, the pixel 51 is driven so that the signal extraction unit 331-1 and the signal extraction unit 331-3 become the inactive tap, and the signal extraction unit 331-2 and the signal extraction unit 331-4 become the active tap.

In addition, distance information is calculated on the basis of pixel signals which are read out from the signal extraction unit 331-1 and the signal extraction unit 331-3 in a state in which the signal extraction unit 331-1 and the signal extraction unit 331-3 are set to the active tap, and pixel signals which are read out from the signal extraction unit 331-2 and the signal extraction unit 331-4 in a state in which the signal extraction unit 331-2 and the signal extraction unit 331-4 are set to the active tap.

Seventh Embodiment

Configuration Example of Pixel

In addition, the signal extraction unit (tap) may be shared by adjacent pixels of the pixel array unit 20.

Figure 18:
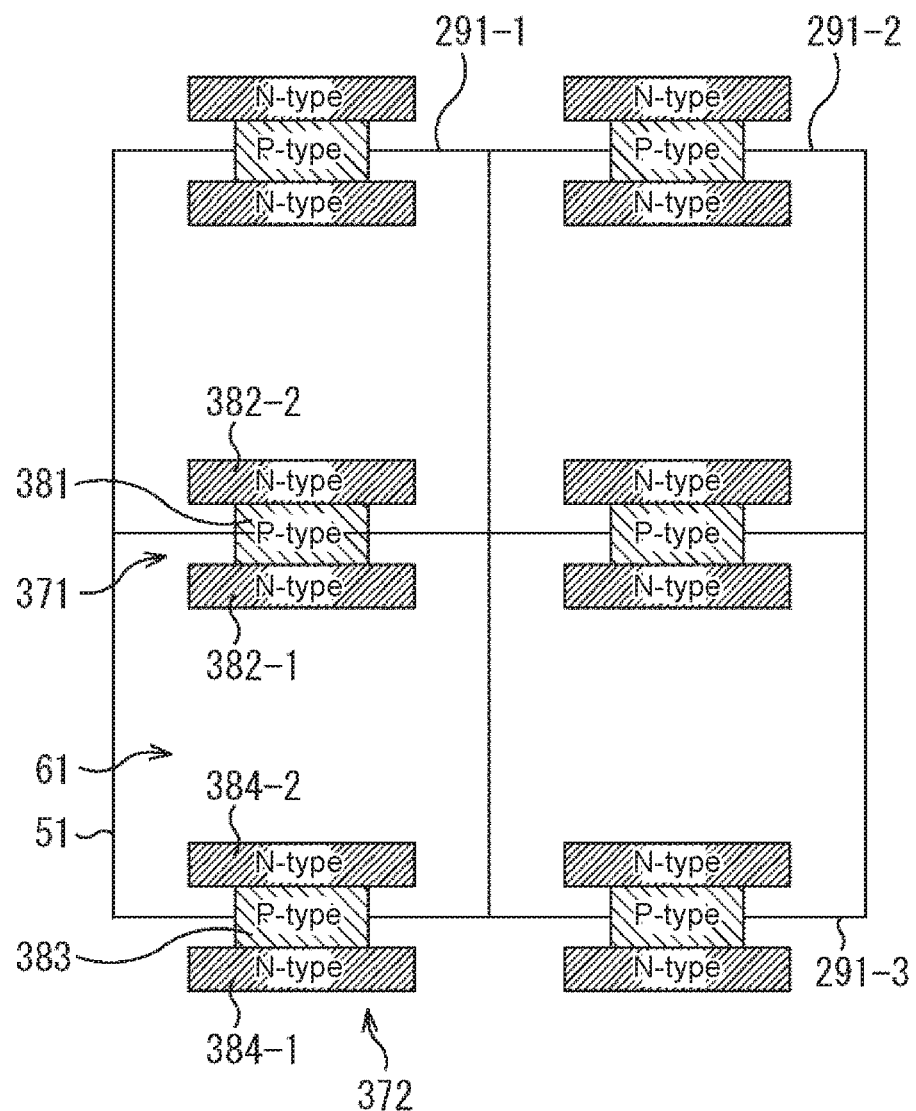
FIG. 18 is a view illustrating still another configuration example of the pixel.

In this case, for example, each pixel of the pixel array unit 20 has a configuration as illustrated in FIG. 18. Note that in FIG. 18, the same reference symbol will be given to a portion corresponding to the case in FIG. 16, and description thereof will be appropriately omitted.

FIG. 18 illustrates an arrangement of the N+ semiconductor region and the P+ semiconductor region when a portion of the signal extraction unit in partial pixels provided in the pixel array unit 20 is viewed from a direction perpendicular to the substrate.

In this example, the pixel 51 and the pixel 291 which are provided in the pixel array unit 20, and two signal extraction units are formed in each of the pixels.

For example, in the pixel 51, a signal extraction unit 371 is formed at an end portion on an upper side of the pixel 51 in the drawing, and a signal extraction unit 372 is formed at an end portion on a lower side of the pixel 51 in the drawing.

The signal extraction unit 371 is shared by the pixel 51 and a pixel 291-1. That is, the signal extraction unit 371 is used as a tap of the pixel 51 and is used as a tap of the pixel 291-1. In addition, the signal extraction unit 372 is shared by the pixel 51, and a pixel (not illustrated) that is adjacent to a lower side of the pixel 51 in the drawing.

In the signal extraction unit 371, a line-shaped P+ semiconductor region 381 corresponding to the P+ semiconductor region 231 illustrated in FIG. 14 is formed at the central position. In addition, line-shaped N+ semiconductor region 382-1 and N+ semiconductor region 382-2 which correspond to the N+ semiconductor region 232 illustrated in FIG. 14 are formed at upper and lower positions of the P+ semiconductor region 381 in the drawing with the P+ semiconductor region 381 interposed therebetween.

Particularly, in this example, the P+ semiconductor region 381 is formed at a boundary portion between the pixel 51 and the pixel 291-1. In addition, the N+ semiconductor region 382-1 is formed in a region inside the pixel 51, and the N+ semiconductor region 382-2 is formed in a region inside the pixel 291-1.

Here, the P+ semiconductor region 381 functions as a voltage application unit, and the N+ semiconductor region 382-1 and the N+ semiconductor region 382-2 function as a charge detection unit. Note that hereinafter, in a case where it is not necessary to particularly distinguish the N+ semiconductor region 382-1 and the N+ semiconductor region 382-2, the regions are also referred to simply as an N+ semiconductor region 382.

In addition, the P+ semiconductor region 381 or the N+ semiconductor region 382 may have an arbitrary shape. In addition, the N+ semiconductor region 382-1 and the N+ semiconductor region 382-2 may be connected to the same FD portion, or may be connected to FD portions different from each other.

In the signal extraction unit 372, line-shaped P+ semiconductor region 383, N+ semiconductor region 384-1, and N+ semiconductor region 384-2 are formed.

The P+ semiconductor region 383, the N+ semiconductor region 384-1, and the N+ semiconductor region 384-2 respectively correspond to the P+ semiconductor region 381, the N+ semiconductor region 382-1, and the N+ semiconductor region 382-2, and are set to the same arrangement, the same shape, and the same function as in the regions. Note that in a case where it is not necessary to particularly distinguish the N+ semiconductor region 384-1 and the N+ semiconductor region 384-2, the regions are also referred to simply as an N+ semiconductor region 384.

As described above, even in a case where the signal extraction unit (tap) is shared between adjacent pixels, it is possible to perform distance measurement according to the indirect ToF method by the same operation as in the example illustrated in FIG. 3.

As illustrated in FIG. 18, in a case where the signal extraction unit is shared between pixels, for example, a distance between the P+ semiconductor region 381 and the P+ semiconductor region 383 or the like, that is, a distance between a pair of P+ semiconductor regions for generating an electric field, that is, a current is lengthened. In other words, when the signal extraction unit is shared between pixels, it is possible to lengthen the distance between the P+ semiconductor regions to the maximum.

Accordingly, a current is less likely to flow between the P+ semiconductor regions, and thus it is possible to reduce power consumption in the pixels. In addition, the above-described configuration is advantageous for miniaturization of the pixels.

Note that description has been given of an example in which one signal extraction unit is shared by two pixels adjacent to each other, but one signal extraction unit may be shared by three or more pixels adjacent to each other. In addition, in a case where the signal extraction unit is shared by two or more pixels adjacent to each other, in the signal extraction unit, only a charge detection unit that detects signal carriers may be shared, or only a voltage application unit that generates an electric field may be shared.

Eighth Embodiment

Configuration Example of Pixel

In addition, the on-chip lens or the interpixel light-shielding portion which are provided in each pixel such as the pixel 51 of the pixel array unit 20 may not be particularly provided.

Figure 19:
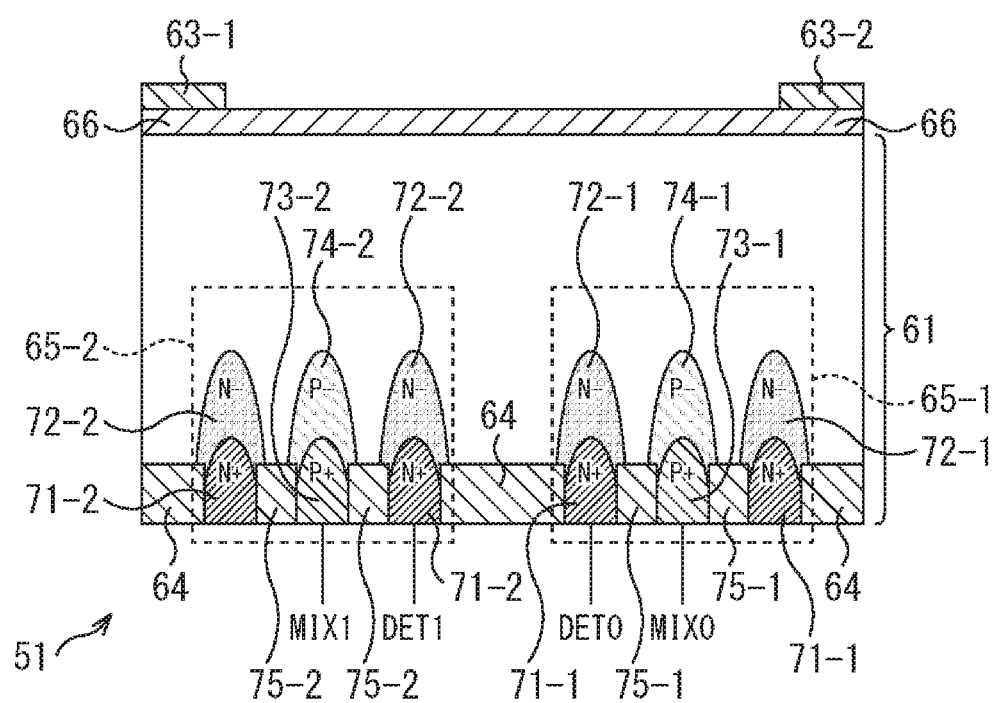
FIG. 19 is a view illustrating still another configuration example of the pixel.

Specifically, for example, the pixel 51 can be set to a configuration illustrated in FIG. 19. Note that in FIG. 19, the same reference symbol will be given to a portion corresponding to the case in FIG. 2, and description thereof will be appropriately omitted.

A configuration of the pixel 51 illustrated in FIG. 19 is different from that of the pixel 51 illustrated in FIG. 2 in that the on-chip lens 62 is not provided, and the other configurations are the same as those of the pixel 51 in FIG. 2.

In the pixel 51 illustrated in FIG. 19, since the on-chip lens 62 is not provided on a light incident surface side of the substrate 61, attenuation of infrared light incident to the substrate 61 from the outside can be made to be smaller. Accordingly, a light amount of infrared light capable of being received by the substrate 61 increases, and thus it is possible to improve sensitivity of the pixel 51.

Modification Example 1 of Eighth Embodiment

Configuration Example of Pixel

Figure 20:
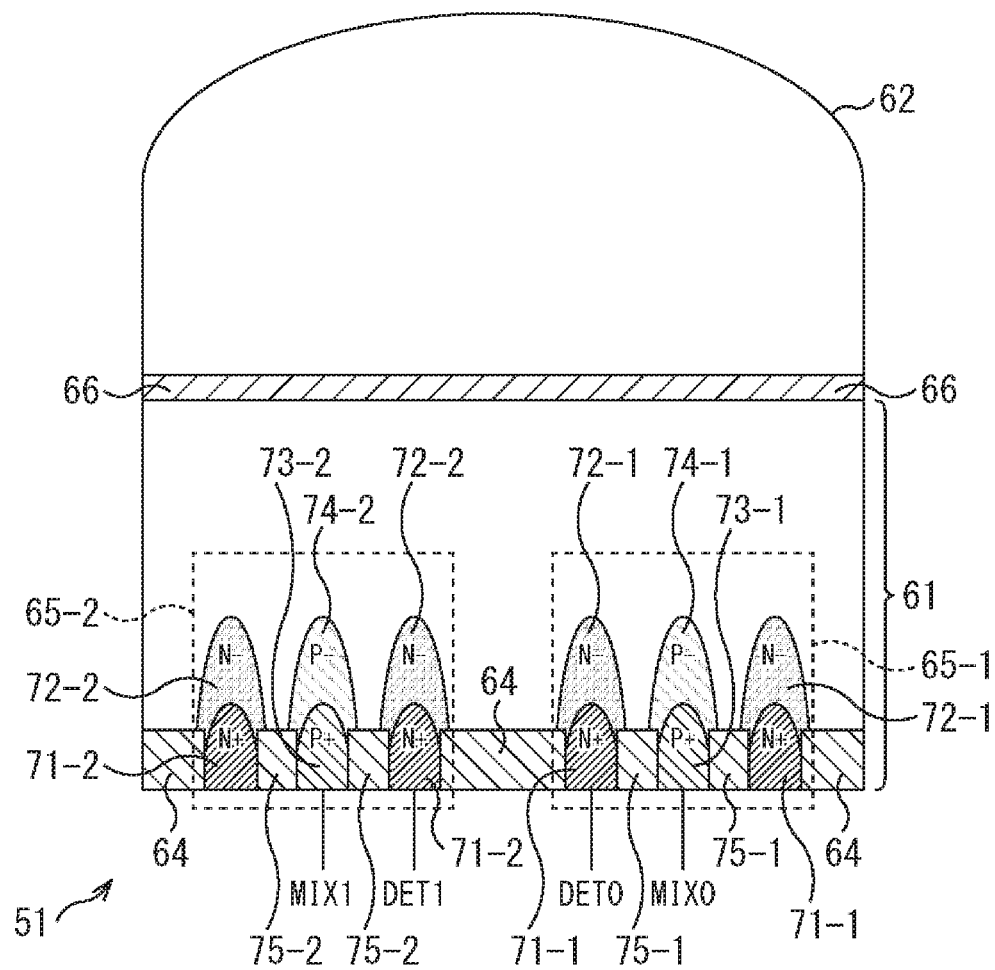
FIG. 20 is a view illustrating still another configuration example of the pixel.

In addition, the configuration of the pixel 51 may be set to, for example, a configuration illustrated in FIG. 20. Note that in FIG. 20, the same reference symbol will be given to a portion corresponding to the case in FIG. 2, and description thereof will be appropriately omitted.

A configuration of the pixel 51 illustrated in FIG. 20 is different from that of the pixel 51 illustrated in FIG. 2 in that the interpixel light-shielding film 63-1 and the interpixel light-shielding film 63-2 are not provided, and the other configurations are the same as those of the pixel 51 in FIG. 2.

In the example illustrated in FIG. 20, since the interpixel light-shielding film 63 is not provided on the light incident surface side of the substrate 61, a cross-talk suppressing effect decreases, but infrared light that is shielded by the interpixel light-shielding film 63 is also incident into the substrate 61, and thus it is possible to improve sensitivity of the pixel 51.

Note that not only the on-chip lens 62 and but also the interpixel light-shielding film 63 may not be provided in the pixel 51.

Modification Example 2 of Eighth Embodiment

Configuration Example of Pixel

Figure 21:
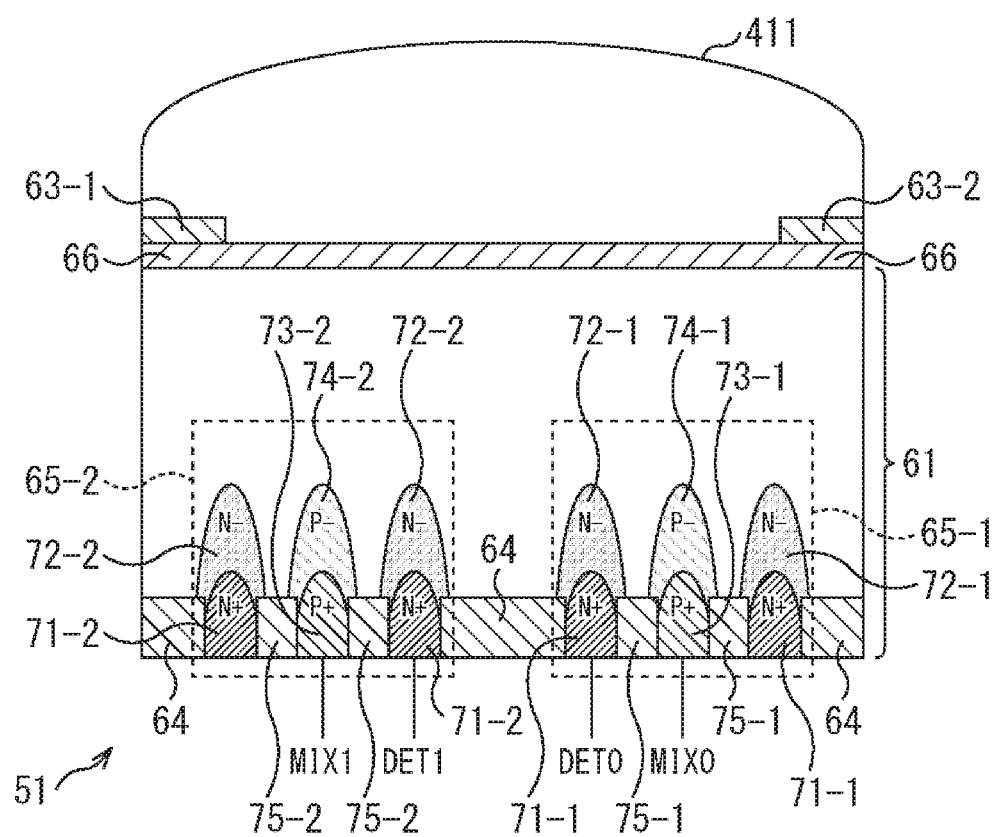
FIG. 21 is a view illustrating still another configuration example of the pixel.

In addition, for example, as illustrated in FIG. 21, the thickness of the on-chip lens in an optical axial direction may also be optimized. Note that in FIG. 21, the same reference symbol will be given to a portion corresponding to the case in FIG. 2, and description thereof will be appropriately omitted.

A configuration of the pixel 51 illustrated in FIG. 21 is different from that of the pixel 51 illustrated in FIG. 2 in that an on-chip lens 411 is provided instead of the on-chip lens 62, and the other configurations are the same as those of the pixel 51 in FIG. 2.

In the pixel 51 illustrated in FIG. 21, the on-chip lens 411 is formed on the light incident surface side of the substrate 61, that is, on an upper side in the drawing. The thickness of the on-chip lens 411 in an optical axial direction, that is, the thickness in a vertical direction in the drawing is made to be smaller in comparison to the on-chip lens 62 illustrated in FIG. 2.

Generally, when the thickness of an on-chip lens provided on a front surface of the substrate 61 is larger, it is more advantageous for condensing of light that is incident to the on-chip lens. However, when the thickness of on-chip lens 411 is reduced, a transmittance becomes higher in proportion to the reduction, and thus it is possible to improve sensitivity of the pixel 51. Accordingly, the thickness of the on-chip lens 411 may be appropriately determined in correspondence with the thickness of the substrate 61, a condensing position of infrared light, or the like.

Ninth Embodiment

Configuration Example of Pixel

In addition, an isolation region may be provided between pixels formed in the pixel array unit 20 to suppress cross-talk by improving isolation characteristics between adjacent pixels.

Figure 22:
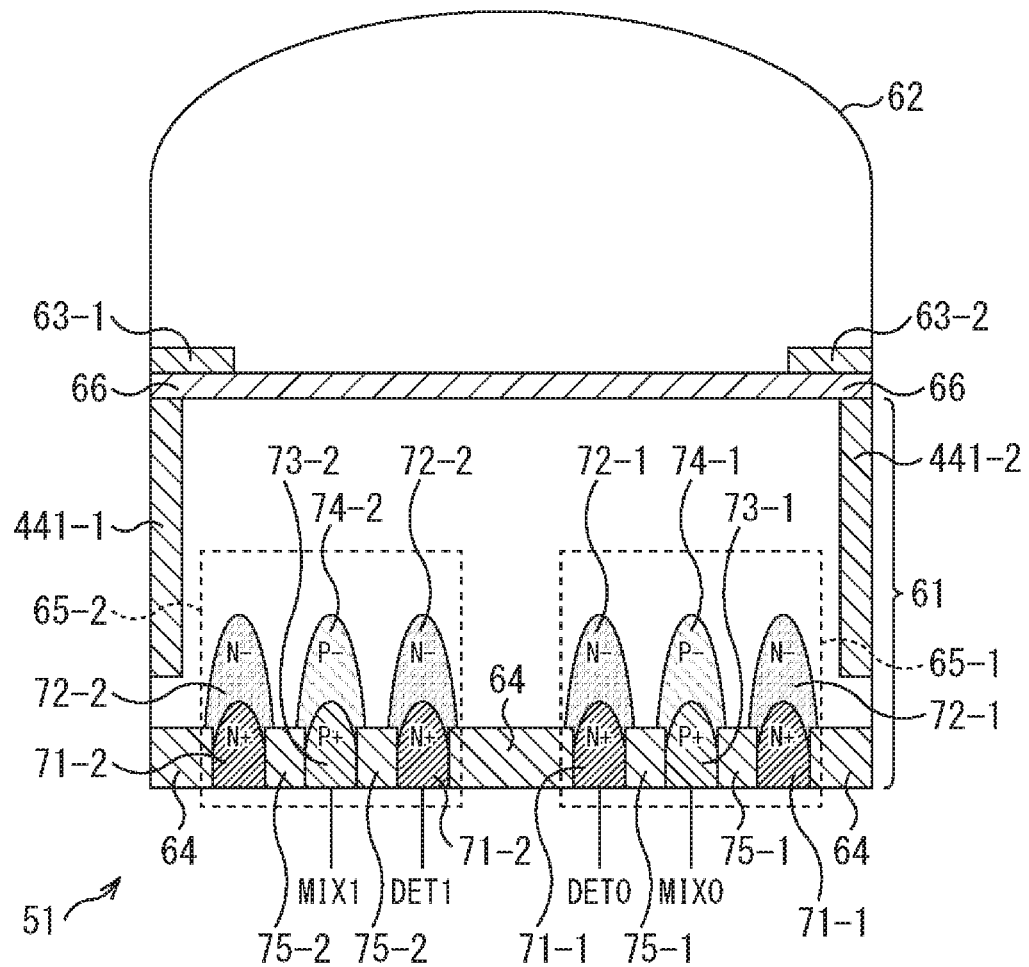
FIG. 22 is a view illustrating still another configuration example of the pixel.

In this case, for example, the pixel 51 is configured as illustrated in FIG. 22. Note that in FIG. 22, the same reference symbol will be given to a portion corresponding to the case in FIG. 2, and description thereof will be appropriately omitted.

A configuration of the pixel 51 illustrated in FIG. 22 is different from that of the pixel 51 illustrated in FIG. 2 in that an isolation region 441-1 and an isolation region 441-2 are provided inside the substrate 61, and the other configurations are the same as those of the pixel 51 in FIG. 2.

In the pixel 51 illustrated in FIG. 22, the isolation region 441-1 and the isolation region 441-2 which isolate adjacent pixels are formed at a boundary portion between the pixel 51 and other pixels adjacent to the pixel 51 at the inside of the substrate 61, that is, end portions on the right and left sides of the pixel 51 in the drawing by a light-shielding film or the like. Note that in a case where it is not necessary to particularly distinguish the isolation region 441-1 and the isolation region 441-2, the regions are also referred to simply as an isolation region 441.

For example, when forming the isolation region 441, an elongated groove (trench) is formed in the substrate 61 at a predetermined depth from the light-incident surface side of the substrate 61, that is, an upper side surface in the drawing to a downward side (in a direction perpendicular to a surface of the substrate 61) in the drawing. Then, a light-shielding film is formed in the groove portion through embedding and becomes the isolation region 441. The isolation region 441 functions as a pixel isolation region that shields infrared light that is incident into the substrate 61 from the light incident surface and propagates toward the other pixels adjacent to the pixel 51.

As described above, when the embedding-type isolation region 441 is formed, it is possible to improve infrared light separation characteristics between pixels, and thus it is possible to suppress occurrence of cross-talk.

Modification Example 1 of Ninth Embodiment

Configuration Example of Pixel

Figure 23:
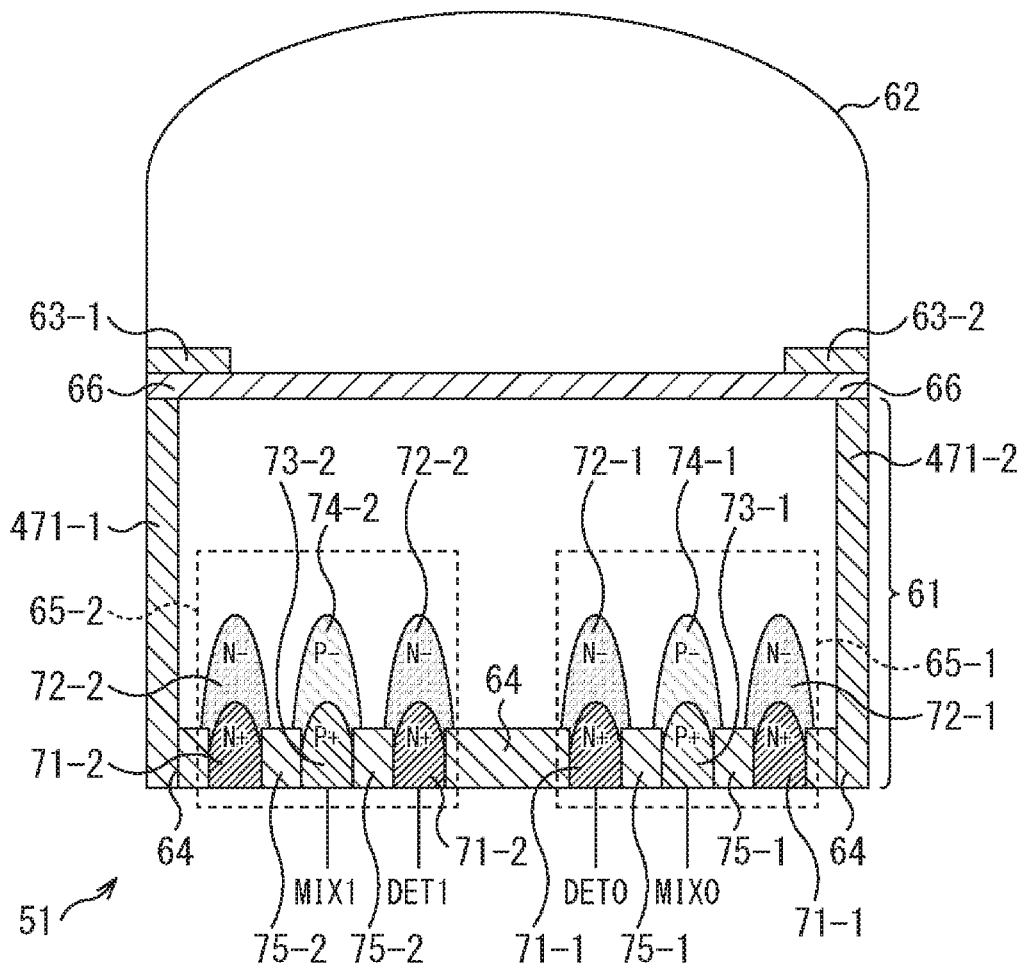
FIG. 23 is a view illustrating still another configuration example of the pixel.

In addition, in the case of forming the embedding-type isolation region in the pixel 51, for example, an isolation region 471-1 and an isolation region 471-2 may be provided to penetrate through the entirety of the substrate 61 as illustrated in FIG. 23. Note that in FIG. 23, the same reference symbol will be given to a portion corresponding to the case in FIG. 2, and description thereof will be appropriately omitted.

A configuration of the pixel 51 illustrated in FIG. 23 is different from that of the pixel 51 illustrated in FIG. 2 in that the isolation region 471-1 and the isolation region 471-2 are provide inside the substrate 61, and the other configurations are the same as those of the pixel 51 in FIG. 2. That is, the pixel 51 illustrated in FIG. 23 has a configuration in which the isolation region 471-1 and the isolation region 471-2 are provided instead of the isolation region 441 of the pixel 51 illustrated in FIG. 22.

In the pixel 51 illustrated in FIG. 23, the isolation region 471-1 and the isolation region 471-2 which penetrate the entirety of the substrate 61 are formed at a boundary portion between the pixel 51 and other pixels adjacent to the pixel 51 at the inside of the substrate 61, that is, end portions on the right and left sides of the pixel 51 in the drawing by a light-shielding film or the like. Note that in a case where it is not necessary to particularly distinguish the isolation region 471-1 and the isolation region 471-2, the regions are also referred to simply as an isolation region 471.

For example, when forming the isolation region 471, an elongated groove (trench) is formed in a surface opposite to the light incident surface side of the substrate 61, that is, from a lower side surface in the drawing to an upward side in the drawing. At this time, the groove is formed until reaching the light incident surface of the substrate 61 to penetrate through the substrate 61. In addition, a light-shielding film is formed in the groove portion formed as described above through embedding, and becomes the isolation region 471.

In accordance with the embedding-type isolation region 471, it is also possible to improve the infrared light separation characteristics between pixels, and thus it is possible to suppress occurrence of cross-talk.

Tenth Embodiment

Configuration Example of Pixel

In addition, the thickness of the substrate in which the signal extraction unit 65 is formed may be determined in correspondence with various characteristics of pixels and the like.

Figure 24:
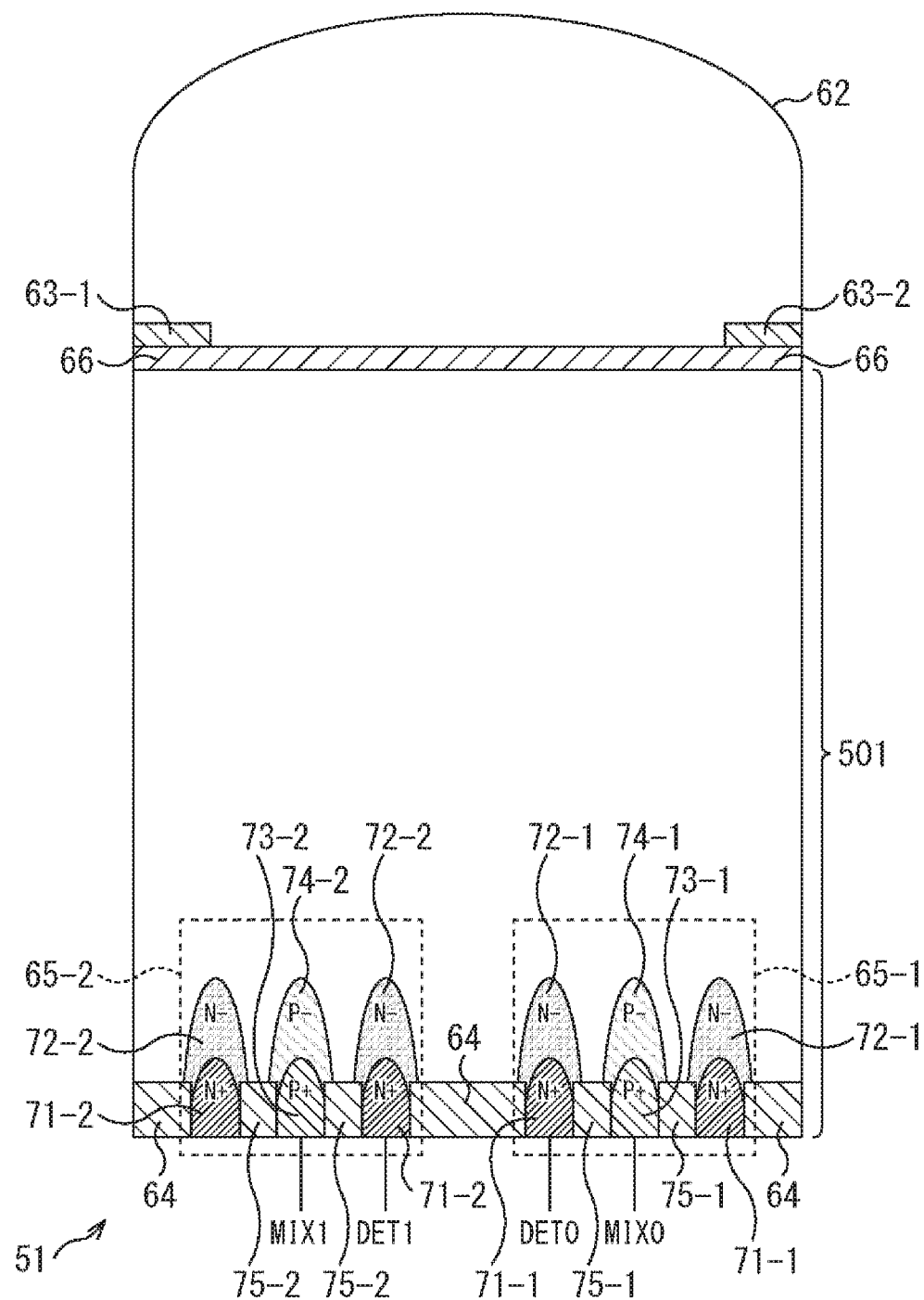
FIG. 24 is a view illustrating still another configuration example of the pixel.

Accordingly, for example, as illustrated in FIG. 24, a substrate 501 that constitutes the pixel 51 may be set to be thicker in comparison to the substrate 61 illustrated in FIG. 2. Note that in FIG. 24, the same reference symbol will be given to a portion corresponding to the case in FIG. 2, and description thereof will be appropriately omitted.

A configuration of the pixel 51 illustrated in FIG. 24 is different from that of the pixel 51 illustrated in FIG. 2 in that the substrate 501 is provided instead of the substrate 61, and the other configurations are the same as those of the pixel 51 in FIG. 2.

That is, in the pixel 51 illustrated in FIG. 24, the on-chip lens 62, the fixed charge film 66, and the interpixel light-shielding film 63 are formed on a light incident surface side of the substrate 501. In addition, the oxide film 64, the signal extraction unit 65, and the isolation portion 75 are formed in the vicinity of a front surface opposite to the light incident surface side of the substrate 501.

For example, the substrate 501 is constituted by a P-type semiconductor substrate having a thickness of 20 μm or greater. The substrate 501 and the substrate 61 are different only in the substrate thickness, and positions at which the oxide film 64, the signal extraction unit 65, and the isolation portion 75 are formed are the same between the substrate 501 and the substrate 61.

Note that a film thickness of various layers (films) which are appropriately formed on the light incident surface side or the like of the substrate 501 or the substrate 61 may be optimized in correspondence with characteristics of the pixel 51 or the like.

Eleventh Embodiment

Configuration Example of Pixel

Figure 25:
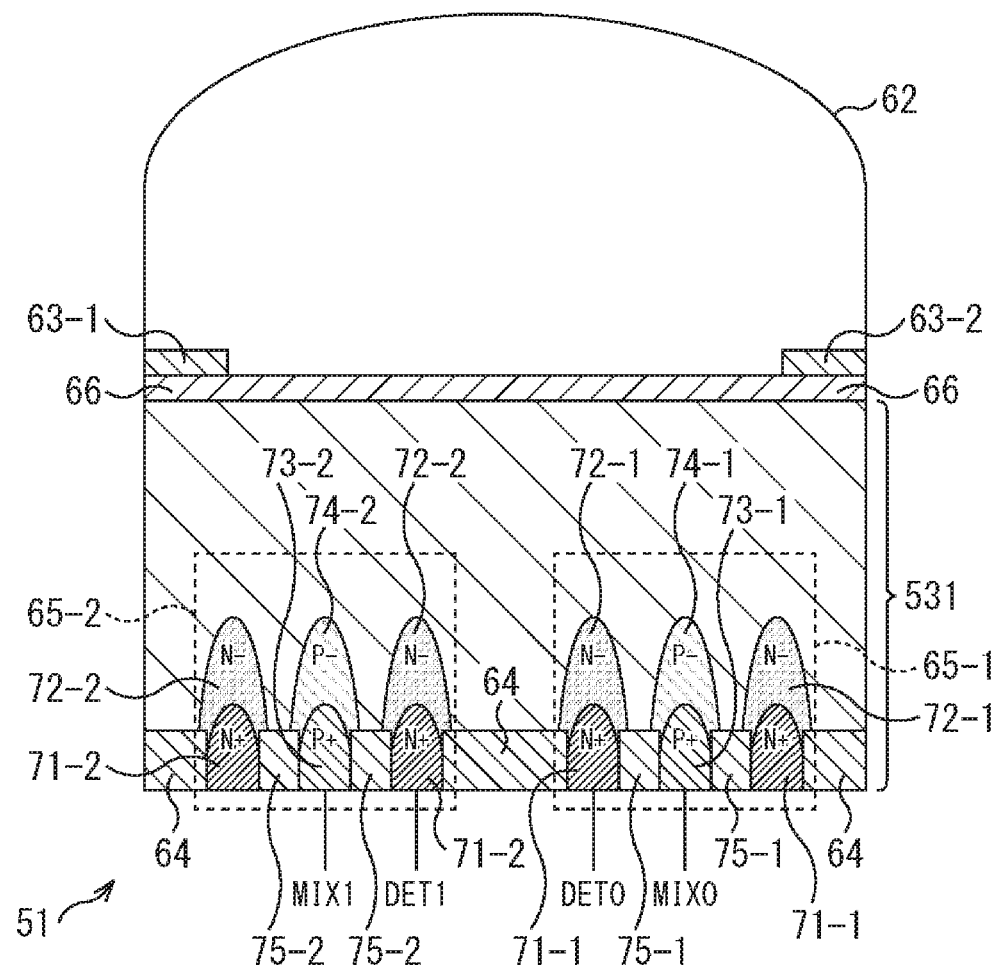
FIG. 25 is a view illustrating still another configuration example of the pixel.

In addition, description has been given of an example in which the substrate that constitutes the pixel 51 is formed form the P-type semiconductor substrate, but the substrate may be constituted by, for example, an N-type semiconductor substrate as illustrated in FIG. 25. Note that in FIG. 25, the same reference symbol will be given to a portion corresponding to the case in FIG. 2, and description thereof will be appropriately omitted.

A configuration of the pixel 51 illustrated in FIG. 25 is different from that of the pixel 51 illustrated in FIG. 2 in that a substrate 531 is provided instead of the substrate 61, and the other configurations are the same as those of the pixel 51 in FIG. 2.

In the pixel 51 illustrated in FIG. 25, for example, the on-chip lens 62, the fixed charge film 66, and the interpixel light-shielding film 63 are formed on a light incident surface side in the substrate 531 constituted by an N-type semiconductor layer such as a silicon substrate.

In addition, the oxide film 64, the signal extraction unit 65, and the isolation portion 75 are formed in the vicinity of a surface opposite to the light incident surface side of the substrate 531. Formation positions of the oxide film 64, the signal extraction unit 65, and the isolation portion 75 are the same between the substrate 531 and the substrate 61, and the configuration of the signal extraction unit 65 is also the same between the substrate 531 and the substrate 61.

For example, the thickness of the substrate 531 in a vertical direction in the drawing, that is, the thickness in a direction perpendicular to a surface of the substrate 531 is set to 20 μm or less.

In addition, for example, the substrate 531 is set to a high-resistance N-Epi substrate of which a substrate concentration is set to the order of 1E+13 or less, and resistance (resistivity) of the substrate 531 is set to, for example, 500 [Ωcm] or greater. Accordingly, it is possible to reduce power consumption in the pixel 51.

Here, with regard to a relationship between the substrate concentration and the resistance of the substrate 531, for example, the resistance is set to 2000 [Ωcm] when the substrate concentration is 2.15E+12 [cm$^3$], the resistance is set to 1000 [Ωcm] when the substrate concentration is 4.30E+12 [cm$^3$], the resistance is set to 500 [Ωcm] when the substrate concentration is 8.61E+12 [cm$^3$], and the resistance is set to 100 [Ωcm] when the substrate concentration is 4.32E+13 [cm$^3$].

As described above, even when the substrate 531 of the pixel 51 is set to the N-type semiconductor substrate, it is possible to obtain the same effect by the same operation as in the example illustrated in FIG. 2.

Twelfth Embodiment

Configuration Example of Pixel

In addition, as in the example described with reference to FIG. 24, the thickness of the N-type semiconductor substrate can also be determined in correspondence with various characteristics of pixels, or the like.

Figure 26:
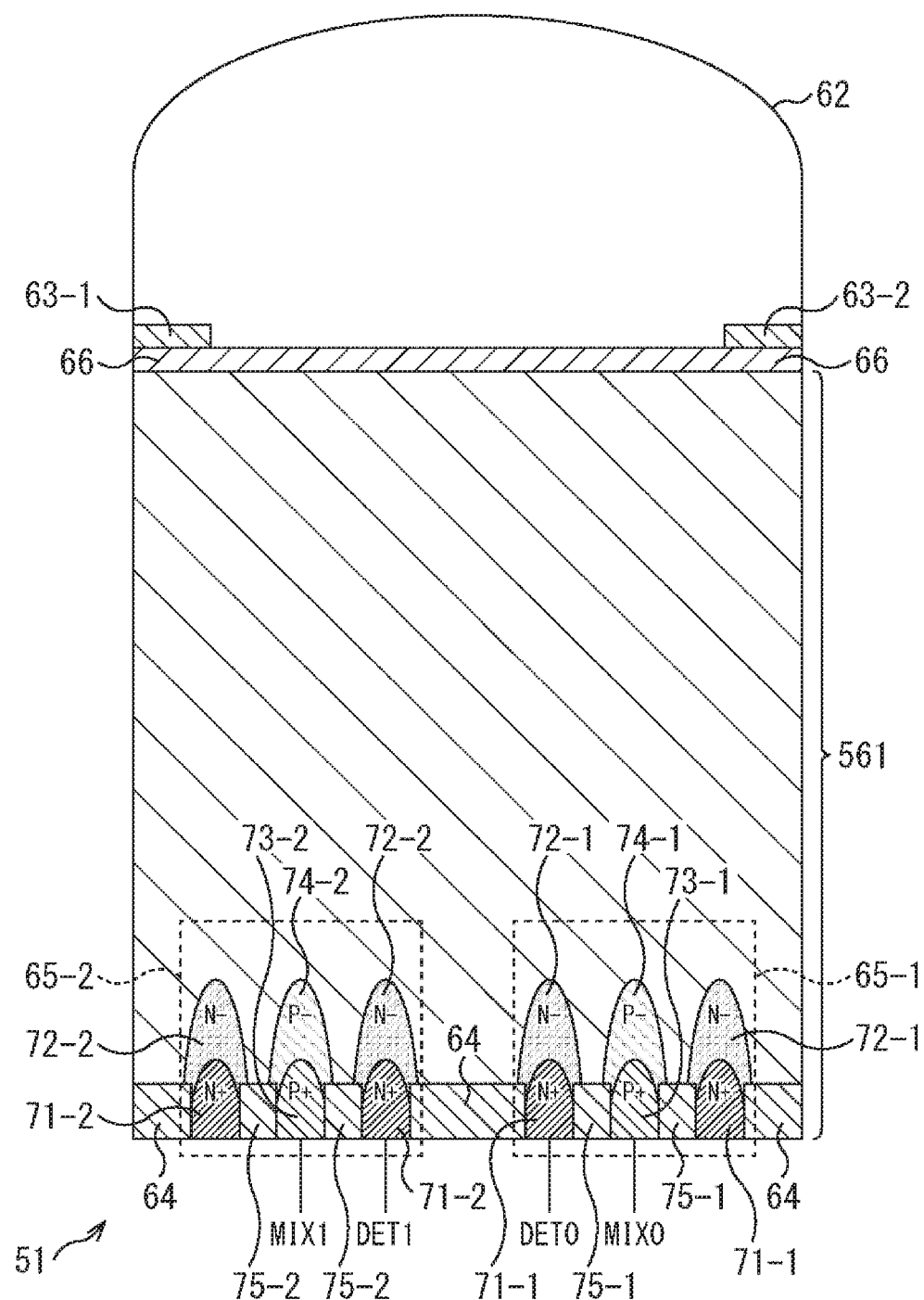
FIG. 26 is a view illustrating still another configuration example of the pixel.

Accordingly, for example, as illustrated in FIG. 26, a substrate 561 that constitutes the pixel 51 may be set to be thicker in comparison to the substrate 531 illustrated in FIG. 25. Note that in FIG. 26, the same reference symbol will be given to a portion corresponding to the case in FIG. 25, and description thereof will be appropriately omitted.

A configuration of the pixel 51 illustrated in FIG. 26 is different from that of the pixel 51 illustrated in FIG. 25 in that the substrate 561 is provided instead of the substrate 531, and the other configurations are the same as those of the pixel 51 in FIG. 25.

That is, in the pixel 51 illustrated in FIG. 26, the on-chip lens 62, the fixed charge film 66, and the interpixel light-shielding film 63 are formed on a light incident surface side in the substrate 561. In addition, the oxide film 64, the signal extraction unit 65, and the isolation portion 75 are formed in the vicinity of a front surface that is a surface opposite to the light incident surface side of the substrate 561.

For example, the substrate 561 is constituted by an N-type semiconductor substrate having a thickness of 20 μm or greater. The substrate 561 and the substrate 531 are different only in a substrate thickness, and formation positions of the oxide film 64, the signal extraction unit 65, and the isolation portion 75 are the same between the substrate 561 and the 531.

Thirteenth Embodiment

Configuration Example of Pixel

In addition, for example, an electric field inside the substrate 61 in a direction perpendicular to a surface of the substrate 61 (hereinafter, may also be referred to as a Z direction) may be strengthened by applying a bias to the light incident surface side of the substrate 61.

Figures 27A, 27B:
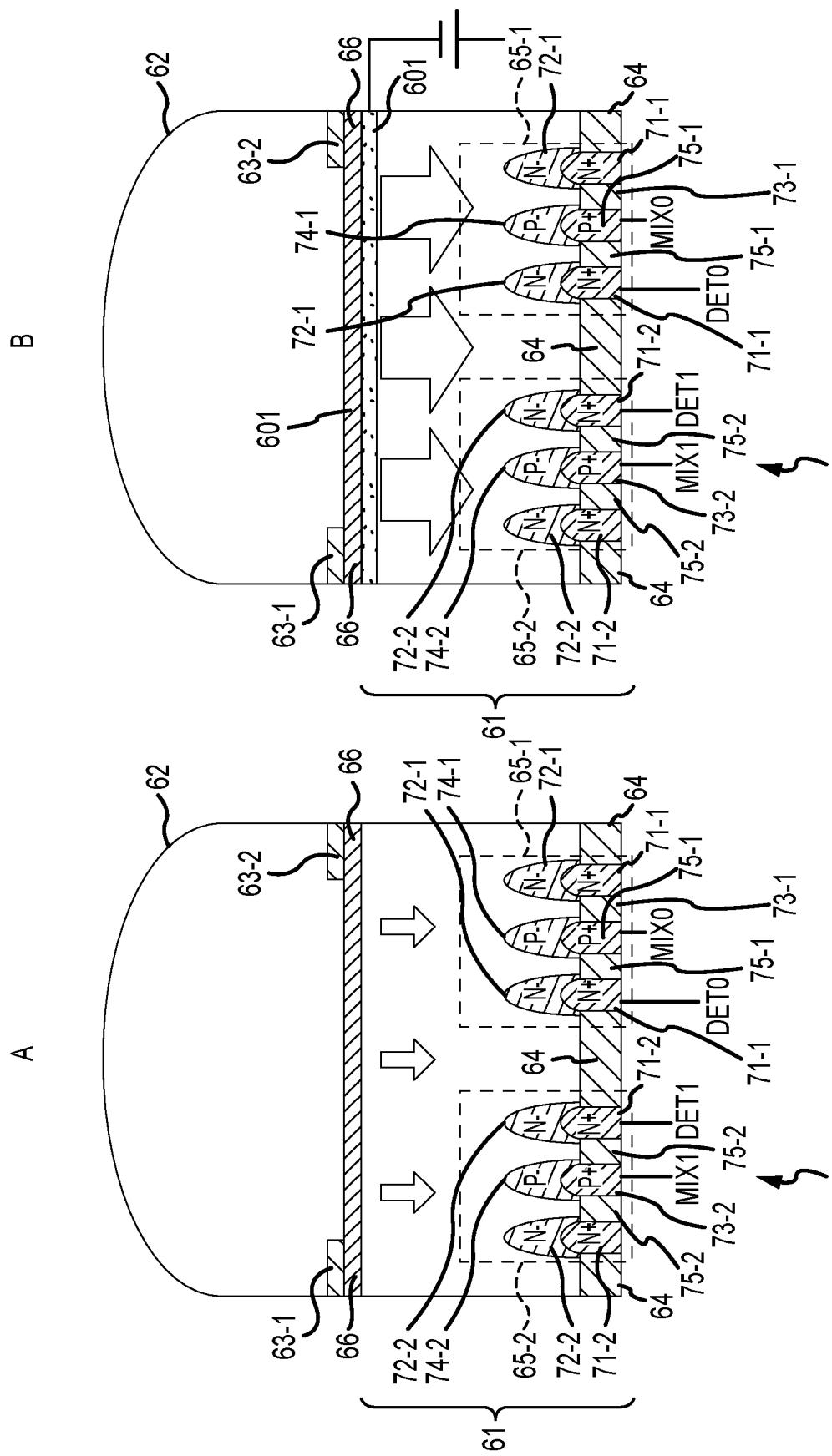
FIGS. 27A-B are views illustrating still another configuration example of the pixel.

In this case, for example, the pixel 51 has a configuration illustrated in FIGS. 27A and 27B. Note that in FIGS. 27A and 27B, the same reference symbol will be given to a portion corresponding to the case in FIG. 2, and description thereof will be appropriately omitted.

FIG. 27A illustrates the pixel 51 illustrated in FIG. 2, and an arrow inside the substrate 61 of the pixel 51 indicates the intensity of the electric field in the Z direction at the inside of the substrate 61.

In contrast, FIG. 27B illustrates a configuration of the pixel 51 in the case of applying the bias (voltage) to the light incident surface of the substrate 61. The configuration of the pixel 51 in FIG. 27B is basically the same as the configuration of the pixel 51 illustrated in FIG. 2, but a P+ semiconductor region 601 is newly added to an interface on the light incident surface side of the substrate 61.

In the P+ semiconductor region 601 formed at the light incident surface side interface of the substrate 61, a voltage of 0 V or less (negative bias) is applied from the inside or the outside of the pixel array unit 20, and thus the electric field in the Z direction is strengthened. An arrow inside the substrate 61 of the pixel 51 in FIG. 27B indicates the intensity of the electric field inside the substrate 61 in the Z direction. Boldness of the arrow drawn inside the substrate 61 in FIG. 27B is greater than that of the arrow in the pixel 51 in FIG. 27A, and the electric field in the Z direction becomes stronger. As described above, when the negative bias is applied to the P+ semiconductor region 601 formed on the light incident surface side of the substrate 61, the electric field in the Z direction is strengthened, and thus it is possible to improve electron extraction efficiency in the signal extraction unit 65.

Note that the configuration for applying a voltage to the light incident surface side of the substrate 61 Is not limited to the configuration in which the P+ semiconductor region 601 is provided, and may be other arbitrary configurations. For example, a transparent electrode film may be formed between the light incident surface of the substrate 61 and the on-chip lens 62 through lamination, and a negative bias may be applied by applying a voltage to the transparent electrode film.

Fourteenth Embodiment

Configuration Example of Pixel

In addition, a large-area reflection member may be provided on a surface opposite to the light incident surface of the substrate 61 to improve sensitivity of the pixel 51 with respect to infrared lays.

Figure 28:
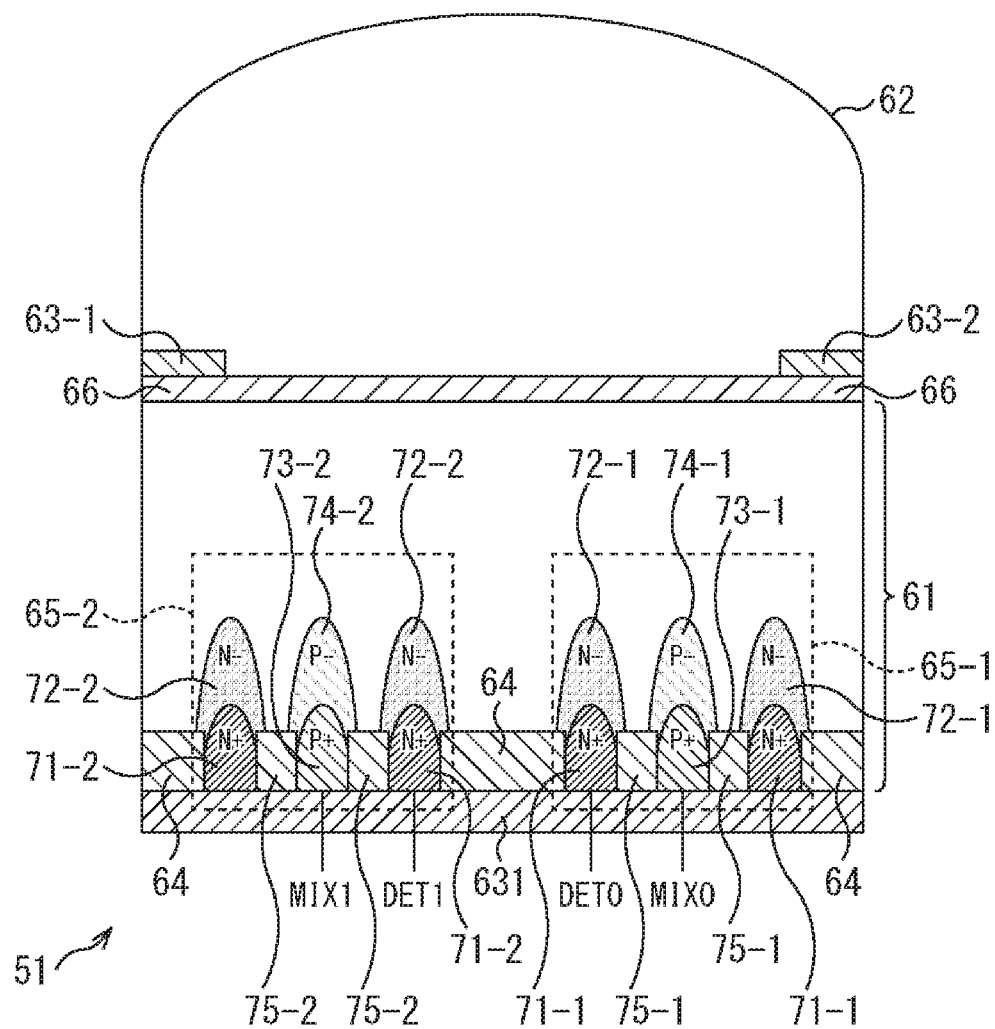
FIG. 28 is a view illustrating still another configuration example of the pixel.

In this case, for example, the pixel 51 is configured as illustrated in FIG. 28. Note that in FIG. 28, the same reference symbol will be given to a portion corresponding to the case in FIG. 2, and description thereof will be appropriately omitted.

A configuration of the pixel 51 illustrated in FIG. 28 is different from that of the pixel 51 in FIG. 2 in that a reflection member 631 is provided on a surface opposite to the light incident surface of the substrate 61, and the other configurations are the same as those of the pixel 51 in FIG. 2.

In an example illustrated in FIG. 28, the reflection member 631 that reflects infrared light is provided to cover the entirety of a surface opposite to the light incident surface of the substrate 61.

The reflection member 631 may be any member as long as a reflectance with respect to infrared light is high. For example, a metal such as copper or aluminum that is provided inside a multilayer interconnection layer laminated on the surface opposite to the light incident surface of the substrate 61 may be used as the reflection member 631, or a reflection structure such as polysilicon and an oxide film may be formed on the surface opposite to the light incident surface of the substrate 61 as the reflection member 631.

As described above, when the reflection member 631 is provided in the pixel 51, infrared light, which is incident into the substrate 61 from the light incident surface through the on-chip lens 62 and is transmitted through the substrate 61 without being photoelectrically converted, is reflected by the reflection member 631 and is caused to be incident into the substrate 61 again. Accordingly, it is possible to increase the amount of infrared light that is photoelectrically converted at the inside of the substrate 61, and thus it is possible to improve quantum efficiency (QE), that is, sensitivity of the pixel 51 with respect to infrared light.

Fifteenth Embodiment

Configuration Example of Pixel

In addition, a large-area light-shielding member may be provided on the surface opposite to the light incident surface of the substrate 61 to suppress erroneous detection of light in nearby pixels.

In this case, for example, the pixel 51 may have a configuration in which the reflection member 631 illustrated in FIG. 28 is substituted with a light-shielding member. That is, in the pixel 51 illustrated in FIG. 28, the reflection member 631 that covers the entirety of a surface opposite to the light incident surface of the substrate 61 is set as a light-shielding member 631' that shields infrared light. The light-shielding member 631' substitutes for the reflection member 631 of the pixel 51 in FIG. 28.

The light-shielding member 631' may be any member as long as a light-shielding rate with respect to infrared light is high. For example, a metal such as copper or aluminum that is provided inside a multilayer interconnection layer laminated on the surface opposite to the light incident surface of the substrate 61 may be used as the light-shielding member 631', or a light-shielding structure such as polysilicon and an oxide film may be formed on the surface opposite to the light incident surface of the substrate 61 as the light-shielding member 631'.

As described above, when the light-shielding member 631' is provided in the pixel 51, it is possible to suppress infrared light, which is incident into the substrate 61 from the light incident surface through the on-chip lens 62 and is transmitted through the substrate 61 without being photoelectrically converted at the inside of the substrate 61, from being scattered in an interconnection layer and being incident to nearby pixels. Accordingly, it is possible to prevent light from being erroneously detected in the nearby pixels.

Note that for example, when the light-shielding member 631' is constituted by a material including a metal, the light-shielding member 631' can also function as the reflection member 631.

Sixteenth Embodiment

Configuration Example of Pixel

In addition, a P-well region constituted by a P-type semiconductor region may be provided instead of the oxide film 64 in the substrate 61 of the pixel 51.

Figure 29:
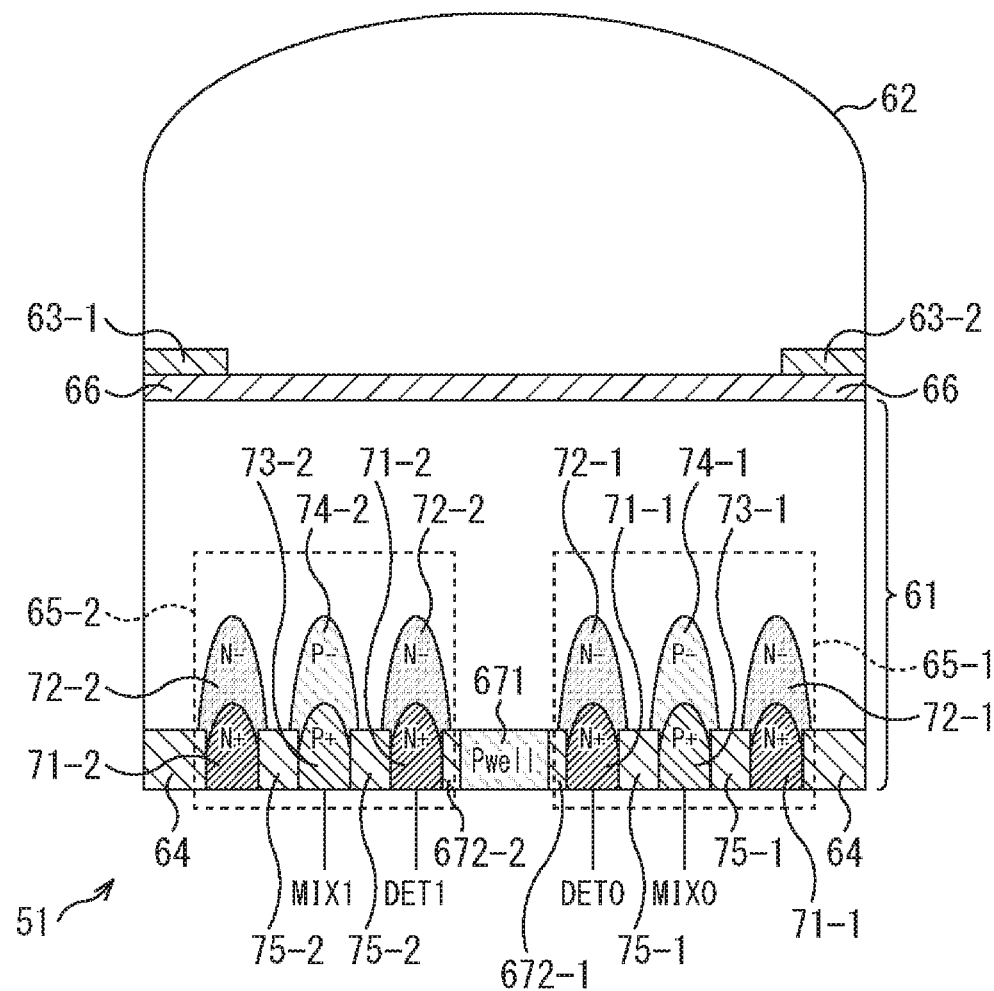
FIG. 29 is a view illustrating still another configuration example of the pixel.

In this case, for example, the pixel 51 is configured as illustrated in FIG. 29. Note that in FIG. 29, the same reference symbol will be given to a portion corresponding to the case in FIG. 2, and description thereof will be appropriately omitted.

A configuration of the pixel 51 illustrated in FIG. 29 is different from that of the pixel 51 illustrated in FIG. 2 in that a P-well region 671, an isolation portion 672-1, and an isolation portion 672-2 are provided instead of the oxide film 64, and the other configurations are the same as those of the pixel 51 in FIG. 2.

In an example illustrated in FIG. 29, the P-well region 671 constituted by a P-type semiconductor region is formed at the central portion on a surface side opposite to the light incident surface at the inside of the substrate 61, that is, on an inner side of a lower surface in the drawing. In addition, the isolation portion 672-1 that isolates the P-well region 671 and the N+ semiconductor region 71-1 from each other is formed between the regions with an oxide film or the like. Similarly, the isolation portion 672-2 that isolates the P-well region 671 and the N+ semiconductor region 71-2 from each other is also formed between the regions with an oxide film or the like. In the pixel 51 illustrated in FIG. 29, the P−semiconductor region 74 is a wider region in an upward direction in the drawing in comparison to the N-semiconductor region 72.

Seventeenth Embodiment

Configuration Example of Pixel

In addition, a P-well region constituted by a P-type semiconductor region may also be provided in addition to the oxide film 64 in the substrate 61 of the pixel 51.

Figure 30:
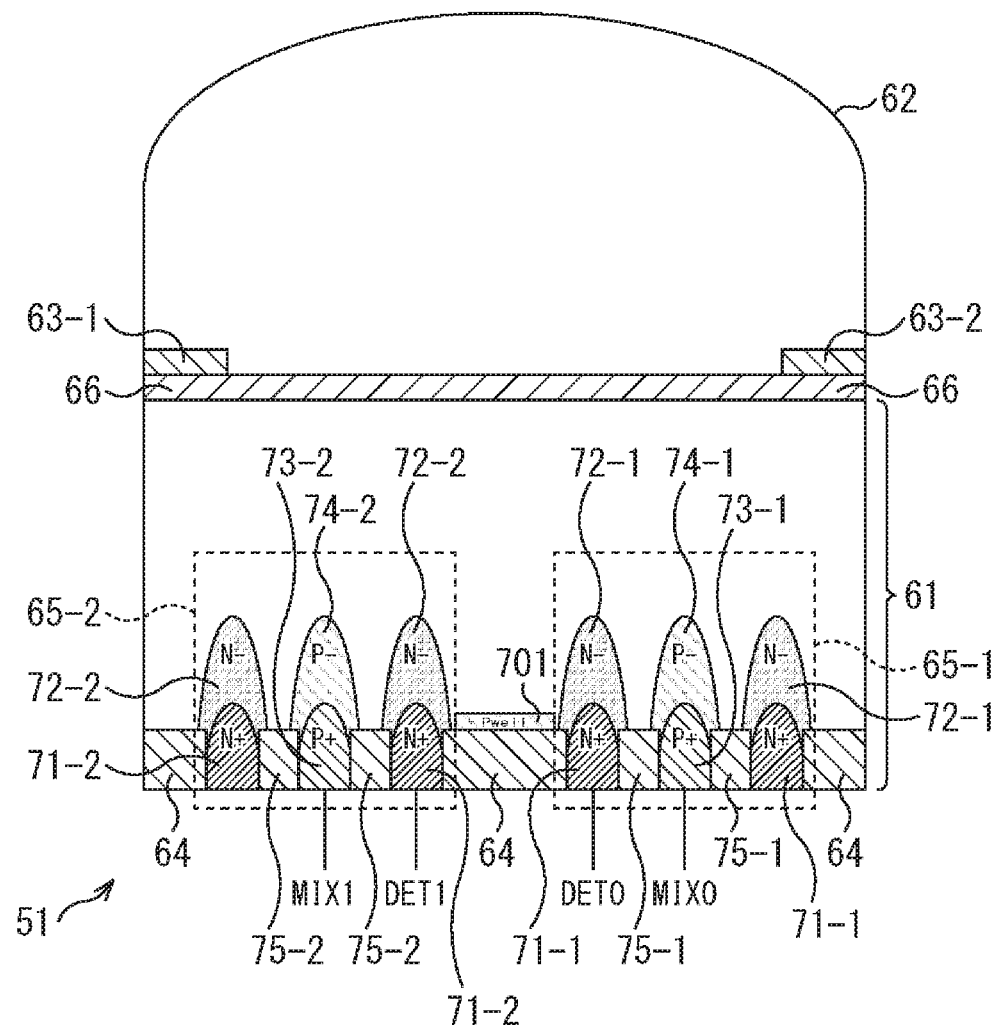
FIG. 30 is a view illustrating still another configuration example of the pixel.

In this case, for example, the pixel 51 is configured as illustrated in FIG. 30. Note that in FIG. 30, the same reference symbol will be given to a portion corresponding to the case in FIG. 2, and description thereof will be appropriately omitted.

A configuration of the pixel 51 illustrated in FIG. 30 is different from that of the pixel 51 illustrated in FIG. 2 in that a P-well region 701 is newly provided, and the other configurations are the same as those of the pixel 51 in FIG. 2. That is, in an example illustrated in FIG. 30, the P-well region 701 constituted by a P-type semiconductor region is formed on an upper side of the oxide film 64 at the inside of the substrate 61.

As described above, according to the present technology, since the CAPD sensor is configured as the back-illuminated type, and thus it is possible to improve characteristics such as pixel sensitivity.

Configuration Example of Equivalent Circuit of Pixel

Figure 31:
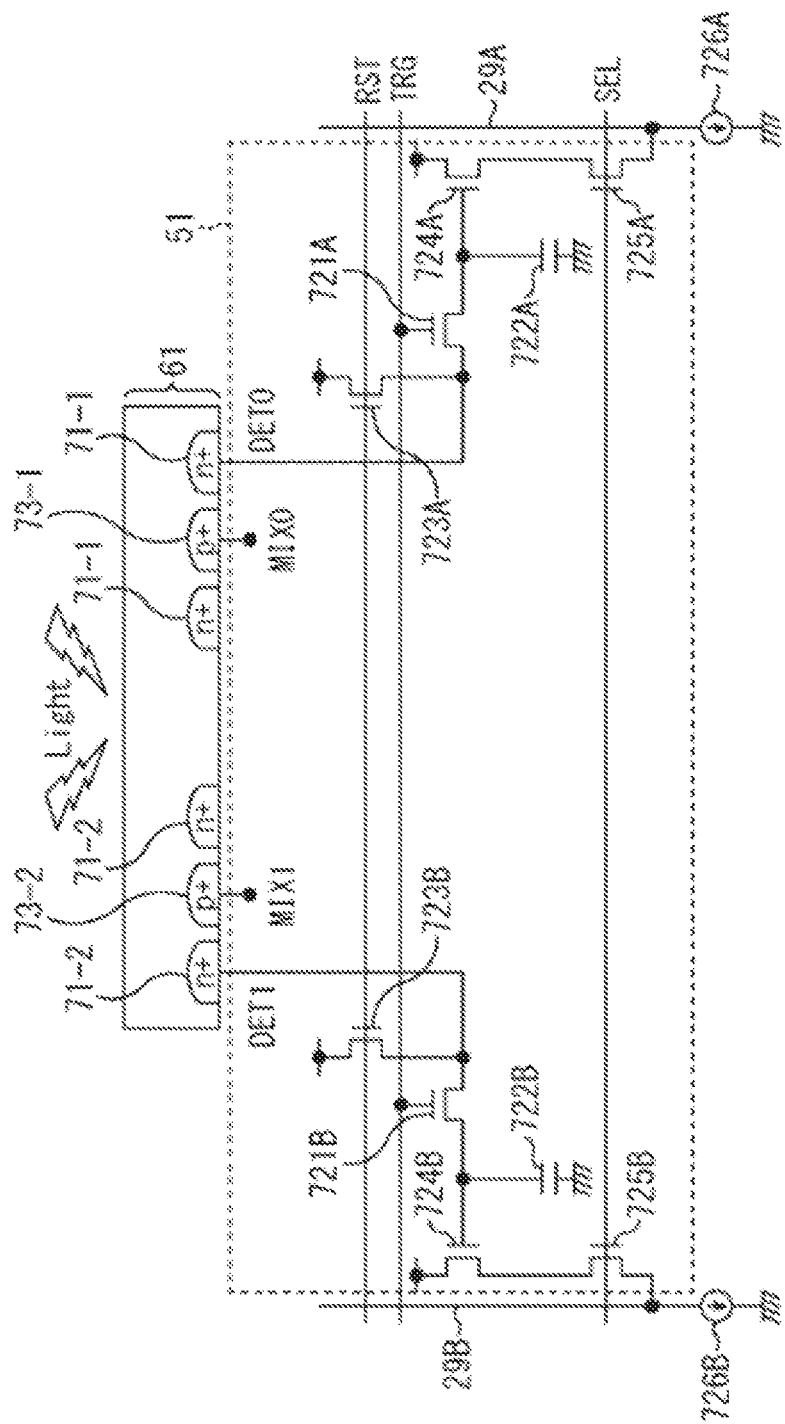
FIG. 31 is a view illustrating an equivalent circuit of the pixel.

FIG. 31 illustrates an equivalent circuit of the pixel 51.

The pixel 51 includes a transfer transistor 721A, an FD 722A, a reset transistor 723A, an amplification transistor 724A, and a selection transistor 725A with respect to the signal extraction unit 65-1 including the N+ semiconductor region 71-1, the P+ semiconductor region 73-1, and the like.

In addition, the pixel 51 includes a transfer transistor 721B, an FD 722B, a reset transistor 723B, an amplification transistor 724B, and a selection transistor 725B with respect to the signal extraction unit 65-2 including the N+ semiconductor region 71-2, the P+ semiconductor region 73-2, and the like.

The tap drive unit 21 applies a predetermined voltage MIX0 (first voltage) to the P+ semiconductor region 73-1, and applies a predetermined voltage MIX1 (second voltage) to the P+ semiconductor region 73-2. In the above-described example, one voltage of the voltage MIX0 and the voltage MIX1 is 1.5 V, and the other voltage is 0 V. The P+ semiconductor regions 73-1 and 73-2 are voltage application units to which the first voltage or the second voltage is applied.

The N+ semiconductor regions 71-1 and 71-2 are charge detection units which detect charges generated through photoelectric conversion of light incident to the substrate 61 and accumulate the charges.

When a drive signal TRG that is supplied to a gate electrode enters an active state, the transfer transistor 721A enters a conduction state in response to the active state, and transfers charges accumulated in the N+ semiconductor region 71-1 to the FD 722A. When the drive signal TRG that is applied to a gate electrode enters an active state, the transfer transistor 721B enters a conduction state in response to the active state, and transfers charges accumulated in the N+ semiconductor region 71-2 to the FD 722B.

The FD 722A temporarily retains a charge DET0 that is supplied from the N+ semiconductor region 71-1. The FD 722B temporarily retains a charge DET1 that is supplied from the N+ semiconductor region 71-2. The FD 722A corresponds to the FD portion A described with reference to FIG. 2, and the FD 722B corresponds to the FD portion B described with reference to FIG. 2.

When a drive signal RST that is supplied to a gate electrode enters an active state, the reset transistor 723A enters a conduction state in response to the active state, and resets a potential of the FD 722A to a predetermined level (power supply voltage VDD). When the drive signal RST that is supplied to a gate electrode enters an active state, the reset transistor 723B enters a conduction state in response to the active state, and resets a potential of the FD 722B to a predetermined level (power supply voltage VDD). Note that when the reset transistors 723A and 723B enter the active state, the transfer transistors 721A and 721B simultaneously enter the active state.

In the amplification transistor 724A, a source electrode is connected to a vertical signal line 29A through the selection transistor 725A, and the amplification transistor 724A constitutes a source follower circuit in combination with a load MOS of a constant current source circuit unit 726A that is connected to one end of the vertical signal line 29A. In the amplification transistor 724B, a source electrode is connected to a vertical signal line 29B through the selection transistor 725B, and the amplification transistor 724B constitutes a source follower circuit in combination with a load MOS of a constant current source circuit unit 726B that is connected to one end of the vertical signal line 29B.

The selection transistor 725A is connected to between the source electrode of the amplification transistor 724A and the vertical signal line 29A. When a selection signal SEL that is applied to a gate electrode enters an active state, the selection transistor 725A enters a conduction state in response to the active state, and outputs pixel signals output from the amplification transistor 724A to the vertical signal line 29A.

The selection transistor 725B is connected to between the source electrode of the amplification transistor 724B and a vertical signal line 29B. When the selection signal SEL that is supplied to a gate electrode enters an active state, the selection transistor 725B enters a conduction state in response to the active state, and outputs pixel signals output from the amplification transistor 724B to the vertical signal line 29B.

The transfer transistors 721A and 721B, the reset transistors 723A and 723B, the amplification transistors 724A and 724B, and the selection transistors 725A and 725B of the pixel 51 are controlled, for example, by the vertical drive unit 22.

Configuration Example of Another Equivalent Circuit of Pixel

Figure 32:
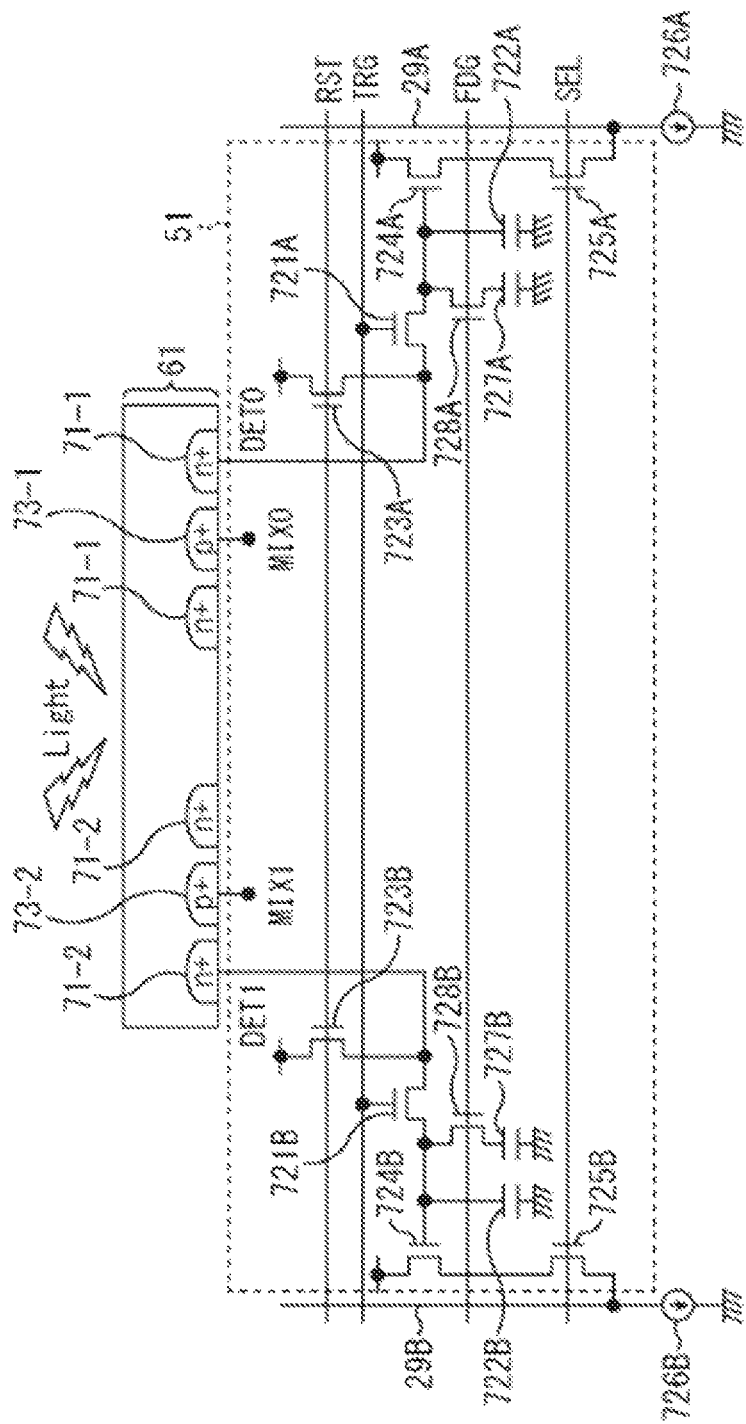
FIG. 32 is a view illustrating another equivalent circuit of the pixel.

FIG. 32 illustrates other equivalent circuit of the pixel 51.

In FIG. 32, the same reference symbol will be given to a portion corresponding to FIG. 31, and description thereof will be appropriately omitted.

In the equivalent circuit in FIG. 32, an additional capacitor 727 and a switching transistor 728 that controls connection of the additional capacitor 727 are added to both of the signal extraction units 65-1 and 65-2 in comparison to the equivalent circuit in FIG. 31.

Specifically, the additional capacitor 727A is connected to between the transfer transistor 721A and the FD 722A through a switching transistor 728A, and an additional capacitor 727B is connected to between the transfer transistor 721B and the FD 722B through a switching transistor 728B.

When a drive signal FDG that is supplied to a gate electrode enters an active state, the switching transistor 728A enters a conduction state in response to the active state, and connects the additional capacitor 727A to the FD 722A. When the drive signal FDG that is supplied to a gate electrode enters an active state, the switching transistor 728B enters a conduction state in response to the active state, and connects the additional capacitor 727B to the FD 722B.

For example, in a high-illuminance state in which a light amount of incident light is great, the vertical drive unit 22 sets the switching transistors 728A and 728B to the active state to connect the FD 722A and the additional capacitor 727A to each other, and to connect the FD 722B and the additional capacitor 727B to each other. Accordingly, it is possible to accumulate relatively many charges in the high-illumination state.

Meanwhile, in a low-illumination state in which the light amount of incident light is small, the vertical drive unit 22 sets the switching transistors 728A and 728B to an inactive state to separate the additional capacitors 727A and 727B from the FD 722A and FD 722B, respectively.

As in the equivalent circuit in FIG. 31, the additional capacitor 727 may be omitted, but when the additional capacitor 727 is provided and is selectively and appropriately used in correspondence with an incident light amount, it is possible to secure a high dynamic range.

Arrangement Example of Voltage Supply Line

Next, description will be given of an arrangement of voltage supply lines for applying the predetermined voltage MIX0 or MIX1 to the P+ semiconductor regions 73-1 and 73-2 which are voltage application units of the signal extraction unit 65 of the pixel 51 with reference to FIG. 33A to FIG. 35B. Voltage supply lines 741 illustrated in FIGS. 33A and 33B, and FIGS. 34A and 34B correspond to the voltage supply lines 30 illustrated in FIG. 1.

Note that with regard to FIGS. 33A and 33B and FIGS. 34A and 34B, description will be given by employing a circular configuration illustrated in FIG. 9 as a configuration of the signal extraction unit 65 of the pixel 51, but it is needless to say that other configurations can be employed.

Figure 33A:
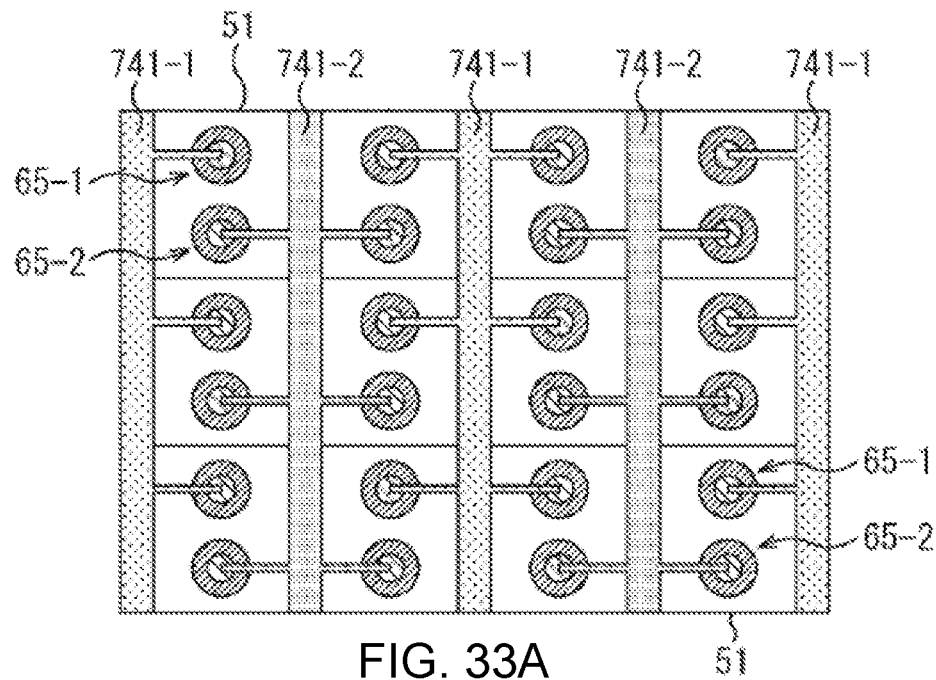
FIGS. 33A-B are views illustrating an arrangement example of voltage supply lines employing a periodic arrangement.

FIG. 33A is a plan view illustrating a first arrangement example of the voltage supply lines.

In the first arrangement example, with respect to multiple pixels 51 which are two-dimensionally arranged in a matrix shape, a voltage supply line 741-1 or 741-2 is wired between two pixels adjacent to each other in a horizontal direction (at a boundary thereof) along a vertical direction.

The voltage supply line 741-1 is connected to the P+ semiconductor region 73-1 of the signal extraction unit 65-1 on one side between two pieces of the signal extraction units 65 in each of the pixels 51. The voltage supply line 741-2 is connected to the P+ semiconductor region 73-2 of the signal extraction unit 65-2 on the other side between two pieces of the signal extraction units 65 in the pixel 51.

In the first arrangement example, two pieces of the voltage supply lines 741-1 and 741-2 are disposed with respect to two pixel columns, and thus the number of voltage supply lines 741 which are arranged in the pixel array unit 20 becomes substantially the same as the number of columns of the pixels 51.

Figure 33B:
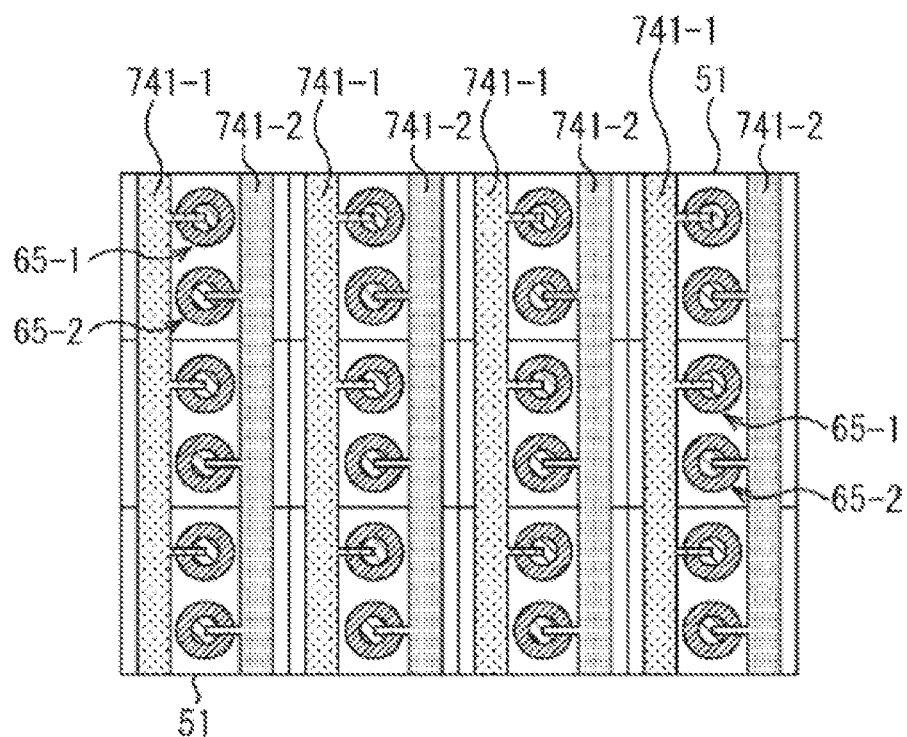

FIG. 33B is a plan view illustrating a second arrangement example of the voltage supply lines.

In the second arrangement example, with respect to one pixel column of the multiple pixels 51 which are two-dimensionally arranged in a matrix shape, two pieces of the voltage supply lines 741-1 and 741-2 are wired along the vertical direction.

The voltage supply line 741-1 is connected to the P+ semiconductor region 73-1 of the signal extraction unit 65-1 on one side between two pieces of the signal extraction units 65 in each of the pixels 51. The voltage supply line 741-2 is connected to the P+ semiconductor region 73-2 of the signal extraction unit 65-2 on the other side between two pieces of the signal extraction units 65 in the pixel 51.

In the second arrangement example, two pieces of the voltage supply lines 741-1 and 741-2 are wired with respect to one pixel column, and thus four pieces of the voltage supply lines 741 are disposed with respect to two pixel columns. Accordingly, the number of the voltage supply lines 741 which are arranged becomes approximately two times the number of columns of the pixels 51.

Any one of the arrangement examples in FIG. 33A and FIG. 33B is a periodic arrangement. In the periodic arrangement, the configuration, in which the voltage supply line 741-1 is connected to the P+ semiconductor region 73-1 of the signal extraction unit 65-1, and the voltage supply line 741-2 is connected to the P+ semiconductor region 73-2, is periodically repeated with respect to pixels arranged in a vertical direction.

In the first arrangement example illustrated in FIG. 33A, it is possible to reduce the number of the voltage supply lines 741-1 and 741-2 which are wired with respect to the pixel array unit 20.

In the second arrangement example illustrated in FIG. 33B, the number of wired pieces further increases in comparison to the first arrangement example, but the number of the signal extraction units 65 which are connected to one piece of the voltage supply line 741 becomes the half, and thus it is possible to reduce a load of an interconnection, and thus the second arrangement example is effective for high-speed drive or a case where a total number of pixels in the pixel array unit 20 is great.

Figure 34A:
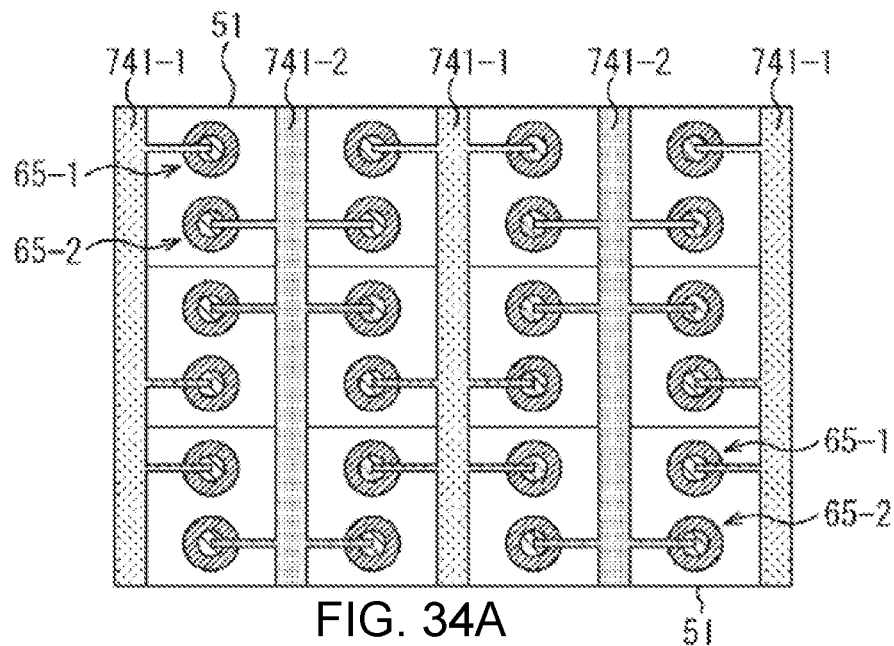
FIG. 34a-B are views illustrating an arrangement example of voltage supply lines employing a mirror arrangement.

FIG. 34A is a plan view illustrating a third arrangement example of the voltage supply lines.

The third arrangement example is an example in which two pieces of the voltage supply lines 741-1 and 741-2 are disposed with respect to two pixel columns as in the first arrangement example in FIG. 33A.

The third arrangement example is different from the first arrangement example in FIG. 33A in that connection destinations of the signal extraction units 65-1 and 65-2 are different from each other between two pixels which are arranged in a vertical direction.

Specifically, for example, in the pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, but in a pixel 51 on a lower side or on an upper side of the pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

Figure 34B:
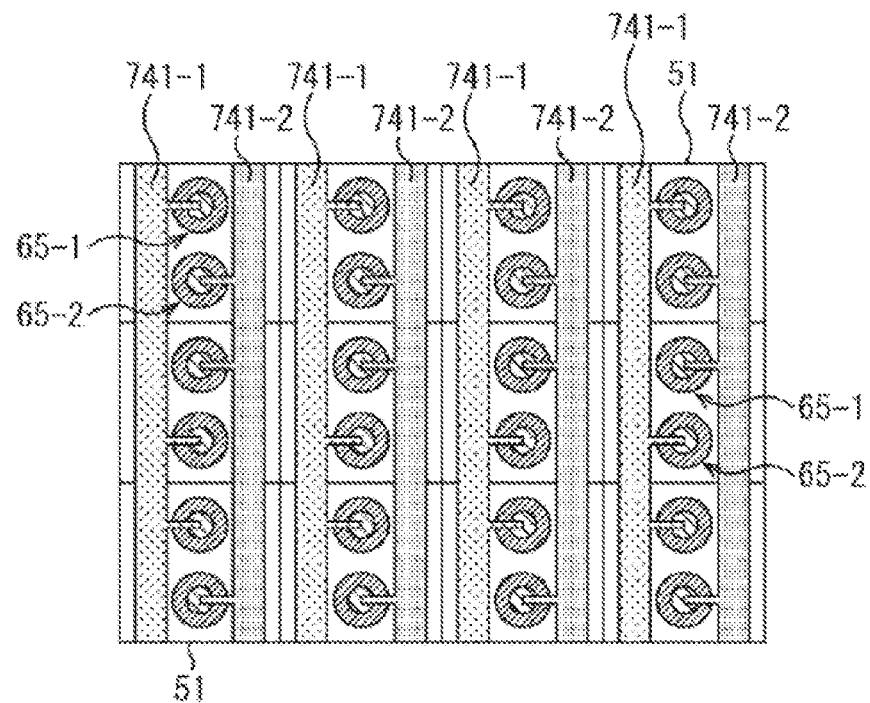

FIG. 34B is a plan view illustrating a fourth arrangement example of the voltage supply lines.

The fourth arrangement example is an example in which two pieces of the voltage supply lines 741-1 and 741-2 are disposed with respect to two pixel columns as in the second arrangement example in FIG. 33B.

The fourth arrangement example is different from the second arrangement example in FIG. 33B in that connection destinations of the signal extraction units 65-1 and 65-2 are different from each other between two pixels which are arranged in a vertical direction.

Specifically, for example, in the pixel 51, the voltage supply line 741-1 is connected to the P+ semiconductor region 73-1 of the signal extraction unit 65-1, and the voltage supply line 741-2 is connected to the P+ semiconductor region 73-2 of the signal extraction unit 65-2, but in a pixel 51 on a lower side or on an upper side of the pixel 51, the voltage supply line 741-1 is connected to the P+ semiconductor region 73-2 of the signal extraction unit 65-2, and the voltage supply line 741-2 is connected to the P+ semiconductor region 73-1 of the signal extraction unit 65-1.

In the third arrangement example illustrated in FIG. 34A, it is possible to reduce the number of the voltage supply lines 741-1 and 741-2 which are wired with respect to the pixel array unit 20.

In the fourth arrangement example illustrated in FIG. 34B, the number of wired pieces further increases in comparison to the third arrangement example, but the number of the signal extraction units 65 which are connected to one piece of the voltage supply line 741 becomes the half, and thus it is possible to reduce a load of an interconnection, and thus the fourth arrangement example is effective for high-speed drive or a case where a total number of pixels in the pixel array unit 20 is great.

Any of the arrangement examples in FIGS. 34A and 34B is a mirror arrangement in which connection destinations with respect to two pixels adjacent to each other in an upper and lower direction (vertical direction) are mirror-inverted.

Figure 35A:
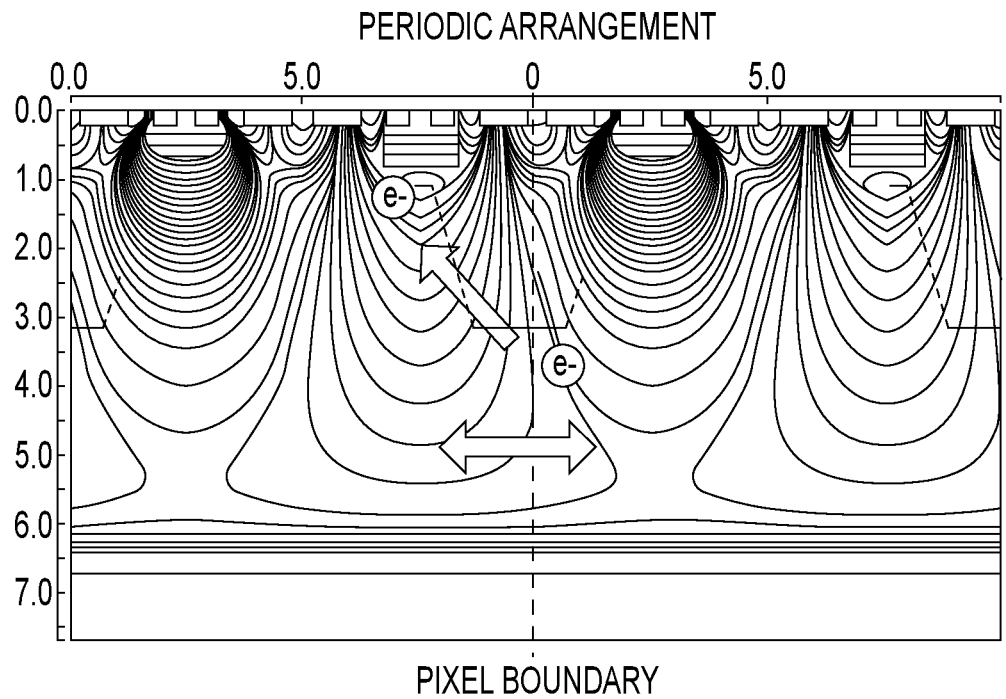
FIGS. 35A-B are views describing characteristics of the periodic arrangement and the mirror arrangement.

As illustrated in FIG. 35A, in the periodic arrangement, voltages which are applied to two pieces of the signal extraction units 65 adjacent to each other with a pixel boundary interposed therebetween become different from each other, and thus charge exchange occurs between the adjacent pixels. Accordingly, charge transfer efficiency is superior to the mirror arrangement, but cross-talk characteristics of adjacent pixels are inferior to the mirror arrangement.

Figure 35B:
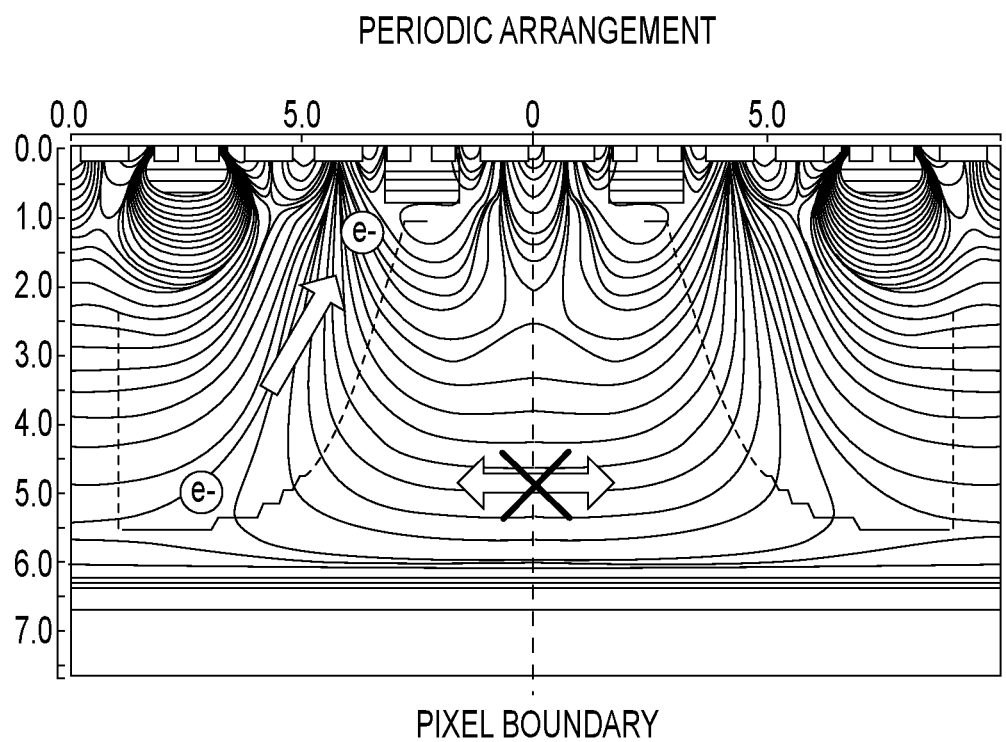

Meanwhile, as illustrated in FIG. 35B, in the mirror arrangement, voltages which are applied to two pieces of the signal extraction units 65 adjacent to each other with a pixel boundary interposed therebetween are the same as each other, and thus charge exchange between the adjacent pixels is suppressed. Accordingly, the charge transfer efficiency is inferior to the periodic arrangement, but the cross-talk characteristics of the adjacent pixels are superior to the periodic arrangement.

Cross-Sectional Configuration of Multiple Pixels in Fourteenth Embodiment

In a cross-sectional configuration of pixels as illustrated in FIG. 2 or the like, illustration of the multilayer interconnection layer formed on the front surface side opposite to the light incident surface of the substrate 61 is omitted.

Hereinafter, with regard to several embodiments described above, a cross-sectional view of multiple pixels adjacent to each other is illustrated in a state in which the multilayer interconnection layer is not omitted.

Figure 36:
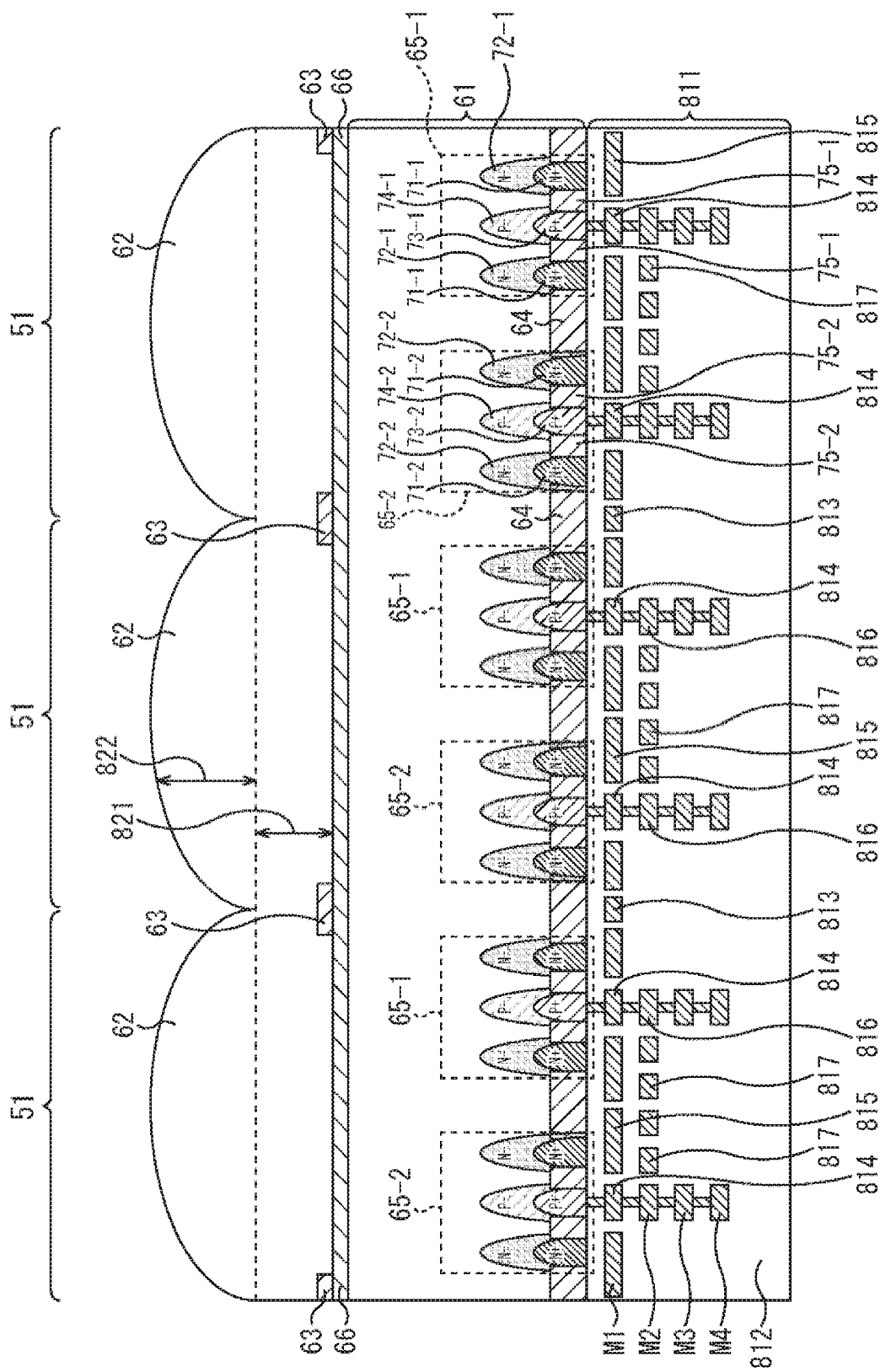
FIG. 36 is a cross-sectional view of multiple pixels in a fourteenth embodiment.
Figure 37:
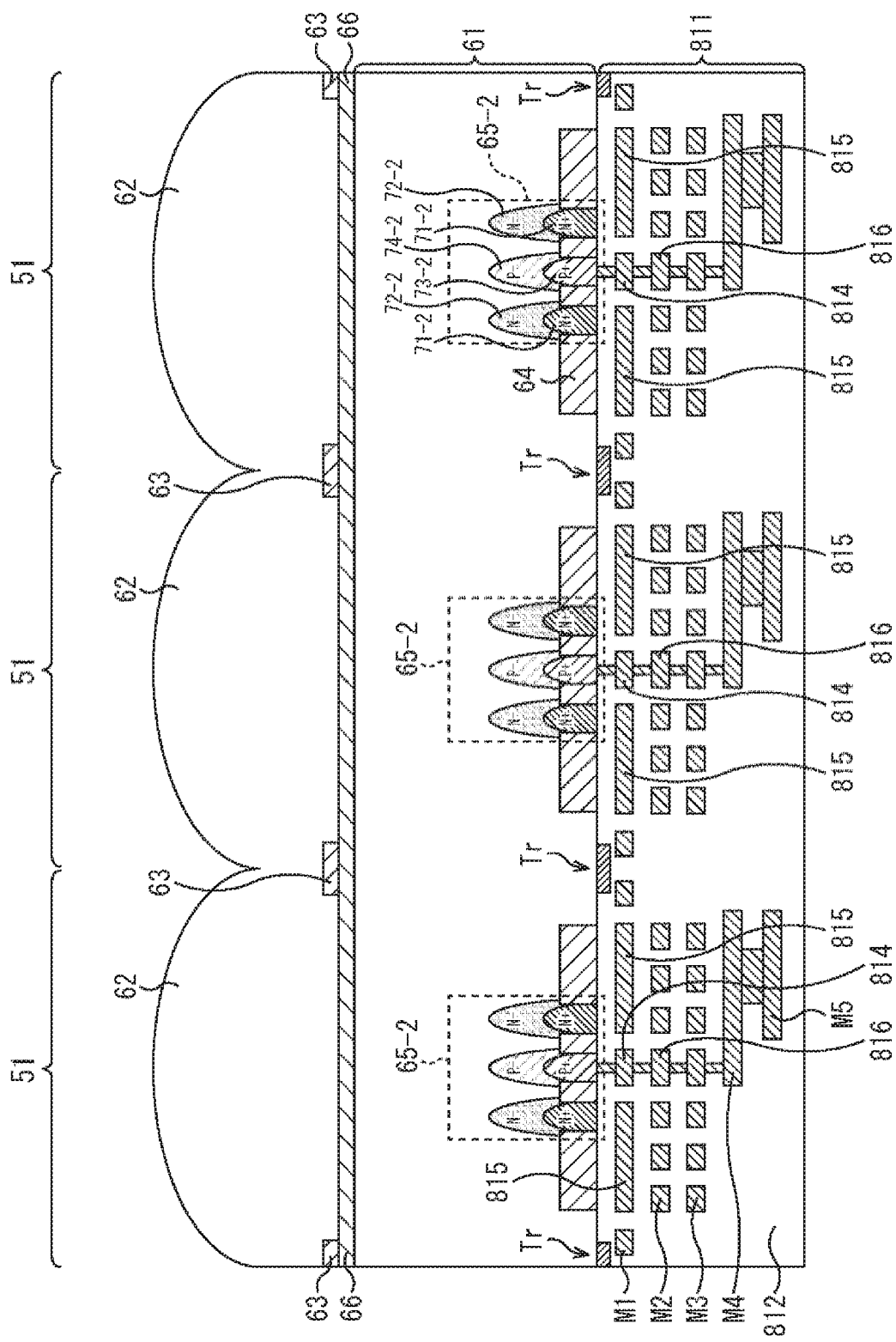
FIG. 37 is a cross-sectional view of the multiple pixels in the fourteenth embodiment.

First, a cross-sectional view of multiple pixels in the fourteenth embodiment illustrated in FIG. 28 is illustrated in FIG. 36 and FIG. 37.

The fourteenth embodiment illustrated in FIG. 28 relates to a configuration of pixels including the large-area reflection member 631 on a side opposite to the light incident surface of the substrate 61.

FIG. 36 corresponds to a cross-sectional view taken along line B-B' in FIG. 11, and FIG. 37 corresponds to a cross-sectional view taken along line A-A'. In addition, a cross-sectional view taken along line C-C' in FIG. 17 can be shown like FIG. 36.

As illustrated in FIG. 36, in the pixel 51, the oxide film 64 is formed at the central portion, and the signal extraction unit 65-1 and the signal extraction unit 65-2 are respectively formed on both sides of the oxide film 64.

In the signal extraction unit 65-1, in a state in which the P+ semiconductor region 73-1 and the P− semiconductor region 74-1 are set as the center, the N+ semiconductor region 71-1 and the N− semiconductor region 72-1 are formed to surround the periphery of the P+ semiconductor region 73-1 and the P− semiconductor region 74-1. The P+ semiconductor region 73-1 and the N+ semiconductor region 71-1 are in contact with a multilayer interconnection layer 811. The P− semiconductor region 74-1 is disposed on an upward side (on the on-chip lens 62 side) of the P+ semiconductor region 73-1 to cover the P+ semiconductor region 73-1, and the N− semiconductor region 72-1 is disposed on an upward side (on the on-chip lens 62 side) of the N+ semiconductor region 71-1 to cover the N+ semiconductor region 71-1. In other words, the P+ semiconductor region 73-1 and the N+ semiconductor region 71-1 are disposed on the multilayer interconnection layer 811 side at the inside of the substrate 61, and the N-semiconductor region 72-1 and the P− semiconductor region 74-1 are disposed on the on-chip lens 62 side at the inside of the substrate 61. In addition, the isolation portion 75-1 that isolates the N+ semiconductor region 71-1 and the P+ semiconductor region 73-1 from each other is formed between the regions with an oxide film or the like.

In the signal extraction unit 65-2, in a state in which the P+ semiconductor region 73-2 and the P− semiconductor region 74-2 are set as the center, the N+ semiconductor region 71-2 and the N− semiconductor region 72-2 are formed to surround the periphery of the P+ semiconductor region 73-2 and the P− semiconductor region 74-2. The P+ semiconductor region 73-2 and the N+ semiconductor region 71-2 are in contact with the multilayer interconnection layer 811. The P− semiconductor region 74-2 is disposed on an upward side (on the on-chip lens 62 side) of the P+ semiconductor region 73-2 to cover the P+ semiconductor region 73-2, and the N− semiconductor region 72-2 is formed on an upward side (on the on-chip lens 62 side) of the N+ semiconductor region 71-2 to cover the N+ semiconductor region 71-2. In other words, the P+ semiconductor region 73-2 and the N+ semiconductor region 71-2 are disposed on the multilayer interconnection layer 811 side at the inside of the substrate 61, and the N-semiconductor region 72-2 and the P− semiconductor region 74-2 are disposed on the on-chip lens 62 side at the inside of the substrate 61. In addition, the isolation portion 75-2 that isolates the N+ semiconductor region 71-2 and the P+ semiconductor region 73-2 from each other is also formed between the regions with an oxide film or the like.

The oxide film 64 is also formed in a boundary region between adjacent pixels 51, that is, between the N+ semiconductor region 71-1 of the signal extraction unit 65-1 of a predetermined pixel 51 and the N+ semiconductor region 71-2 of the signal extraction unit 65-2 of a pixel 51 adjacent to the predetermined pixel 51.

The fixed charge film 66 is formed at an interface on the light incident surface side of the substrate 61 (upper surface in FIG. 36 and FIG. 37).

As illustrated in FIG. 36, when dividing the on-chip lens 62 formed for every pixel on the light incident surface side of the substrate 61 into a rising portion 821 of which the thickness is evenly raised over the entire surface of a region inside a pixel, and a curved surface portion 822 of which the thickness is different depending on a position inside the pixel in a height direction, the thickness of the rising portion 821 is set to be smaller than the thickness of the curved surface portion 822. The larger the thickness of the rising portion 821 is, the more oblique incident light is likely to be reflected by the interpixel light-shielding film 63. Accordingly, when the thickness of the rising portion 821 is set to be smaller, it is possible to receive the oblique incident light into the substrate 61. In addition, the larger the thickness of the curved surface portion 822 is, the further incident light is condensed to the center of a pixel.

The multilayer interconnection layer 811 is formed on a side opposite to the light incident surface side of the substrate 61 in which the on-chip lens 62 is formed for every pixel. In other words, the substrate 61 that is a semiconductor layer is disposed between the on-chip lens 62 and the multilayer interconnection layer 811. The multilayer interconnection layer 811 includes five layers of metal films M1 to M5, and an interlayer insulating film 812 disposed between the metal films. Note that in FIG. 36, among the five layers of metal films M1 to M5 of the multilayer interconnection layer 811, the metal film M5 on the outermost side exists at a location at which the metal film M5 is not viewed, and thus the metal film M5 is not illustrated in the cross-sectional view of FIG. 36. However, the metal film M5 is illustrated in a cross-sectional view of FIG. 37 that is a cross-sectional view seen from a direction different from a direction in FIG. 36.

As illustrated in FIG. 37, a pixel transistor Tr is formed in a pixel boundary region of an interface portion between the multilayer interconnection layer 811 and the substrate 61. The pixel transistor Tr is any one of the transfer transistor 721, the reset transistor 723, the amplification transistor 724, and the selection transistor 725 illustrated in FIG. 31 and FIG. 32.

A power supply line 813 that supplies a power supply voltage, a voltage application interconnection 814 that supplies a predetermined voltage to the P+ semiconductor region 73-1 or 73-2, and a reflection member 815 that is a member reflecting incident light are included in the metal film M1 that is closest to the substrate 61 among the five layers of metal films M1 to M5 of the multilayer interconnection layer 811. In the metal film M1 illustrated in FIG. 36, an interconnection other than the power supply line 813 and the voltage application interconnection 814 becomes the reflection member 815, but a partial reference symbol is omitted for preventing complication of the drawing. The reflection member 815 is a dummy interconnection that is provided to reflect incident light, and corresponds to the reflection member 631 illustrated in FIG. 28. The reflection member 815 is disposed on a downward side of the N+ semiconductor regions 71-1 and 71-2 to overlap the N+ semiconductor regions 71-1 and 71-2 which are charge detection units in a plan view. Note that in a case where the light-shielding member 631' of the fifteenth embodiment is provided instead of the reflection member 631 of the fourteenth embodiment illustrated in FIG. 28, a portion of the reflection member 815 in FIG. 36 becomes the light-shielding portion 631'.

In addition, in the metal film M1, a charge extraction interconnection (not illustrated in FIG. 36) that connects the N+ semiconductor region 71 and the transfer transistor 721 is formed to transfer charges accumulated in the N+ semiconductor region 71 to the FD 722.

Note that in the example, the reflection member 815 (reflection member 631) and the charge extraction interconnection are set to be disposed in the same layer of the metal film M1, but there is no limitation to the disposition at the same layer.

In the metal film M2 that is a second layer from the substrate 61 side, for example, a voltage application interconnection 816 that is connected to the voltage application interconnection 814 of the metal film M1, a control line 817 that transfers the drive signal TRG, the drive signal RST, the selection signal SEL, the drive signal FDG, and the like, a ground line, and the like are formed. In addition, the FD 722B and the additional capacitor 727A are formed in the metal film M2.

In the metal film M3 that is a third layer from the substrate 61 side, for example, the vertical signal line 29, a VSS interconnection for shielding, and the like are formed.

In the metal film M4 and the metal film M5 which are fourth and fifth layers from the substrate 61 side, for example, the voltage supply lines 741-1 and 741-2 (FIGS. 33A and 33B and FIGS. 34A and 34B) that applies a predetermined voltage MIX0 or MIX1 to the P+ semiconductor regions 73-1 and 73-2 which are voltage application units of the signal extraction unit 65 are formed.

Note that a planar arrangement of the five layers of metal films M1 to M5 of the multilayer interconnection layer 811 will be described later with reference to FIG. 42 and FIG. 43.

Cross-Sectional Configuration of Multiple Pixels of Ninth Embodiment

Figure 38:
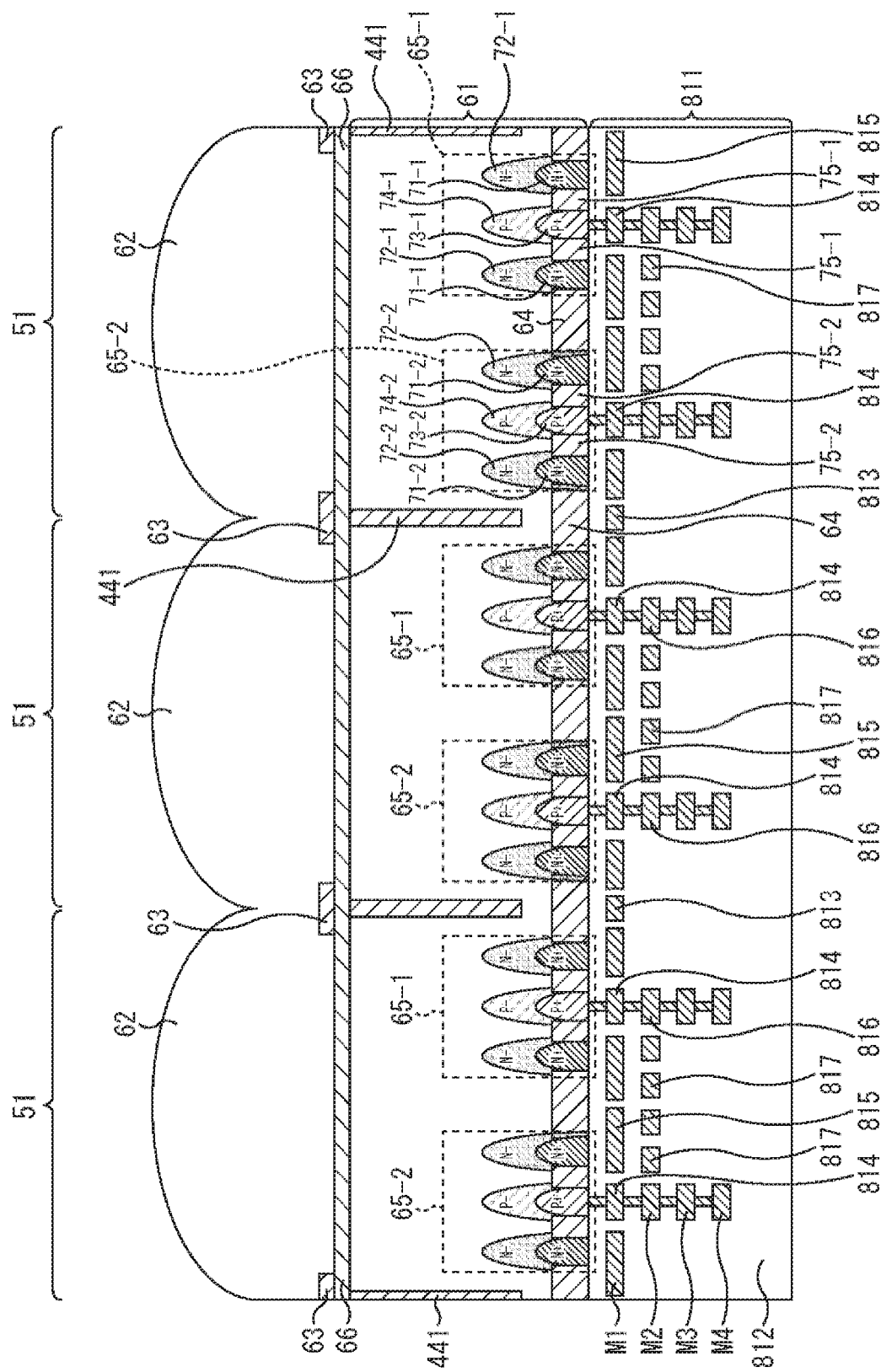
FIG. 38 is a cross-sectional view of multiple pixels in a ninth embodiment.

FIG. 38 is a cross-sectional view illustrating a pixel structure of the ninth embodiment illustrated in FIG. 22 with respect to multiple pixels in an aspect in which the multilayer interconnection layer is not omitted.

The ninth embodiment illustrated in FIG. 22 is a pixel configuration including the isolation region 441 obtained by forming an elongated groove (trench) to a predetermined depth from the rear surface (light incident surface) side of the substrate 61 at a pixel boundary portion inside the substrate 61, and by embedding a light-shielding film in the groove.

The other configurations including the signal extraction units 65-1 and 65-2, the five layers of metal films M1 to M5 of the multilayer interconnection layer 811, and the like are similar to the configurations illustrated in FIG. 36.

Figure 39:
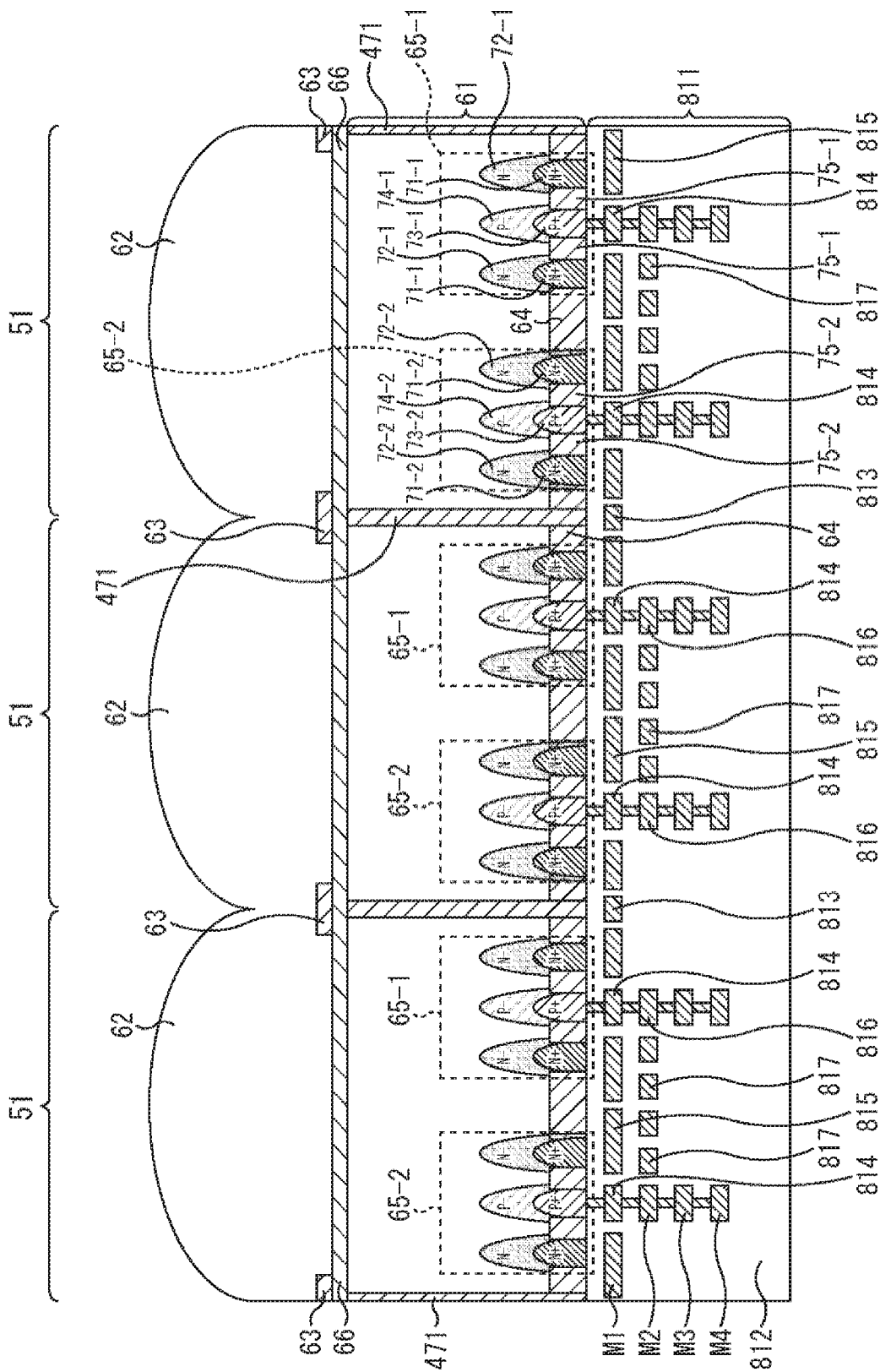
FIG. 39 is a cross-sectional view of multiple pixels in Modification Example 1 of the ninth embodiment.

Cross-Sectional Configuration of Multiple Pixels of Modification Example 1 of Ninth Embodiment FIG. 39 is a cross-sectional view illustrating a pixel structure of the Modification Example 1 of the ninth embodiment illustrated in FIG. 23 with respect to multiple pixels in an aspect in which the multilayer interconnection layer is not omitted.

The Modification Example 1 of the ninth embodiment illustrated in FIG. 23 is a pixel configuration including the isolation region 471 that penetrates through the entirety of the substrate 61 at a pixel boundary portion inside the substrate 61.

The other configurations including the signal extraction units 65-1 and 65-2, the five layers of metal films M1 to M5 of the multilayer interconnection layer 811, and the like are similar to the configurations illustrated in FIG. 36.

Cross-Sectional Configuration of Multiple Pixels of Sixteenth Embodiment

Figure 40:
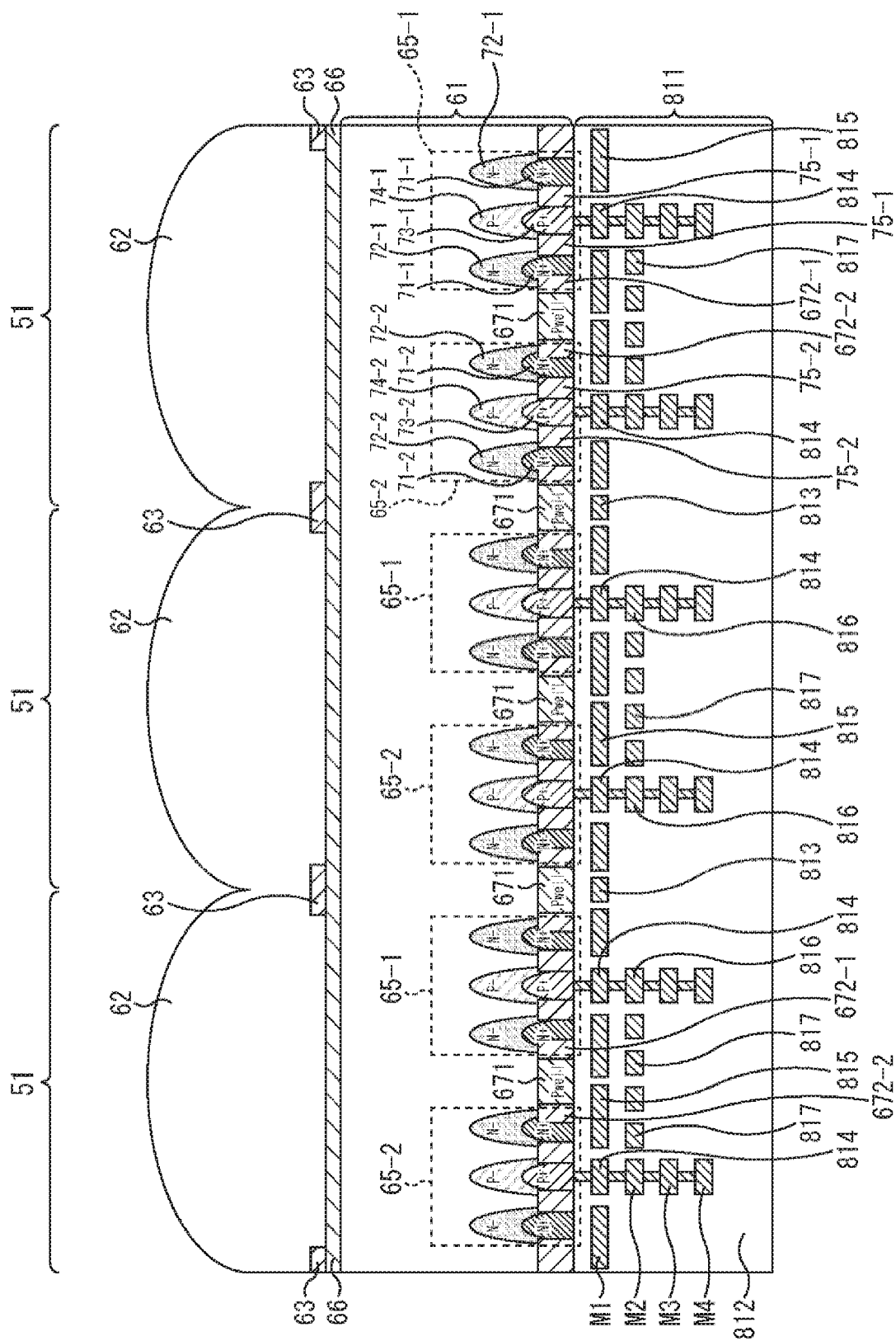
FIG. 40 is a cross-sectional view of multiple pixels in a fifteenth embodiment.

FIG. 40 is a cross-sectional view illustrating a pixel structure of the sixteenth embodiment illustrated in FIG. 29 with respect to multiple pixels in an aspect in which the multilayer interconnection layer is not omitted.

The sixteenth embodiment illustrated in FIG. 29 is a configuration including the P-well region 671 at the central portion on a surface side opposite to the light incident surface at the inside of the substrate 61, that is, on an inner side of the lower surface in the drawing. In addition, the separation portion 672-1 is formed between the P-well region 671 and the N+ semiconductor region 71-1 with an oxide film or the like. Similarly, the separation portion 672-2 is formed between the P-well region 671 and the N+ semiconductor region 71-2 with an oxide film or the like. The P-well region 671 is also formed at a pixel boundary portion a lower surface of the substrate 61.

The other configurations including the signal extraction units 65-1 and 65-2, the five layers of metal films M1 to M5 of the multilayer interconnection layer 811, and the like are similar to the configurations illustrated in FIG. 36.

Cross-Sectional Configuration of Multiple Pixels of Tenth Embodiment

Figure 41:
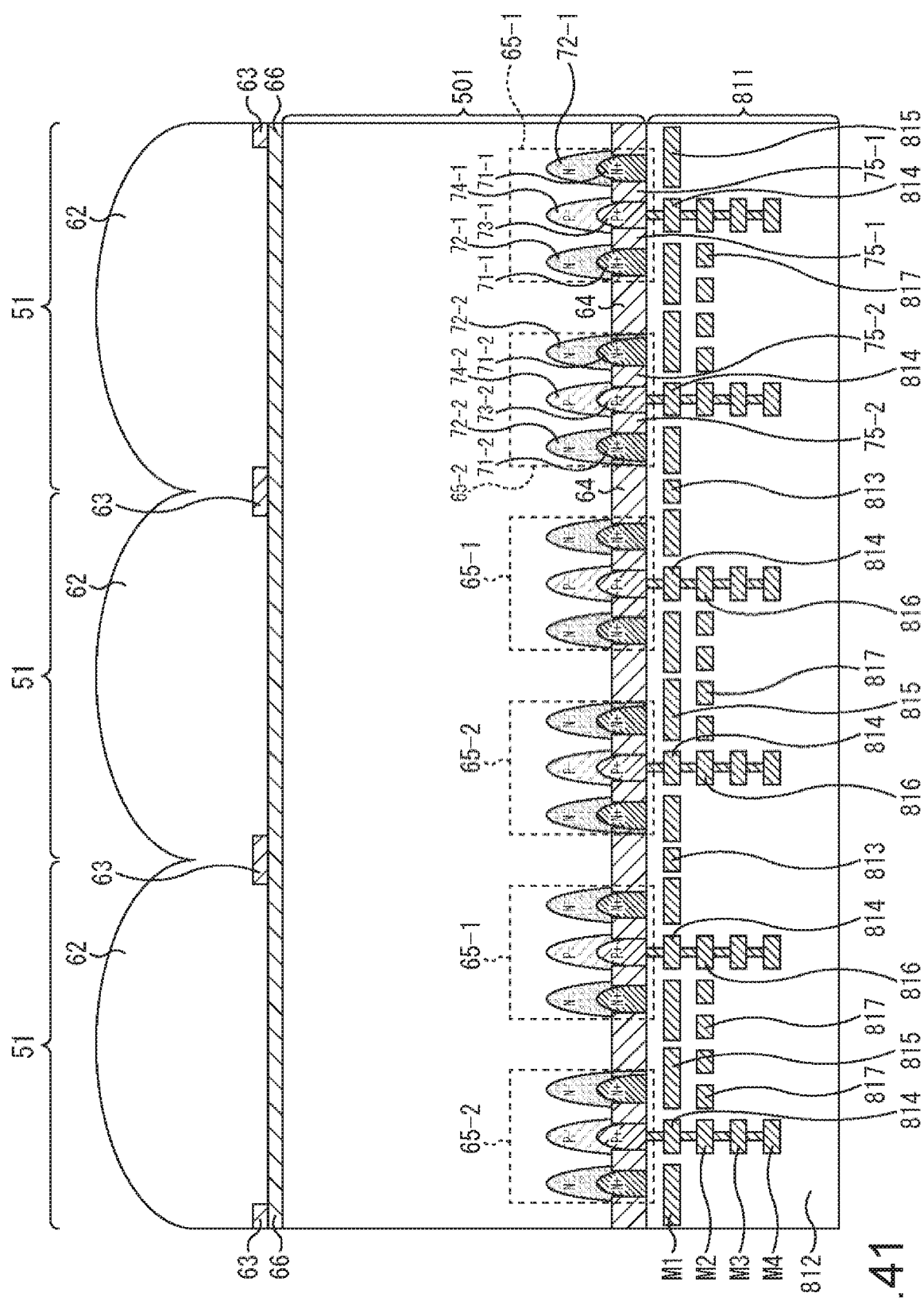
FIG. 41 is a cross-sectional view of multiple pixels in a tenth embodiment.

FIG. 41 is a cross-sectional view illustrating a pixel structure of the tenth embodiment illustrated in FIG. 24 with respect to multiple pixels in an aspect in which the multilayer interconnection layer is not omitted.

The tenth embodiment illustrated in FIG. 24 is a pixel configuration in which the substrate 501 of which a substrate thickness is larger is provided instead of the substrate 61.

The other configurations including the signal extraction units 65-1 and 65-2, the five layers of metal films M1 to M5 of the multilayer interconnection layer 811, and the like are similar to the configurations illustrated in FIG. 36.

Planar Arrangement Example of Five Layers of Metal Films M1 to M5

Next, description will be given of a planar arrangement example of the five layers of metal films M1 to M5 of the multilayer interconnection layer 811 illustrated in FIG. 36 to FIG. 41 with reference to FIGS. 42A to 42C, and FIGS. 43A and 43B.

Figure 42A:
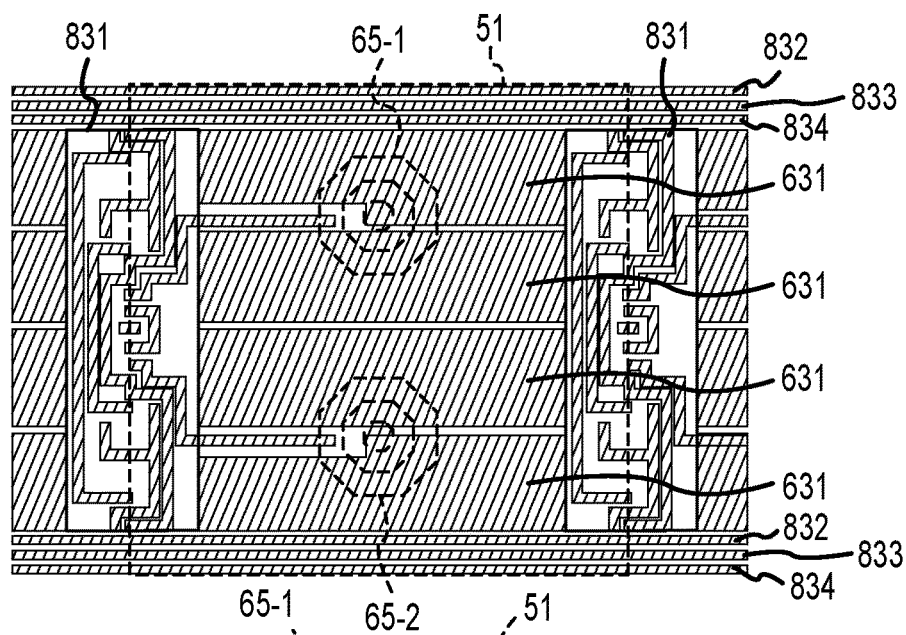
FIGS. 42A-C are views describing five-layer metal films of a multilayer interconnection layer.

FIG. 42A illustrates a planar arrangement example of the first-layer metal film M1 among the five layers of metal films M1 to M5 of the multilayer interconnection layer 811.

Figure 42B:
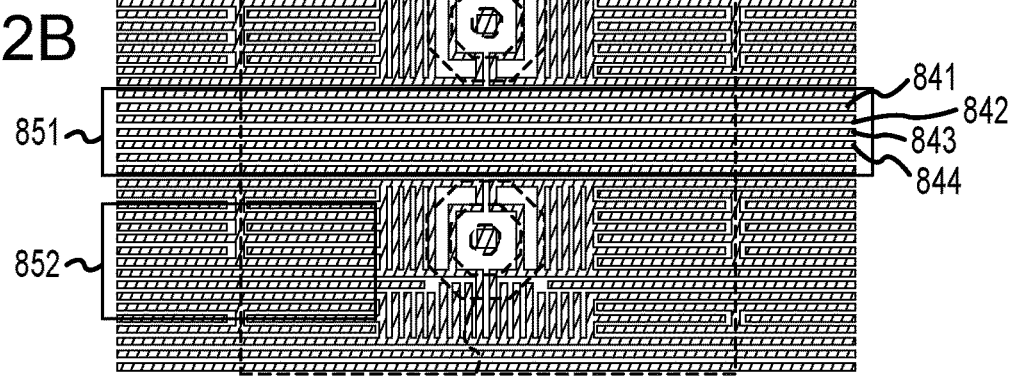

FIG. 42B illustrates a planar arrangement example of the second-layer metal film M2 among the five layers of metal films M1 to M5 of the multilayer interconnection layer 811.

Figure 42C:
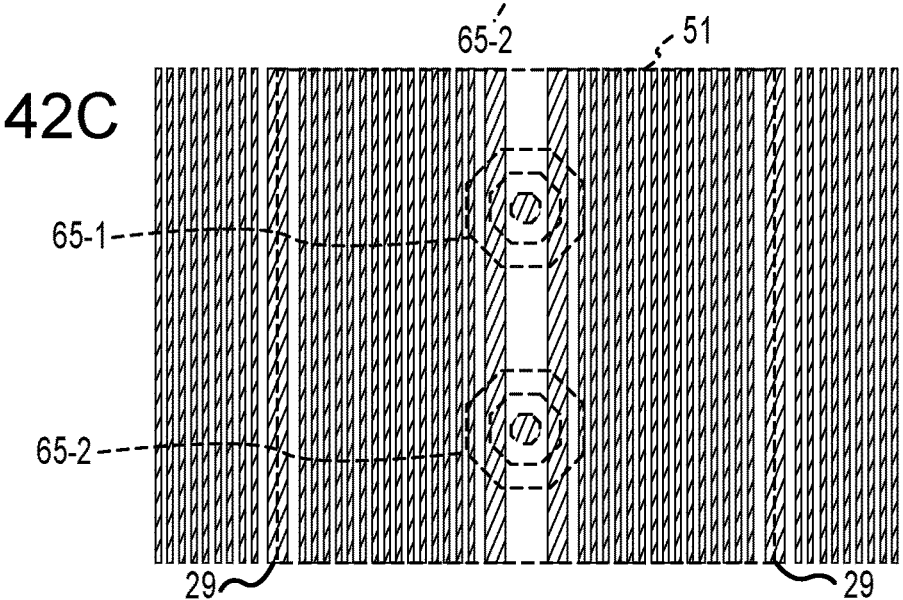

FIG. 42C illustrates a planar arrangement example of the third-layer metal film M3 among the five layers of metal films M1 to M5 of the multilayer interconnection layer 811.

Figure 43A:
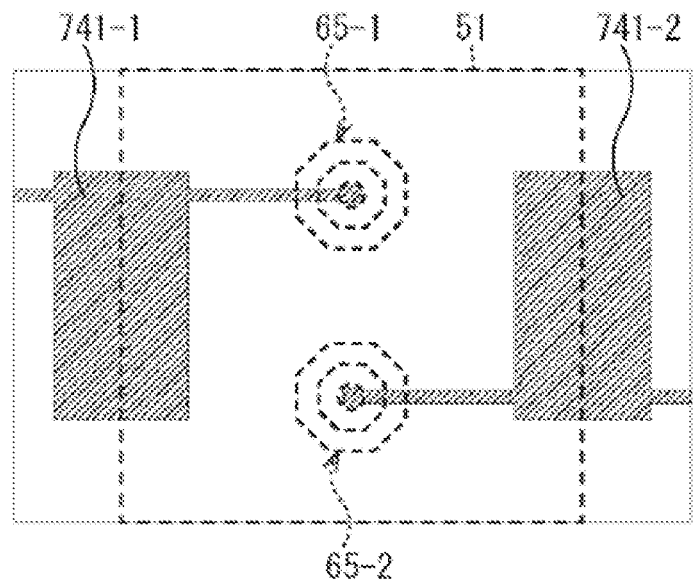
FIGS. 43A-B are views describing the five-layer metal films of the multilayer interconnection layer.

FIG. 43A illustrates a planar arrangement example of the fourth-layer metal film M4 among the five layers of metal films M1 to M5 of the multilayer interconnection layer 811.

Figure 43B:
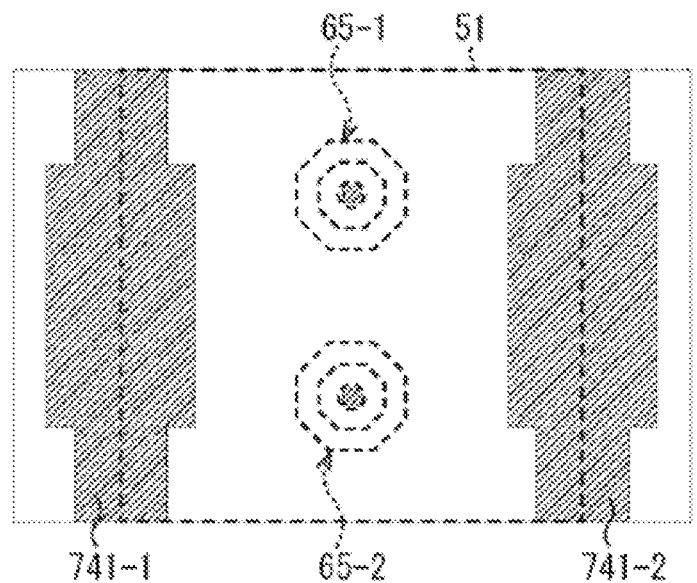

FIG. 43B illustrates a planar arrangement example of the fifth-layer metal film M5 among the five layers of metal films M1 to M5 of the multilayer interconnection layer 811.

Note that a region of the pixel 51 in FIGS. 42A to 42C and FIGS. 43A and 43B, and a region of the signal extraction units 65-1 and 65-2 which have the octagonal shape illustrated in FIG. 11 are indicated by a broken line.

In FIGS. 42A to 42C, and FIGS. 43A and 43B, a vertical direction in the drawing is a vertical direction of the pixel array unit 20, and a horizontal direction in the drawing is a horizontal direction of the pixel array unit 20.

In the first-layer metal film M1 of the multilayer interconnection layer 811, as illustrated in FIG. 42A, the reflection member 631 that reflects infrared light is formed. In a region of the pixel 51, two sheets of the reflection members 631 are formed with respect to each of the signal extraction units 65-1 and 65-2, and the two sheets of reflection member 631 of the signal extraction unit 65-1 and the two sheets of reflection members 631 of the signal extraction unit 65-1 are formed in symmetry in the vertical direction.

In addition, in the horizontal direction, a pixel transistor interconnection region 831 is disposed between the reflection members 631 of adjacent pixels 51. In the pixel transistor interconnection region 831, an interconnection that connects pixel transistors Tr of the transfer transistor 721, the reset transistor 723, the amplification transistor 724, or the selection transistor 725 is formed. The interconnections for the pixel transistor Tr are formed in symmetry in the vertical direction on the basis of an intermediate line (not illustrated) of two pieces of the signal extraction unit 65-1 and 65-2.

In addition, interconnections such as a ground line 832, a power supply line 833, and a ground line 834 are formed between the reflection members 631 of the adjacent pixels 51. The interconnections are formed in symmetry in the vertical direction on the basis of the central line of the two pieces of signal extraction units 65-1 and 65-2.

As described above, in the first-layer metal film M1, since a region on the signal extraction unit 65-1 side and a region on the signal extraction unit 65-2 side at the inside of the pixel are disposed in symmetry, an interconnection load is adjusted evenly between the signal extraction units 65-1 and 65-2. Accordingly, a drive variation of the signal extraction units 65-1 and 65-2 is reduced.

In the first-layer metal film M1, since the large-area reflection member 631 is formed on a lower side of the signal extraction units 65-1 and 65-2 formed in the substrate 61, infrared light, which is incident into the substrate 61 through the on-chip lens 62 and is transmitted through the substrate 61 without being photoelectrically converted in the substrate 61, is reflected by the reflection member 631 and is caused to be incident into the substrate 61 again. Accordingly, it is possible to increase the amount of infrared light that is photoelectrically converted at the inside of the substrate 61, and thus it is possible to improve quantum efficiency (QE), that is, sensitivity of the pixel 51 with respect to infrared light.

Meanwhile, in the first-layer metal film M1, in a case where the light-shielding member 631' is disposed in the same region as in the reflection member 631 instead of the reflection member 631, it is possible to suppress infrared light, which is incident into the substrate 61 from the light incident surface through the on-chip lens 62 and is transmitted through the substrate 61 without being photoelectrically converted at the inside of the substrate 61, from being scattered in the interconnection layer and being incident to nearby pixels. Accordingly, it is possible to prevent light from being erroneously detected in the nearby pixels.

In the second-layer metal film M2 of the multilayer interconnection layer 811, as illustrated in FIG. 42B, a control line region 851 in which control lines 841 to 844 which transfer a predetermined signal in a horizontal direction, and the like are formed is disposed at a position between the signal extraction units 65-1 and 65-2. For example, the control lines 841 to 844 are lines which transfer the drive signal TRG, the drive signal RST, the selection signal SEL, or the drive signal FDG.

When the control line region 851 is disposed between the two pieces of signal extraction units 65, an influence on each of the signal extraction units 65-1 and 65-2 becomes even, and thus it is possible to reduce a drive variation between the signal extraction units 65-1 and 65-2.

In addition, a capacitor region 852 in which the FD 722B or the additional capacitor 727A is formed is disposed in a predetermined region different from the control line region 851 of the second-layer metal film M2. In the capacitor region 852, the metal film M2 is patterned and formed in a comb-tooth shape to construct the FD 722B or the additional capacitor 727A.

When the FD 722B or the additional capacitor 727A is disposed in the second-layer metal film M2, it is possible to freely dispose a pattern of the FD 722B or the additional capacitor 727A in correspondence with a desired interconnection capacity in design, and thus it is possible to improve the degree of freedom in design.

In the third-layer metal film M3 of the multilayer interconnection layer 811, as illustrated in FIG. 42C, at least the vertical signal line 29 that transfers pixel signal output from each pixel 51 to the column processing unit 23 is formed. Three or more pieces of the vertical signal lines 29 may be disposed with respect to one pixel column to improve a read-out speed of pixel signals. In addition, in addition to the vertical signal line 29, a shield interconnection may be disposed to reduce coupling capacitance.

In the fourth-layer metal film M4 and the fifth-layer metal film M5 of the multilayer interconnection layer 811, the voltage supply lines 741-1 and 741-2, which apply the predetermined voltage MIX0 or MIX1 to the P+ semiconductor regions 73-1 and 73-2 of the signal extraction unit 65 in the pixel 51, are formed.

The metal film M4 and metal film M5 illustrated in FIGS. 43A and 43B represent an example in the case of employing the voltage supply line 741 in the first arrangement example illustrated in FIG. 33A.

The voltage supply line 741-1 of the metal film M4 is connected to the voltage application interconnection 814 (for example, FIG. 36) of the metal film M1 through the metal films M3 and M2, and the voltage application interconnection 814 is connected to the P+ semiconductor region 73-1 of the signal extraction unit 65-1 of the pixel 51. Similarly, the voltage supply line 741-2 of the metal film M4 is connected the voltage application interconnection 814 (for example, FIG. 36) of the metal film M1 through the metal films M3 and M2, and the voltage application interconnection 814 is connected to the P+ semiconductor region 73-2 of the signal extraction unit 65-2 of the pixel 51.

The voltage supply lines 741-1 and 741-2 of the metal film M5 are connected to the tap drive unit 21 at the periphery of the pixel array unit 20. The voltage supply line 741-1 of the metal film M4 and the voltage supply line 741-1 of the metal film M5 are connected to each other by a via (not illustrated) or the like at a predetermined position in a planar region at which both of the metal films exist. The predetermined voltage MIX0 or MIX1 from the tap drive unit 21 is supplied to the voltage supply lines 741-1 and 741-2 of the metal film M4 after being transferred through the voltage supply lines 741-1 and 741-2 of the metal film M5 and is supplied from the voltage supply lines 741-1 and 741-2 to the voltage application interconnection 814 of the metal film M1 through the metal films M3 and M2.

When the light-receiving element 1 is set as the back-illuminated type CAPD sensor, for example, as illustrated in FIG. 43A and FIG. 43B, for example, it is possible to wire the voltage supply lines 741-1 and 741-2 for applying the predetermined voltage MIX0 or MIX1 to the signal extraction unit 65 of the pixel 51 in the vertical direction, that is, it is possible to freely design a wiring width and a layout of drive interconnections. In addition, it is possible to realize wiring suitable for a high-speed drive or wiring in consideration of load reduction.

Planar Arrangement Example of Pixel Transistor

Figure 44A:
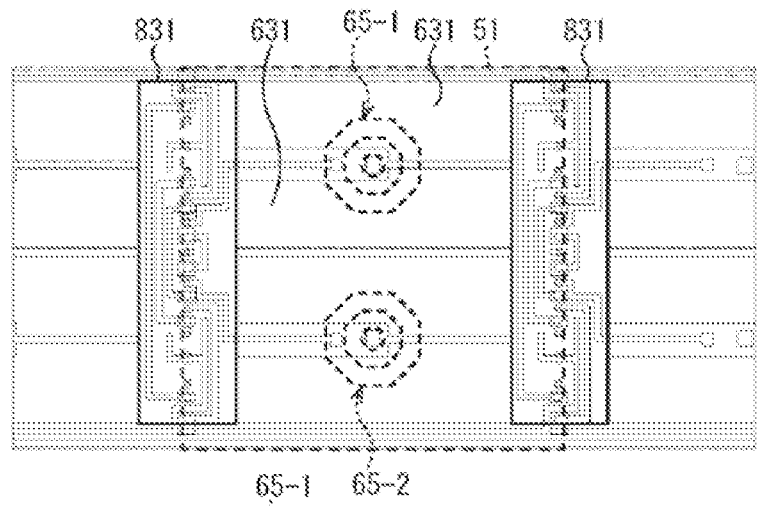
FIG. 44a-C are views describing a polysilicon layer.
Figure 44B:
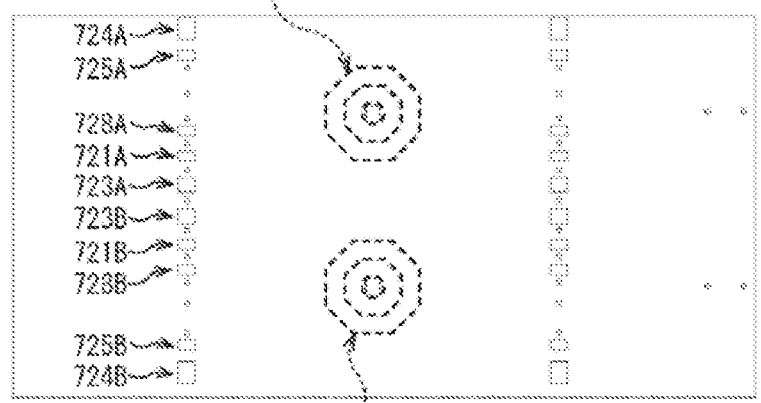
Figure 44C:
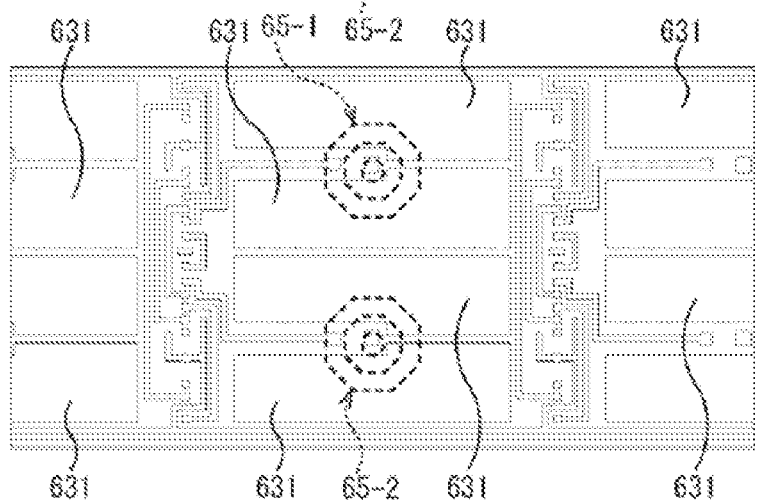

FIGS. 44A to 44C are plan views illustrating an overlapping structure between the first-layer metal film M1 illustrated in FIG. 42A, and a polysilicon layer which is formed on the metal film M1 and in which a gate electrode of the pixel transistor Tr and the like are formed.

FIG. 44A is a plan view obtained by overlapping the metal film M1 in FIG. 44C and the polysilicon layer in FIG. 44B, FIG. 44B is a plan view of only the polysilicon layer, and FIG. 44C is a plan view of only the metal film M1. The plan view of the metal film M1 in FIG. 44C is the same as the plan view illustrated in FIG. 42A, but hatching is omitted.

As described above with reference to FIG. 42A, the pixel transistor interconnection region 831 is formed between the reflection members 631 of respective pixels.

The pixel transistor Tr corresponding to each of the signal extraction units 65-1 and 65-2 is formed in the pixel transistor interconnection region 831, for example, as illustrated in FIG. 44B.

In FIG. 44B, on the basis of an intermediate line (not illustrated) of two pieces of the signal extraction units 65-1 and 65-2, gate electrodes of the reset transistors 723A and 723B, the transfer transistors 721A and 721B, the switching transistors 728A and 728B, the selection transistors 725A and 725B, and the amplification transistors 724A and 724B are formed in this order from a side closer to the intermediate line.

Interconnection which connect pixel transistors Tr of the metal film M1 illustrated in FIG. 44C are formed in symmetry in the vertical direction on the basis of the intermediate line (not illustrated) of the two pieces of signal extraction units 65-1 and 65-2.

As described above, multiple pixel transistors Tr inside the pixel transistor interconnection region 831 are disposed in a region on the signal extraction unit 65-1 side and a region on the signal extraction unit 65-2 side in a symmetrical manner. Accordingly, it is possible to reduce a drive variation of the signal extraction units 65-1 and 65-2.

Modification Example of Reflection Member 631

Next, a modification example of the reflection member 631 formed in the metal film M1 will be described with reference to FIGS. 45A to 45C and FIGS. 46A and 46B.

In the above-described example, as illustrated in FIG. 42A, the large-area reflection member 631 is disposed in a region at the periphery of the signal extraction unit 65 inside the pixel 51.

Figure 45A:
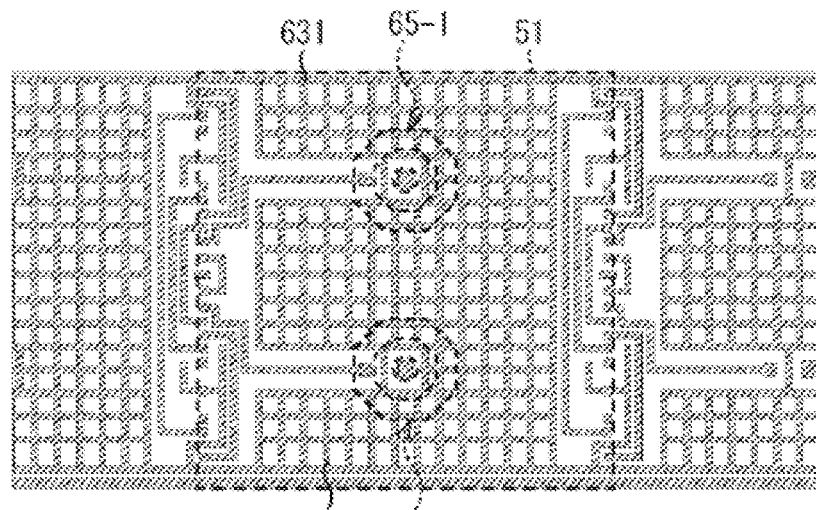
FIG. 45A-C are views illustrating a modification example of a reflection member that is formed on a metal film.

In contrast, for example, as illustrated in FIG. 45A, the reflection member 631 may be disposed in a lattice-shaped pattern. In this manner, when the reflection member 631 is formed in the lattice-shaped pattern, it is possible to remove pattern anisotropy, and it is possible to reduce XY anisotropy in reflection capability. In other words, when the reflection member 631 is formed in the lattice-shaped pattern, reflection of incident light to a partial biased region is reduced, and incident light is likely to be equally reflected. Accordingly, distance measurement accuracy is improved.

Figure 45B:
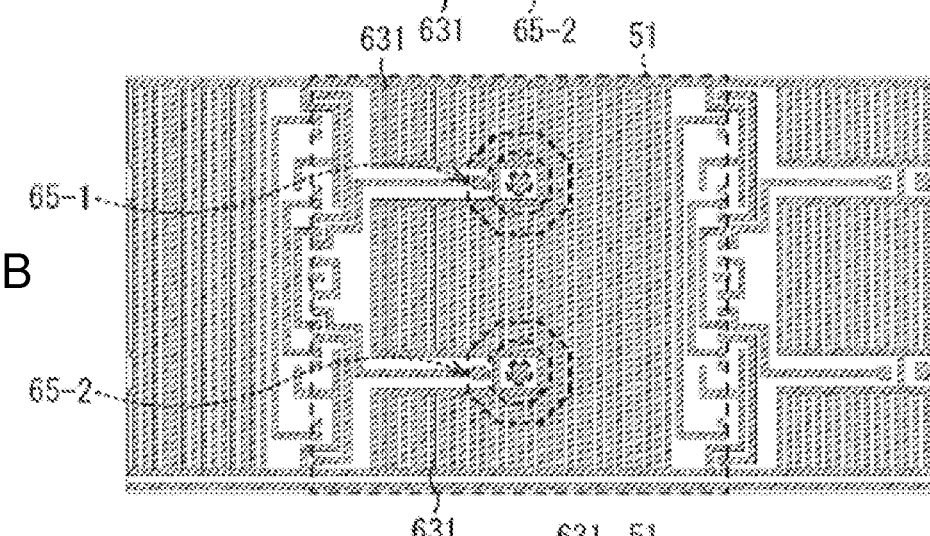

Alternatively, for example, as illustrated in FIG. 45B, the reflection member 631 may be disposed in a stripe-shaped pattern. In this manner, when the reflection member 631 is formed in the stripe-shaped pattern, the pattern of the reflection member 631 may be used as an interconnection capacitor, and thus it is possible to realize a configuration in which a dynamic range is expanded to the maximum.

Note that FIG. 45B illustrates an example of a vertical stripe shape, but a horizontal stripe shape is also possible.

Figure 45C:
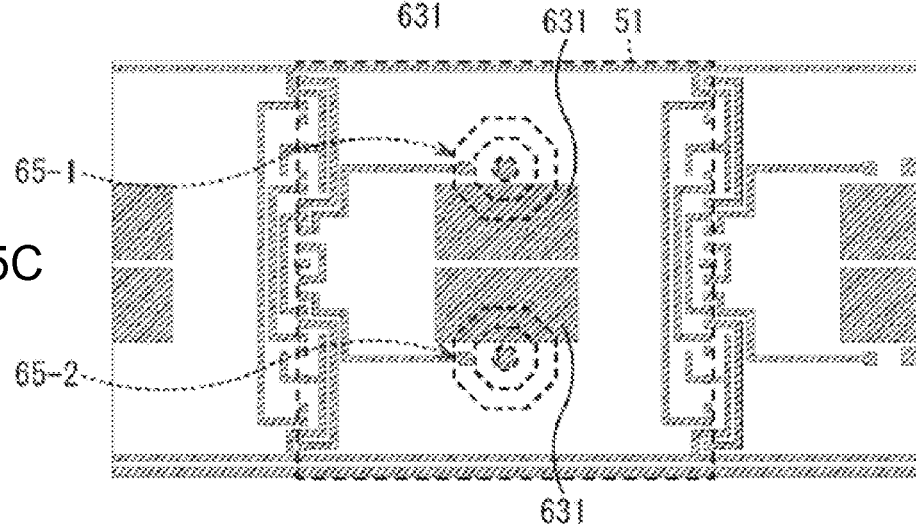

Alternatively, for example, as illustrated in FIG. 45C, the reflection member 631 may be disposed only in a pixel central region, more specifically, only between the two pieces of signal extraction units 65. In this manner, when the reflection member 631 is formed in the pixel central region, and is not formed at a pixel end, it is possible to suppress components which are reflected to adjacent pixels in a case where oblique light is incident while obtaining a sensitivity improving effect due to the reflection member 631 with respect to the pixel central region, and thus it is possible to realize a configuration in which suppression of cross-talk is emphasized.

Figure 46A:
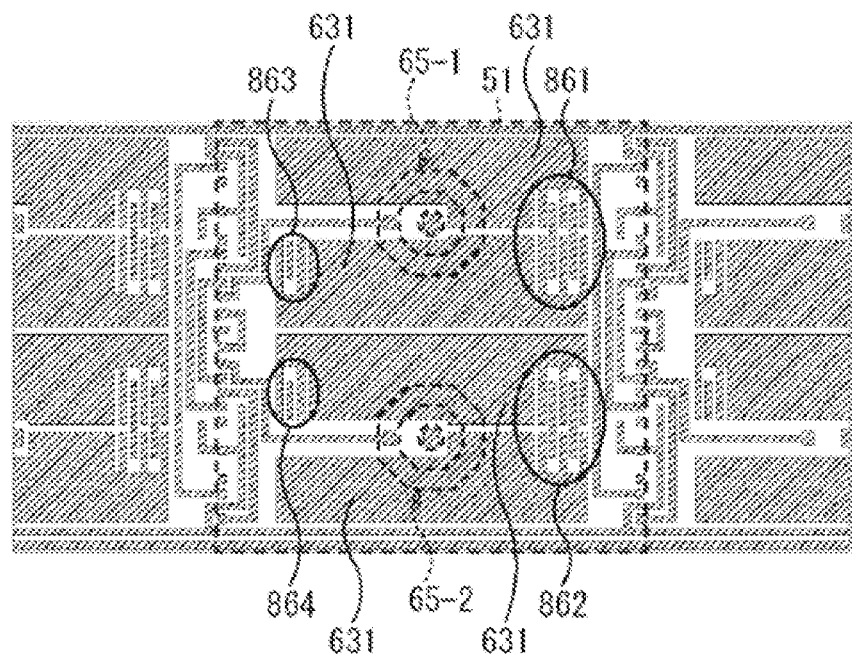
FIGS. 46A-B are views illustrating a modification example of the reflection member that is formed on the metal film.

In addition, for example, as illustrated in FIG. 46A, when a part of the reflection member 631 is pattern-disposed in a comb-tooth shape, a part of the metal film M1 may be allocated to interconnection capacitance of the FD 722 or the additional capacitor 727. In FIG. 46A, comb-teeth shapes inside regions 861 to 864 surrounded by a solid line constitute at least a part of the FD 722 or the additional capacitor 727. The FD 722 or the additional capacitor 727 may be disposed to be appropriately distributed to the metal film M1 and the metal film M2. A pattern of the metal film M1 can be disposed for the reflection member 631, and capacitance of the FD 722 or the additional capacitor 727 with valance.

Figure 46B:
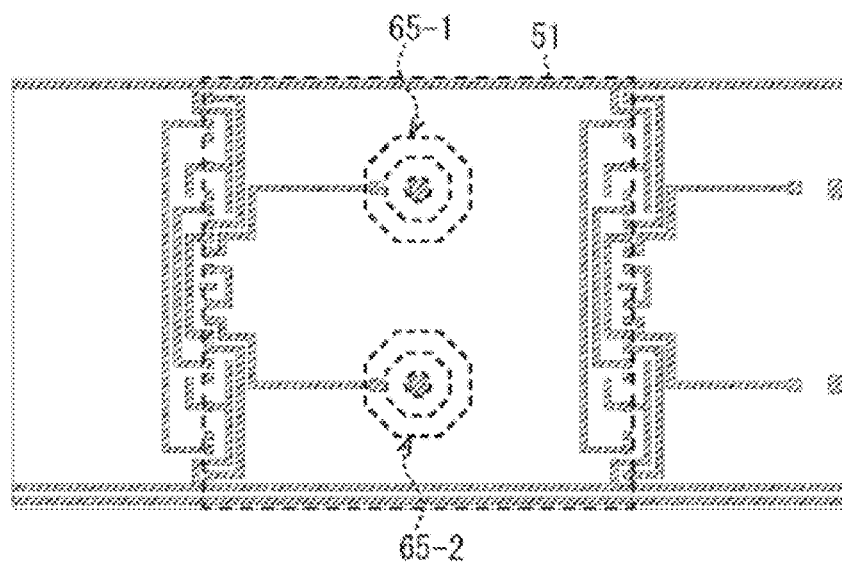

FIG. 46B illustrates a pattern of the metal film M1 in a case where the reflection member 631 is not disposed. It is desirable to dispose the reflection member 631 to increase the amount of infrared light that is photoelectrically converted at the inside of the substrate 61 and to improve sensitivity of the pixel 51, but it is also possible to employ a configuration in which the reflection member 631 is not disposed.

The arrangement example of the reflection member 631 illustrated in FIGS. 45A to 45C and FIGS. 46A and 46B is also applicable to the light-shielding member 631' in a similar manner.

Substrate Configuration Example of
Light-Receiving Element

Figure 47A:
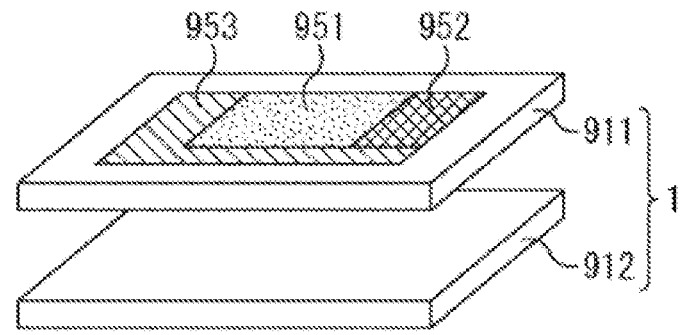
FIGS. 47A-C are views describing a substrate configuration of the light-receiving element.
Figure 47B:
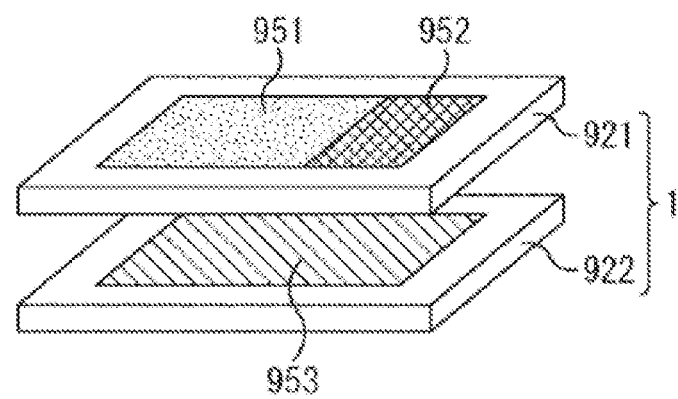
Figure 47C:
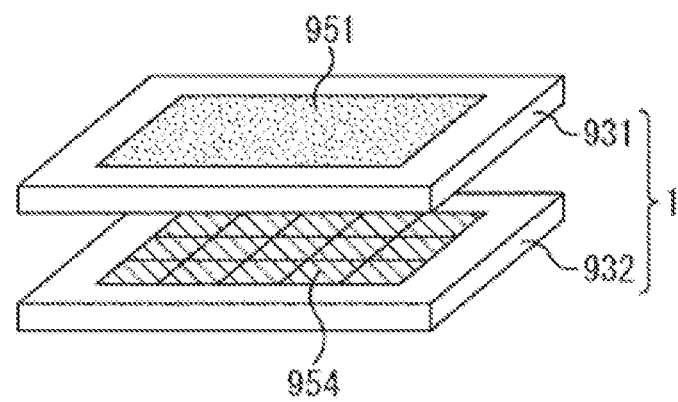

The light-receiving element 1 in FIG. 1 can employ a substrate configuration in any one of FIG. 47A to FIG. 47C.

FIG. 47A illustrates an example in which the light-receiving element 1 is constituted by one sheet of semiconductor substrate 911 and a support substrate 912 located on a lower side of the semiconductor substrate 911.

In this case, a pixel array region 951 corresponding to the pixel array unit 20, a control circuit 952 that controls respective pixels of the pixel array region 951, and a logic circuit 953 including a signal processing circuit that processes pixel signals are formed in the semiconductor substrate 911 on an upper side.

The tap drive unit 21, the vertical drive unit 22, the horizontal drive unit 24, and the like are included in the control circuit 952. The column processing unit 23 that performs AD conversion processing of pixel signals, and the signal processing unit 31 that performs distance calculation processing of calculating a distance from a ratio of pixel signals acquired from two or more pieces of signal extraction units 65 inside a pixel, calibration processing, and the like are included in the logic circuit 953.

Alternatively, as illustrated in FIG. 47B, the light-receiving element 1 may be set to a configuration in which a first semiconductor substrate 921 in which the pixel array region 951 and the control circuit 952 are formed and a second semiconductor substrate 922 in which the logic circuit 953 is formed are laminated. Note that the first semiconductor substrate 921 and the second semiconductor substrate 922 are electrically connected to each other, for example, by a through-via or a metallic bond of Cu—Cu.

Alternatively, as illustrated in FIG. 47C, the light-receiving element 1 may be set to a lamination structure of a first semiconductor substrate 931 in which only the pixel array region 951 is formed, and a second semiconductor substrate 932 in which an area control circuit 954 including a control circuit that controls each pixel and a signal processing circuit that processes pixel signals, the control circuit and the signal processing circuit being provided in a one-pixel unit or an area unit of multiple pixels. The first semiconductor substrate 931 and the second semiconductor substrate 932 are electrically connected to each other, for example, by a through-via or a metallic bond of Cu—Cu.

As in the light-receiving element 1 in FIG. 47C, according to the configuration in which the control circuit and the signal processing circuit are provided in the one-pixel unit or the area unit, it is possible to set an optimal drive timing or gain for every division control unit, and it is possible to acquire optimized distance information regardless of a distance or a reflectance. In addition, it is possible to calculate distance information by driving only a partial region instead of the entirety of the pixel array region 951, and thus it is also possible to suppress power consumption in correspondence with an operation mode.

Eighteenth Embodiment

Configuration Example of Pixel

Next, other embodiments other than the above-mentioned first to seventeenth embodiments will be described.

In the thirteenth embodiment, the example in which one of the two signal extraction unit 65 provided in the pixel 51 is used as an active tap, the other is used as an inactive tap, and a negative bias is applied to the light incident surface of the substrate 61 has been described with reference to FIG. 27.

In this case, since the electric field is enhanced due to application of the negative bias, it is possible to improve electron extraction efficiency. Meanwhile, by making the P+ semiconductor region 73 of the signal extraction unit 65 that is not used as an active tap in the pixel 51 be in a floating state instead of applying a voltage thereto, power consumption can be reduced.

Figure 48:
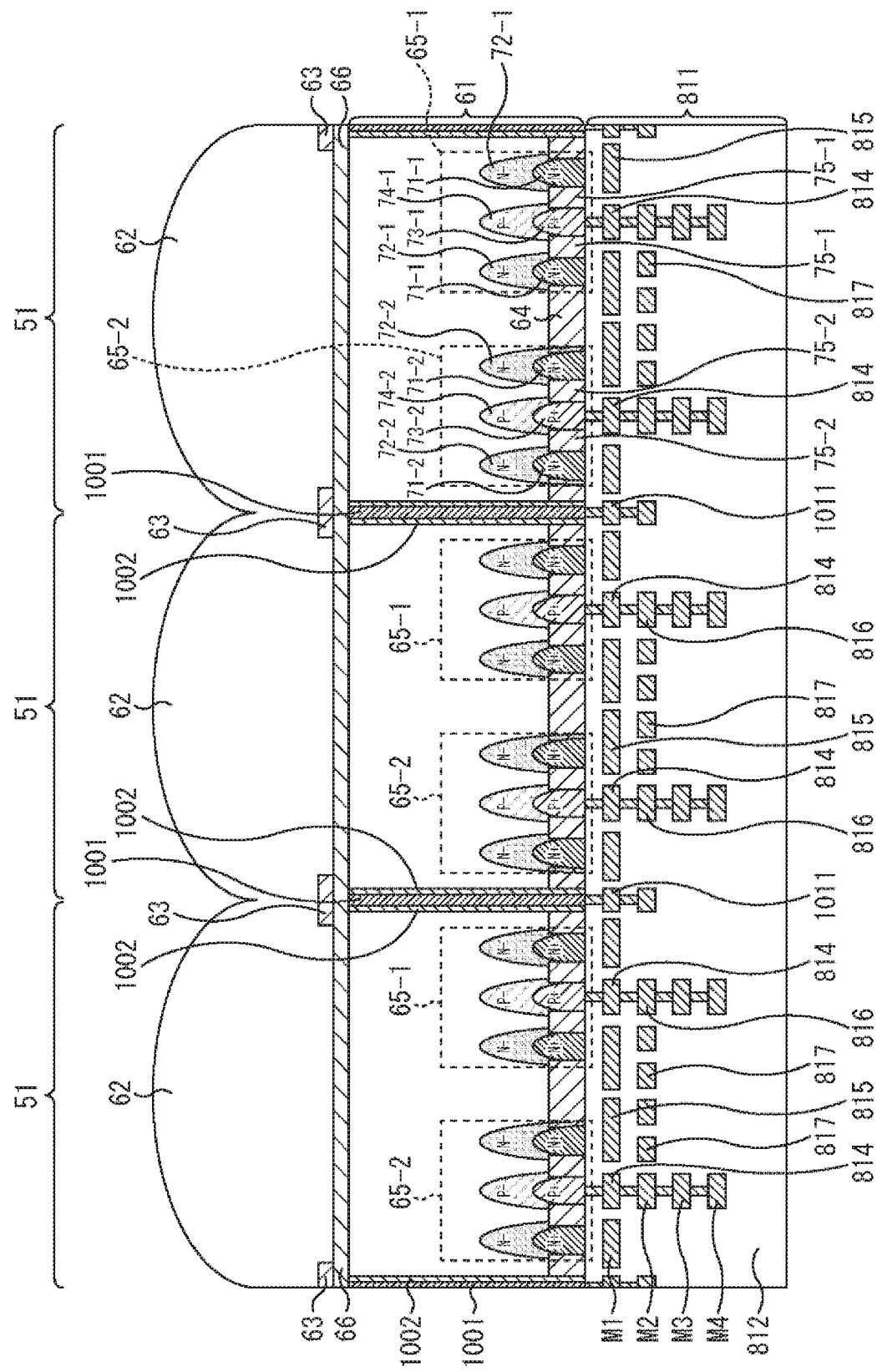
FIG. 48 is a cross-sectional view of the multiple pixels.

In such a case, the configuration of the cross section of the pixels 51 is as illustrated in FIG. 48, for example.

FIG. 48 is a cross-sectional view of the multiple pixels corresponding to the B-B' line in FIG. 11, similarly to the above-mentioned FIG. 36 and the like.

Note that in FIG. 48, the same reference symbol will be given to a portion corresponding to FIG. 36, and description thereof will be appropriately omitted.

When comparing the configuration of the pixels 51 illustrated in FIG. 48 with the configuration of the pixels 51 illustrated in FIG. 36, in the pixels 51 illustrated in FIG. 48, a penetrating electrode 1001 that penetrates the substrate 61 that is a P-type semiconductor layer and isolates the adjacent pixels 51 and an insulation film 1002 that covers the outer periphery (side wall) of the penetrating electrode 1001 are newly formed at the boundary of the adjacent pixels 51 (pixel boundary).

The penetrating electrode 1001 is formed of a metal material such as tungsten (W), aluminum (Al), and copper (Cu), polysilicon, or the like. The insulation film 1002 is formed of, for example, an oxide film (SiO2).

The penetrating electrode 1001 is formed at the boundary portion of the pixels 51, and functions as a pixel isolation unit that isolates the semiconductor layer (substrate 61) of the pixels 51 adjacent to each other. Note that it can also be regarded that a pixel isolation unit is constituted by the penetrating electrode 1001 and the insulation film 1002 including the insulation film 1002 of the outer periphery portion constitute.

The penetrating electrode 1001 is electrically connected to a voltage application interconnection 1011 of the metal film M1 that is a metal film of the multilayer interconnection layer 811 closest to the substrate 61. A predetermined bias (voltage) is applied to the penetrating electrode 1001 through the voltage application interconnection 1011.

Here, the bias to be applied to the penetrating electrode 1001 is a voltage different from the voltage to be applied to the P+ semiconductor region 73 of the signal extraction unit 65 used as an active tap. More specifically, the bias to be applied to the penetrating electrode 1001 is, for example, a voltage of 0 V or less, i.e., a negative bias. It can be said that the penetrating electrode 1001 to which a negative bias is to be applied in this way functions as a voltage application unit.

The penetrating electrode 1001 and the insulation film 1002 can be formed by forming a trench from the front surface side or back surface side of the substrate 61 to the substrate surface on the opposite side by dry etching or the like, forming the insulation film 1002, and then embedding polysilicon or a metal material to be the penetrating electrode 1001.

By providing the penetrating electrode 1001 that penetrates he substrate 61 in this way, the electric field in the direction parallel to the surface of the substrate 61 can be enhanced.

Further, in the pixels 51 illustrated in FIG. 48, the two signal extraction units 65 are alternately used as an active tap during a period in which charges generated by photoelectric conversion in the substrate 61 are accumulated. Then, while one of the signal extraction units 65 in the pixel 51 is used as an active tap, the P+ semiconductor region 73 of the other signal extraction unit 65 is in a floating state.

With this, in the substrate 61, a current corresponding to the negative bias using the penetrating electrode 1001 flows, but a current caused by a potential difference between one signal extraction unit 65 used as an active tap and the other signal extraction unit 65 does not flow.

Accordingly, it is possible to reduce the amount of currents (total amount of hall currents) generated in the substrate 61 as compared with the case where a voltage of 0 V or the like is applied to the P+ semiconductor region 73 of one signal extraction unit 65 when the other signal extraction unit 65 is used as an active tap. As a result, it is possible to reduce power consumption in the substrate 61.

In addition, in the case where the signal extraction unit 65 that is not an active tap is in a floating state, it is possible to improve the transfer efficiency of charges (electrons) and perform distance detection with high accuracy as compared with the case where a voltage of 0 V or the like is applied to the signal extraction unit 65 that is not an active tap. In other words, it is possible to improve the characteristics of the CAPD sensor. This is because the electric field is not generated between the two signal extraction units 65 when the signal extraction unit 65 that is not an active tap is in a floating state, and thus, the path of charges (electros) that moves toward the N+ semiconductor region 71 of the signal extraction unit 65 used as an active tap becomes shorter.

Equivalent Circuit Configuration Example of Pixel

Figure 49:
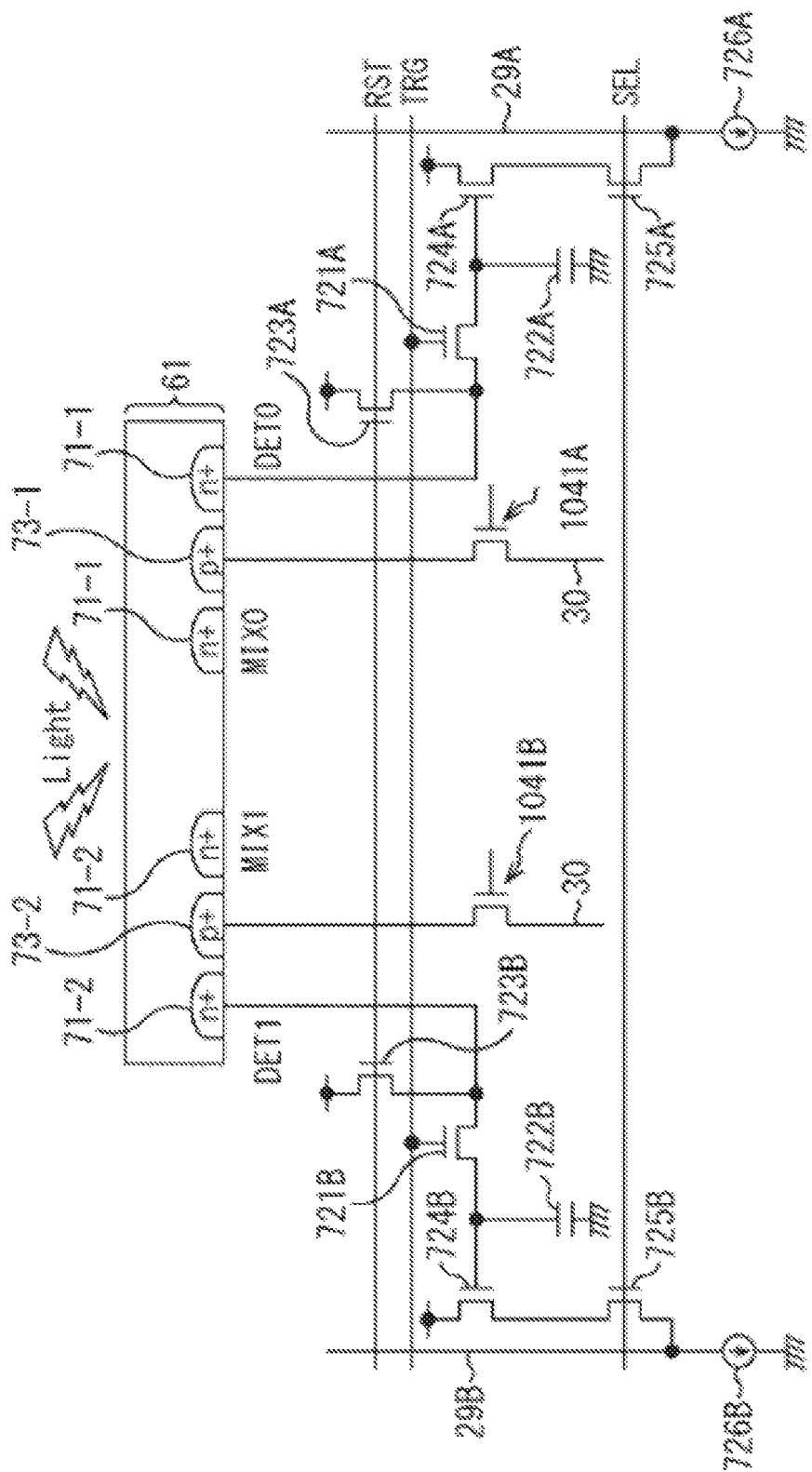
FIG. 49 is a view illustrating the equivalent circuit of the pixel.

In the case where the signal extraction unit 65 that is not an active tap is in a floating state as described above, the equivalent circuit of the pixel 51 is as illustrated in FIG. 49. Note that in FIG. 49, the same reference symbol will be given to a portion corresponding to FIG. 1 or FIG. 31, and description thereof will be appropriately omitted.

The configuration of the equivalent circuit of the pixel 51 illustrated in FIG. 49 is obtained by newly providing a transistor 1041A and a transistor 1041B to the configuration of the equivalent circuit of the pixel 51 illustrated in FIG. 31.

In the example illustrated in FIG. 49, the transistor 1041A is provided between the P+ semiconductor region 73-1 and the voltage supply line 30, and the transistor 1041B is provided between the P+ semiconductor region 73-2 and the voltage supply line 30.

In more detail, for example, the voltage application interconnection 814 and the voltage application interconnection 816 illustrated in FIG. 48 are provided between the P+ semiconductor region 73-1 and the transistor 1041A. Similarly, for example, the voltage application interconnection 814 and the voltage application interconnection 816 are provided also between the P+ semiconductor region 73-2 and the transistor 1041B.

Note that hereinafter, in a case where it is not particularly necessary to distinguish the transistor 1041A and the transistor 1041B with each other, they are also referred to simply as the transistor 1041.

The transistor 1041A and the transistor 1041B are controlled by the tap drive unit 21 and function as switches.

That is, the tap drive unit 21 is capable of applying a desired voltage of 1.5 V, 0 V, or the like to the P+ semiconductor region 73 by making the drive signal (voltage) to be supplied to the gate electrode of the transistor 1041 be in the active state to make the transistor 1041 be in an on-state (conductive state).

Meanwhile, the tap drive unit 21 electrically disconnects the P+ semiconductor region 73 from the voltage supply line 30 by making the drive signal(voltage) to be supplied to the gate electrode of the transistor 1041 be in a non-active state to make the transistor 1041 be in an off-state (non-conductive state). This causes the P+ semiconductor region 73 to be in a floating state.

Note that driving of turning on and off the transistor 1041 may be performed by the vertical drive unit 22 instead of the tap drive unit 21.

Example of Driving Pixels

Next, an example of driving the pixels 51 illustrated in FIG. 48 will be described.

Figure 50:
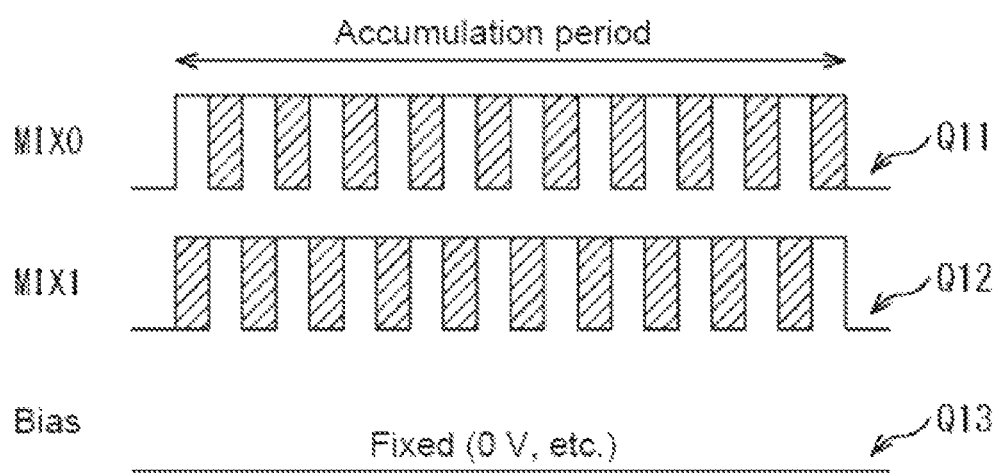
FIG. 50 is a view describing drive of the signal extraction unit.

The tap drive unit 21 controls driving of the signal extraction unit 65 during the accumulation period of charges generated by photoelectric conversion in the substrate 61 as illustrated in FIG. 50, for example.

In FIG. 50, the voltage MIX0 to be applied to the P+ semiconductor region 73-1 of the signal extraction unit 65-1 is illustrated in the part shown by an arrow Q11 and the voltage MIX1 to be applied to the P+ semiconductor region 73-2 of the signal extraction unit 65-2 is illustrated in the part shown by an arrow Q12. In particular, shaded parts in the voltage MIX0 and the voltage MIX1 respectively shown by the arrow Q11 and the arrow Q12 indicate being in a floating state.

Further, the voltage to be applied to the penetrating electrode 1001 that is a voltage application unit, i.e., bias to be applied to the light incident surface (back surface), is illustrated in a part shown by an arrow Q13.

In this example, a constant fixed voltage of 0 V or less, i.e., a fixed negative bias, is continuously applied to the penetrating electrode 1001 that is a voltage application unit as illustrated in the arrow Q13.

Meanwhile, in the P+ semiconductor region 73-1, for example, the state where a positive voltage of 1.5 V or the like is applied to the P+ semiconductor region 73-1 as the voltage MIX0 and the floating state are alternately repeated.

Specifically, the tap drive unit 21 makes the transistor 1041A be in an on-state to apply a positive voltage of 1.5 V or the like to the P+ semiconductor region 73-1 at the timing when the signal extraction unit 65-1 is used as an active tap. Further, the tap drive unit 21 makes the transistor 1041A in an off-state to make the P+ semiconductor region 73-1 be in a floating state at the timing when the signal extraction unit 65-1 is not used as an active tap.

Similarly, in the P+ semiconductor region 73-2, for example, the state where a positive voltage of 1.5 V or the like is applied to the P+ semiconductor region 73-2 as the voltage MIX1 and the floating state are alternately repeated.

In particular, the tap drive unit 21 makes the P+ semiconductor region 73-2 be in a floating state when a positive voltage is applied to the P+ semiconductor region 73-1, and makes the P+ semiconductor region 73-1 be in a floating state when a positive voltage is applied to the P+ semiconductor region 73-2. It can be said that such a tap drive unit 21 functions as a voltage control unit that controls application of a voltage to the P+ semiconductor region 73.

In addition, the tap drive unit 21 may be capable of switching a floating mode and a normal mode as appropriate.

Here, the floating mode is a mode in which the P+ semiconductor region 73 of the signal extraction unit 65 that is not an active tap is made in a floating state as described with reference to FIG. 50.

That is, in the floating mode, a voltage of 1.5 V or the like is applied to the P+ semiconductor region 73 of the signal extraction unit 65 that is used as an active tap, the P+ semiconductor region 73 of the signal extraction unit 65 that is not used as an active tap is made in a floating state, and a negative bias is applied to the penetrating electrode 1001.

Further, the normal mode is a mode in which the P+ semiconductor region 73 of the signal extraction unit 65 that is not an active tap is not made in a floating state.

That is, in the normal mode, a voltage of 1.5 V or the like is applied to the P+ semiconductor region 73 of the signal extraction unit 65 that is used as an active tap, and a voltage of 0 V or the like is applied to the P+ semiconductor region 73 of the signal extraction unit 65 that is not used as an active tap, i.e., the signal extraction unit 65 that is an inactive tap. That is, the voltage MIX1 and the voltage MIX0 different voltages at each timing.

Further, in the normal mode, a negative bias may be applied to the penetrating electrode 1001 or a negative bias is not applied to the penetrating electrode 1001 and the penetrating electrode 1001 may be made in a floating state. For example, the negative bias to be applied to the penetrating electrode 1001 can be the same as the voltage to be applied to the P+ semiconductor region 73 of an inactive tap.

The tap drive unit 21 switches the modes as appropriate so that driving is performed in either the floating mode or the normal mode.

Modification Example 1 of Eighteenth Embodiment

Configuration Example of Pixel

Further, in the case where a negative bias is applied to the substrate 61 and the P+ semiconductor region 73 of the signal extraction unit 65 that is not used as an active tap is made in a floating state, the electric field in the depth direction (Z direction) perpendicular to the surface of the substrate 61 can be enhanced.

Figure 51:
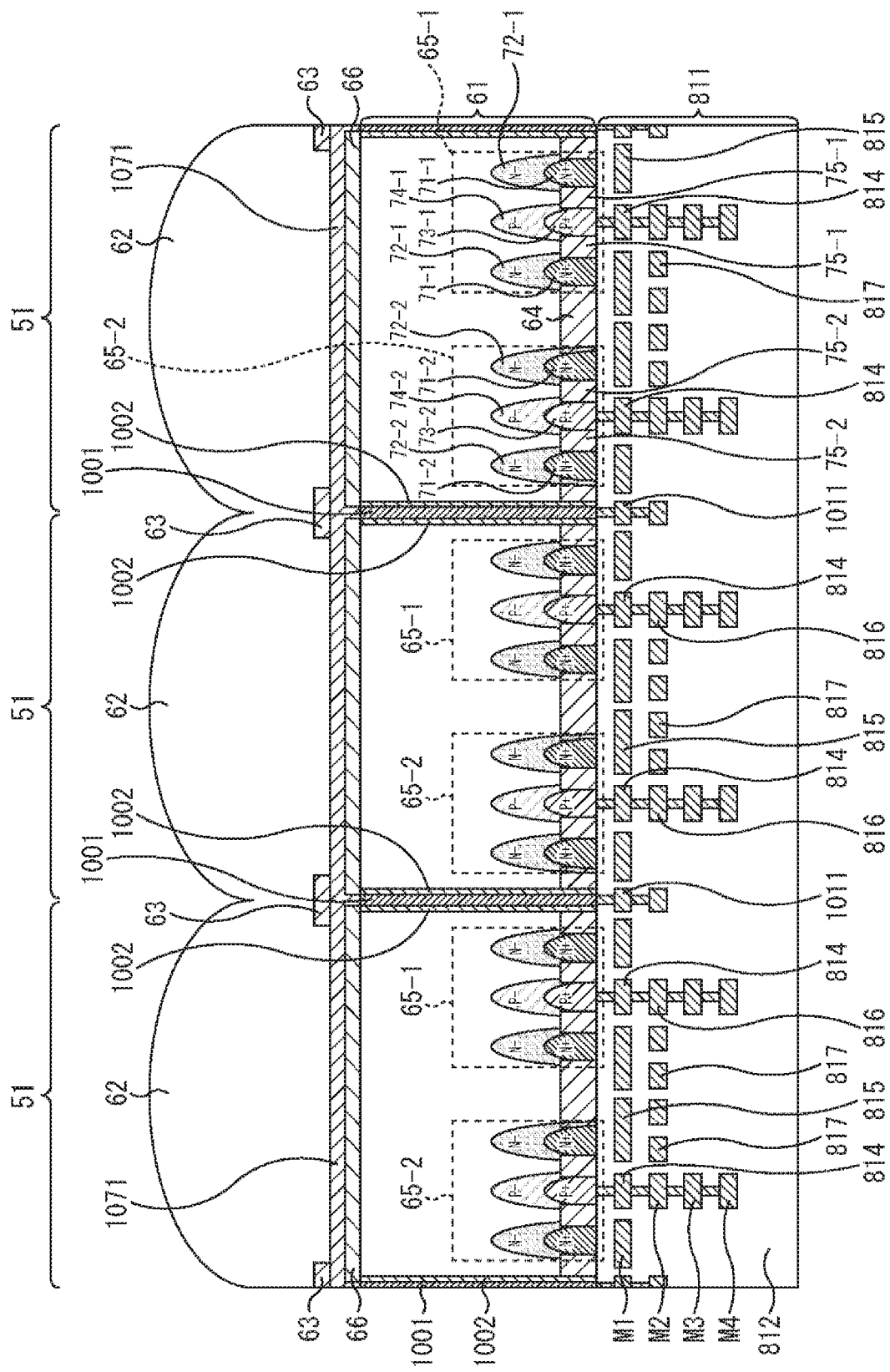
FIG. 51 is a cross-sectional view of the multiple pixels.

In such a case, the configuration of the cross section of the pixels 51 is as illustrated in FIG. 51, for example.

FIG. 51 is a cross-sectional view of multiple pixels corresponding to the B-B' line of FIG. 11, similarly to the above-mentioned FIG. 36 and the like. Note that in FIG. 51, the same reference symbol will be given to a portion corresponding to FIG. 48, and description thereof will be appropriately omitted.

When comparing the configuration of the pixels 51 illustrated in FIG. 51 with the configuration of the pixels 51 illustrated in FIG. 48, in the pixels 51 illustrated in FIG. 51, a transparent conductive film 1071 that is a transparent electrode is newly formed on the upper surface of the fixed charge film 66 formed on the light incident surface of the substrate 61. That is, the transparent conductive film 1071 is formed on the surface of the substrate 61 on the on-chip lens 62 side.

The transparent conductive film 1071 is connected to the penetrating electrode 1001 at the boundary of the pixels 51. As the transparent conductive film 1071, a material such as indium-tin-oxide (ITO), ZnO, SnO, $Cd_2SnO_4$, and $TiO_2$:Nb can be employed.

Since the penetrating electrode 1001 is connected to the voltage application interconnection 1011, when a negative bias is applied to the voltage application interconnection 1011, the negative bias is applied to the fixed charge film 66 via the penetrating electrode 1001 and the transparent conductive film 1071. Therefore, in this example, the penetrating electrode 1001 and the transparent conductive film 1071 function as a voltage application unit.

Also in the example illustrated in FIG. 51, similarly to the example illustrated in FIG. 48, the tap drive unit 21 drives the signal extraction unit 65 as described with reference to FIG. 50. Further, also in the example illustrated in FIG. 51, the tap drive unit 21 is capable of switching the normal mode and the floating mode.

In the pixels 51 illustrated in FIG. 51, since the transparent conductive film 1071 is formed on the upper surface of the fixed charge film 66, it is possible to enhance the electric field in the depth direction from the light incident surface of the substrate 61 toward the signal extraction unit 65 (tap) As a result, it is possible to further improve electron extraction efficiency as compared with the example illustrated in FIG. 48.

Note that if the fixed charge film 66 is not formed on the light incident surface of the substrate 61 in the pixels 51, a configuration in which an insulating film including an oxide film or the like is formed on the light incident surface of the substrate 61 and a negative bias is applied to the insulating film via the penetrating electrode 1001 and the transparent conductive film 1071 can be employed. The insulating film is not limited to a single layer film and may be a stacked film.

Further, although the example in which the transparent conductive film 1071 and the penetrating electrode 1001 are electrically connected to each other has been described in FIG. 51, the transparent conductive film 1071 and the penetrating electrode 1001 do not necessarily need to be electrically connected to each other. Further, in such a case, a negative bias may be applied to only the transparent conductive film 1071. Further, only the transparent conductive film 1071 may be provided and it does not necessarily need to provide the penetrating electrode 1001.

Nineteenth Embodiment

Configuration Example of Pixel

Further, in the case where driving in the floating mode is performed, an interpixel light-shielding unit for applying a bias may be provided separately for each side surface of the pixels 51 so that a higher effect can be achieved by enhancement of the electric field from the side wall of the pixels 51, i.e., enhancement of the electric field in the direction parallel to the surface of the substrate 61.

Figure 52:
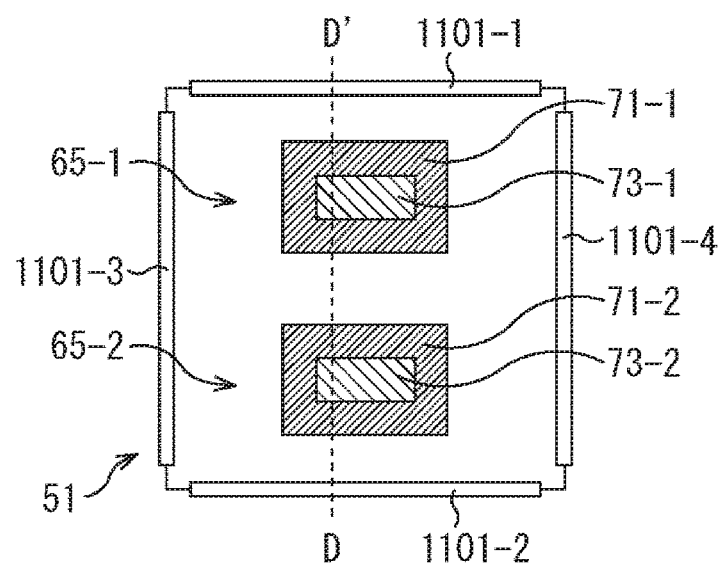
FIG. 52 is a view of the pixel viewed from a direction perpendicular to a surface of the substrate.

In such a case, an interpixel light-shielding unit is formed between the pixels 51 as shown in FIG. 52, for example. Note that in FIG. 52, the same reference symbol will be given to a portion corresponding to FIG. 3, and description thereof will be appropriately omitted.

FIG. 52 is a view of the pixel 51 viewed from the direction perpendicular to the surface of the substrate 61.

In this example, an interpixel light-shielding unit 1101-1 to an interpixel light-shielding unit 1101-4 are provided at positions of boundaries between the pixel 51 and the other pixels 51.

Specifically, the interpixel light-shielding unit 1101-1 is provided at the upper boundary of the pixel 51 and the interpixel light-shielding unit 1101-2 is provided at the lower boundary of the pixel 51 in the figure.

That is, the interpixel light-shielding unit 1101-1 is formed at the pixel boundary on the signal extraction unit 65-1 side in the direction in which the two signal extraction units 65 are arranged in the pixel 51. Meanwhile, the interpixel light-shielding unit 1101-2 is formed at the pixel boundary on the signal extraction unit 65-2 side in the direction in which the two signal extraction units 65 are arranged in the pixel 51.

Further, the interpixel light-shielding unit 1101-3 is provided at the left boundary of the pixel 51 and the interpixel light-shielding unit 1101-4 is provided at the right boundary of the pixel 51 in the figure. That is, the interpixel light-shielding unit 1101-3 and the interpixel light-shielding unit 1101-4 are formed in the pixel boundaries in the direction perpendicular to the direction in which the two signal extraction units 65 is arranged in the pixel 51.

Note that hereinafter, in a case where it is not necessary to particularly distinguish the interpixel light-shielding unit 1101-1 to the interpixel light-shielding unit 1101-4 with each other, they are also referred to simply as the interpixel light-shielding unit 1101.

These four interpixel light-shielding units 1101 are each a deep trench isolation (DTI) having a trench structure that isolates an adjacent pixel 51. For example, the interpixel light-shielding unit 1101 is formed of a metal material such as tungsten (W), aluminum (Al), and copper (Cu), polysilicon, or the like.

Further, here, the four interpixel light-shielding units 1101-1 to 1101-4 are electrically isolated from each other. Note that for example, the interpixel light-shielding unit 1101-3 or the interpixel light-shielding unit 1101-4 of the pixel 51 and the interpixel light-shielding unit 1101-3 or the interpixel light-shielding unit 1101-4 of another pixel 51 adjacent to that pixel 51 in the vertical direction in the figure may be electrically connected to each other.

For example, in the example illustrated in FIG. 52, the interpixel light-shielding unit 1101-1 to the interpixel light-shielding unit 1101-4 each function as a pixel isolation unit that isolates the pixels 51 adjacent to each other and also as a voltage application unit to which a voltage such as a negative bias is to be applied.

Specifically, for example, a constant voltage of 0 V or less, i.e., a constant (fixed) negative bias, is constantly applied to the interpixel light-shielding unit 1101-3 and the interpixel light-shielding unit 1101-4.

Further, in the case where the signal extraction unit 65-1 is used as an active tap, a voltage higher than that around the interpixel light-shielding unit 1101-1, e.g., a voltage of 1.5 V, is applied to the interpixel light-shielding unit 1101-1 provided on the signal extraction unit 65-1 side. Note that the voltage to be applied to the interpixel light-shielding unit 1101-1 can be the same as the voltage MIX0.

In this way, the electric field in the vicinity of the signal extraction unit 65-1 that is used as an active tap can be enhanced, and thus, electron extraction efficiency can be improved.

Meanwhile, in the case where the signal extraction unit 65-1 is not used as an active tap, i.e., the P+ semiconductor region 73-1 of the signal extraction unit 65-1 is in a floating state, also the interpixel light-shielding unit 1101-1 is in a floating state.

In order to make the application state of a voltage to the interpixel light-shielding unit 1101-1 be the same as the application state of a voltage to the P+ semiconductor region 73-1, for example, it only needs to connect not only the P+ semiconductor region 73-1 but also the interpixel light-shielding unit 1101-1 to the transistor 1041A illustrated in FIG. 49.

Meanwhile, regarding the interpixel light-shielding unit 1101-2 provided on the signal extraction unit 65-2 side, the voltage application state thereof only needs to be the same as the application state of a voltage to the P+ semiconductor region 73-2 of the signal extraction unit 65-2. That is, the voltage application state to the interpixel light-shielding unit 1101-2 only needs to be opposite to the voltage application state to the interpixel light-shielding unit 1101-1.

Specifically, in the case where a voltage of 1.5 V or the like is applied to the interpixel light-shielding unit 1101-1, the interpixel light-shielding unit 1101-2 is caused to be in a floating state. Conversely, in the case where the interpixel light-shielding unit 1101-1 is in a floating state, a voltage of 1.5 V or the like is applied to the interpixel light-shielding unit 1101-2.

In order to perform such control of the application state of a voltage to the interpixel light-shielding unit 1101-2, for example, it only needs to connect not only the P+ semiconductor region 73-2 but also the interpixel light-shielding unit 1101-2 to the transistor 1041B illustrated in FIG. 49.

Figure 53:
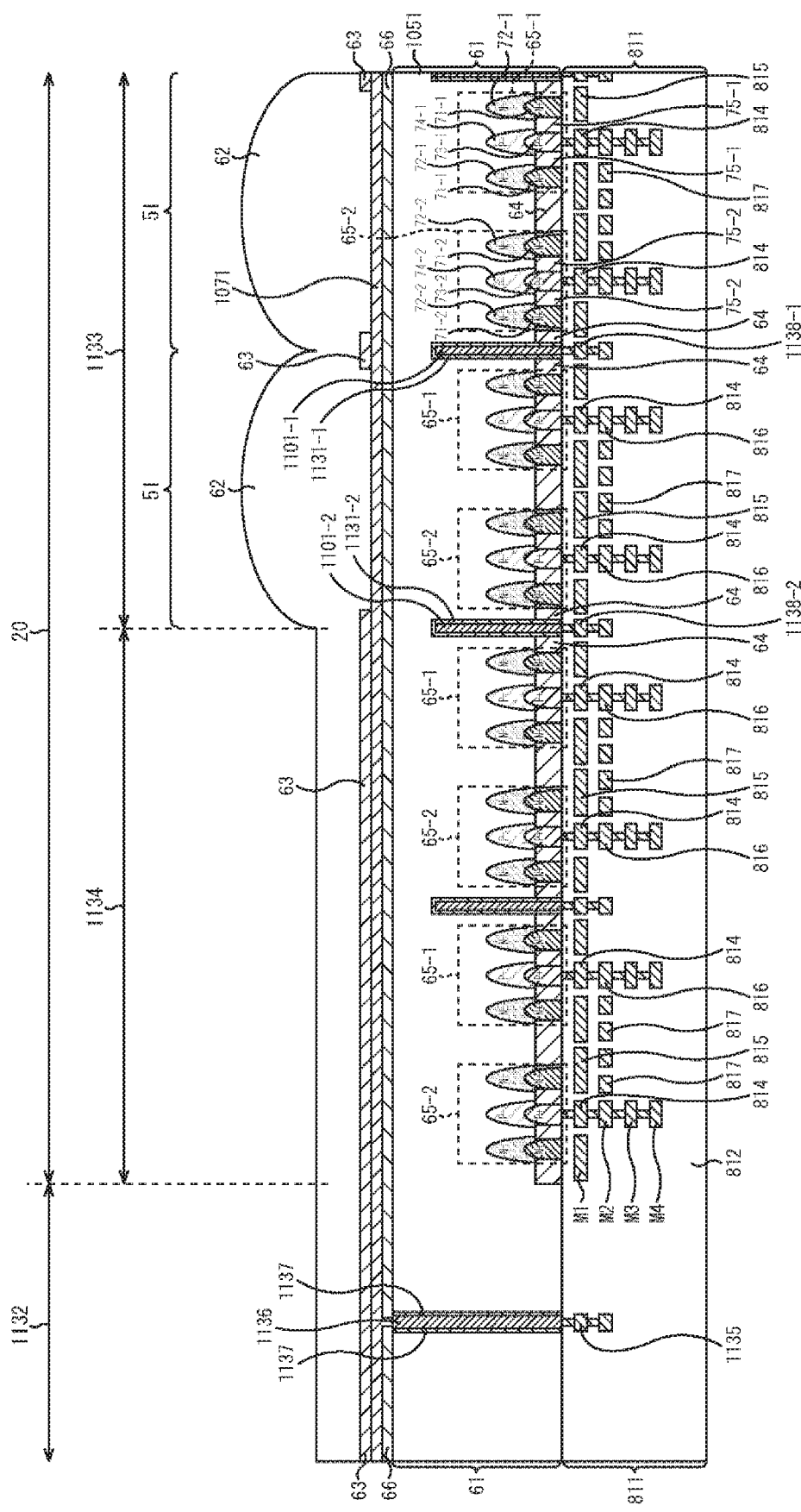
FIG. 53 is a cross-sectional view of the multiple pixels.

Further, a cross-sectional view of multiple pixels corresponding to the D-D' line in the pixel 51 illustrated in FIG. 52 is as illustrated in FIG. 53, for example. Note that in FIG. 53, the same reference symbol will be given to a portion corresponding to FIG. 1, FIG. 51, or FIG. 52, and description thereof will be appropriately omitted.

The configuration of the pixels 51 illustrated in FIG. 53 is different from the configuration of the pixels 51 illustrated in FIG. 51 mainly in that the interpixel light-shielding unit 1101, an insulating film 1131-1, and an insulating film 1131-2 are provided instead the penetrating electrode 1001 and the insulation film 1002 in the configuration of the pixels 51 illustrated in FIG. 51. Note that hereinafter, in a case where it is not particularly necessary to distinguish the insulating film 1131-1 and the insulating film 1131-2 with each other, they are also referred to simply as the insulating film 1131.

In the example of FIG. 53, a region outside the pixel array unit 20 constituting the light-receiving element 1 above the semiconductor substrate is a peripheral circuit unit 1132. Further, the pixel array unit 20 is constituted by an effective pixel region 1133 in which a plurality of pixels 51 is arranged and an OPB pixel region 1134 around the effective pixel region 1133.

In such a pixel array unit 20 illustrated in FIG. 53, since the penetrating electrode 1001 is not formed, a negative bias cannot be applied to the fixed charge film 66 via the penetrating electrode 1001. In this regard, in the example illustrated in FIG. 53, a negative bias is applied from a voltage application interconnection 1135 formed in the peripheral circuit unit 1132 outside the pixel array unit 20 to the transparent conductive film 1071 via a penetrating electrode 1136, and the negative bias is applied from the transparent conductive film 1071 to the fixed charge film 66.

That is, in the example illustrated in FIG. 53, the voltage application interconnection 1135 is formed in the multilayer interconnection layer 811 of the peripheral circuit unit 1132 outside the pixel array unit 20, and a negative bias is supplied to the voltage application interconnection 1135. Further, the penetrating electrode 1136 whose outer periphery is covered by an insulating film 1137 is formed in the peripheral circuit unit 1132 of the substrate 61, and the penetrating electrode 1136 is connected to the transparent conductive film 1071 on the light incident surface of the substrate 61.

In accordance with such pixels 51, a negative bias supplied from the voltage application interconnection 1135 of the multilayer interconnection layer 811 is applied to the fixed charge film 66 via the penetrating electrode 1136 and the transparent conductive film 1071. As a result, it is possible to enhance the electric field in the depth direction from the light incident surface of the substrate 61 toward the signal extraction unit 65 (tap).

Note that an example in which a negative bias is applied to the transparent conductive film 1071 will be described now, but particularly, it does not necessarily need to apply a negative bias to the transparent conductive film 1071.

Further, in the substrate 61, the interpixel light-shielding unit 1101 that isolates an adjacent pixel 51 and shields the adjacent pixel 51 from light and the insulating film 1131 that covers the outer periphery (side wall) of the interpixel light-shielding unit 1101 are formed at the boundary with the adjacent pixel 51 from the surface of the substrate 61 on the multilayer interconnection layer 811 side, which is a P-type semiconductor layer, to a predetermined depth.

In particular, here, the interpixel light-shielding unit 1101-1 is covered by the insulating film 1131-1, and the interpixel light-shielding unit 1101-2 is covered by the insulating film 1131-2.

The insulating film 1131 is formed by, for example, an oxide film ($SiO_2$). The interpixel light-shielding unit 1101 functions also as a pixel isolation unit that isolates the semiconductor layer (substrate 61) of the pixels 51 adjacent to each other. Note that it can also be regarded that a pixel isolation unit is constituted by the interpixel light-shielding unit 1101 and the insulating film 1131 including the insulating film 1131 on the outer periphery portion.

The interpixel light-shielding unit 1101-1 and the interpixel light-shielding unit 1101-2 are respectively connected to a voltage application interconnection 1138-1 and a voltage application interconnection 1138-2 of the metal film M1 that is a metal film of the multilayer interconnection layer 811 closest to the substrate 61.

In more detail, the interpixel light-shielding unit 1101-1 is connected to the transistor 1041A via the voltage application interconnection 1138-1 and the like, and the interpixel light-shielding unit 1101-2 is connected to the transistor 1041B via the voltage application interconnection 1138-2 and the like. Note that hereinafter, in a case where it is not particularly necessary to distinguish the voltage application interconnection 1138-1 and the voltage application interconnection 1138-2 with each other, they are also referred to simply as the voltage application interconnection 1138.

The interpixel light-shielding unit 1101 and the insulating film 1131 can be formed by forming a trench from the side of the surface of the substrate 61 (on the multilayer interconnection layer 811 side) to a predetermined depth by dry etching or the like, forming the insulating film 1131, and then embedding polysilicon or a metal material to be the interpixel light-shielding unit 1101.

Note that although only the interpixel light-shielding unit 1101-1 and the interpixel light-shielding unit 1101-2 are illustrated here, also the interpixel light-shielding unit 1101-3 and the interpixel light-shielding unit 1101-4 have the same structure as those of the interpixel light-shielding unit 1101-1 and the interpixel light-shielding unit 1101-2. That is, also the surface of each of the interpixel light-shielding unit 1101-3 and the interpixel light-shielding unit 1101-4 is covered by the insulating film 1131.

Further, although the interpixel light-shielding unit 1101 and the insulating film 1131 are formed from the surface side to a predetermined depth here, the interpixel light-shielding unit 1101 and the insulating film 1131 may be formed from the surface side to the back surface side (on the light incident surface side) so as to penetrate the substrate 61. In such a case, for example, the interpixel light-shielding unit 1101-3 and the interpixel light-shielding unit 1101-4 may be electrically connected to the transparent conductive film 1071.

Further, the interpixel light-shielding unit 1101 and the insulating film 1131 may be formed from the back surface side of the substrate 61 (on the light incident surface side) to a predetermined depth.

Example of Driving Pixel

Next, an example of driving the pixels 51 illustrated in FIG. 52 will be described.

Figure 54:
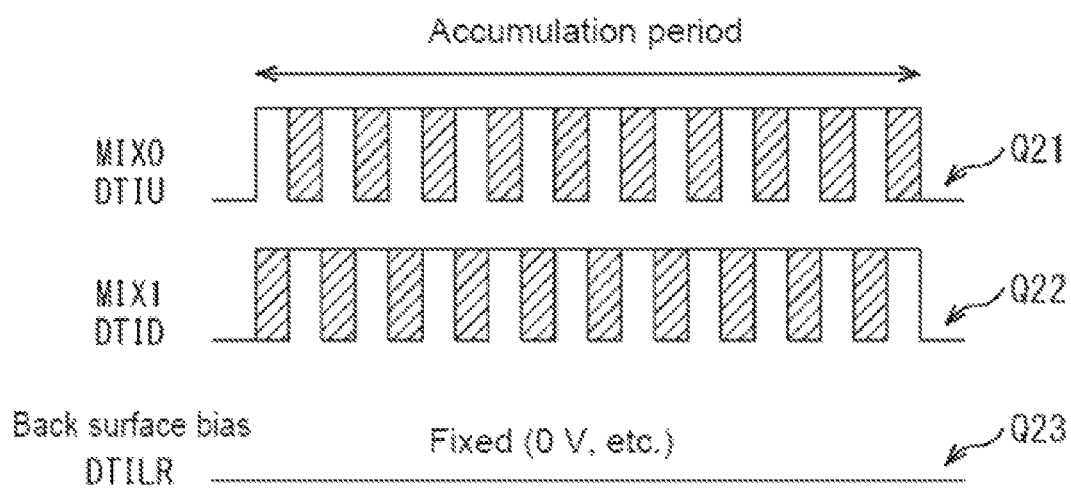
FIG. 54 is a view describing drive of the signal extraction unit.

The tap drive unit 21 controls driving of the signal extraction unit 65 during the accumulation period of charges generated by photoelectric conversion in the substrate 61 as illustrated in FIG. 54, for example.

In FIG. 54, the voltage MIX0 to be applied to the P+ semiconductor region 73-1 of the signal extraction unit 65-1 and a voltage to be applied to the interpixel light-shielding unit 1101-1 are illustrated in the part shown by an arrow Q21. In particular, the characters "DTIU" indicate the interpixel light-shielding unit 1101-1.

Further, the voltage MIX1 to be applied to the P+ semiconductor region 73-2 of the signal extraction unit 65-2 and a voltage to be applied to the interpixel light-shielding unit 1101-2 are illustrated in the part shown by an arrow Q22. In particular, the characters "DTID" indicate the interpixel light-shielding unit 1101-2.

Further, the shaded parts shown by the arrow Q21 and the arrow Q22 indicate being in a floating state.

The part shown by an arrow Q23 indicates voltages (biases) to be applied to the transparent conductive film 1071, the interpixel light-shielding unit 1101-3, and the interpixel light-shielding unit 1101-4. In particular, the characters "DTILR" indicate the interpixel light-shielding unit 1101-3 and the interpixel light-shielding unit 1101-4.

In this example, as illustrated in the arrow Q23, a constant fixed voltage of 0 V or less, i.e., a constant negative bias is continuously applied to the transparent conductive film 1071, the interpixel light-shielding unit 1101-3, and the interpixel light-shielding unit 1101-4.

Note that different voltages may be applied to the transparent conductive film 1071, and the interpixel light-shielding unit 1101-3 and the interpixel light-shielding unit 1101-4.

Meanwhile, in the P+ semiconductor region 73-1 and the interpixel light-shielding unit 1101-1, the state where a positive voltage of 1.5 V or the like is applied and the floating state are alternately repeated.

Specifically, the tap drive unit 21 makes the transistor 1041A be in an on-state to apply a positive voltage of 1.5 V or the like to the P+ semiconductor region 73-1 and the interpixel light-shielding unit 1101-1 at a timing when the signal extraction unit 65-1 is used as an active tap.

Further, the tap drive unit 21 makes the transistor 1041A be in an off-state to make the P+ semiconductor region 73-1 and the interpixel light-shielding unit 1101-1 be in a floating state at a timing when the signal extraction unit 65-1 is not used as an active tap.

Similarly, in the P+ semiconductor region 73-2 and the interpixel light-shielding unit 1101-2, the state where a positive voltage of 1.5 V or the like is applied and the floating state are alternately repeated.

In particular, the tap drive unit 21 makes the P+ semiconductor region 73-2 and the interpixel light-shielding unit 1101-2 be in a floating state when a positive voltage is applied to the P+ semiconductor region 73-1 and the interpixel light-shielding unit 1101-1. Conversely, the tap drive unit 21 causes the P+ semiconductor region 73-1 and the interpixel light-shielding unit 1101-1 to be in a floating state when a positive voltage is applied to the P+ semiconductor region 73-2 and the interpixel light-shielding unit 1101-2.

Note that in the case of performing such driving, in the pixel 51 adjacent to the upper side of the pixel 51 illustrated in FIG. 52, the interpixel light-shielding unit 1101-1 is provided to be adjacent to the signal extraction unit 65-2. Therefore, in such a pixel 51, it only needs to cause the timing when a positive voltage is applied and the timing when it is caused to be in a floating state to be the same between the signal extraction unit 65-2 and the interpixel light-shielding unit 1101-1 provided to be adjacent to each other. In this case, the timing when a positive voltage is applied and the timing when it is caused to be in a floating state are caused to be the same between the signal extraction unit 65-1 and the interpixel light-shielding unit 1101-2 provided to be adjacent to each other. In addition, the interpixel light-shielding unit 1101-1 and the interpixel light-shielding unit 1101-2 may be provided to be adjacent to each other at the boundary of two pixels 51.

In addition, also in the pixel 51 illustrated in FIG. 52, the tap drive unit 21 may be capable of switching the floating mode and the normal mode as appropriate.

By performing driving described above with reference to FIG. 54, it is possible to reduce the consumption amount of currents and improve the transfer efficiency of charges (electrons) and distance detection can be performed with high accuracy, similarly to the case of the eighteenth embodiment. In other words, it is possible to improve characteristics of the CAPD sensor.

Twentieth Embodiment

Configuration Example of Pixel

Further, in the eighteenth embodiment or the nineteenth embodiment, an example in which the penetrating electrode 1001 or the transparent conductive film 1071 functions as a voltage application unit when performing driving in the floating mode has been described. However, particularly, it does not necessarily need to provide the penetrating electrode 1001 and the transparent conductive film 1071.

Figure 55:
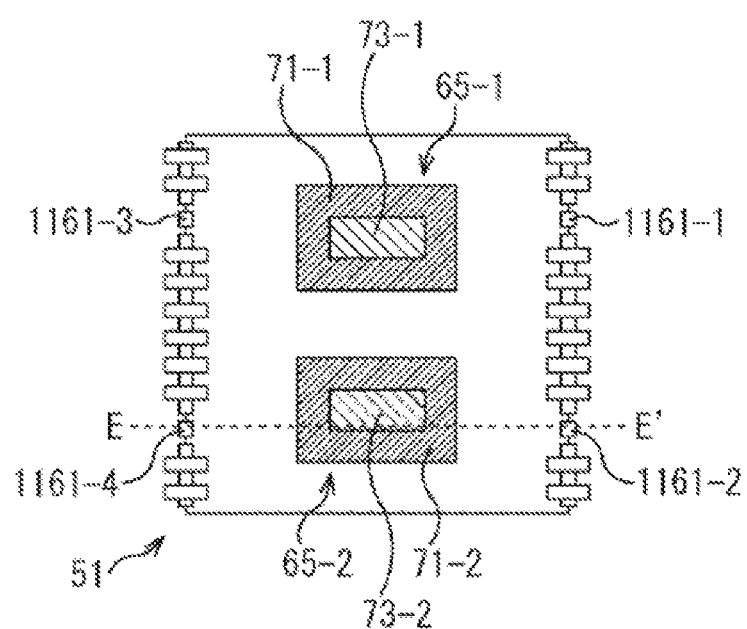
FIG. 55 is a view of the pixel viewed from a direction perpendicular to a surface of the substrate.

In such a case, for example, it only needs to use, as a voltage application unit, a contact that is provided in the multilayer interconnection layer 811 and connected to a ground line as illustrated in FIG. 55. Note that in FIG. 55, the same reference symbol will be given to a portion corresponding to FIG. 3, and description thereof will be appropriately omitted.

FIG. 55 is a view of the pixel 51 viewed from the direction perpendicular to the surface of the substrate 61.

In this example, a transistor is drawn at the boundary part between the pixels 51 in the right and left direction in the figure. Further, a contact 1161-1 to a contact 1161-4 connected to a ground line 832, a ground line 834, or the like are provided at the boundary part between the pixels 51 in the right and left direction in the figure.

The contact 1161-1 to the contact 1161-4 are each formed of a metal material such as copper (Cu). Note that hereinafter, in a case where it is not necessary to particularly distinguish the contact 1161-1 to the contact 1161-4 with each other, they are also referred to as simply the contact 1161.

Since the contact 1161 is connected to an interconnection having a constant voltage such as the ground line 832, the contact 1161 can be used as a voltage application unit for applying a voltage to the substrate 61. Here, for example, a constant voltage of 0 V or the like is constantly applied to the contact 1161.

Therefore, for example, since currents flow between the signal extraction unit 65 that is used as an active tap and the contact 1161, it is possible to improve the transfer efficiency of charges (electrons).

Note that the example in which the contacts 1161 that function as a voltage application unit are provided at the right and left boundary positions in the pixel 51 in the figure has been described here. However, the contacts 1161 that function as a voltage application unit may be provided at the up and down boundary positions or up, down, right, and left boundary positions in the pixel 51 in the figure.

Figure 56:
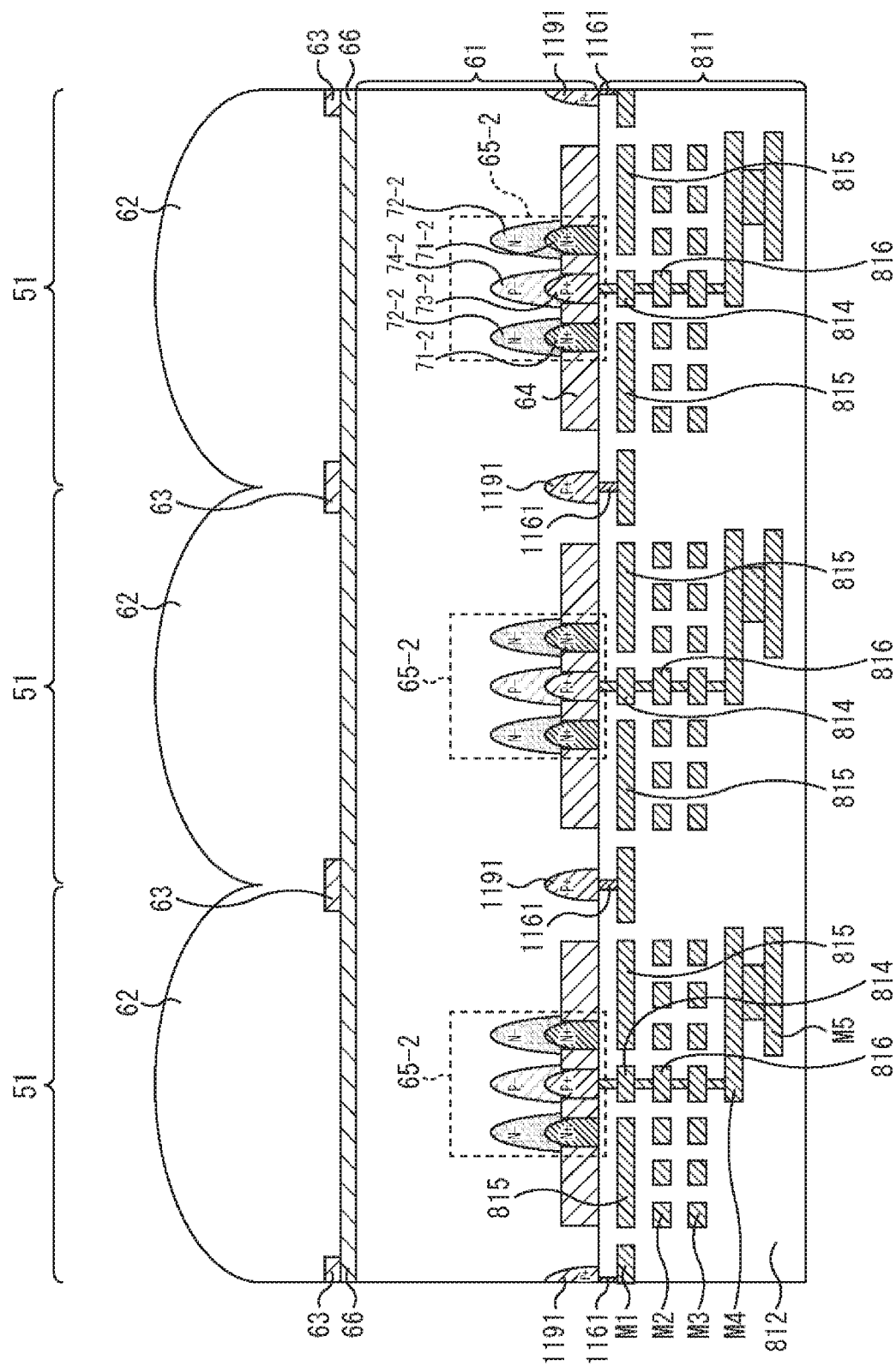
FIG. 56 is a cross-sectional view of the multiple pixels.

Further, a cross-sectional view of multiple pixels corresponding to the E-E' line in the pixel 51 in FIG. 55 is as illustrated in FIG. 56, for example. Note that in FIG. 56, the same reference symbol will be given to a portion corresponding to FIG. 37, and description thereof will be appropriately omitted.

The configuration of the pixels 51 illustrated in FIG. 56 is obtained by providing the contacts 1161 instead of the transistors in the configuration of the pixels 51 illustrated in FIG. 37. This is because not the transistor but the contact 1161 is disposed at the cross-sectional position of the multilayer interconnection layer 811 corresponding to the E-E' line.

In this example, the contact 1161 is formed at the boundary part between the pixels 51 adjacent to each other in the multilayer interconnection layer 811, and the contact 1161 is connected to a ground line or the like of the metal film M1. In particular, the contact 1161 is disposed at the boundary part between the multilayer interconnection layer 811 and the substrate 61. A part adjacent to the contact 1161 in the substrate 61, a P+ semiconductor region 1191 is formed so as to cover the contact 1161 part.

With such a configuration, a constant voltage is constantly applied to the substrate 61 by the contact 1161.

Example of Driving Pixel

Next, an example of driving the pixel 51 illustrated in FIG. 55 will be described.

Figure 57:
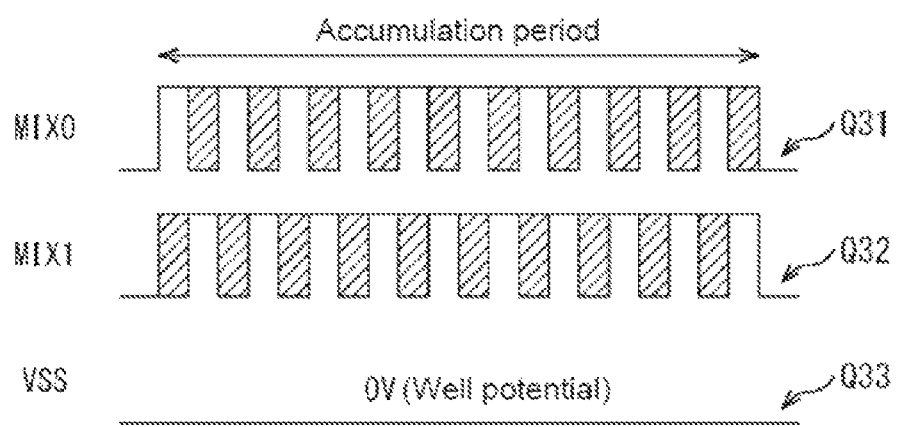
FIG. 57 is a view describing drive of the signal extraction unit.

The tap drive unit 21 controls driving of the signal extraction unit 65 during the accumulation period of charges generated by photoelectric conversion in the substrate 61 as illustrated in FIG. 57, for example.

In FIG. 57, the voltage MIX0 to be applied to the P+ semiconductor region 73-1 of the signal extraction unit 65-1 is illustrated in the part shown by an arrow Q31, and the voltage MIX1 to be applied to the P+ semiconductor region 73-2 of the signal extraction unit 65-2 is illustrated in the part shown by an arrow Q32. In particular, shaded parts in the voltage MIX0 and the voltage MIX1 respectively shown by the arrow Q31 and the arrow Q32 indicate being a floating state.

Further, a voltage to be applied to the contact 1161 that is a voltage application unit is illustrated in the part shown by an arrow Q33.

In this example, a constant fixed voltage of 0 V or the like is continuously applied to the contact 1161 as illustrated in the arrow Q33.

Meanwhile, in the P+ semiconductor region 73-1, the state where a positive voltage of 1.5 V or the like is applied as the voltage MIX0 and the floating state are alternately repeated.

Specifically, the tap drive unit 21 makes the transistor 1041A be in an on-state to apply a positive voltage of 1.5 V or the like to the P+ semiconductor region 73-1 at the timing when the signal extraction unit 65-1 is used as an active tap. Further, the tap drive unit 21 causes the transistor 1041A to be in an off-state to cause the P+ semiconductor region 73-1 to be in a floating state at the timing when the signal extraction unit 65-1 is not used as an active tap.

Similarly, in the P+ semiconductor region 73-2, for example, the state where a positive voltage such as 1.5 V or the like is applied to the P+ semiconductor region 73-2 as the voltage MIX1 and the floating state are alternately repeated.

In particular, the tap drive unit 21 makes the P+ semiconductor region 73-2 be in a floating state when a positive voltage is applied to the P+ semiconductor region 73-1, and makes the P+ semiconductor region 73-1 be in a floating state when a positive voltage is applied to the P+ semiconductor region 73-2.

By performing driving described above with reference to FIG. 57, it is possible to reduce the consumption amount of currents and improve the transfer efficiency of charges (electrons) and distance detection can be performed with high accuracy, similarly to the case of the eighteenth embodiment. In other words, it is possible to improve characteristics of the CAPD sensor.

In addition, also in the twentieth embodiment, the tap drive unit 21 may be capable of switching the floating mode and the normal mode as appropriate.

Note that in the eighteenth embodiment to twentieth embodiment described above, for example, the example in which the reflection member 815 is provided in the multilayer interconnection layer 811 has been described in FIG. 48, FIG. 51, FIG. 53, and FIG. 56. In particular, here, the reflection member 815 is provided so as to overlap the N+ semiconductor region 71 in a plan view, i.e., when viewed from the direction perpendicular to the surface of the substrate 61. However, a light-shielding member 631' may be provided instead of the reflection member 815. Also in such a case, the light-shielding member 631' is provided so as to overlap the N+ semiconductor region 71 in a plan view.

Twenty First Embodiment

Configuration Example of Pixel

Incidentally, a structure such as an oxide film, a metal material, a gate electrode is provided in the substrate 61 or the multilayer interconnection layer 811 constituting the pixel 51.

For this reason, if infrared light that has been condensed by the on-chip lens 62 and entered the substrate 61 is reflected by the structure, the reflected light thereof enters a region of another adjacent pixel 51, which reduces pixel sensitivity or causes cross-talk to occur. Further, when cross-talk occurs, the resolution of a depth image generated by the light-receiving element 1 at the time of distance measurement, i.e., distance measurement accuracy, is reduced.

In this regard, in the present technology, a pixel isolation unit that isolates the light-receiving regions of the pixels 51 is provided at the boundary part of each pixel 51, which makes it possible to improve pixel sensitivity and prevent cross-talk from occurring. That is, it has been made possible to improve characteristics of the CAPD sensor, such as sensitivity characteristics and distance measurement accuracy. Note that the light-receiving region a region in the substrate 61 where photoelectric conversion is performed.

Hereinafter, a configuration example of the pixel 51 for suppressing reduction in pixel sensitivity or cross-talk will be described with reference to FIG. 58 to FIG. 93.

Note that in FIG. 58 to FIG. 93, the same reference symbol will be given to a portion corresponding to FIG. 3, FIG. 36, FIG. 37, or FIG. 42 and description thereof will be appropriately omitted. Further, in FIG. 58 to FIG. 93, the same reference symbol will be given to portions corresponding to each other and description thereof will be appropriately omitted.

First, a configuration of the pixel 51 according to a twenty first embodiment will be described with reference to FIG. 58 to FIG. 60.

Figure 58:
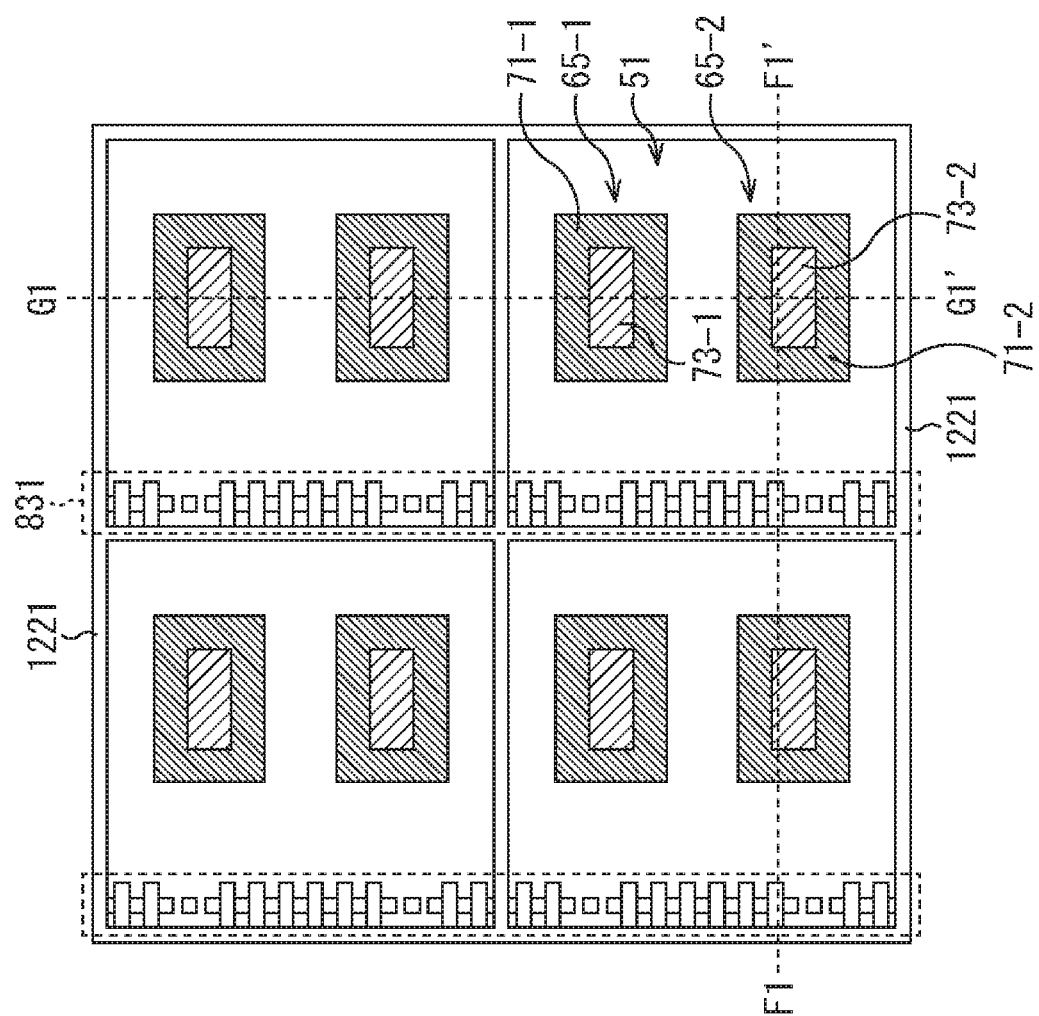
FIG. 58 is a view of the pixel viewed from a direction perpendicular to a surface of the substrate.

FIG. 58 is a view of the pixels 51 viewed from the direction perpendicular to the surface of the substrate 61.

In this example, a pixel isolation unit 1221 that functions as a pixel isolation region for isolating the region (light-receiving region) of the pixel 51 is formed at the boundary part of the pixels 51 adjacent to each other so that the region of each pixel 51, i.e., the light-receiving region of the pixel 51, is surrounded by the pixel isolation unit 1221 in a plan view.

The pixel transistor interconnection region 831 is provided in a part in the vicinity of the pixel boundary in the multilayer interconnection layer 811 of the pixel 51.

Further, a transistor that drives the pixel 51, and the like are formed in the boundary part between the substrate 61 and the multilayer interconnection layer 811 in the substrate 61 and the multilayer interconnection layer 811.

Specifically, for example, in the boundary part between the substrate 61 and the multilayer interconnection layer 811, the reset transistor 723A and the transfer transistor 721A connected to the N+ semiconductor region 71-1, the reset transistor 723B and the transfer transistor 721B connected to the N+ semiconductor region 71-2, and the like are formed.

A transistor that drives the pixel 51 is disposed in the pixel transistor interconnection region 831 when viewed from the direction perpendicular to the surface of the substrate 61, i.e., in a plan view. For this reason, it can be said that the pixel transistor interconnection region 831 is a transistor region in which a transistor is formed, in a plan view.

In the example illustrated in FIG. 58, the pixel isolation unit 1221 is disposed at a position shifted from the transistor and the like so that the positions at which the transistor for driving the pixel 51, and the like are disposed and the position at which the pixel isolation unit 1221 is disposed are different from each other when viewed from the direction perpendicular to the surface of the substrate 61.

In other words, the pixel isolation unit 1221 is provided in a region different from the pixel transistor interconnection region 831, i.e., a region different from the transistor region in a plan view.

Figure 59:
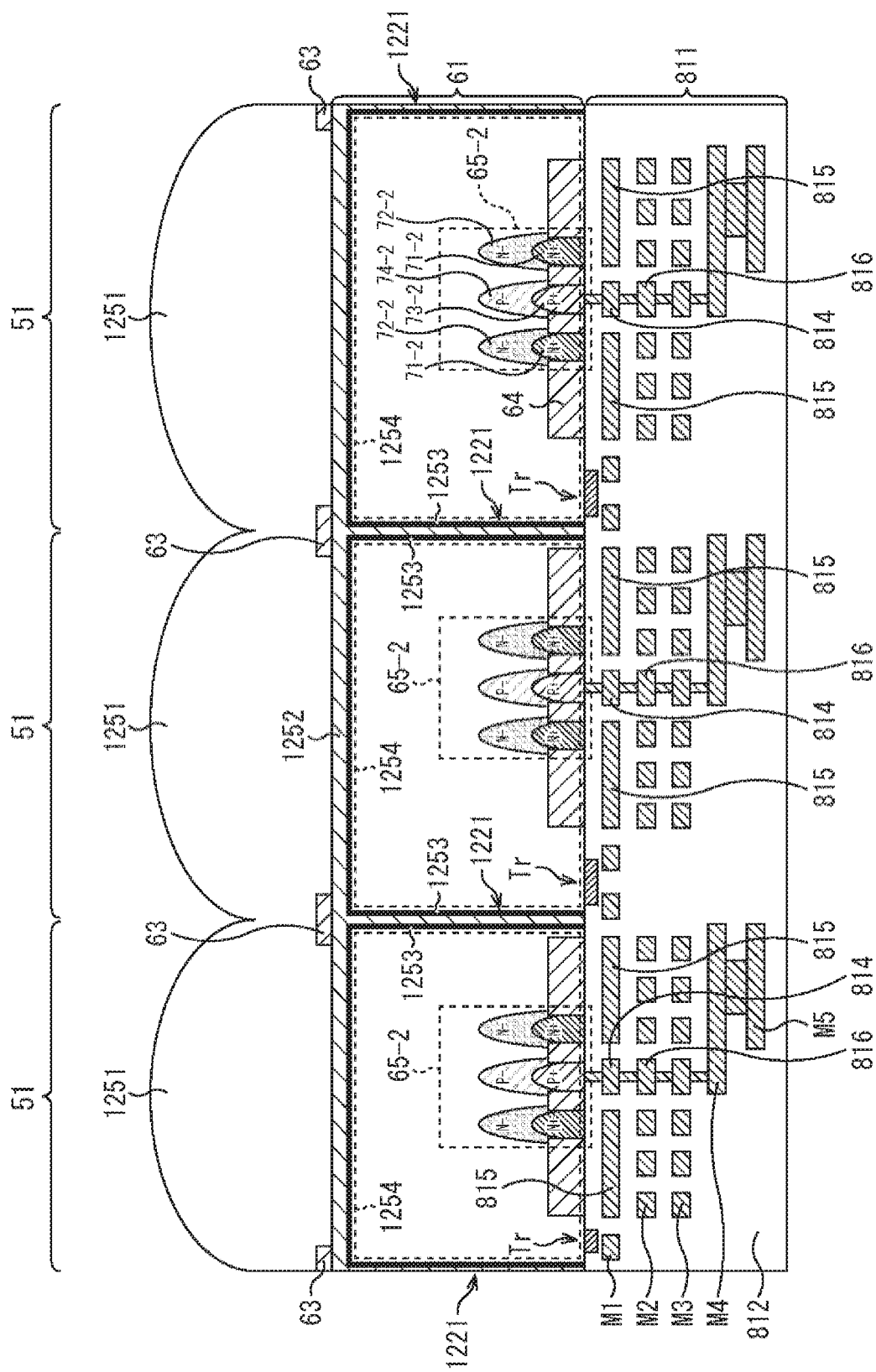
FIG. 59 is a cross-sectional view of the multiple pixels.
Figure 60:
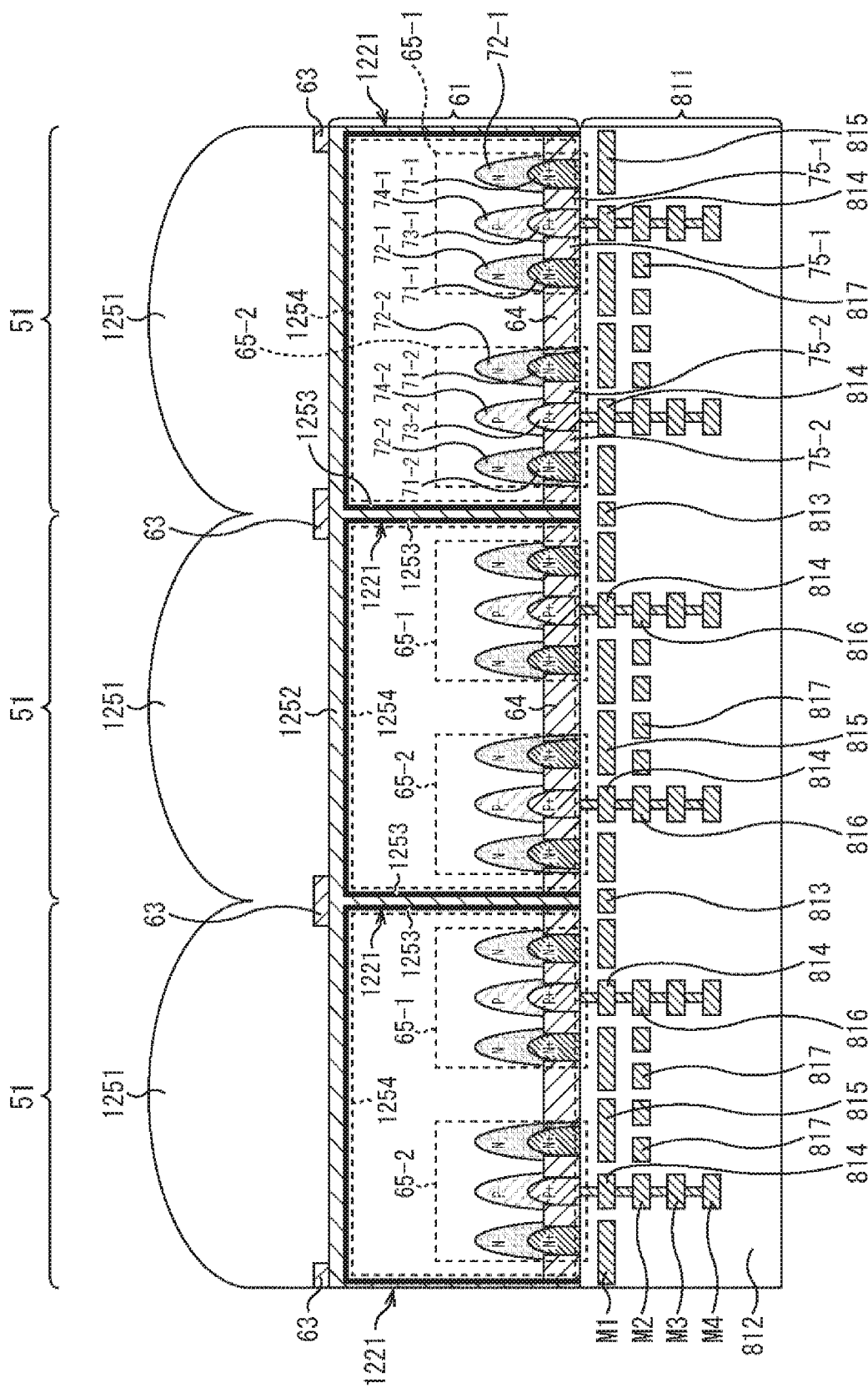
FIG. 60 is a cross-sectional view of the multiple pixels.

Here, a cross section corresponding to the line F1-F1' and a cross section corresponding to the G1-G1' line in FIG. 58 are respectively illustrated in FIG. 59 and FIG. 60.

The configuration of the pixels 51 illustrated in FIG. 59 and FIG. 60 is different from the configuration of the pixels 51 illustrated in FIG. 36 and FIG. 37 in that the on-chip lens 62 and the fixed charge film 66 are not provided and an on-chip lens 1251, an oxide film 1252, and an fixed charge film 1253 are newly provided.

As illustrated in FIG. 59, in each pixel 51, the on-chip lens 1251 is disposed to be adjacent to the light incident surface side in the substrate 61, i.e., the side opposite to the multilayer interconnection layer 811 side. The on-chip lens 1251 condenses infrared light that has entered from the outside and guides the infrared light into the inside of the substrate 61.

Further, in each pixel 51, a part constituting one pixel 51 in the substrate 61 is a light-receiving region 1254. Then, the pixel isolation unit 1221 constituted by a part of the oxide film 1252 and fixed charge film 1253 isolates the light-receiving regions 1254 of the adjacent pixels 51.

Here, the light-receiving region 1254 is surrounded by the pixel isolation unit 1221 when viewed from the direction perpendicular to the surface of the substrate 61, i.e., in a plan view. In other words, the pixel isolation unit 1221 is formed in the boundary part of the light-receiving regions 1254 adjacent to each other.

In the example illustrated in FIG. 59, the oxide film 1252 is formed so as to cover the surface of the substrate 61 on the on-chip lens 1251 side. Further, at the boundary part of the pixels 51 adjacent to each other, the oxide film 1252 penetrates the substrate 61, which isolates the light-receiving regions 1254 of the adjacent pixels 51 from each other.

Further, inside the substrate 61, a region between the P-type semiconductor region constituting the substrate 61 and the oxide film 1252, i.e., the surface part of the oxide film 1252 is covered by the fixed charge film 1253.

In particular, in this example, a part having a trench structure, which is long in the direction perpendicular to the surface of the substrate 61 in the oxide film 1252 and the fixed charge film 1253, i.e., a part that functions as full trench isolation (FTI) that penetrates the substrate 61 and isolates the light-receiving regions 1254 of the adjacent pixels 51 from each other, is the pixel isolation unit 1221.

Note that although the pixel isolation unit 1221 has been described to be constituted by the oxide film 1252 and the fixed charge film 1253, it can also be regarded that the pixel isolation unit 1221 is constituted by only the oxide film 1252.

In addition, the pixel isolation unit 1221 may be formed of a metal material and the fixed charge film 1253 covering the metal material instead of the oxide film 1252, or may be formed of a metal material and an oxide film. That is, the pixel isolation unit 1221 can be formed of at least one of an oxide film, a fixed charge film, or a metal material.

In the boundary part of the pixels 51, the pixel isolation unit 1221 is formed. For this reason, even in the case where infrared light that has entered the substrate 61 from the on-chip lens 1251 is reflected by a structure such as the oxide film 64, the gate electrode of the transistor, and the metal material, by providing the pixel isolation unit 1221, it is possible to prevent the reflected light from entering an adjacent pixel 51.

As a result, it is possible to prevent cross-talk from occurring, suppress reduction in pixel sensitivity, and improve characteristics of the CAPD sensor, such as sensitivity characteristics and distance measurement accuracy (resolution).

Further, in the example illustrated in FIG. 59, the pixel isolation unit 1221 is formed at a position shifted from the position at which the transistor is formed in the horizontal direction in the figure. That is, the pixel isolation unit 1221 is not disposed immediately above the transistor.

For example, if the pixel isolation unit 1221 is formed immediately above the transistor, currents of the pixel isolation unit 1221 leaked from the fixed charge film 1253 are generated in the transistor, in more detail, the P-well part covering the transistor in the substrate 61 in some cases.

In this regard, in this embodiment, the pixel isolation unit 1221 is formed at a position shifted from immediately above the transistor, thereby preventing such leaked currents from being generated.

Note that although the pixel isolation unit 1221 is formed at a position away from the P-well part covering the transistor in more detail, the pixel isolation unit 1221 may be formed to penetrate a part of the P-well.

Further, in the example illustrated in FIG. 59, since the pixel isolation unit 1221 is formed at a shifted position in accordance with the position of the transistor, also the interpixel light-shielding film 63 and the on-chip lens 1251 are disposed to be shifted in accordance therewith.

That is, the interpixel light-shielding film 63 is disposed to be located on the upper side of (immediately above) the pixel isolation unit 1221 in FIG. 59. Further, as illustrated in FIG. 59, the center of the on-chip lens 1251, i.e., the position of the optical axis of the on-chip lens 1251, is located at a position substantially in the middle of the two pixel isolation units 1221 provided at both ends (side walls of the pixel 51) of the pixel 51 when viewed from the direction parallel to the surface of the substrate 61.

In other words, the on-chip lens 1251 is disposed so that the position of the optical axis of the on-chip lens 1251 is located at a position of substantially the center of a rectangular region surrounded by the pixel isolation unit 1221 at the boundary of the pixels 51 as illustrated in FIG. 58. With this, it is possible to increase the amount of light (amount of received light) guided into the light-receiving region 1254 by the on-chip lens 1251, and improve sensitivity characteristics.

Further, a cross-sectional view of the pixels 51 illustrated in FIG. 58 corresponding to the line G1-G1' is as illustrated in FIG. 60. Also in FIG. 60, similarly to the case in FIG. 59, a part having a trench structure, which is long in the direction perpendicular to the surface of the substrate 61 in the oxide film 1252 and the fixed charge film 1253, is the pixel isolation unit 1221, and the pixel isolation unit 1221 isolates the light-receiving regions 1254 of the adjacent pixels 51. In particular, here, the pixel isolation unit 1221 penetrates the oxide film 64 part to reach the multilayer interconnection layer 811.

In accordance with the pixels 51 having such a structure illustrated in FIG. 58 to FIG. 60, it is possible to improve characteristics such as sensitivity characteristics and distance measurement accuracy (resolution), and also prevent leaked currents from being generated.

Note that in FIG. 59, the example in which the position at which the on-chip lens 1251 is disposed is shifted in accordance with the position at which the pixel isolation unit 1221 is formed has been described.

However, the on-chip lens 1251 may be disposed so that the position of the optical axis of the on-chip lens 1251 is located substantially in the middle of the two signal extraction units 65 in the pixel 51, in more detail, the two N+ semiconductor regions 71, when viewed from the direction perpendicular to the surface of the substrate 61.

With this, it is possible to condense infrared light at a position between the signal extraction unit 65-1 and the signal extraction unit 65-2, and make the electron extraction efficiency substantially uniform between the signal extraction units 65.

Further, for example, in the example illustrated in FIG. 58, the signal extraction units 65 may be shifted and disposed so that the position between the signal extraction unit 65-1 and the signal extraction unit 65-2 is at the position of the optical axis of the on-chip lens 1251.

Twenty Second Embodiment

Configuration Example of Pixel

Next, a configuration of the pixel 51 according to a twenty second embodiment will be described with reference to FIG. 61 to FIG. 63.

Figure 61:
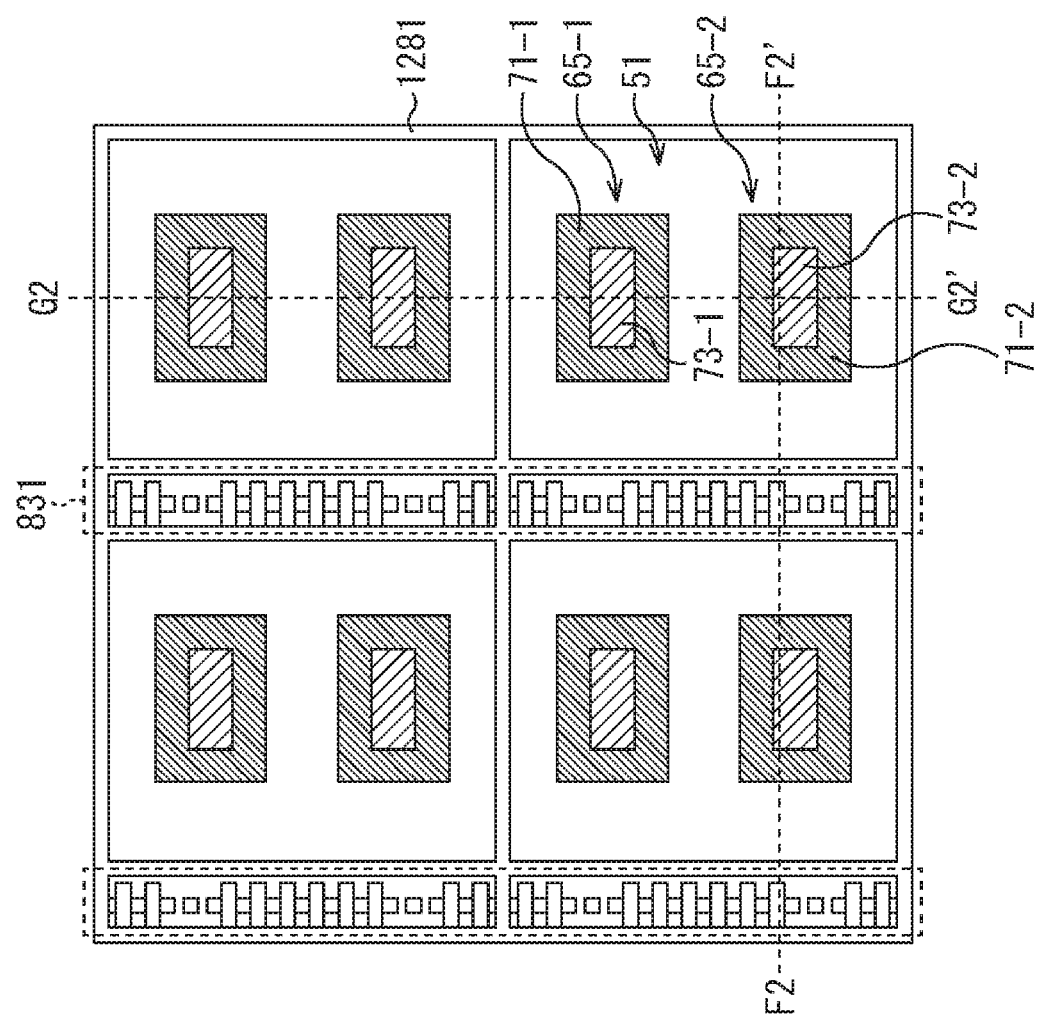
FIG. 61 is a view of the pixel viewed from a direction perpendicular to a surface of the substrate.

FIG. 61 is a view of the pixels 51 viewed from the direction perpendicular to the surface of the substrate 61.

In this example, a pixel isolation unit 1281 that functions as a pixel isolation region for isolating the regions of the pixels 51 is formed at the boundary part of the pixels 51 adjacent to each other so that the region of each pixel 51 is surrounded by the pixel isolation unit 1281.

Further, in this example, also the pixel transistor interconnection region 831 of the multilayer interconnection layer 811 in the pixel 51, in more detail, the transistor region in which the transistor is formed, is surrounded by the pixel isolation unit 1281. In other words, the pixel isolation unit 1281 is provided at both ends in the right and left direction of the pixel transistor interconnection region 831 (transistor region) in the figure.

Also in FIG. 61, similarly to the case in FIG. 58, the positions at which the transistor for driving the pixel 51, and the like are disposed and the position at which the pixel isolation unit 1281 is disposed are different from each other when viewed from the direction perpendicular to the surface of the substrate 61. That is, the pixel isolation unit 1281 is disposed at a position shifted from the transistor and the like.

By forming the pixel isolation unit 1281 so as to surround (sandwich) the transistor region, it is possible to isolate the light-receiving region and the transistor region from each other and prevent infrared light from entering the gate electrode part of the transistor.

Figure 62:
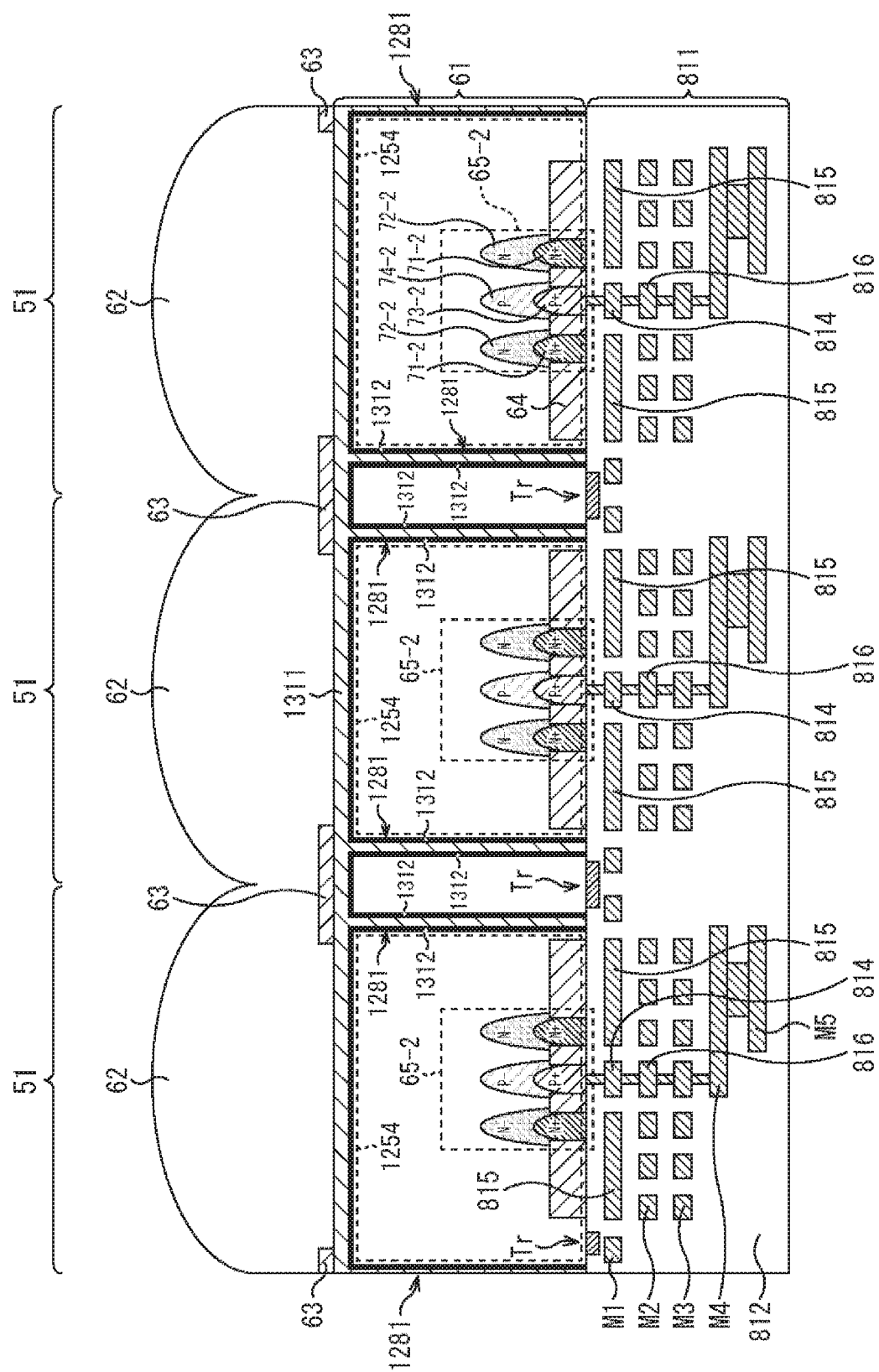
FIG. 62 is a cross-sectional view of the multiple pixels.
Figure 63:
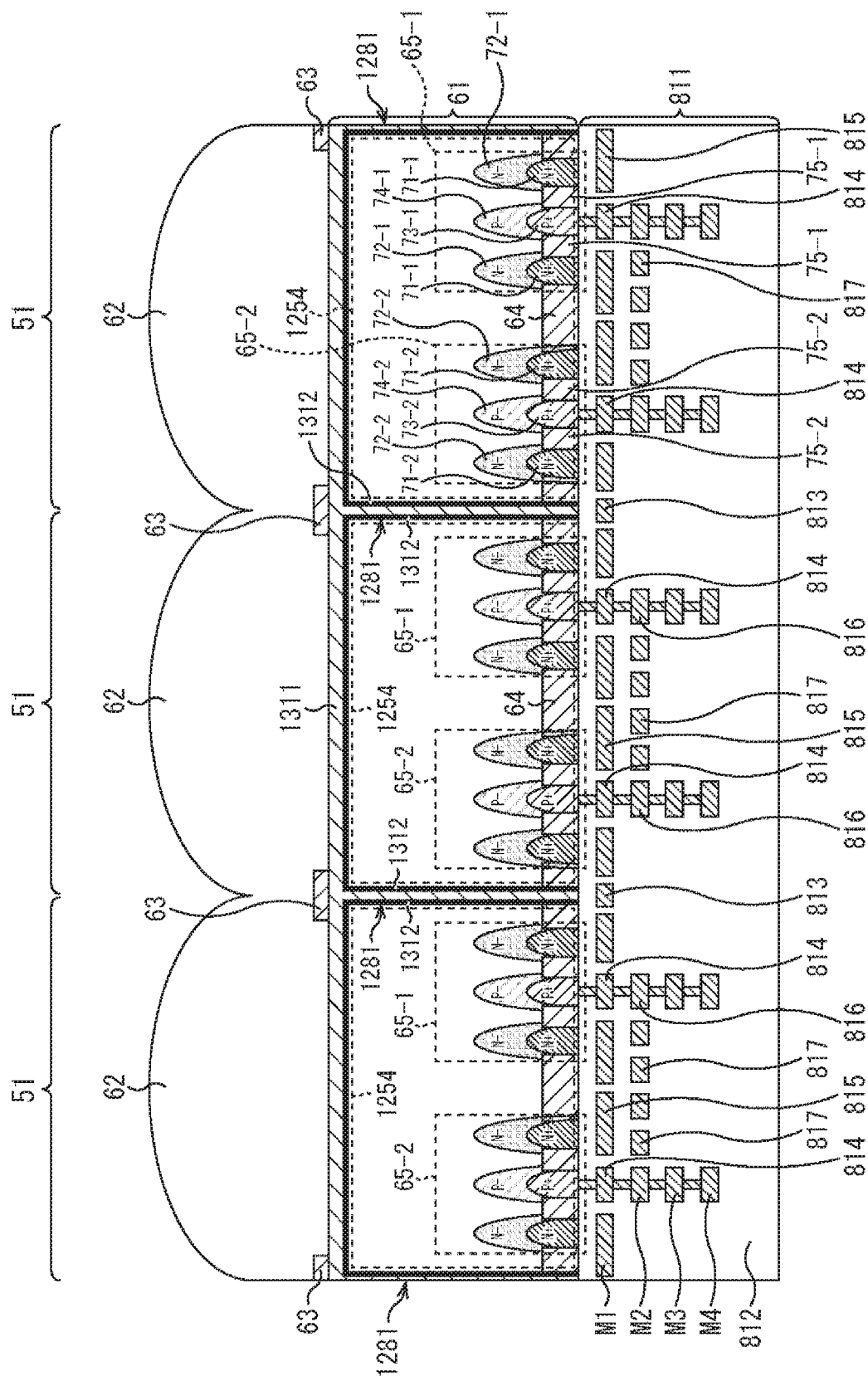
FIG. 63 is a cross-sectional view of the multiple pixels.

Here, a cross section corresponding to the line F2-F2' and a cross section corresponding to the line G2-G2 in FIG. 61 are respectively illustrated in FIG. 62 and FIG. 63.

The configuration of the pixels 51 illustrated in FIG. 62 and FIG. 63 is different from the configuration of the pixels 51 illustrated in FIG. 36 and FIG. 37 in that the fixed charge film 66 is not provided and an oxide film 1311 and a fixed charge film 1312 are newly provided.

As illustrated in FIG. 62, in each pixel 51, a region of the part surrounded by the pixel isolation unit 1281, in which the signal extraction unit 65 is disposed, among the parts constituting one pixel in the substrate 61, is the light-receiving region 1254.

Here, the pixel isolation unit 1281 is constituted by a part of the oxide film 1311 and fixed charge film 1312.

That is, in the example illustrated in FIG. 62, the oxide film 1311 is formed so as to cover the surface of the substrate 61 on the on-chip lens 62 side. Further, in the boundary part of the pixels 51 adjacent to each other, the oxide film 1311 penetrates the substrate 61. Further, the region of the transistor in the substrate 61 is surrounded by the oxide film 1311 formed so as to penetrate the substrate 61 so that infrared light does not enter the transistor.

Inside the substrate 61, the region between the P-type semiconductor region constituting the substrate 61 and the oxide film 1311, i.e., the surface part of the oxide film 1311 is covered by the fixed charge film 1312.

In particular, in this example, the part having a trench structure, which is long in the direction perpendicular to the surface of the substrate 61 in the oxide film 1311 and the fixed charge film 1312, i.e., the part having an FTI structure penetrating the substrate 61, is the pixel isolation unit 1281.

Note that although he pixel isolation unit 1281 has been described to be constituted by the oxide film 1311 and the fixed charge film 1312 here, it can also be regarded that the pixel isolation unit 1281 is constituted by only the oxide film 1311.

In addition, the pixel isolation unit 1281 may be formed of a metal material and a fixed charge film, or may be formed of a metal material and an oxide film.

In the example illustrated in FIG. 62, since the pixel isolation unit 1281 is formed in the boundary part of the pixels 51, it is possible to prevent the reflected light of infrared light that has entered the substrate 61 from the on-chip lens 62 from entering an adjacent pixel 51, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

Further, the region of the transistor in the substrate 61 is surrounded by the pixel isolation unit 1281, and the inter-pixel light-shielding film 63 is disposed immediately above the region surrounded by the pixel isolation unit 1281. Therefore, it is possible to prevent infrared light condensed by the on-chip lens 62 from entering the transistor, particularly, the gate electrode part of the transistor.

As a result, it is possible to prevent infrared light from being reflected by the gate electrode part of the transistor, and further suppress occurrence of cross-talk and reduction in pixel sensitivity.

Further, in the example illustrated in FIG. 62, since the pixel isolation unit 1281 is formed at a position shifted from the transistor, it is possible to prevent leaked currents from being generated in the P-well part covering the transistor, similarly to the example illustrated in FIG. 59.

Further, a cross-sectional view corresponding to the line G2-G2' of the pixels 51 illustrated in FIG. 61 is as illustrated in FIG. 63. In FIG. 63, similarly to the case in FIG. 62, the part having a trench structure, which is long in the direction perpendicular to the surface of the substrate 61 in the oxide film 1311 and the fixed charge film 1312, is the pixel isolation unit 1281, and the pixel isolation unit 1281 isolates the light-receiving regions 1254 of the adjacent pixels 51. In particular, here, the pixel isolation unit 1281 penetrates the oxide film 64 part to reach the multilayer interconnection layer 811.

In accordance with the pixels 51 having such a configuration illustrated in FIG. 61 to FIG. 63, it is possible to improve characteristics such as sensitivity characteristics and distance measurement accuracy (resolution), and also prevent leaked currents from being generated.

Twenty Third Embodiment

Configuration Example of Pixel

A configuration of the pixel 51 according to a twenty third embodiment will be described with reference to FIG. 64 to FIG. 66.

Figure 64:
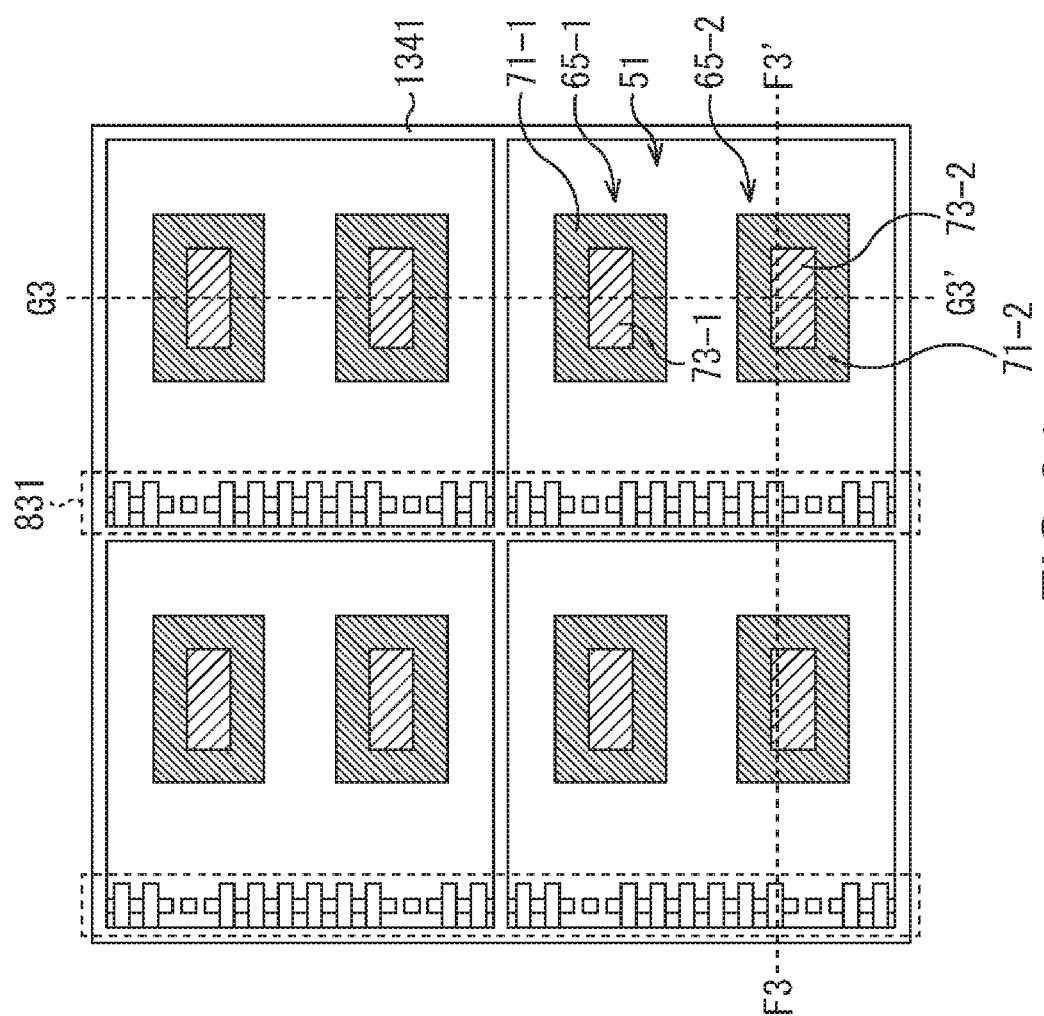
FIG. 64 is a view of the pixel viewed from a direction perpendicular to a surface of the substrate.

FIG. 64 is a view of the pixels 51 viewed from the direction perpendicular to the surface of the substrate 61.

In this example, a pixel isolation unit 1341 that functions as a pixel isolation region for isolating the regions of the pixels 51 is formed in the boundary part of the pixels 51 adjacent to each other so that the region of each pixel 51 is surrounded by the pixel isolation unit 1341.

Also in FIG. 64, similarly to the case in FIG. 58, the positions at which the transistor for driving the pixel 51, and the like are disposed and the position at which the pixel isolation unit 1341 is disposed are different from each other when viewed from the direction perpendicular to the surface of the substrate 61. That is, the pixel isolation unit 1341 is located at a position shifted from the transistor and the like.

Note that the pixel isolation unit 1341 is different from the pixel isolation unit 1221 illustrated in FIG. 58 in that the pixel isolation unit 1221 penetrates the substrate 61 but the pixel isolation unit 1341 does not penetrate the substrate 61.

Figure 65:
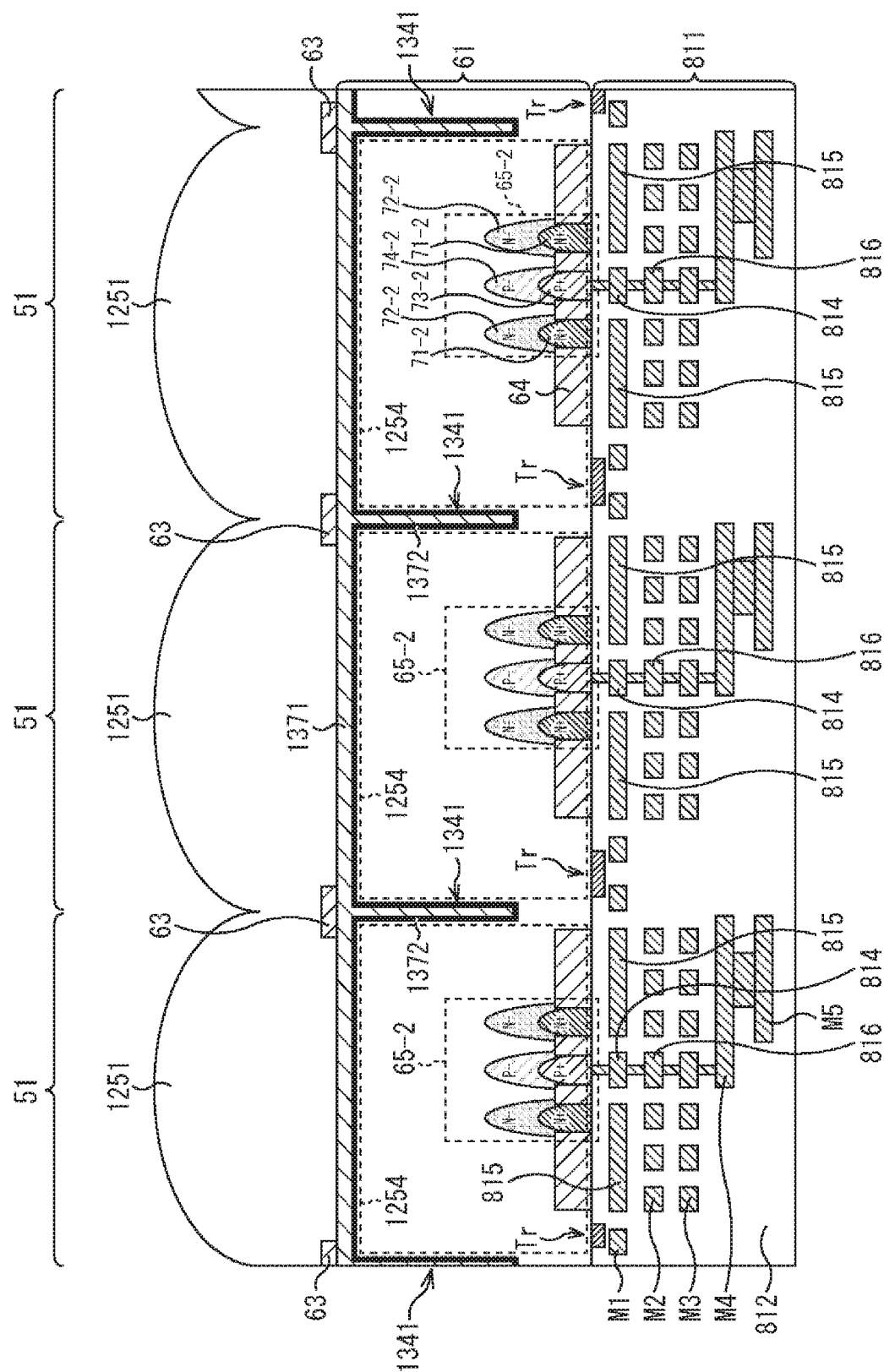
FIG. 65 is a cross-sectional view of the multiple pixels.
Figure 66:
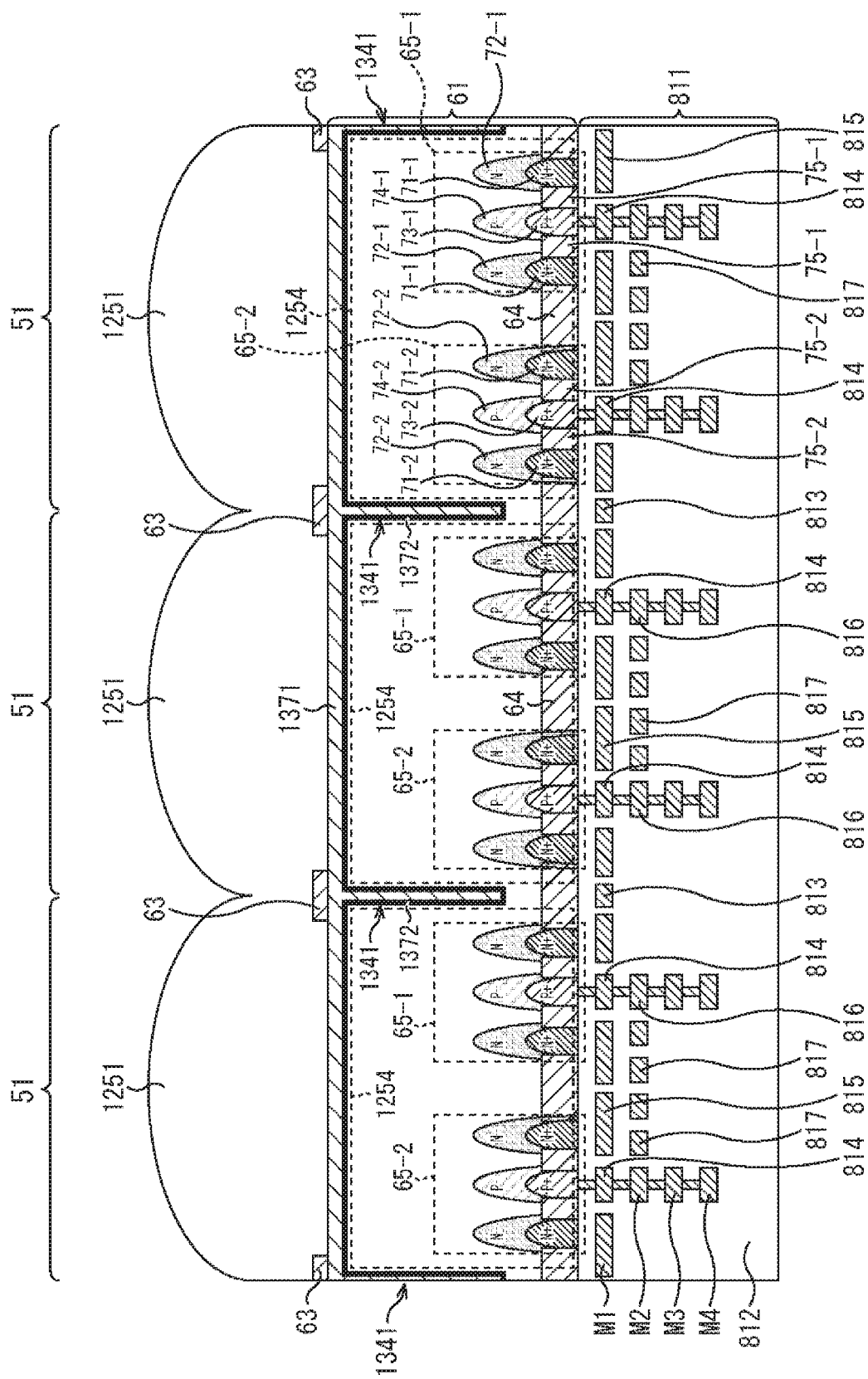
FIG. 66 is a cross-sectional view of the multiple pixels.

Here, a cross section corresponding to the line F3-F3' and a cross section corresponding to the line G3-G3' in FIG. 64 are respectively illustrated in FIG. 65 and FIG. 66.

The configuration of the pixels 51 illustrated in FIG. 65 and FIG. 66 is different from the configuration of the pixels 51 illustrated in FIG. 59 and FIG. 60 in that an oxide film 1371 and a fixed charge film 1372 are provided instead of the oxide film 1252 and the fixed charge film 1253.

As illustrated in FIG. 65, in each pixel 51, the on-chip lens 1251 is disposed on the light incident surface side in the substrate 61. Further, the part constituting one pixel 51 in the substrate 61 is the light-receiving region 1254.

Then, the pixel isolation unit 1341 constituted by a part of the oxide film 1371 and the fixed charge film 1372 isolates the light-receiving regions 1254 of the adjacent pixels 51.

That is, in the example illustrated in FIG. 65, the oxide film 1371 is formed so as to cover the surface of the substrate 61 on the on-chip lens 1251 side.

Further, at the boundary part of the pixels 51 adjacent to each other, the oxide film 1371 is formed from the surface of the substrate 61 on the light incident surface side (on the on-chip lens 1251 side) to a predetermined depth, which isolates the light-receiving regions 1254 of the adjacent pixels 51.

Further, inside the substrate 61, the region between the P-type semiconductor region constituting the substrate 61 and the oxide film 1371, i.e., the surface part of the oxide film 1371 is covered by the fixed charge film 1372.

In particular, in this example, the part that is formed to a predetermined depth to be long in the direction perpendicular to the surface of the substrate 61 in the oxide film 1371 and the fixed charge film 1372, and functions as a DTI having a trench structure for isolating the light-receiving regions 1254 between the adjacent pixels 51 is the pixel isolation unit 1341.

Note that although the pixel isolation unit 1341 has been described to be constituted by the oxide film 1371 and the fixed charge film 1372, it can also be regarded that the pixel isolation unit 1341 is constituted by only the oxide film 1371.

In addition, the pixel isolation unit 1341 may be formed of a metal material and a fixed charge film, or may be formed of a metal material and an oxide film.

In the example illustrated in FIG. 65, since the pixel isolation unit 1341 is formed in the boundary part of the pixels 51, it is possible to prevent the reflected light of infrared light that has entered the substrate 61 from the on-chip lens 1251 from entering an adjacent pixel 51, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

Further, in the example illustrated in FIG. 65, since the pixel isolation unit 1341 is formed at a position shifted from the transistor, it is possible to prevent leaked currents from being generated in the P-well part covering the transistor, similarly to the example illustrated in FIG. 59.

In particular, in the example illustrated in FIG. 59, the pixel isolation unit 1221 penetrates the substrate 61. For this reason, there is a possibility that in the transistor, currents leaked from the fixed charge film 1253 are generated via the P-well part covering the transistor, which is formed on the bottom portion of the substrate 61, i.e., on the multilayer interconnection layer 811 side of the substrate 61.

Meanwhile, in the example illustrated in FIG. 65, it is possible to adjust the depth of the pixel isolation unit 1341 so that the pixel isolation unit 1341 is formed at a position sufficiently away from the P-well part covering the transistor. As a result, it is possible to reliably prevent leaked current from being generated.

Further, in the example illustrated in FIG. 65, the inter-pixel light-shielding film 63 and the on-chip lens 1251 are disposed in accordance with the pixel isolation unit 1341 that is shifted and disposed, similarly to the example in FIG. 59.

Therefore, also in the case illustrated in FIG. 65, similarly to the case in FIG. 59, it is possible to increase the amount of light (amount of received light) guided into the light-receiving region 1254 by the on-chip lens 1251, and improve sensitivity characteristics.

Further, a cross-sectional view corresponding to the line G3-G3' of the pixels 51 illustrated in FIG. 64 is as illustrated in FIG. 66. Also in FIG. 66, similarly to the case in FIG. 65, the part having a trench structure, which is long in the direction perpendicular to the surface of the substrate 61 in the oxide film 1371 and the fixed charge film 1372, is the pixel isolation unit 1341. In particular, the pixel isolation unit 1341 is formed to a predetermined depth, and the pixel isolation unit 1341 does not reach the oxide film 64 part in this example.

In accordance with the pixels 51 having such a configuration illustrated in FIG. 64 to FIG. 66, it is possible to improve characteristics such as sensitivity characteristics and distance measurement accuracy (resolution), and also prevent leaked currents from being generated.

Note that also in the example illustrated in FIG. 64 to FIG. 66, the on-chip lens 1251 may be disposed so that the position of the optical axis of the on-chip lens 1251 is located substantially in the middle of the two signal extraction units 65 in the pixel 51. Further, the signal extraction units 65 may be shifted and disposed so that the position between the two signal extraction units 65 is at a position of the optical axis of the on-chip lens 1251.

Twenty Fourth Embodiment

Configuration Example of Pixel

A configuration of the pixel 51 according to a twenty fourth embodiment will be described with reference to FIG. 67 to FIG. 69.

Figure 67:
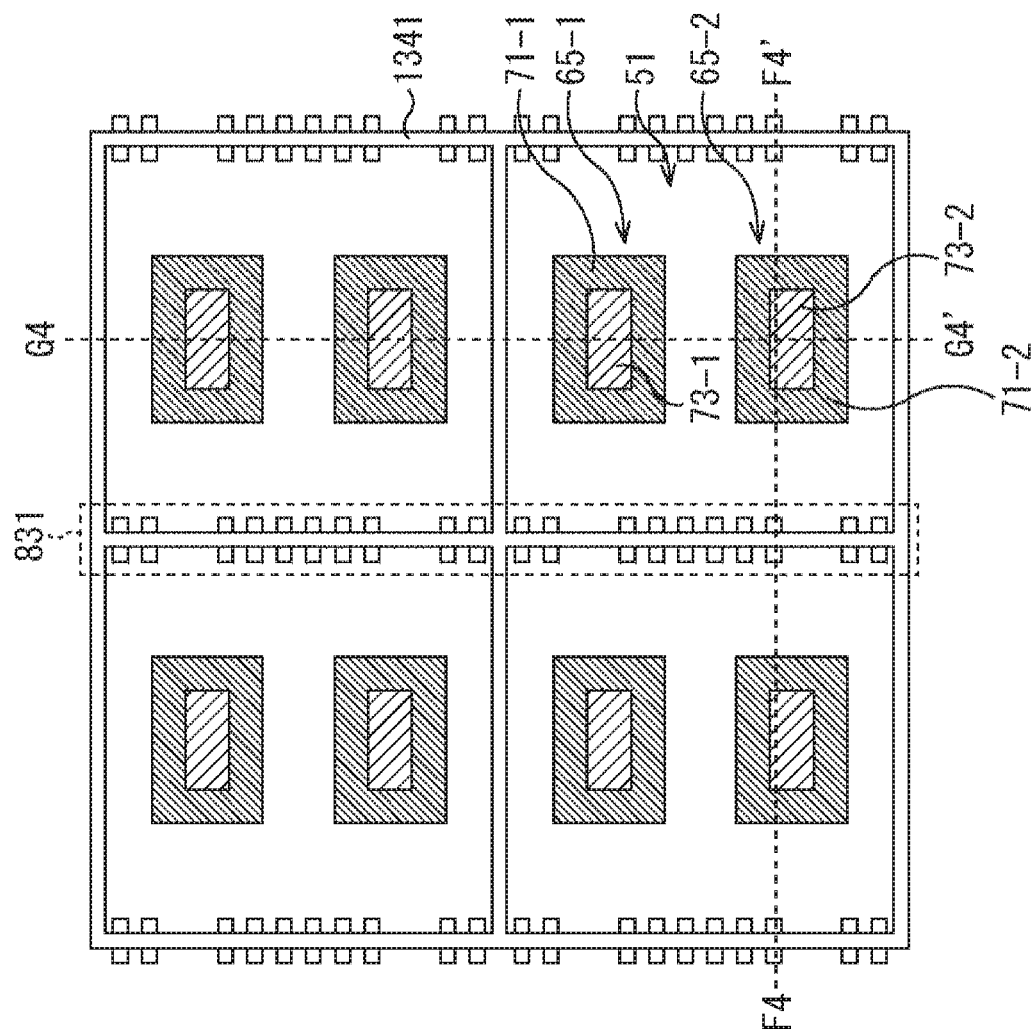
FIG. 67 is a view of the pixel viewed from a direction perpendicular to a surface of the substrate.

FIG. 67 is a view of the pixels 51 viewed from the direction perpendicular to the surface of the substrate 61.

In this example, the pixel isolation unit 1341 that functions as a pixel isolation region for isolating the regions of the pixels 51 is formed at the boundary portion of the pixels 51 adjacent to each other so that the region of each pixel 51 is surrounded by the pixel isolation unit 1341.

The example illustrated in FIG. 67 is different from that in FIG. 64 in that the pixel isolation unit 1341 is provided immediately above the pixel transistor interconnection region 831, i.e., immediately above the transistor.

Figure 68:
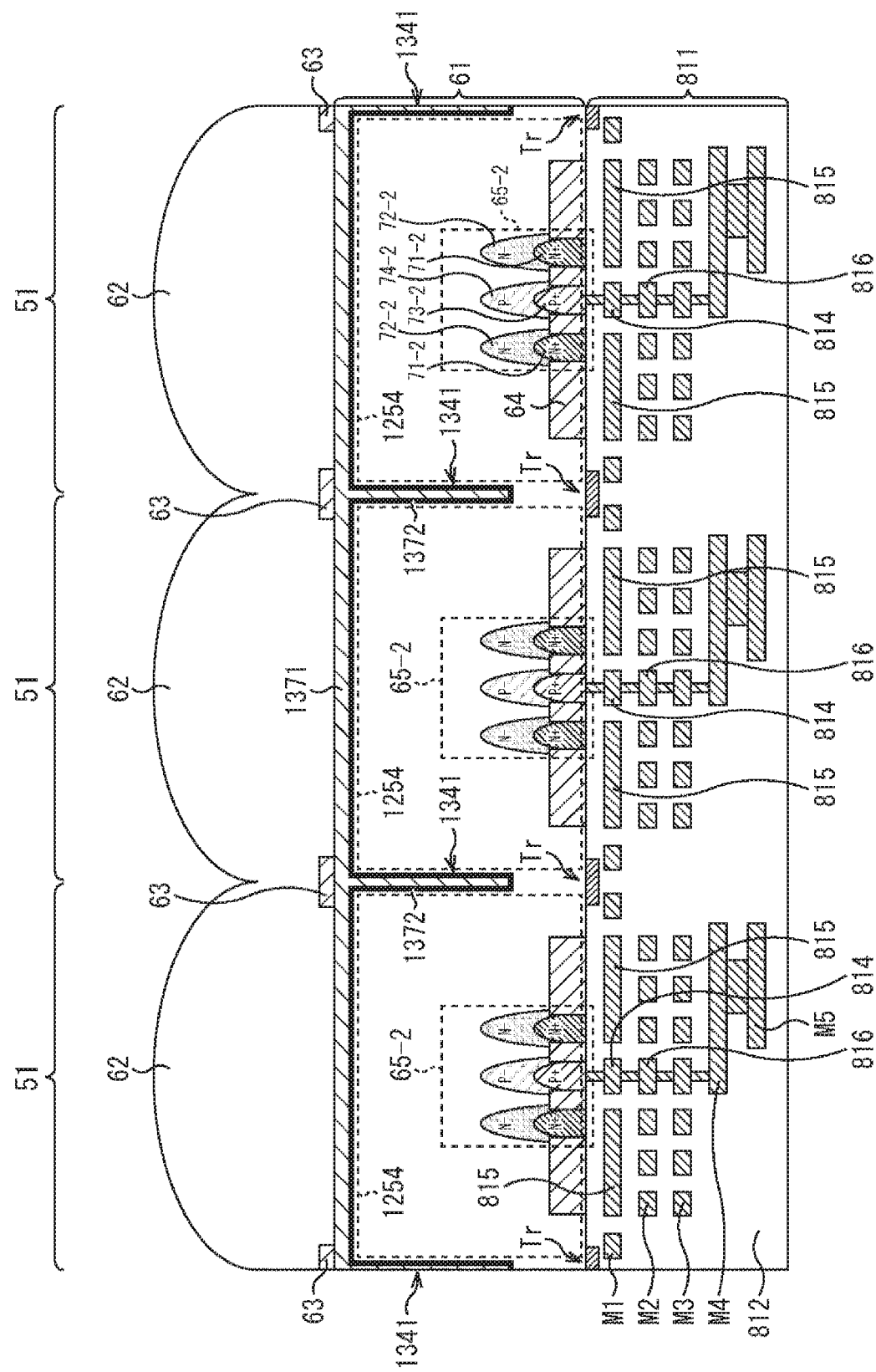
FIG. 68 is a cross-sectional view of the multiple pixels.
Figure 69:
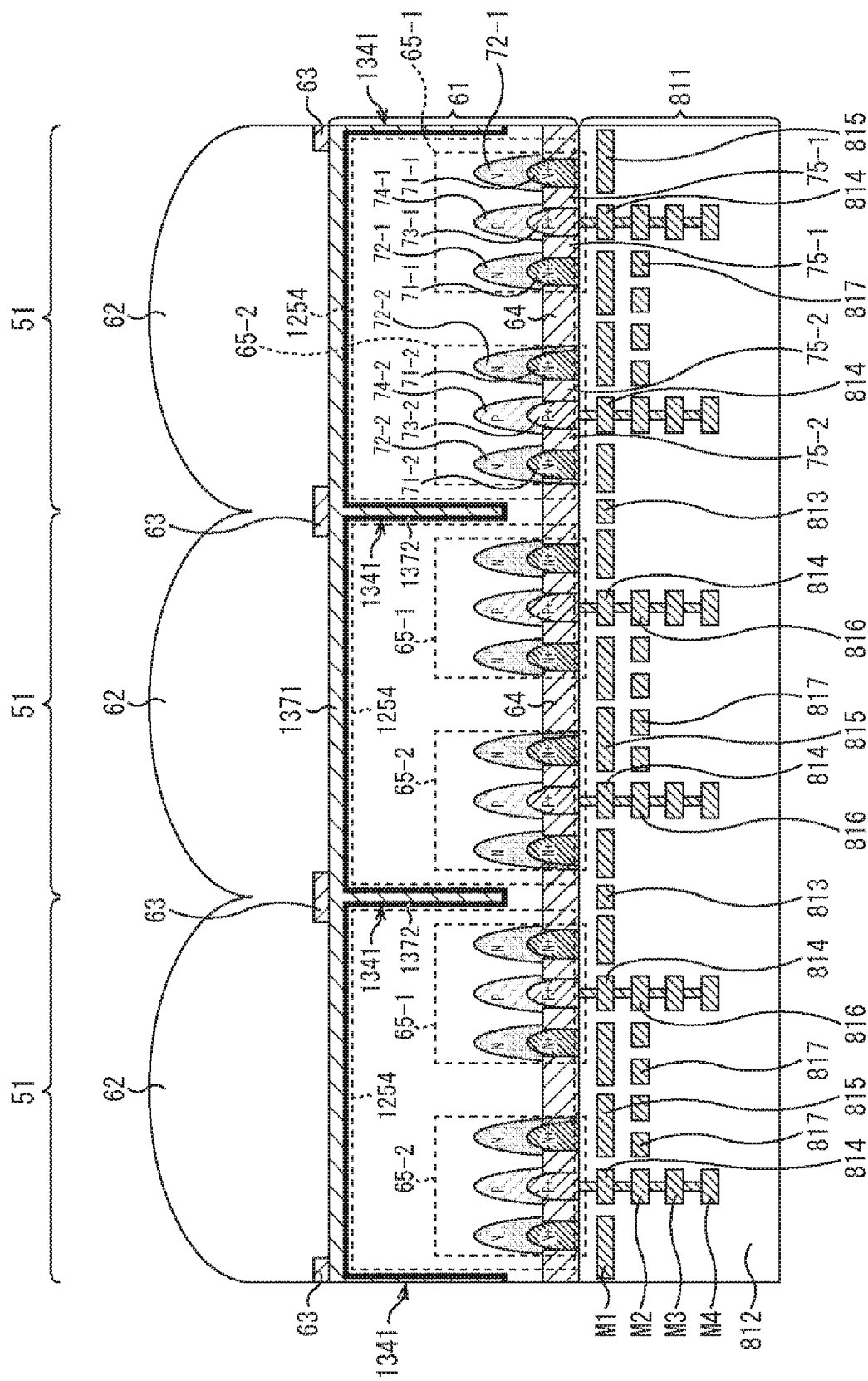
FIG. 69 is a cross-sectional view of the multiple pixels.

Here, a cross section corresponding to the line F4-F4' and a cross section corresponding to the line G4-G4' in FIG. 67 are respectively illustrated in FIG. 68 and FIG. 69.

The configuration of the pixels 51 illustrated in FIG. 68 and FIG. 69 is the same as the configuration of the pixels 51 illustrated in FIG. 65 and FIG. 66 except that the on-chip lens 62 is provided instead of the on-chip lens 1251 and the position of the pixel isolation unit 1341 differs.

As illustrated in FIG. 68, in each pixel 51, the on-chip lens 62 is disposed on the light incident surface side in the substrate 61. This on-chip lens 62 is disposed so that the position of the optical axis of the on-chip lens 62 is located between the two signal extraction units 65 in the pixel 51.

Further, the pixel isolation unit 1341 constituted by a part of the oxide film 1371 and fixed charge film 1372 is disposed immediately above the transistor, and the pixel isolation unit 1341 having such a trench structure isolates the light-receiving regions 1254 of the adjacent pixels 51.

In particular, here, since the pixel isolation unit 1341 does not penetrate the substrate 61, even in the case of disposing the pixel isolation unit 1341 immediately above the transistor, the pixel isolation unit 1341 is sufficiently away from the P-well part and it is possible to prevent leaked currents from being generated.

Therefore, in the example illustrated in FIG. 68, it does not necessarily need to dispose the on-chip lens 62 to be shifted, and it is possible to dispose the on-chip lens 62 so that the position of the optical axis is located between the two signal extraction units 65. As a result, it is possible to make the electron extraction efficiency substantially uniform between the two signal extraction units 65 in the pixel 51.

Further, a cross-sectional view corresponding to the line G4-G4' of the pixels 51 illustrated in FIG. 67 is as illustrated in FIG. 69. The cross section of the pixels 51 illustrated in FIG. 69 is the same as the cross section illustrated in FIG. 66 except that the on-chip lens 62 is provided instead of the on-chip lens 1251 in FIG. 66.

In accordance with the pixels 51 having such a configuration illustrated in FIG. 67 to FIG. 69, it is possible to improve characteristics such as sensitivity characteristics and distance measurement accuracy (resolution), and also prevent leaked currents from being generated.

Twenty Fifth Embodiment

Configuration Example of Pixel

A configuration of the pixel 51 according to a twenty fifth embodiment will be described with reference to FIG. 70 to FIG. 72.

Figure 70:
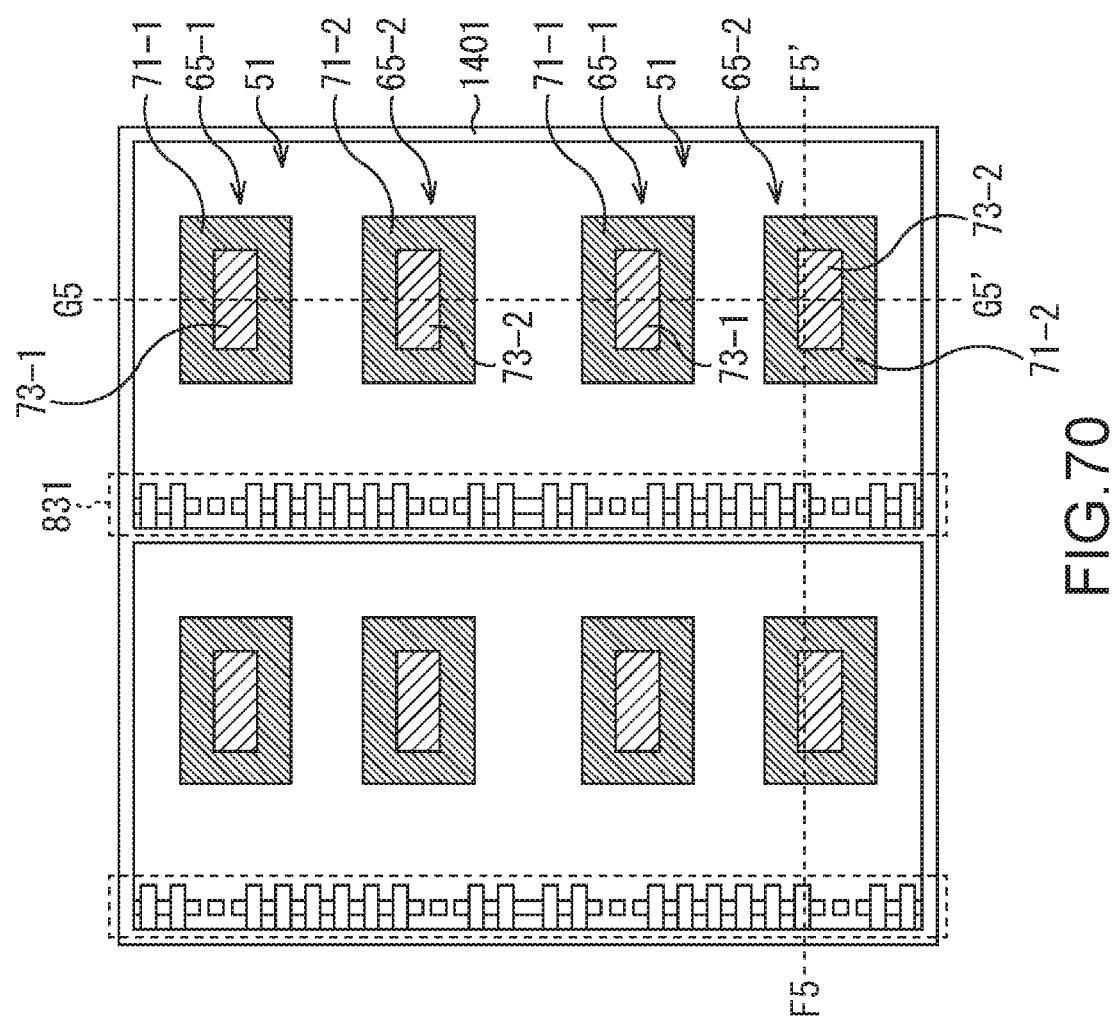
FIG. 70 is a view of the pixel viewed from a direction perpendicular to a surface of the substrate.

FIG. 70 is a view of the pixels 51 viewed from the direction perpendicular to the surface of the substrate 61.

In this example, a pixel isolation unit 1401 that functions as a pixel isolation region for isolating the regions of the pixels 51 is formed at the boundary part of the pixels 51 so that the regions of two pixels 51 adjacent to each other in the vertical direction in the figure are surrounded by the pixel isolation unit 1401.

Note that the region surrounded by the pixel isolation unit 1401, in which four signal extraction units 65 are provided, can also be regarded as one pixel. In this case, the four signal extraction units 65 are formed in the light-receiving region of one pixel in the substrate 61, and the light-receiving region is surrounded by the pixel isolation unit 1401 and thus is isolated from the light-receiving region of another pixel.

In this example, the pixel isolation unit 1401 is disposed at a position shifted from the transistor and the like so that the positions at which the transistor for driving the pixel 51, and the like are disposed and the position at which the pixel isolation unit 1401 is disposed are different from each other when viewed from the direction perpendicular to the surface of the substrate 61.

For example, in the case of measuring the distance to a target object using an indirect ToF method, by performing the measurement using more than two phases, it is possible to reduce the number of times of the operation of reading charges accumulated in the signal extraction unit 65, and improve the frame rate at the time of distance measurement.

At this time, in order to reduce the number of times of the reading operation, it is necessary to divide the phase to be used for each of the pixels 51 (signal extraction units 65), and sensitivity characteristics can be improved by using a plurality of pixels 51 used for the distance measurement of the same target object as a unit and causing the plurality of pixels 51 to be surrounded by the pixel isolation unit 1401.

Here, the phase represents a timing when accumulating charges obtained by photoelectric conversion in one signal extraction unit 65 using the signal extraction unit 65 as an active tap, i.e., a phase in which the signal extraction unit 65 is used as an active tap.

Now, for example, assumption is made that one pixel 51 is used and the distance to a target object is measured by receiving reflected light from the target object for one pulse emission of infrared light. In particular, here, assumption is made that four-phase measurement is performed by the two signal extraction units 65 (taps) in one pixel 51.

In this case, for example, a first tap that is one of the signal extraction units 65 in the one pixel 51 is used as an active tap in a first phase that is the initial phase, and a second tap that is the other of the signal extraction units 65 is used as an active tap in the subsequent second phase. Charges accumulated in the first tap and the second tap are read after the second phase is finished, for example.

Further, the first tap is used as an active tap again in a third phase following the second phase, and the second tap is used as an active tap in the last fourth phase. Then, for example, when the fourth phase is finished, charges accumulated in the first tap and the second tap are read.

When the charges (pixel signals) for four phases are read in this way, the distance to a target object is obtained on the basis of the signal corresponding to the read charges.

The above-mentioned method of accumulating charges in four phases using two taps to obtain a distance to a target object will be referred to as two-tap-four-phase processing. In general terms, a method of accumulating charges in m phases using n different taps to measure a distance to a target object is n-tap-m-phase processing.

For example, in the case of performing the above-mentioned two-tap-four-phase processing, the number of times of reading charges is two.

Meanwhile, assumption is made that two pixels 51, i.e., four signal extraction units 65 (taps) are used to perform four-tap-four-phase processing. In this case, when taking the four different taps as the first tap to the fourth tap, it only needs to respectively drive, as active taps, the first tap to the fourth tap in the first phase to the fourth phase.

In this case, since each tap is used as an active tap only once during the four phases, the number of times of reading charges is only one.

Therefore, for example, by performing four-tap-four-phase processing, it is possible to reduce the number of reading times as compared with the case of performing two-tap-four-phase processing. In this example, it is possible to double the reading rate at the time of distance measurement, i.e., the frame rate.

Here, in the case of using four signal extraction units 65 arranged in the vertical direction to obtain the distance to a target object by four-tap-four-phase processing, for example, two pixels 51 to be used for measuring the distance to the same target object can be caused to be surrounded by the pixel isolation unit 1401 as illustrated in FIG. 70. Note that in this case, the region surrounded by the pixel isolation unit 1401 can also be regarded as one pixel.

With this, since reflected light from the same target object enters the region surrounded by the pixel isolation unit 1401, it is possible to suppress variation in sensitivity and reduction in sensitivity as compared with the case of isolating the region for each pixel 51. That is, it is possible to improve sensitivity characteristics. Note that the use of the light-receiving element 1 having the configuration illustrated in FIG. 70 is not limited to measurement of a distance to a target object, and the light-receiving element 1 may be used for any other purpose.

Figure 71:
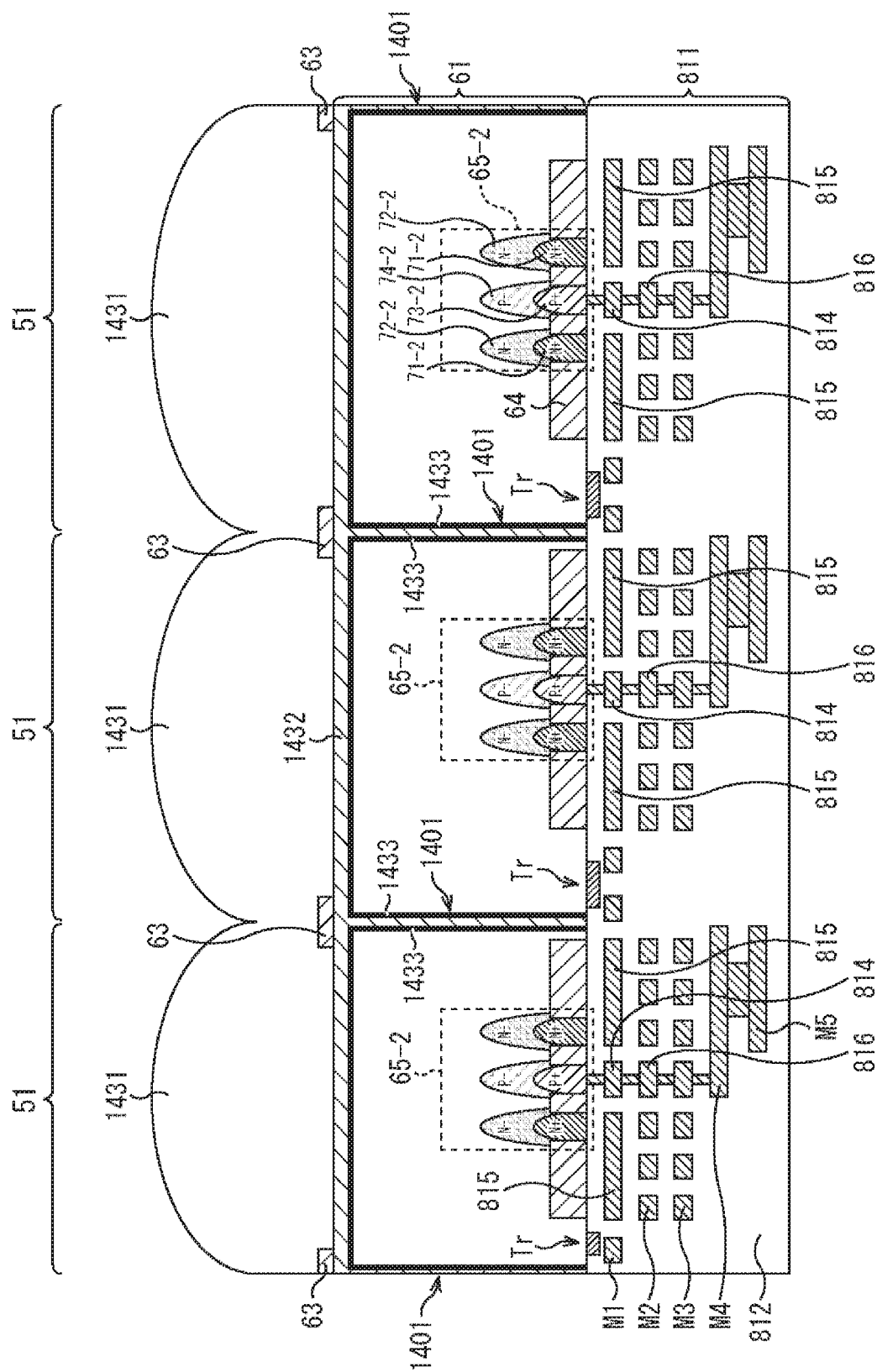
FIG. 71 is a cross-sectional view of the multiple pixels.
Figure 72:
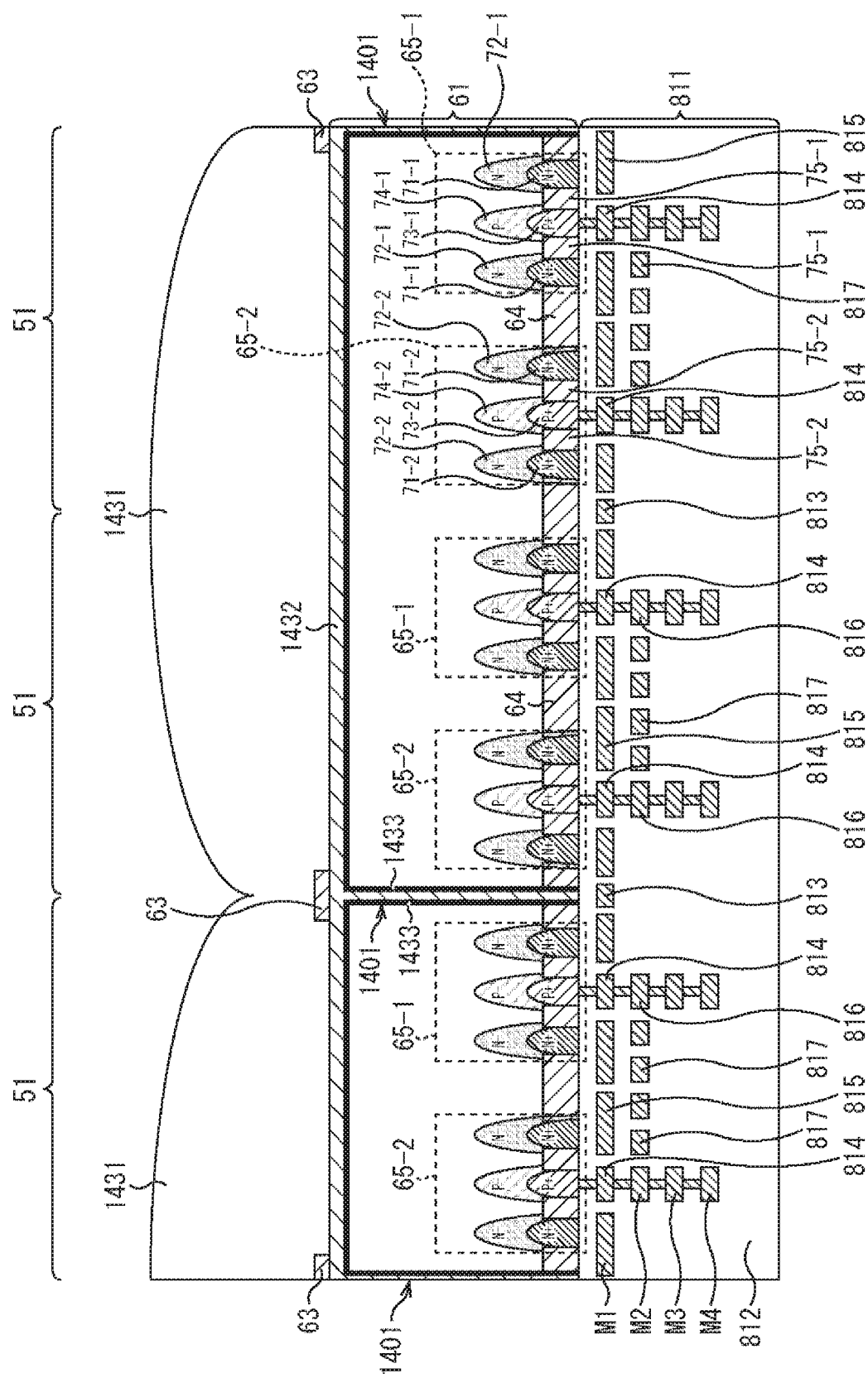
FIG. 72 is a cross-sectional view of the multiple pixels.

Here, a cross section corresponding to the line F5-F5' and a cross section corresponding to the line G5-G5' in FIG. 70 are respectively illustrated in FIG. 71 and FIG. 72.

The configuration of the pixels 51 illustrated in FIG. 71 and FIG. 72 is different from the configuration of the pixels 51 illustrated in FIG. 36 and FIG. 37 in that the on-chip lens 62 and the fixed charge film 66 are not provided and an on-chip lens 1431, an oxide film 1432, and a fixed charge film 1433 are newly provided.

As illustrated in FIG. 71, in each pixel 51, the on-chip lens 1431 is disposed to be adjacent with the light incident surface side in the substrate 61, i.e., the side opposite to the multilayer interconnection layer 811 side. The on-chip lens 1431 condenses infrared light that has entered from the outside, and guides the infrared light into the inside of substrate 61.

In particular, in the cross section illustrated in FIG. 71, one on-chip lens 1431 is provided for each of the pixels 51 arranged in the horizontal direction in the figure.

Further, the pixel isolation unit 1401 constituted by a part of the oxide film 1432 and fixed charge film 1433 isolates the light-receiving regions of the adjacent pixels 51. In particular, in the cross section illustrated in FIG. 71, the pixel isolation unit 1401 is formed at the boundary position of the pixels 51 arranged in the horizontal direction in the figure, and the light-receiving regions of the pixels 51 are isolated from each other.

In the example illustrated in FIG. 71, the oxide film 1432 is formed so as to cover the surface of the substrate 61 on the on-chip lens 1431 side. Further, at the boundary part of the pixels 51 adjacent to each other, the oxide film 1432 penetrates the substrate 61, thereby isolating the light-receiving regions of the adjacent pixels 51. Further, inside the substrate 61, the surface part of the oxide film 1432 is covered by the fixed charge film 1433.

Such a part having a trench structure, which is long in the direction perpendicular to the surface of the substrate 61 in the oxide film 1432, and the fixed charge film 1433, i.e., the part that penetrates the substrate 61 and functions as an FTI for isolating the light-receiving regions between the adjacent pixels 51, is the pixel isolation unit 1401.

Note that although the pixel isolation unit 1401 has been described to be constituted by the oxide film 1432 and the fixed charge film 1433 here, it can also be regarded that the pixel isolation unit 1401 is constituted by only the oxide film 1432.

In addition, the pixel isolation unit 1401 may be formed of a metal material and a fixed charge film, or may be formed of a metal material and an oxide film.

Since the pixel isolation unit 1401 is formed in the boundary part of the pixels 51, it is possible to prevent reflected light of infrared light that has entered the substrate 61 from the on-chip lens 1431 from entering the pixel 51 to be used for measuring the distance to a different target object, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

In the example illustrated in FIG. 71, since the pixel isolation unit 1401 is formed at a position shifted from the transistor, it is possible to prevent leaked currents from being generated in the P-well part covering the transistor, similarly to the example illustrated in FIG. 59.

Further, in this example, similarly to the example in FIG. 59, the interpixel light-shielding film 63 and the on-chip lens 1431 are disposed in accordance with the pixel isolation unit 1401 disposed to be shifted.

Therefore, also in the case illustrated in FIG. 71, similarly to the case in FIG. 59, it is possible to increase the amount of light (amount of received light) guided into the light-receiving region by the on-chip lens 1431, and improve sensitivity characteristics.

Further, a cross-sectional view corresponding to the line G5-G5' of the pixels 51 illustrated in FIG. 70 is as illustrated in FIG. 72. In FIG. 72, since two pixels 51 arranged in the horizontal direction in the figure are used for measuring the distance to the same target object, the pixel isolation unit 1401 is formed in the boundary part of the two pixels 51 and another pixel 51.

In other words, the regions of the two pixels 51 arranged in the horizontal direction in the figure in the substrate 61 are surrounded by the pixel isolation unit 1401, and the regions of the two pixels 51 arranged in the horizontal direction and the region of another pixel 51 adjacent to the two pixels 51 are isolated by the pixel isolation unit 1401.

Further, in the cross section illustrated in FIG. 72, one on-chip lens 1431 is provided for the two pixels 51 arranged in the horizontal direction in the figure, i.e., the two pixels 51 to be used for measuring the distance to the same target object. Therefore, for example, in the example illustrated in FIG. 70, one on-chip lens 1431 is provided for the two pixels 51 arranged in the vertical direction in FIG. 70, i.e., the two pixels 51 surrounded by the pixel isolation unit 1401, which are to be used for measuring the distance to the same target object.

In accordance with the pixels 51 having such a configuration illustrated in FIG. 70 to FIG. 72, it is possible to improve characteristics such as sensitivity characteristics and distance measurement accuracy (resolution), and also prevent leaked currents from being generated.

Note that in FIG. 71, the example in which the position at which the on-chip lens 1431 is disposed is shifted in accordance with the position at which the pixel isolation unit 1401 is formed has been described. However, the on-chip lens 1431 may be disposed so that the position of the optical axis of the on-chip lens 1431 is located substantially in the middle of the two pixels 51 when viewed from the direction perpendicular to the surface of the substrate 61.

Further, for example, in the example illustrated in FIG. 70, regarding the two pixels 51 surrounded by the pixel isolation unit 1401, the signal extraction units 65 may be disposed to be shifted so that the position between the signal extraction unit 65-1 of the pixel 51 on the lower side in the figure and the signal extraction unit 65-2 of the pixel 51 on the upper side in the figure is located at a position of the optical axis of the on-chip lens 1431.

Twenty Sixth Embodiment

Configuration Example of Pixel

A configuration of the pixel 51 according to a twenty sixth embodiment will be described with reference to FIG. 73 to FIG. 75.

Figure 73:
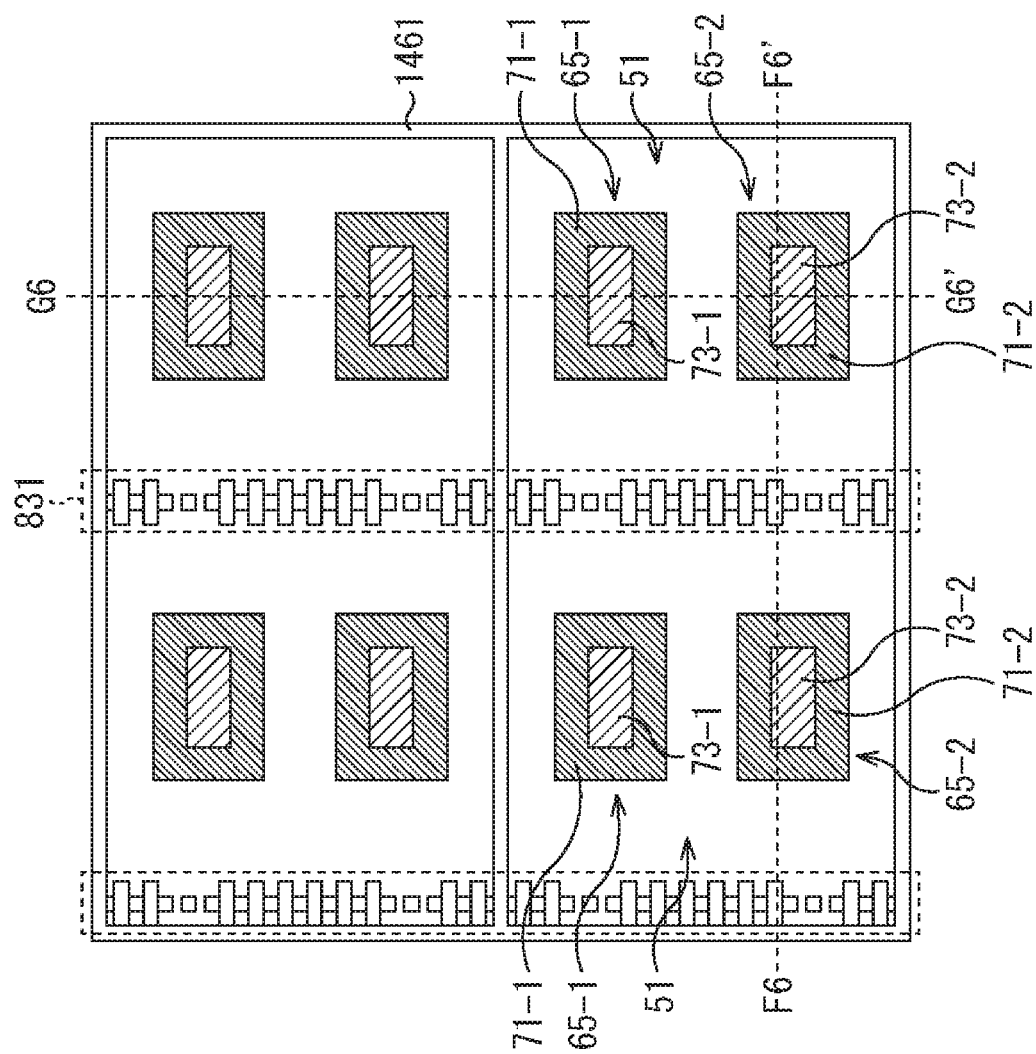
FIG. 73 is a view of the pixel viewed from a direction perpendicular to a surface of the substrate.

FIG. 73 is a view of the pixels 51 viewed from the direction perpendicular to the surface of the substrate 61.

In this example, a pixel isolation unit 1461 that functions as a pixel isolation region for isolating regions of the pixels 51 is formed at the boundary part of the pixels 51 so that the region of two pixels 51 adjacent to each other in the right and left direction in the figure are surrounded by the pixel isolation unit 1461. Note that the region surrounded by the pixel isolation unit 1461, in which four signal extraction units 65 are provided, can also be regarded as one pixel.

In this example, the pixel isolation unit 1461 is disposed at a position shifted from the transistor and the like so that the positions at which the transistor for driving the pixel 51, and the like are disposed and the position at which the pixel isolation unit 1461 is disposed are different from each other when viewed from the direction perpendicular to the surface of the substrate 61.

In FIG. 70, the example in which the two pixels 51 adjacent to each other in the vertical direction are used to measure the distance to the same target object by an indirect ToF method has been described.

Meanwhile, in the example illustrated in FIG. 73, for example, two pixels 51 adjacent to each other in the right and left direction in the figure, i.e., two pixels 51 surrounded by the pixel isolation unit 1461, can be used for measurement of the distance to the same target object by an indirect ToF method. Note that in this case, the region surrounded by the pixel isolation unit 1461 can also be regarded as one pixel. Note that the use of the light-receiving element 1 having the configuration illustrated in FIG. 73 is not limited to measurement of the distance to a target object, and the light-receiving element 1 may be used for any other purpose.

By causing the two pixels 51, which are to be used for measuring the distance to the same target object, to be surrounded by the pixel isolation unit 1461 as described above, it is possible to suppress variation in sensitivity and reduction in sensitivity, similarly to the example illustrated in FIG. 70. That is, it is possible to improve sensitivity characteristics.

Figure 74:
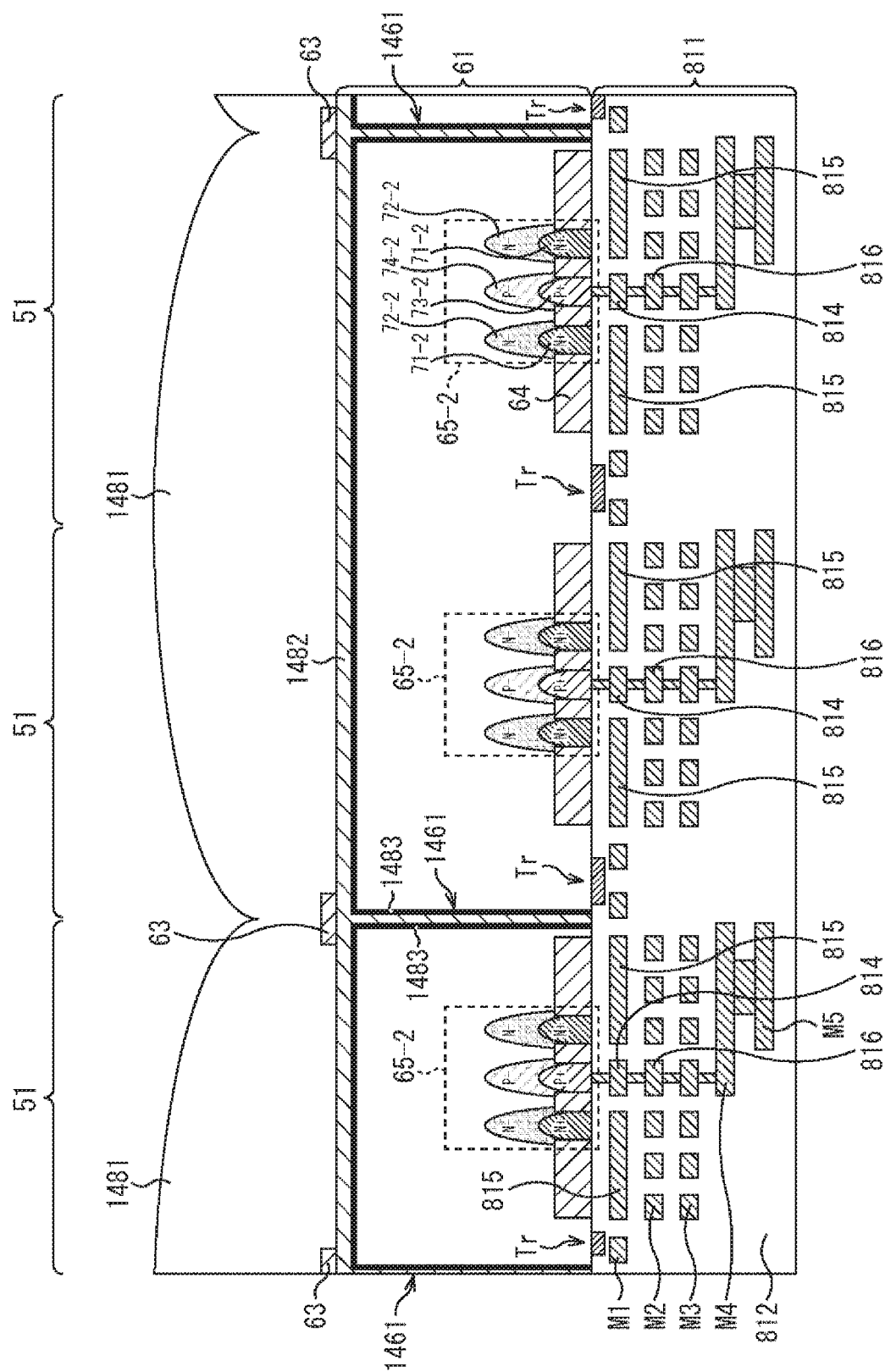
FIG. 74 is a cross-sectional view of the multiple pixels.
Figure 75:
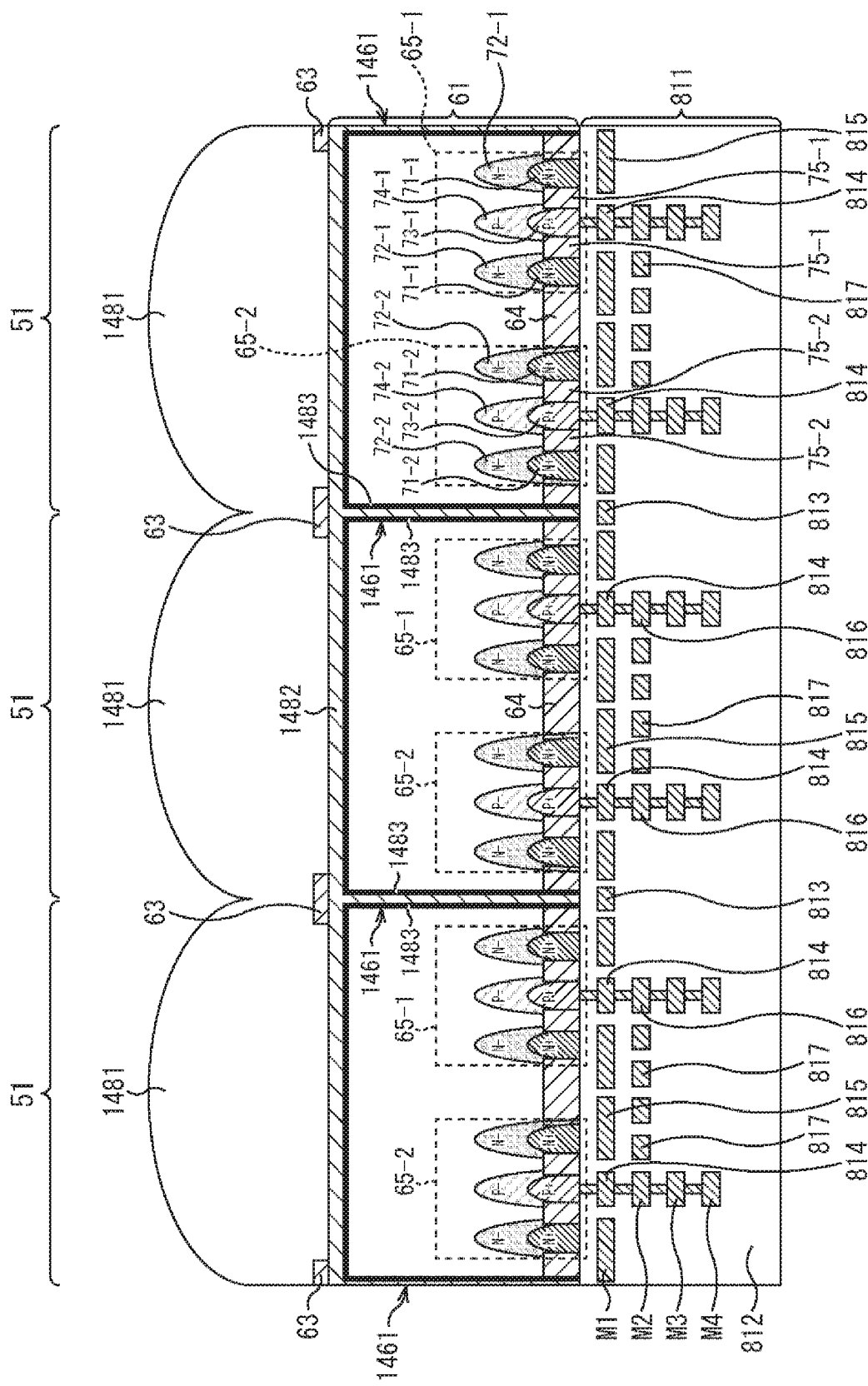
FIG. 75 is a cross-sectional view of the multiple pixels.

Here, a cross section corresponding to the line F6-F6' and a cross section corresponding to the line G6-G6' in FIG. 73 are respective illustrated in FIG. 74 and FIG. 75.

The configuration of the pixels 51 illustrated in FIG. 74 and FIG. 75 is different from the configuration of the pixels 51 illustrated in FIG. 36 and FIG. 37 in that the on-chip lens 62 and the fixed charge film 66 are not provided and an on-chip lens 1481, an oxide film 1482, and a fixed charge film 1483 are newly provided.

As illustrated in FIG. 74, in each pixel 51, the on-chip lens 1481 is disposed to be adjacent to the light incident surface side in the substrate 61, i.e., the side opposite to the multilayer interconnection layer 811 side. The on-chip lens 1481 condenses infrared light that has entered from the outside and guides the infrared light into the inside of the substrate 61.

In particular, in the cross section illustrated in FIG. 74, one on-chip lens 1481 is provided for the two pixels 51 arranged in the horizontal direction in the figure.

Further, the pixel isolation unit 1461 constituted by a part of the oxide film 1482 and fixed charge film 1483 isolates the light-receiving regions of the pixels 51.

In this example, since the two pixels 51 arranged in the horizontal direction in the figure are used for measuring the distance to the same target object, the pixel isolation unit 1461 is formed in the boundary part of the two pixels 51 and another pixel 51.

In other words, the regions of the two pixels 51 arranged in the horizontal direction in the figure in the substrate 61 are surrounded by the pixel isolation unit 1461, and the regions of the two pixels 51 arranged in the horizontal direction and the region of another pixel 51 adjacent to the two pixels 51 are isolated from each other by the pixel isolation unit 1461.

In the example illustrated in FIG. 74, the oxide film 1482 is formed so as to cover the surface of the substrate 61 on the on-chip lens 1481 side. Further, at the boundary part of the pixels 51 adjacent to each other, which are to be used for measuring distances to different target objects, the oxide film 1482 penetrates the substrate 61, thereby isolating the light-receiving regions of the adjacent pixels 51. Further, inside the substrate 61, the surface part of the oxide film 1482 is covered by the fixed charge film 1483.

Such a part having a trench structure, which is long in the direction perpendicular to the surface of the substrate 61 in the oxide film 1482 and the fixed charge film 1483, i.e., the part that penetrates the substrate 61 and functions as FTI for isolating the light-receiving regions between the adjacent pixels 51, is the pixel isolation unit 1461.

Note that although the pixel isolation unit 1461 has been described to be constituted by the oxide film 1482 and the fixed charge film 1483 here, it can also be regarded that the pixel isolation unit 1461 is constituted by only the oxide film 1482.

In addition, the pixel isolation unit 1461 may be formed of a metal material and a fixed charge film, or may be formed of a metal material and an oxide film.

Since the pixel isolation unit 1461 is formed in the boundary part of the pixels 51 to be used for measuring distances to different target objects, it is possible to prevent reflected light of infrared light that has entered the substrate 61 from the on-chip lens 1481 from entering the pixel 51 to be used for measuring the distance to a different target object, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

Further, in the example illustrated in FIG. 74, since the pixel isolation unit 1461 is formed at a position shifted from the transistor, it is possible to prevent leaked currents from being generated in the P-well part covering the transistor, similarly to the example illustrated in FIG. 59.

Further, in this example, similarly to the example in FIG. 59, the interpixel light-shielding film 63 and the on-chip lens 1481 are disposed in accordance with the pixel isolation unit 1461 that is disposed to be shifted.

Therefore, also in the case illustrated in FIG. 74, similarly to the case in FIG. 59, it is possible to increase the amount of light (amount of received light) guided into the light-receiving region by the on-chip lens 1481, and improve sensitivity characteristics.

Further, a cross-sectional view corresponding to the line G6-G6' of the pixels 51 illustrated in FIG. 73 is as illustrated in FIG. 75. In FIG. 75, the pixel isolation unit 1461 is formed in the boundary part of the pixels 51 adjacent to each other. Further, in the cross section illustrated in FIG. 75, one on-chip lens 1481 is provided for one pixel 51.

Therefore, for example, in the example illustrated in FIG. 73, one on-chip lens 1481 is provided for two pixels 51 arranged in the right and left direction in FIG. 73, i.e., two pixels 51 surrounded by the pixel isolation unit 1461, which are to be used for measuring the distance to the same target object.

In accordance with the pixels 51 having such a configuration illustrated in FIG. 73 to FIG. 75, it is possible to improve characteristics such as sensitivity characteristics and distance measurement accuracy (resolution), and also prevent leaked currents from being generated.

Note that in FIG. 74, the example in which the position at which the on-chip lens 1481 is disposed is shifted in accordance with the position at which the pixel isolation unit 1461 is formed has been described. However, the on-chip lens 1481 may be disposed so that the position of the optical axis of the on-chip lens 1481 is located at a position substantially in the middle of the four signal extraction units 65 in the region surrounded by the pixel isolation unit 1461, i.e., at a position at which the distances from the signal extraction units 65 are substantially equal to each other when viewed from the direction perpendicular to the surface of the substrate 61.

Further, for example, in the example illustrated in FIG. 73, the four signal extraction units 65 may be disposed to be shifted so that the position substantially in the middle of the four signal extraction units 65 surrounded by the pixel isolation unit 1461 is a position of the optical axis of the on-chip lens 1481.

Twenty Seventh Embodiment

Configuration Example of Pixel

A configuration of the pixel 51 according to a twenty seventh embodiment will be described with reference to FIG. 76 to FIG. 78.

Figure 76:
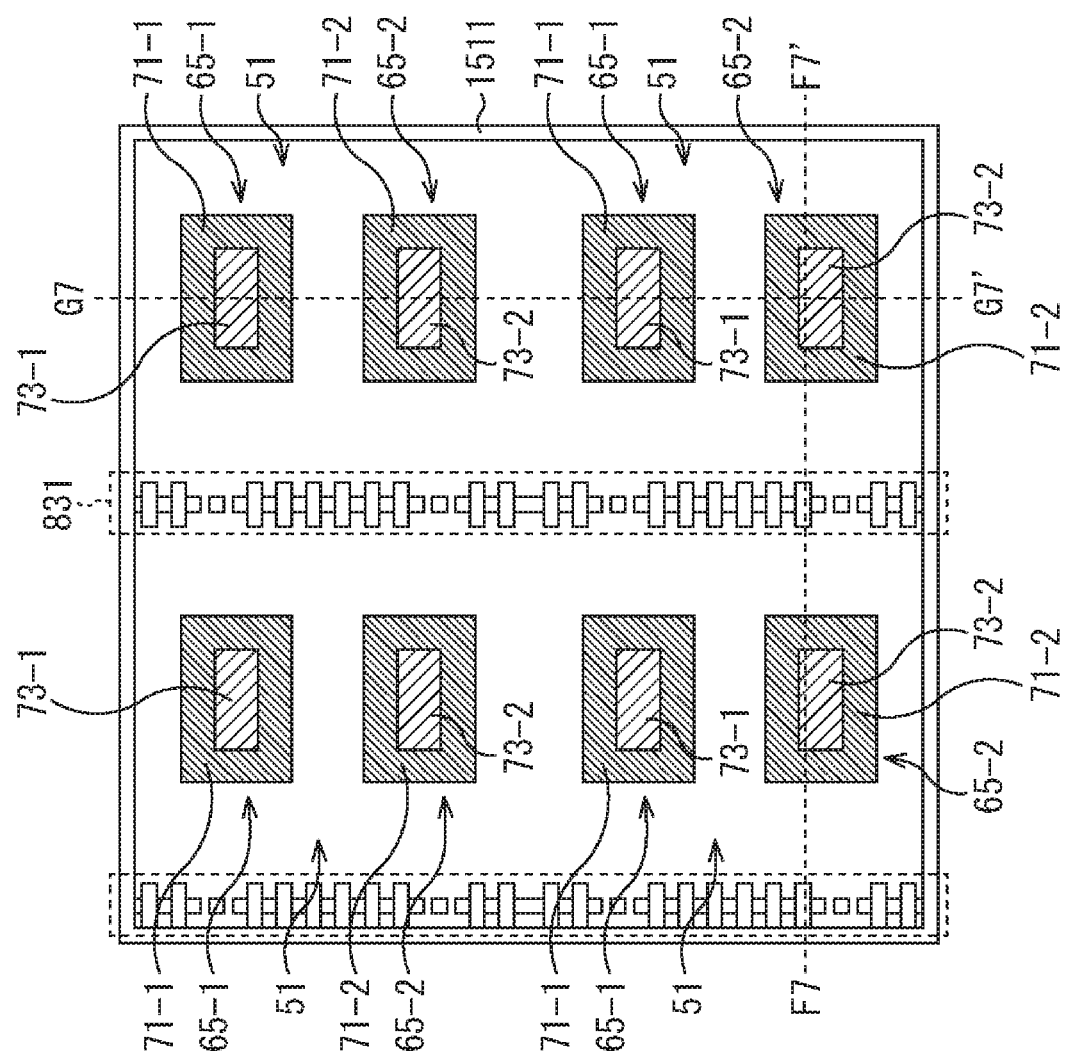
FIG. 76 is a view of the pixel viewed from a direction perpendicular to a surface of the substrate.
Figure 777:
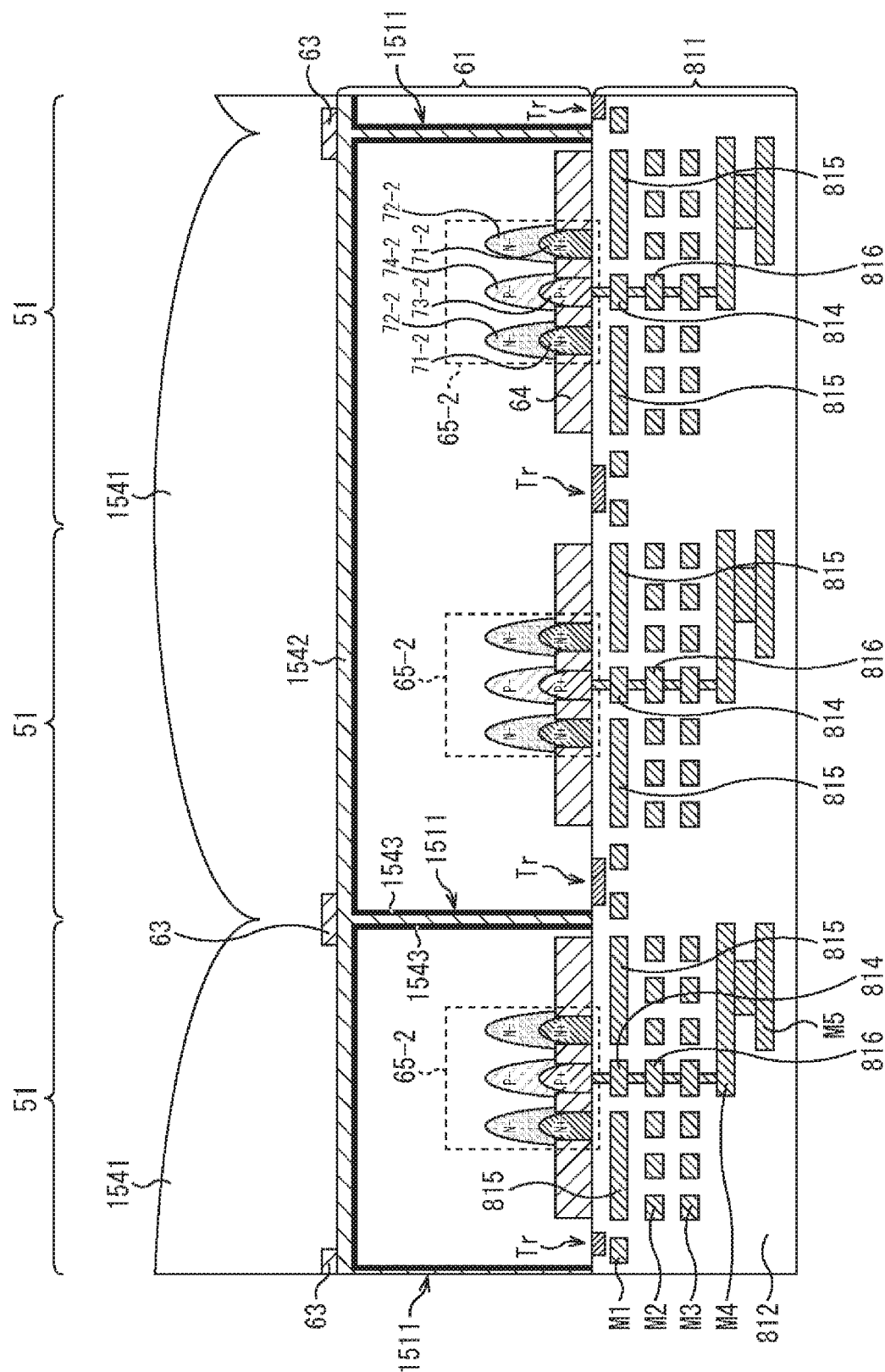

FIG. 76 is a view of the pixels 51 viewed from the direction perpendicular to the surface of the substrate 61.

In this example, a pixel isolation unit 1511 that functions as a pixel isolation region for isolating regions of the pixels 51 is formed in the boundary part of the pixels 51 so that regions of four pixels 51 adjacent to each other in the figure are surrounded by the pixel isolation unit 1511. Note that the region surrounded by the pixel isolation unit 1511, in which eight signal extraction units 65 are provided, can also be regarded as one pixel.

In this example, the pixel isolation unit 1511 is disposed at a position shifted from the transistor and the like so that the positions at which the transistor for driving the pixel 51, and the like are arranged and the position at which the pixel isolation unit 1511 is disposed are different from each other when viewed from the direction perpendicular to the surface of the substrate 61.

In FIG. 70, the example in which two pixels 51 adjacent to each other are used for measuring the distance to the same target object by an indirect ToF method has been described.

Meanwhile, in the example illustrated in FIG. 76, for example, four pixels 51 adjacent to each other, i.e., four pixels 51 surrounded by the pixel isolation unit 1511, are used for measuring the distance to the same target object by an indirect ToF method. Note that in this case, the region surrounded by the pixel isolation unit 1511 can also be regarded as one pixel. Further, the use of the light-receiving element 1 having the configuration illustrated in FIG. 76 is not limited to measurement of a distance to a target object, and the light-receiving element 1 may be used for any other purpose.

By causing the four pixels 51, which are to be used for measuring the distance to the same target object, to be surrounded by the pixel isolation unit 1511 as described above, it is possible to suppress variation in sensitivity and reduction in sensitivity, i.e., it is possible to improve sensitivity characteristics, similarly to the example illustrated in FIG. 70.

Note that in the example illustrated in FIG. 76, for example, four pixels 51 can be used to perform eight-tap-eight-phase processing. In this case, the reading rate at the time of distance measurement can be quadrupled as compared with the case of two-tap-eight-phase processing.

Figure 78:
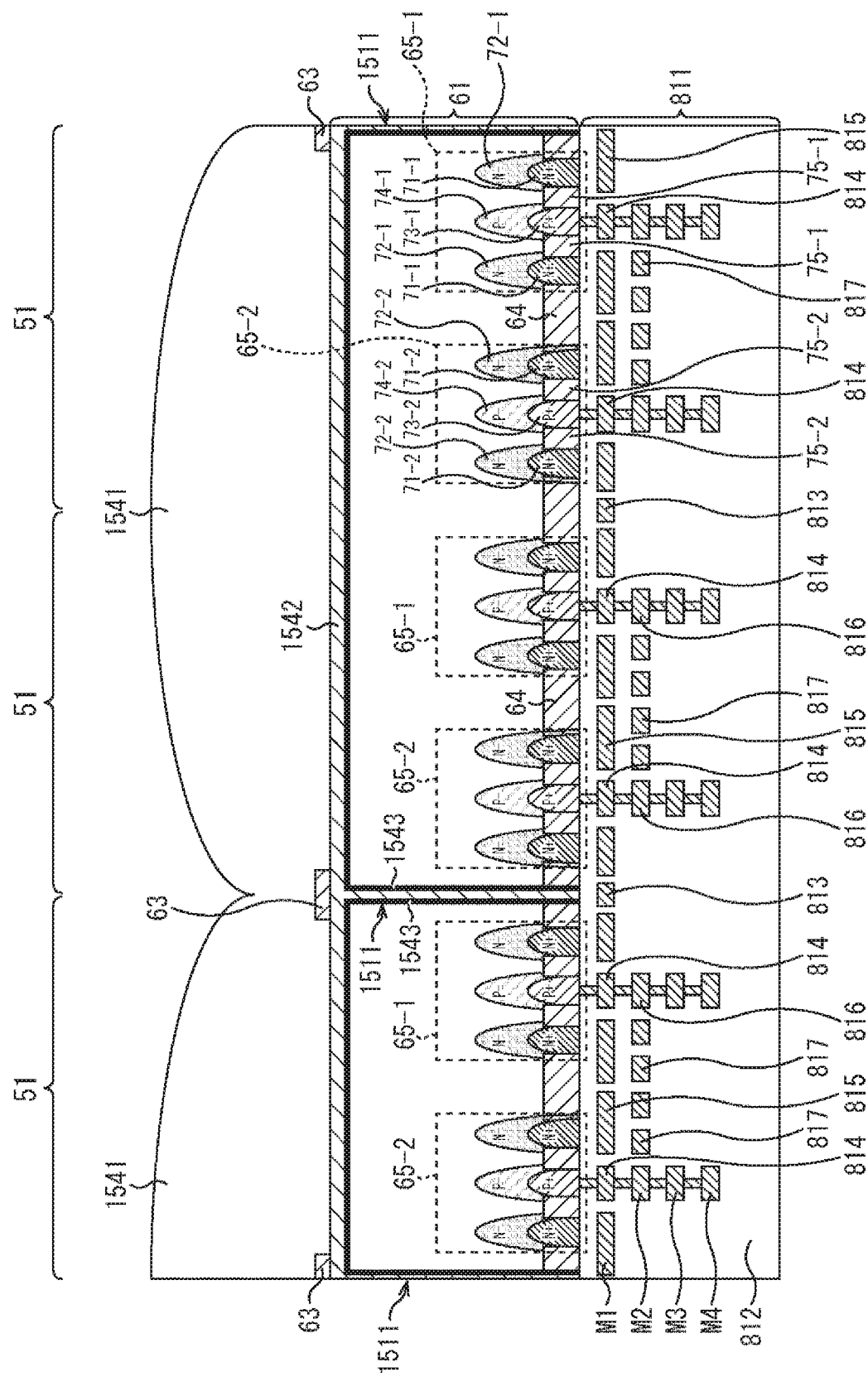
FIG. 78 is a cross-sectional view of the multiple pixels.

Here, a cross section corresponding to the line F7-F7' and a cross section corresponding to the line G7-G7' in FIG. 76 are respectively illustrated in FIG. 77 and FIG. 78.

The configuration of the pixels 51 illustrated in FIG. 77 and FIG. 78 is different from the configuration of the pixels 51 illustrated in FIG. 36 and FIG. 37 in that the on-chip lens 62 and the fixed charge film 66 are not provided and an on-chip lens 1541, an oxide film 1542, and a fixed charge film 1543 are newly provided.

As illustrated in FIG. 77, in each pixel 51, the on-chip lens 1541 is disposed to be adjacent to the light incident surface side in the substrate 61, i.e., the side opposite to the multilayer interconnection layer 811 side. The on-chip lens 1541 condenses infrared light that has entered from the outside and guides the infrared light into the inside of the substrate 61.

In particular, in the cross section illustrated in FIG. 77, one on-chip lens 1541 is provided for two pixels 51 arranged in the horizontal direction in the figure.

Further, the pixel isolation unit 1511 constituted by a part of the oxide film 1542 and fixed charge film 1543 isolates the light-receiving regions of the pixels 51.

In this example, since two pixels 51 arranged in the horizontal direction in the figure are used for measuring the distance to the same target object, the pixel isolation unit 1511 is formed in the boundary part of the two pixels 51 and another pixel 51.

In other words, the regions of two pixels 51 arranged in the horizontal direction in the figure in the substrate 61 are surrounded by the pixel isolation unit 1511, and the regions of the two pixels 51 arranged in the horizontal direction and the region of another pixel 51 adjacent to the two pixels 51 are isolated by the pixel isolation unit 1511.

In the example illustrated in FIG. 77, the oxide film 1542 is formed so as to cover the surface of the substrate 61 on the on-chip lens 1541 side. Further, at the boundary part of the pixels 51 adjacent to each other, which are to be used for measuring distances to different target objects, the oxide film 1542 penetrates the substrate 61, thereby isolating the light-receiving regions of the adjacent pixels 51. Further, inside the substrate 61, the surface part of the oxide film 1542 is covered by the fixed charge film 1543.

Such a part having a trench structure, which is long in the direction perpendicular to the surface of the substrate 61 in the oxide film 1542 and the fixed charge film 1543, i.e., the part that penetrates the substrate 61 and functions as FTI for isolating the light-receiving regions between the adjacent pixels 51, is the pixel isolation unit 1511.

Note that although the pixel isolation unit 1511 has been described to be constituted by the oxide film 1542 and the fixed charge film 1543 here, it can also be regarded that the pixel isolation unit 1511 is constituted by only the oxide film 1542.

In addition, the pixel isolation unit 1511 may be formed of a metal material and a fixed charge film, or may be formed of a metal material and an oxide film.

Since the pixel isolation unit 1511 is formed in the boundary part of the pixels 51 to be used for measuring distances to different target objects, it is possible to prevent reflected light of infrared light that has entered the substrate 61 from the on-chip lens 1541 from entering the pixel 51 to be used for measuring the distance to a different target object, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

Further, in the example illustrated in FIG. 77, since the pixel isolation unit 1511 is formed at a position shifted from the transistor, it is possible to prevent leaked currents from being generated in the P-well part covering the transistor, similarly to the example illustrated in FIG. 59.

Further, in this example, similarly to the example in FIG. 59, the interpixel light-shielding film 63 and the on-chip lens 1541 are disposed in accordance with the pixel isolation unit 1511 that is disposed to be shifted.

Therefore, also in the case illustrated in FIG. 77, similarly to the case in FIG. 59, it is possible to increase the amount of light (amount of received light) guided into the light-receiving region by the on-chip lens 1541, and improve sensitivity characteristics.

Further, a cross-sectional view corresponding to the line G7-G7' of the pixels 51 illustrated in FIG. 76 is as illustrated in FIG. 78. In FIG. 78, since two pixels 51 arranged in the horizontal direction in the figure are used for measuring the distance to the same target object, the pixel isolation unit 1511 is formed in the boundary part of the two pixels 51 and another pixel 51.

In other words, the regions of two pixels 51 arranged in the horizontal direction in the figure in the substrate 61 are surrounded by the pixel isolation unit 1511, and the regions of the two pixels 51 arranged in the horizontal direction and the region of another pixel 51 adjacent to the two pixels 51 are isolated by the pixel isolation unit 1511.

Further, in the cross section illustrated in FIG. 78, one on-chip lens 1541 is provided for two pixels 51 arranged in the horizontal direction in the figure, i.e., two pixels 51 to be used for measuring the distance to the same target object. Therefore, for example, in the example illustrated in FIG. 76, one on-chip lens 1541 is provided for four pixels 51 adjacent to each other, i.e., four pixels 51 surrounded by the pixel isolation unit 1511, which are to be used for measuring the distance to the same target object.

In accordance with the pixels 51 having such a configuration illustrated in FIG. 76 to FIG. 78, it is possible to improve characteristics such as sensitivity characteristics and distance measurement accuracy (resolution), and also prevent leaked currents from being generated.

Note that in FIG. 77, the example in which the position at which the on-chip lens 1541 is disposed is shifted in accordance with the position at which the pixel isolation unit 1511 is formed has been described. However, the on-chip lens 1541 may be disposed so that the position of the optical axis of the on-chip lens 1541 is located substantially in the middle of the four pixels 51 when viewed from the direction perpendicular to the surface of the substrate 61. Conversely, each of the signal extraction units 65 of the four pixels 51 may be disposed to be shifted so that the position of the optical axis of the on-chip lens 1541 is located substantially in the middle of the two pixels 51 in the cross section illustrated in FIG. 77.

Twenty Eighth Embodiment

Configuration Example of Pixel

A configuration of the pixel 51 according to a twenty eighth embodiment will be described with reference to FIG. 79 to FIG. 81.

Figure 79:
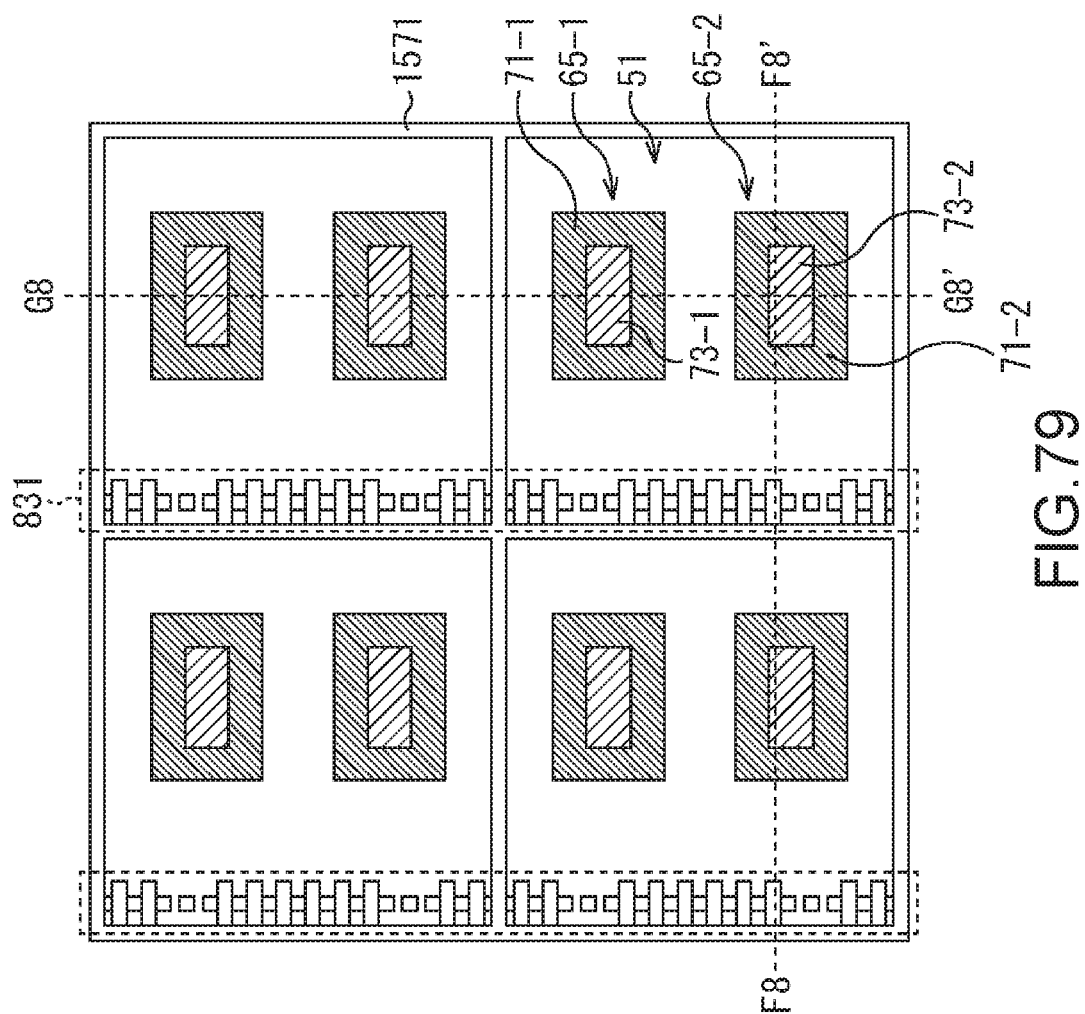
FIG. 79 is a view of the pixel viewed from a direction perpendicular to a surface of the substrate.

FIG. 79 is a view of the pixels 51 viewed from the direction perpendicular to the surface of the substrate 61.

In this example, a pixel isolation unit 1571 that functions as a pixel isolation region for isolating the regions of the pixels 51 is formed in the boundary part of the pixels 51 adjacent to each other so that the region of each pixel 51 is surrounded.

Also in FIG. 79, similarly to the case in FIG. 58, the positions at which the transistor for driving the pixel 51, and the like are arranged and the position at which the pixel isolation unit 1571 is disposed are different from each other when viewed from the direction perpendicular to the surface of the substrate 61. That is, the pixel isolation unit 1571 is disposed at a position shifted from the transistor and the like.

Figure 80:
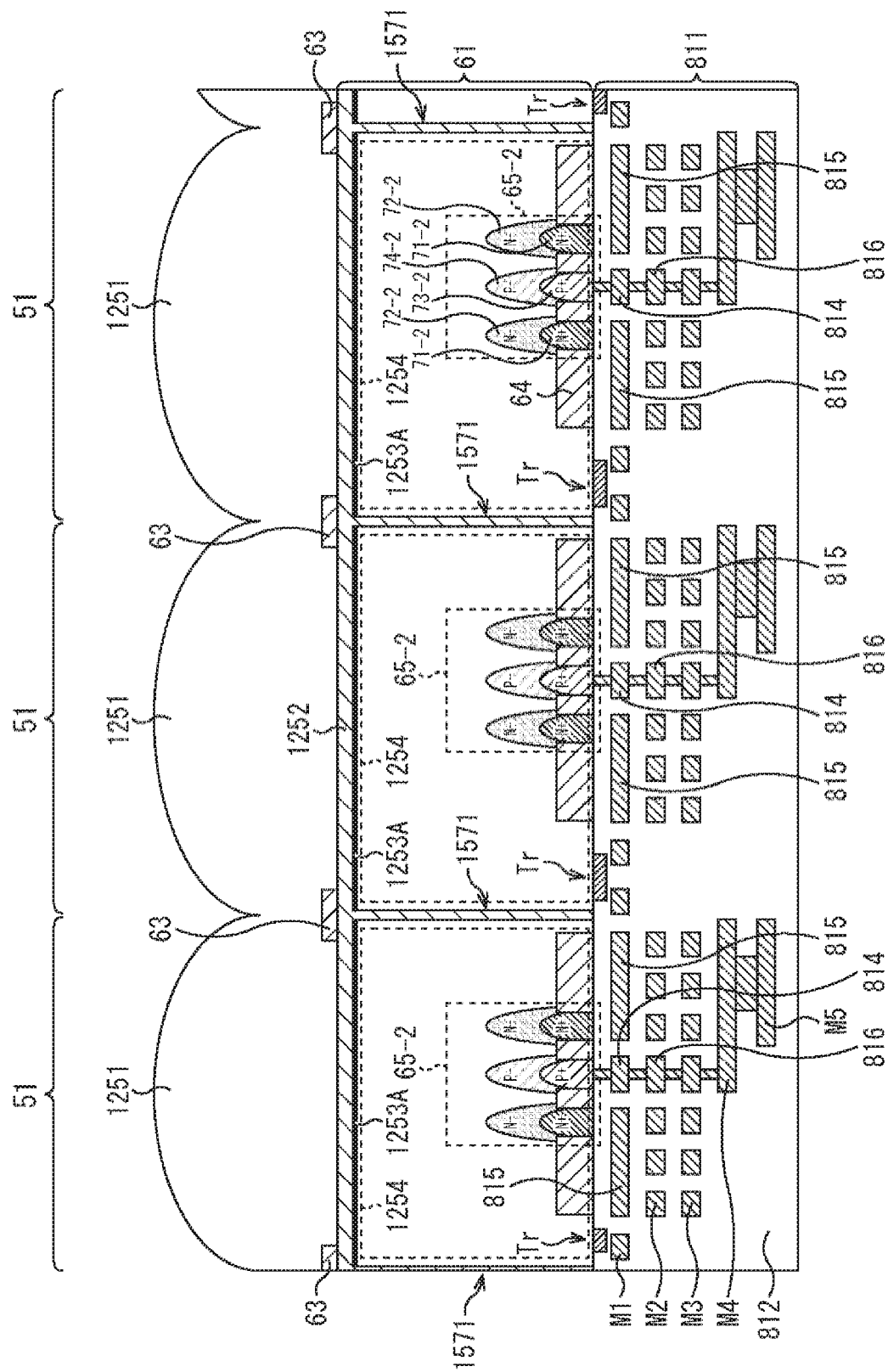
FIG. 80 is a cross-sectional view of the multiple pixels.
Figure 81:
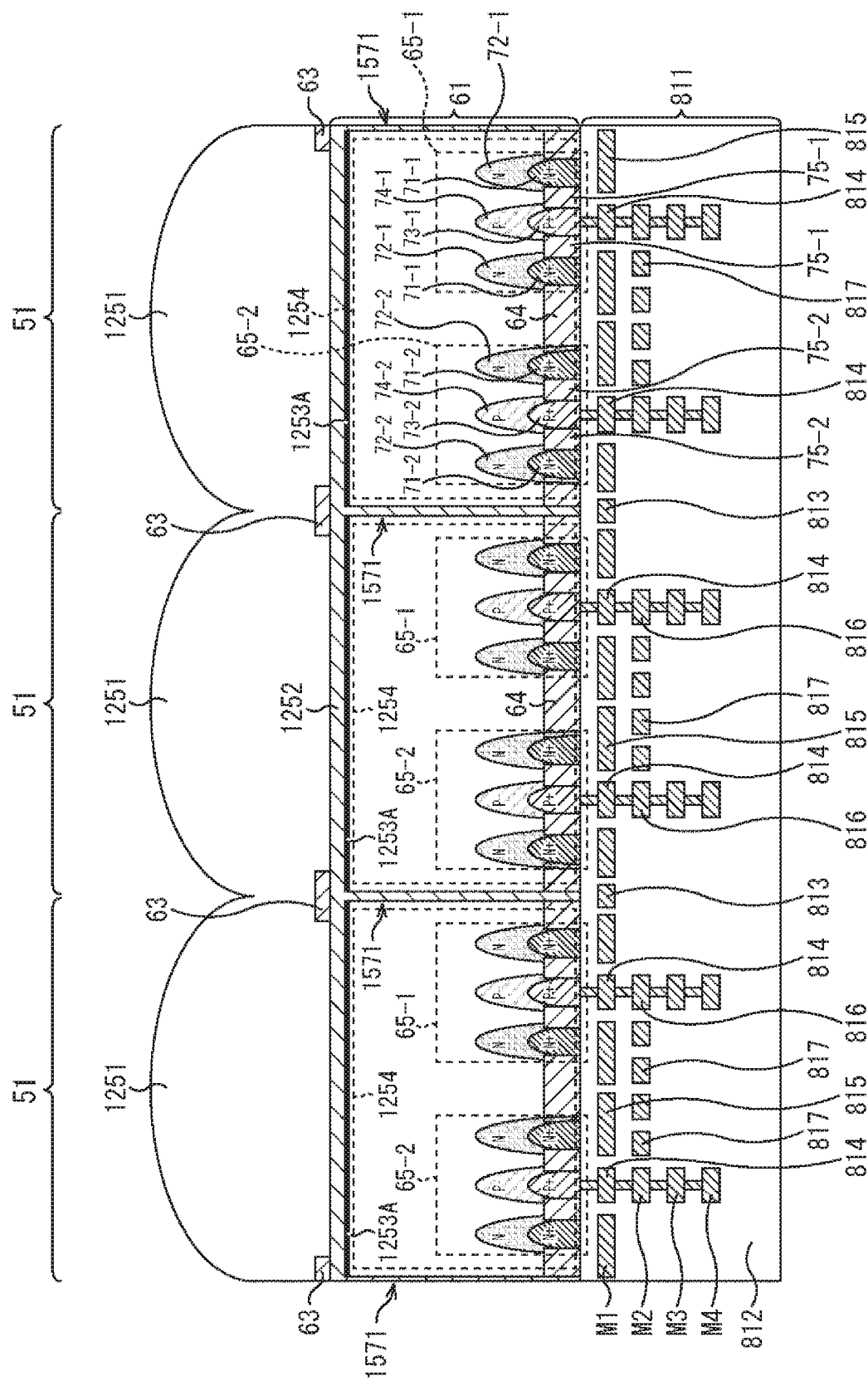
FIG. 81 is a cross-sectional view of the multiple pixels.

Here, a cross section corresponding to the line F8-F8' and a cross section corresponding to the line G8-G8' in FIG. 79 are respectively illustrated in FIG. 80 and FIG. 81.

The configuration of the pixels 51 illustrated in FIG. 80 and FIG. 81 is obtained by forming a fixed charge film 1253A instead of the fixed charge film 1253 in the configuration of the pixels 51 illustrated in FIG. 59 and FIG. 60. That is, the configuration of the pixels 51 illustrated in FIG. 80 and FIG. 81 is the same as the configuration in the example illustrated in FIG. 59 and FIG. 60 except for the fixed charge film 1253A part.

Specifically, in FIG. 59, the fixed charge film 1253 has been formed on the surface of the oxide film 1252 penetrating the substrate 61 in the boundary part of the pixels 51. Meanwhile, the fixed charge film 1253 is not formed in the surface part of the oxide film 1252 penetrating the substrate 61 in the boundary part of the pixels 51 in FIG. 80.

In FIG. 80, the oxide film 1252 is formed to cover the surface of the substrate 61 on the on-chip lens 1251 side, and a fixed charge film 1253A is formed so as to cover the surface of the oxide film 1252 on the side of the inside of the substrate 61 except for the pixel boundary part.

Therefore, the part constituting the pixel isolation unit 1221 in the fixed charge film 1253 illustrated in FIG. 59, i.e., the FTI part, is not formed in FIG. 80. In FIG. 80, the part different from the FTI part in the fixed charge film 1253 illustrated in FIG. 59 is the fixed charge film 1253A.

In the example illustrated in FIG. 80, the part having a trench structure, which is long in the direction perpendicular to the surface of the substrate 61 in the oxide film 1252, i.e., the part that penetrates the substrate 61 and functions as FTI for isolating the light-receiving regions 1254 between adjacent pixels 51, is the pixel isolation unit 1571.

For example, in the configuration illustrated in FIG. 59, there is a possibility that leaked currents are generated from the fixed charge film 1253 to the transistor via the P-well part in the case where the pixel isolation unit 1221 and the P-well part that covers the transistor are not sufficiently isolated from each other.

Meanwhile, in the example illustrated in FIG. 80, since a fixed charge film is not formed in the part in the vicinity of the P-well covering the transistor, it is possible to prevent leaked currents from being generated.

Further, a cross-sectional view corresponding to the line G8-G8' of the pixels 51 illustrated in FIG. 79 is as illustrated in FIG. 81. Also in FIG. 81, similarly to the case in FIG. 80, the part having a trench structure, which is long in the direction perpendicular to the surface of the substrate 61 in the oxide film 1252, is the pixel isolation unit 1571, and the pixel isolation unit 1571 isolates the light-receiving regions 1254 between the adjacent pixels 51. In particular, here, the pixel isolation unit 1571 penetrates the oxide film 64 part to reach the multilayer interconnection layer 811.

In accordance with the pixels 51 having such a configuration illustrated in FIG. 79 to FIG. 81, it is possible to improve characteristics such as sensitivity characteristics and distance measurement accuracy (resolution), and also prevent leaked currents from being generated.

Twenty Ninth Embodiment

Configuration Example of Pixel

A configuration of the pixel 51 according to a twenty ninth embodiment will be described with reference to FIG. 82 to FIG. 84.

Figure 82:
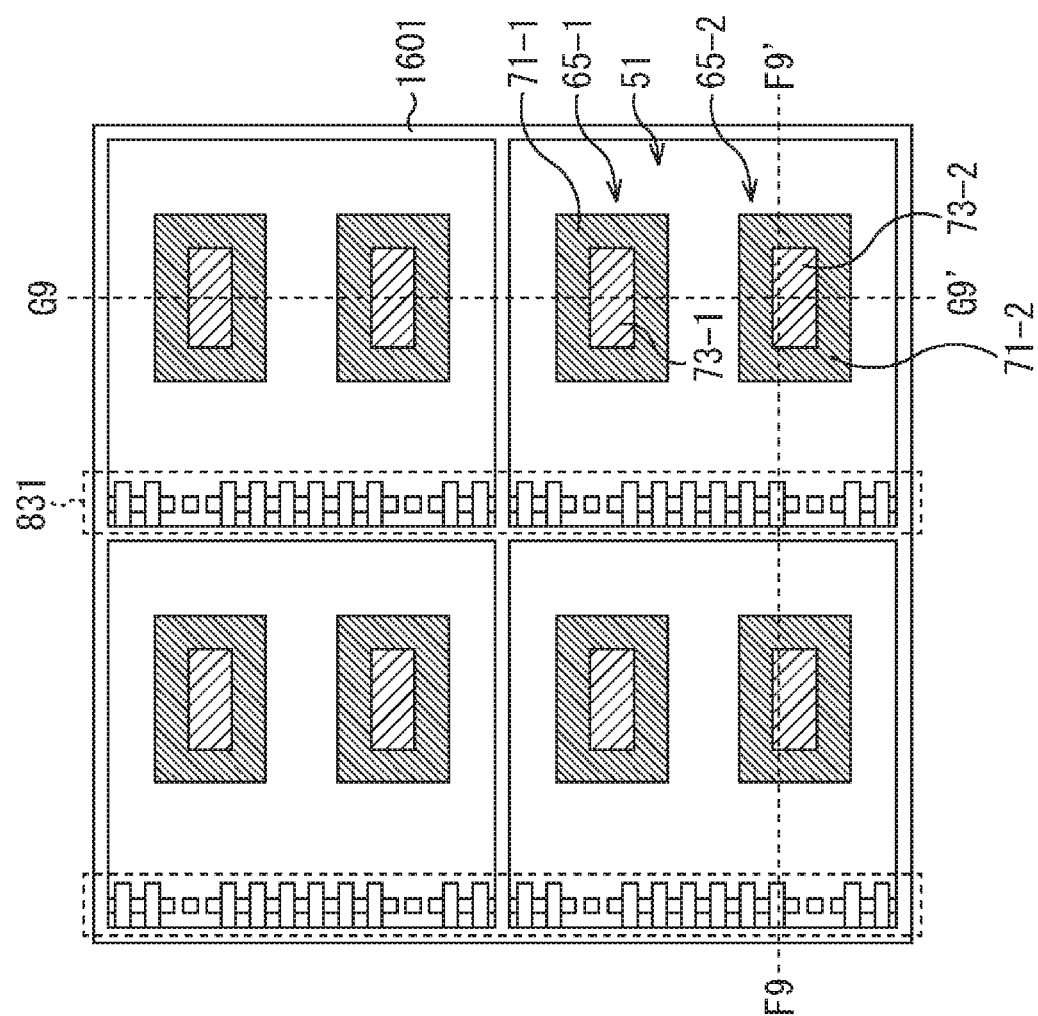
FIG. 82 is a view of the pixel viewed from a direction perpendicular to a surface of the substrate.

FIG. 82 is a view of the pixels 51 viewed from the direction perpendicular to the surface of the substrate 61.

In this example, a pixel isolation unit 1601 that functions as a pixel isolation region for isolating the regions of the pixels 51 is formed in the boundary portion of the pixels 51 adjacent to each other so that the region of each pixel 51 is surrounded the pixel isolation unit 1601.

Also in FIG. 82, similarly to the case in FIG. 58, the positions at which the transistor for driving the pixel 51, and the like are arranged and the position at which the pixel isolation unit 1601 is disposed are different from each other when viewed from the direction perpendicular to the surface of the substrate 61. That is, the pixel isolation unit 1601 is disposed at a position shifted from the transistor and the like.

Figure 83:
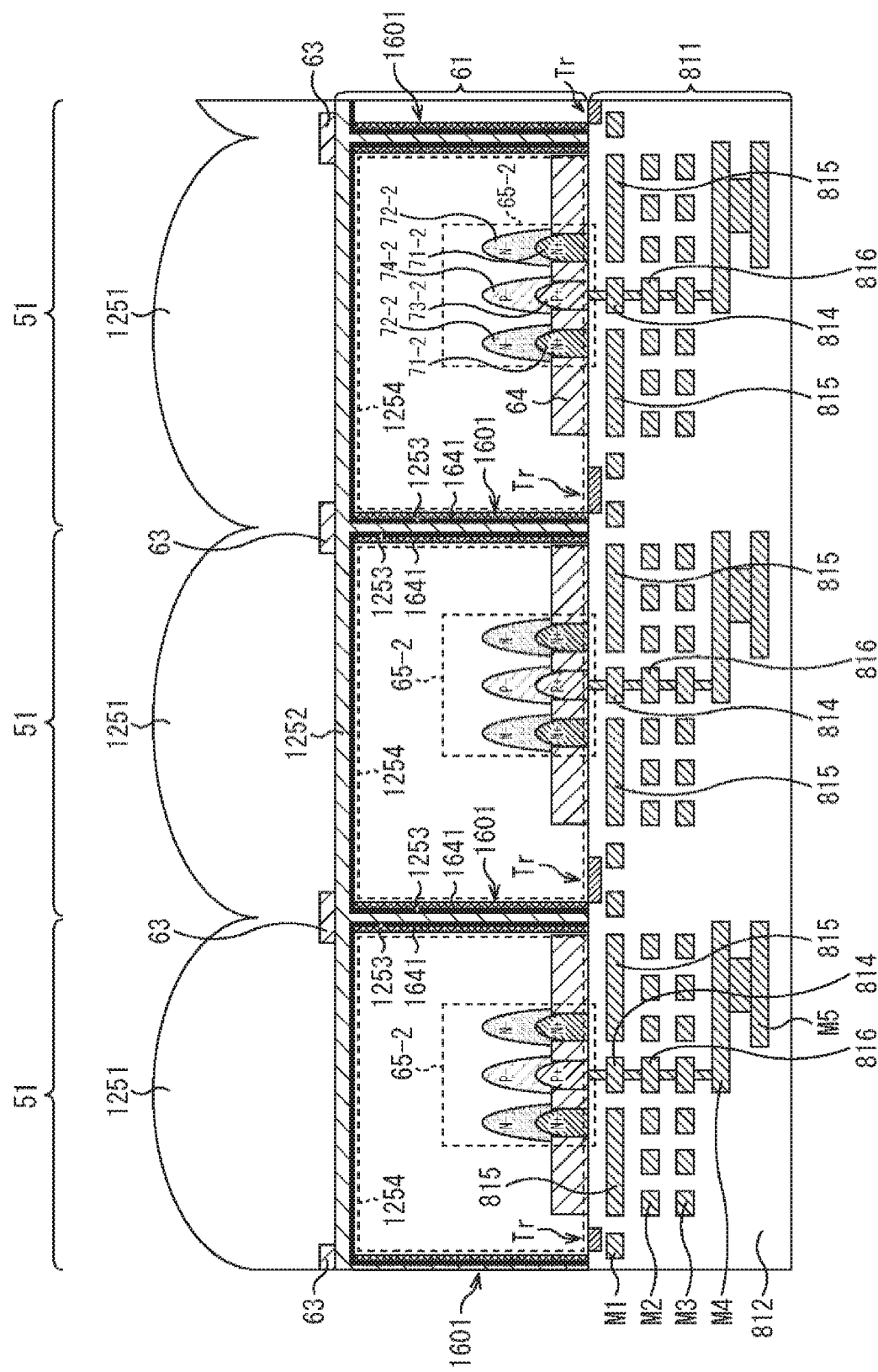
FIG. 83 is a cross-sectional view of the multiple pixels.
Figure 84:
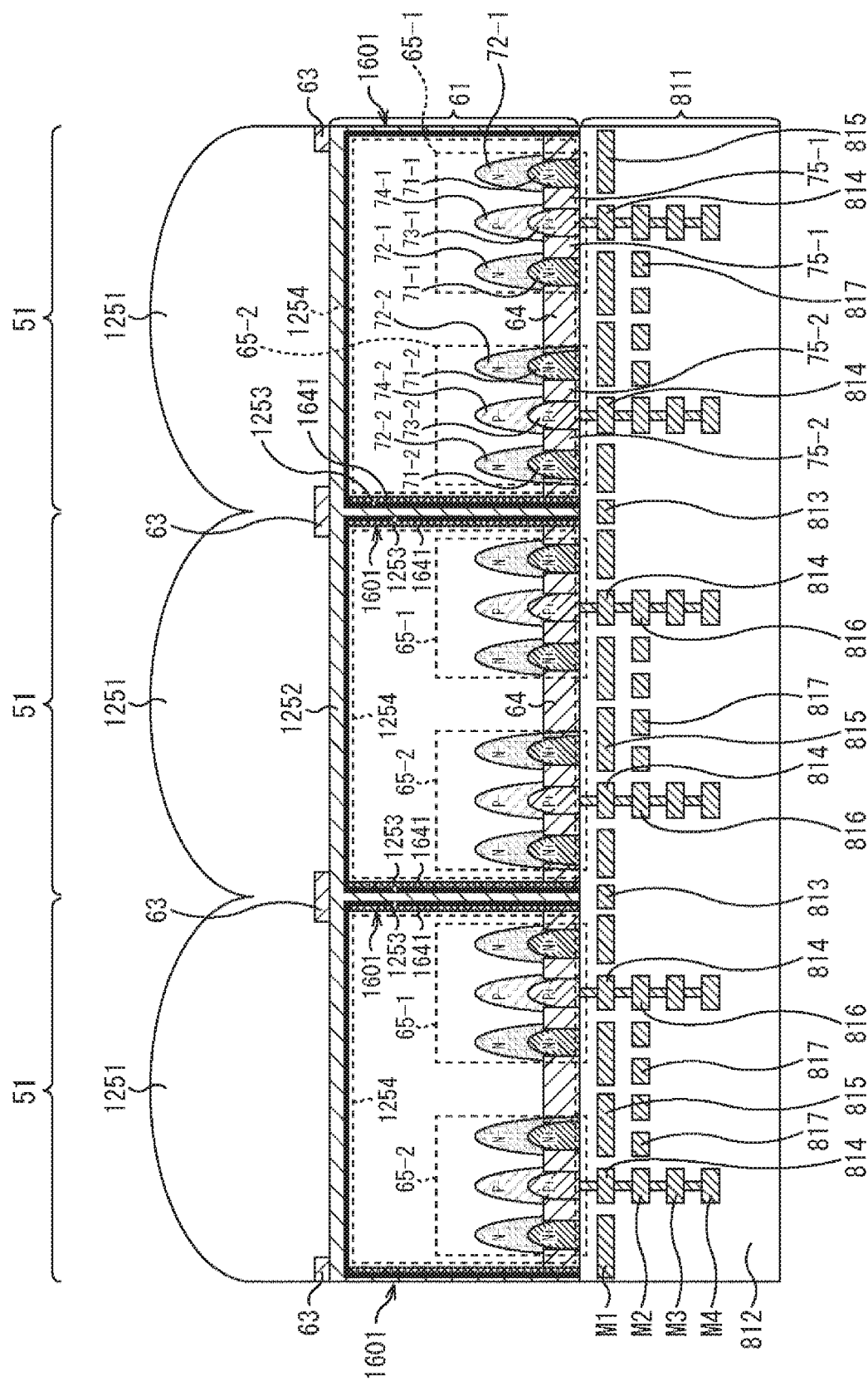
FIG. 84 is a cross-sectional view of the multiple pixels.

Here, a cross section corresponding to the line F9-F9' and a cross section corresponding to the line G9-G9' in FIG. 82 are respectively illustrated in FIG. 83 and FIG. 84.

The configuration of the pixels 51 illustrated in FIG. 83 and FIG. 84 is obtained by further providing an N-type semiconductor region 1641 to the configuration of the pixels 51 illustrated in FIG. 59 and FIG. 60. That is, the configuration of the pixels 51 illustrated in FIG. 83 and FIG. 84 is the same as the configuration of the example illustrated in FIG. 59 and FIG. 60 except for the N-type semiconductor region 1641 part.

In FIG. 83, the N-type semiconductor region 1641 is formed so that the surface of the fixed charge film 1253 is covered by the N-type semiconductor region 1641 in the part long in the direction perpendicular to the surface of the substrate 61 in the oxide film 1252 and the fixed charge film 1253, i.e., the part that has an FTI structure penetrating the substrate 61. This N-type semiconductor region 1641 is formed by, for example, implantation.

In this example, the part that is constituted by a part of each of the oxide film 1252 and the fixed charge film 1253 and the N-type semiconductor region 1641, penetrates the substrate 61, and functions as FTI for isolating the light-receiving regions 1254 between the adjacent pixels 51 is the pixel isolation unit 1601. Note that also in this case, it can also be regarded that the pixel isolation unit 1601 is constituted by only the oxide film 1252 or the pixel isolation unit 1601 is constituted by the oxide film 1252 and the fixed charge film 1253.

By providing such a pixel isolation unit 1601, it is possible to prevent leaked currents from being generated by PN isolation, and achieve isolation of the light-receiving regions 1254 between the pixels 51.

For example, in the example illustrated in FIG. 59, there is a possibility that leaked currents are generated from the fixed charge film 1253 to the transistor via the P-well part in the case where the pixel isolation unit 1221 and the P-well part covering the transistor are not sufficiently isolated from each other.

In this regard, in the example illustrated in FIG. 83, by isolating the surface (peripheral) part of FTI with the N-type semiconductor region 1641 and applying a fixed voltage of, for example, 0 V to 2.8 V to the N-type semiconductor region 1641, leaked currents are prevented from being generated by using the reverse bias of PN junction.

Note that the fixed voltage to be applied to the N-type semiconductor region 1641 only needs to be a voltage equal to or higher than the voltage to be applied to the substrate 61. Further, although the example in which the substrate 61 includes a P-type semiconductor layer has been described here, it only needs to form a P-type semiconductor region instead of the N-type semiconductor region 1641 in the case where the substrate 61 includes an N-type semiconductor layer.

Further, a cross-sectional view corresponding to the line G9-G9' of the pixels 51 illustrated in FIG. 82 is as illustrated in FIG. 84. Also in FIG. 84, similarly to the case in FIG. 83, the part that is constituted by a part of each of the oxide film 1252 and the fixed charge film 1253 and the N-type semiconductor region 1641, and functions as FTI penetrating the substrate 61 is the pixel isolation unit 1601. Then, the light-receiving regions 1254 are isolated from each other between the adjacent pixels 51 by the pixel isolation unit 1601. In particular, here, the part corresponding to the oxide film 1252, the fixed charge film 1253, and the N-type semiconductor region 1641 constituting the pixel isolation unit 1601 penetrate the oxide film 64 to reach the multilayer interconnection layer 811.

In accordance with the pixels 51 having such a configuration illustrated in FIG. 82 to FIG. 84, it is possible to improve characteristics such as sensitivity characteristics and distance measurement accuracy (resolution), and also prevent leaked currents from being generated. Note that in the example illustrated in FIG. 83 and FIG. 84, it does not necessarily need to provide the fixed charge film 1253.

Thirtieth Embodiment

Configuration Example of Pixel

A configuration of the pixel 51 according to a thirties embodiment will be described with reference to FIG. 85 to FIG. 87.

Figure 85:
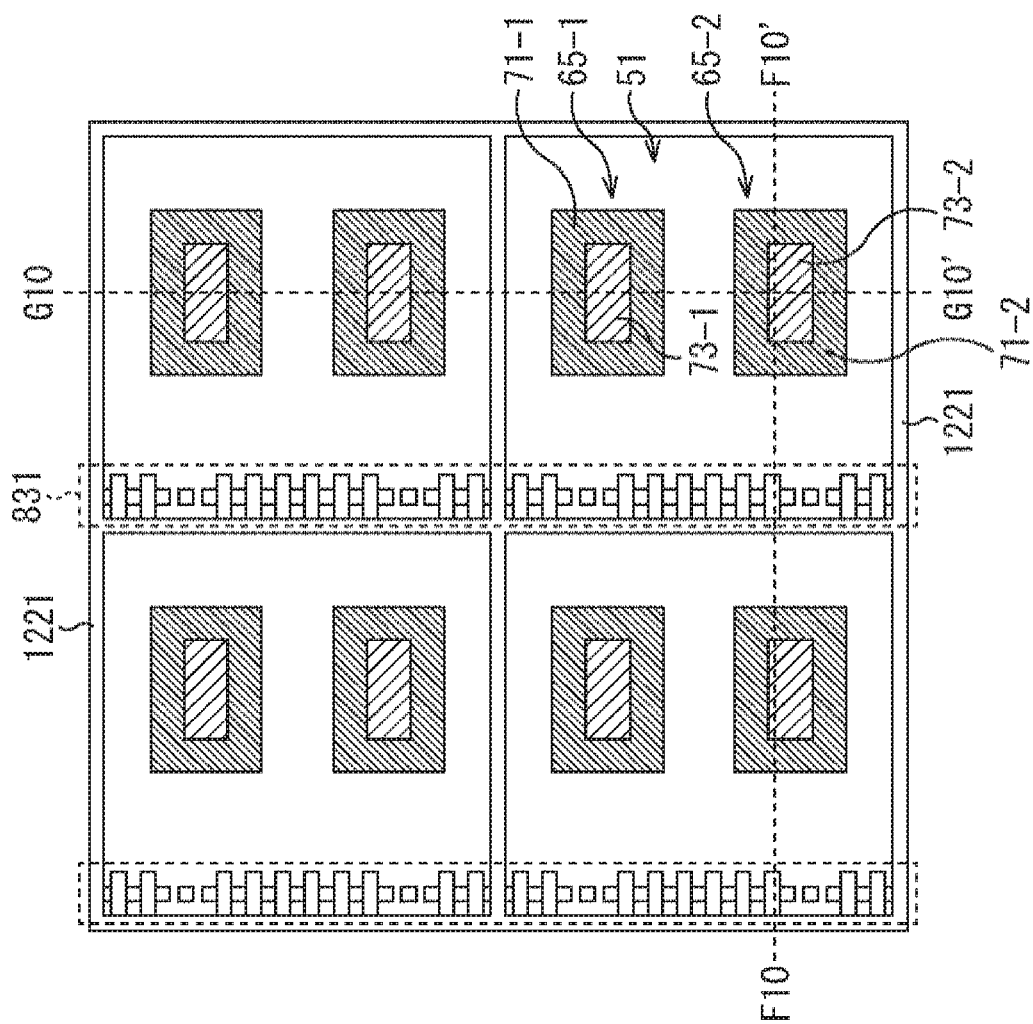
FIG. 85 is a view of the pixel viewed from a direction perpendicular to a surface of the substrate.

FIG. 85 is a view of the pixels 51 viewed from the direction perpendicular to the surface of the substrate 61.

In this example, the pixel isolation unit 1221 that functions as a pixel isolation region for isolating the regions of the pixels 51 is formed in the boundary part of the pixels 51 adjacent to each other so that the region of each pixel 51 is surrounded by the pixel isolation unit 1221.

Also in FIG. 85, similarly to the case in FIG. 58, the positions at which the transistor for driving the pixel 51, and the like are arranged and the position at which the pixel isolation unit 1221 is disposed are different from each other when viewed from the direction perpendicular to the surface of the substrate 61. That is, the pixel isolation unit 1221 is disposed at a position shifted from the transistor and the like.

Figure 86:
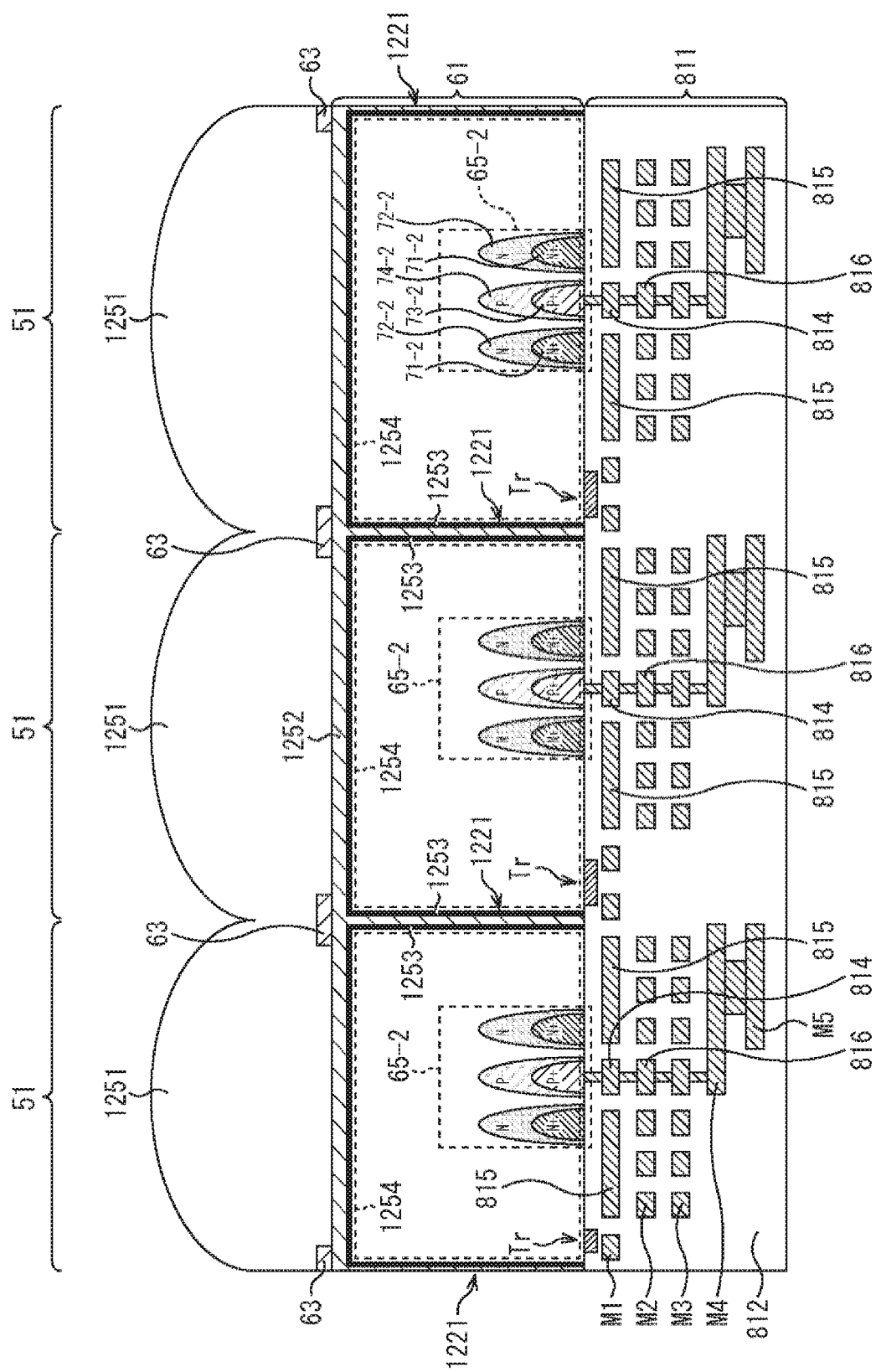
FIG. 86 is a cross-sectional view of the multiple pixels.
Figure 87:
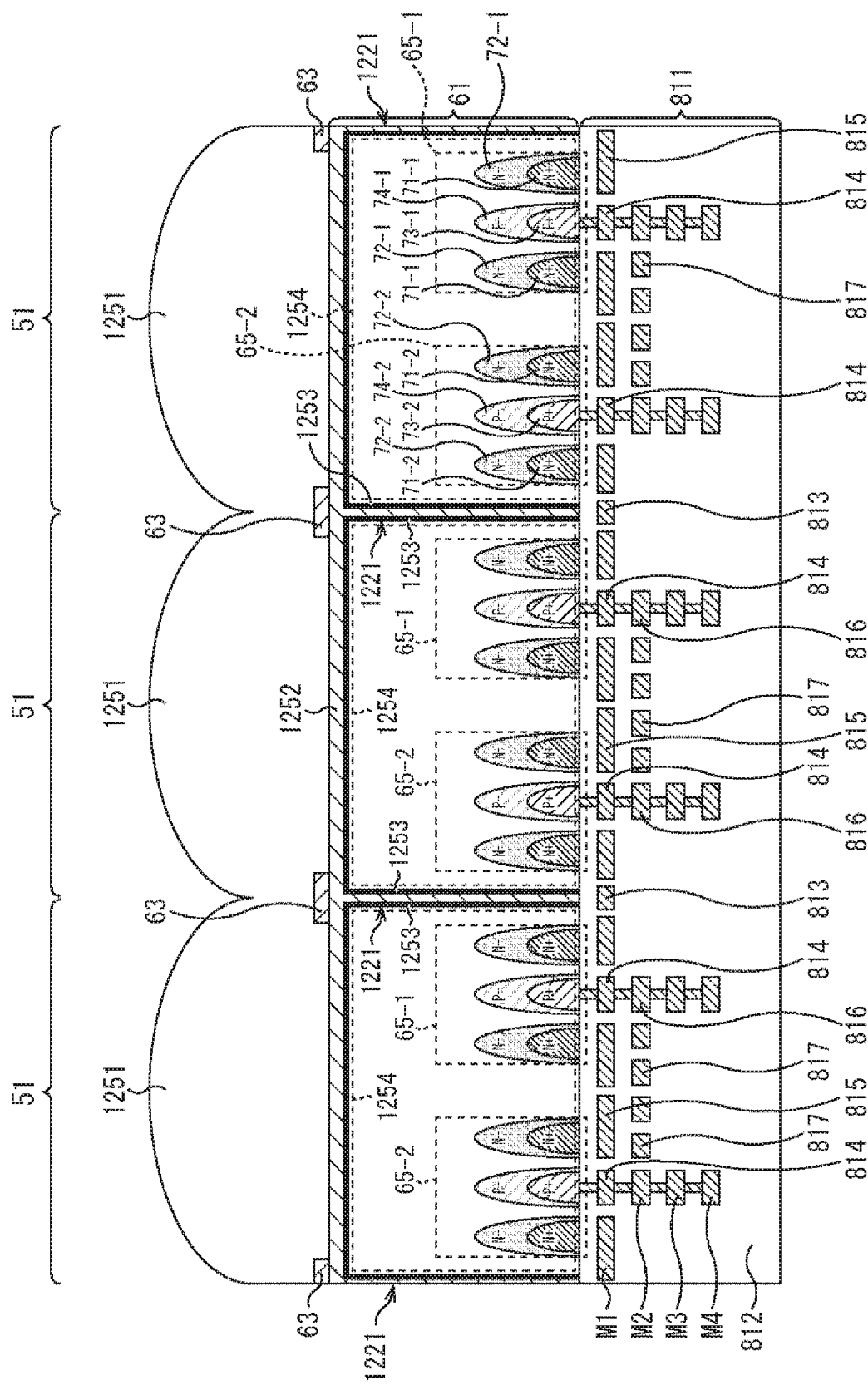
FIG. 87 is a cross-sectional view of the multiple pixels.

Here, a cross section corresponding to the line F10-F10' and a cross section corresponding to the line G10-G10' in FIG. 85 are respectively illustrated in FIG. 86 and FIG. 87.

The configuration of the pixels 51 illustrated in FIG. 85 and FIG. 86 is the same as the configuration of the pixels 51 illustrated in FIG. 59 and FIG. 60 except that the oxide film 64 is not provided.

In the case where the oxide film 64 is not provided in the pixel 51, i.e., in the light-receiving region 1254 of the pixel 51, infrared light that has entered the substrate 61 from the on-chip lens 1251 is not reflected by the oxide film 64 part and does not enter an adjacent pixel 51. Therefore, it is possible to further suppress occurrence of cross-talk and reduction in pixel sensitivity, and improve characteristics of the CAPD sensor, such as sensitivity characteristics and distance measurement accuracy (resolution).

Thirty First Embodiment

Configuration Example of Pixel

A configuration of the pixel 51 according to a thirty first embodiment with reference to FIG. 88 to FIG. 90 will be described.

Figure 88:
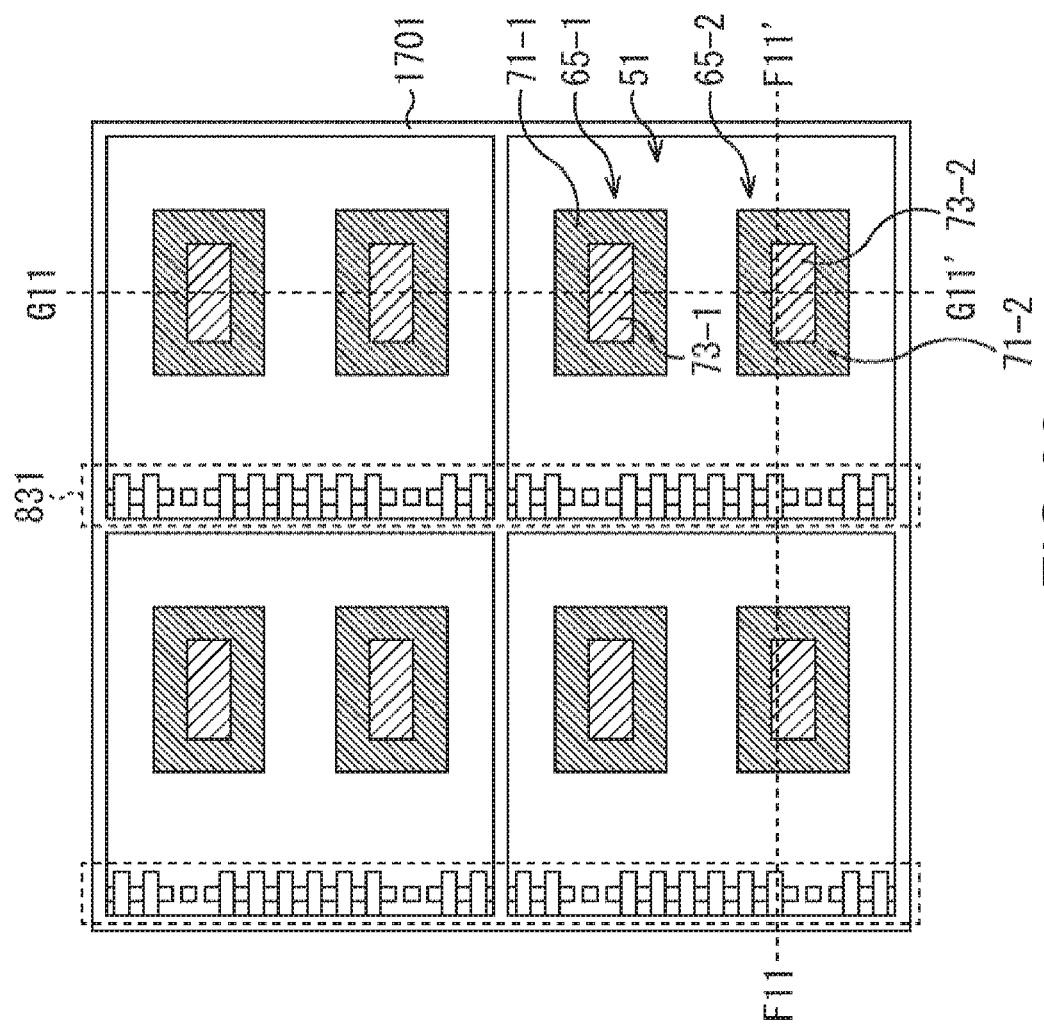
FIG. 88 is a view of the pixel viewed from a direction perpendicular to a surface of the substrate.

FIG. 88 is a view of the pixels 51 viewed from the direction perpendicular to the surface of the substrate 61.

In this example, a pixel isolation unit 1701 that functions as a pixel isolation region that isolates the regions of the pixels 51 is formed in the boundary part of the pixels 51 adjacent to each other so that the region of each pixel 51 is surrounded by the pixel isolation unit 1701.

Also in FIG. 88, similarly to the case in FIG. 58, the positions at which the transistor for driving the pixel 51, and the like are arranged and the position at which the pixel isolation unit 1701 is disposed are different from each other when viewed from the direction perpendicular to the surface of the substrate 61. That is, the pixel isolation unit 1701 is disposed at a position shifted from the transistor and the like.

Figure 89:
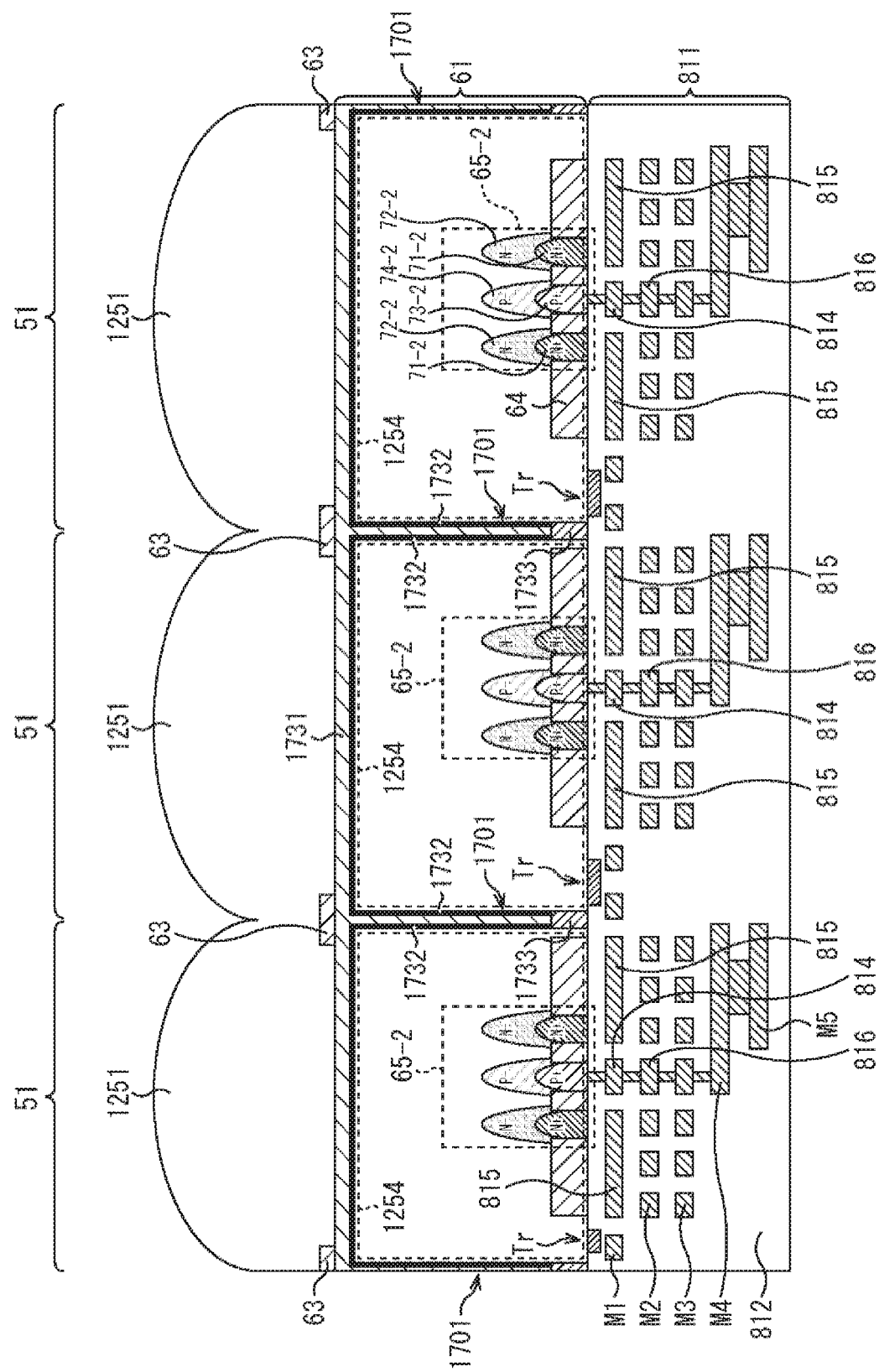
FIG. 89 is a cross-sectional view of the multiple pixels.
Figure 90:
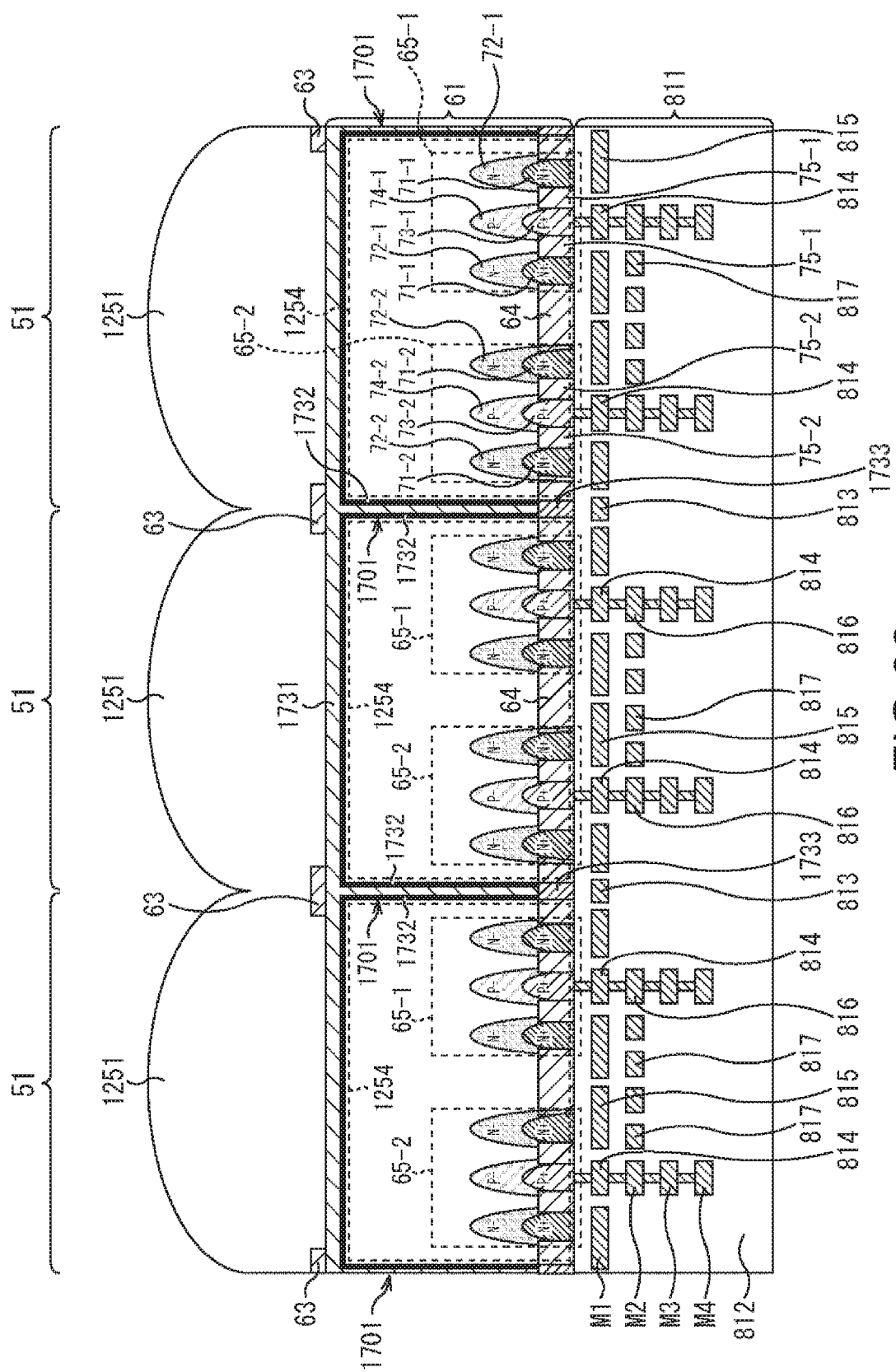
FIG. 90 is a cross-sectional view of the multiple pixels.

Here, a cross section corresponding to the line F11-F11' and a cross section corresponding to the line G11-G11' in FIG. 88 are respectively illustrated in FIG. 89 and FIG. 90.

The configuration of the pixels 51 illustrated in FIG. 89 and FIG. 90 is obtained by providing an oxide film 1731, a fixed charge film 1732, and an oxide film 1733 instead of the oxide film 1252 and the fixed charge film 1253 in the configuration of the pixels 51 illustrated in FIG. 59 and FIG. 60.

In the example illustrated in FIG. 89, the oxide film 1731 is formed so as to cover the surface of the substrate 61 on the on-chip lens 1251 side. Further, in the boundary part of the pixels 51 adjacent to each other, the oxide film 1731 is formed from the on-chip lens 1251 side of the substrate 61 to a predetermined depth in the direction of the multilayer interconnection layer 811 side, thereby isolating the light-receiving regions 1254 of the adjacent pixels 51.

Further, inside the substrate 61, the region between the P-type semiconductor region constituting the substrate 61 and the oxide film 1731, i.e., the surface part of the oxide film 1731 is covered by the fixed charge film 1732.

In particular, in this example, the part that is long in the direction perpendicular to the surface of the substrate 61 in the oxide film 1731 and the fixed charge film 1732 and functions as FTI for isolating the light-receiving regions 1254 between the adjacent pixels 51 is the pixel isolation unit 1701.

Note that although the pixel isolation unit 1701 has been described to be constituted by the oxide film 1731 and the fixed charge film 1732 here, it can also be regarded that the pixel isolation unit 1701 is constituted by only the oxide film 1731.

In addition, the pixel isolation unit 1701 may be formed of a metal material and a fixed charge film, or may be formed of a metal material and an oxide film.

Further, in the example illustrated in FIG. 89, the oxide film 1733 is provided between the pixel isolation unit 1701 in the substrate 61 and the multilayer interconnection layer 811. That is, the oxide film 1733 is formed between the surface of the substrate 61 on the multilayer interconnection layer 811 side and the pixel isolation unit 1701. This oxide film 1733 is formed simultaneously with the oxide film 64.

Further, a cross-sectional view corresponding to the line G11-G11' of the pixels 51 illustrated in FIG. 88 is as illustrated in FIG. 90. In FIG. 90, a part of the oxide film 64 is the oxide film 1733, and the oxide film 1733, and the oxide film 1731 and the fixed charge film 1732 constituting the pixel isolation unit 1701 are connected to each other.

Also in the cross section illustrated in FIG. 90, the pixel isolation unit 1701 isolates the light-receiving regions 1254 between the adjacent pixels 51.

In the configuration illustrated in FIG. 89 and FIG. 90, the oxide film 1731 and the fixed charge film 1732 constituting the pixel isolation unit 1701 that functions as FTI are formed from the light incident surface side (on-chip lens 1251 side) of the substrate 61 as described above. Then, in the substrate 61, the oxide film 1733 and the pixel isolation unit 1701 that functions as FTI are connected to each other, and thus, the fixed charge layer is penetrated thereby.

By providing the oxide film 1733 between the pixel isolation unit 1701 and the multilayer interconnection layer 811 as described above, it is possible to prevent leaked currents flowing from the fixed charge film 1732 to the transistor via the P-well part covering the transistor from being generated.

In accordance with the pixels 51 having such as configuration illustrated in FIG. 88 to FIG. 90, it is possible to improve characteristics such as sensitivity characteristics and distance measurement accuracy (resolution), and also prevent leaked currents from being generated.

Note that in FIG. 89, the example in which the position at which the on-chip lens 1251 is disposed is shifted in accordance with the position at which the pixel isolation unit 1701 is formed has been described. However, the on-chip lens 1251 may be formed so that the position of the optical axis of the on-chip lens 1251 is located substantially in the middle of the two signal extraction units 65 in the pixels 51 when viewed from the direction perpendicular to the surface of the substrate 61.

With this, it is possible to condense infrared light at a position between the signal extraction unit 65-1 and the signal extraction unit 65-2, and make the electron extraction efficiency substantially uniform between the signal extraction units 65.

Further, for example, in the example illustrated in FIG. 88, the signal extraction units 65 may be disposed to be shifted so that the position between the signal extraction unit 65-1 and the signal extraction unit 65-2 is at a position of the optical axis of the on-chip lens 1251.

Thirty Second Embodiment

Configuration Example of Pixel

Figure 91:
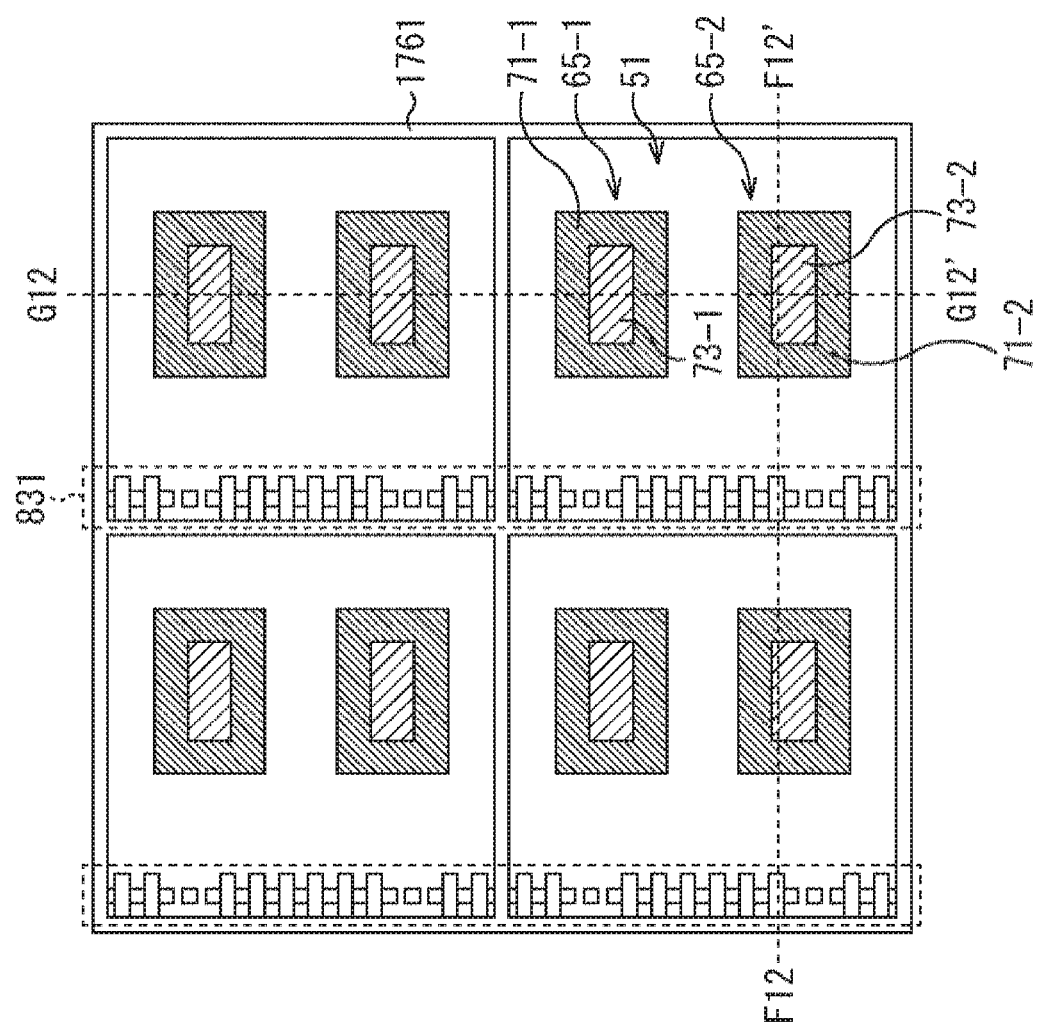
FIG. 91 is a view of the pixel viewed from a direction perpendicular to a surface of the substrate.
Figure 92:
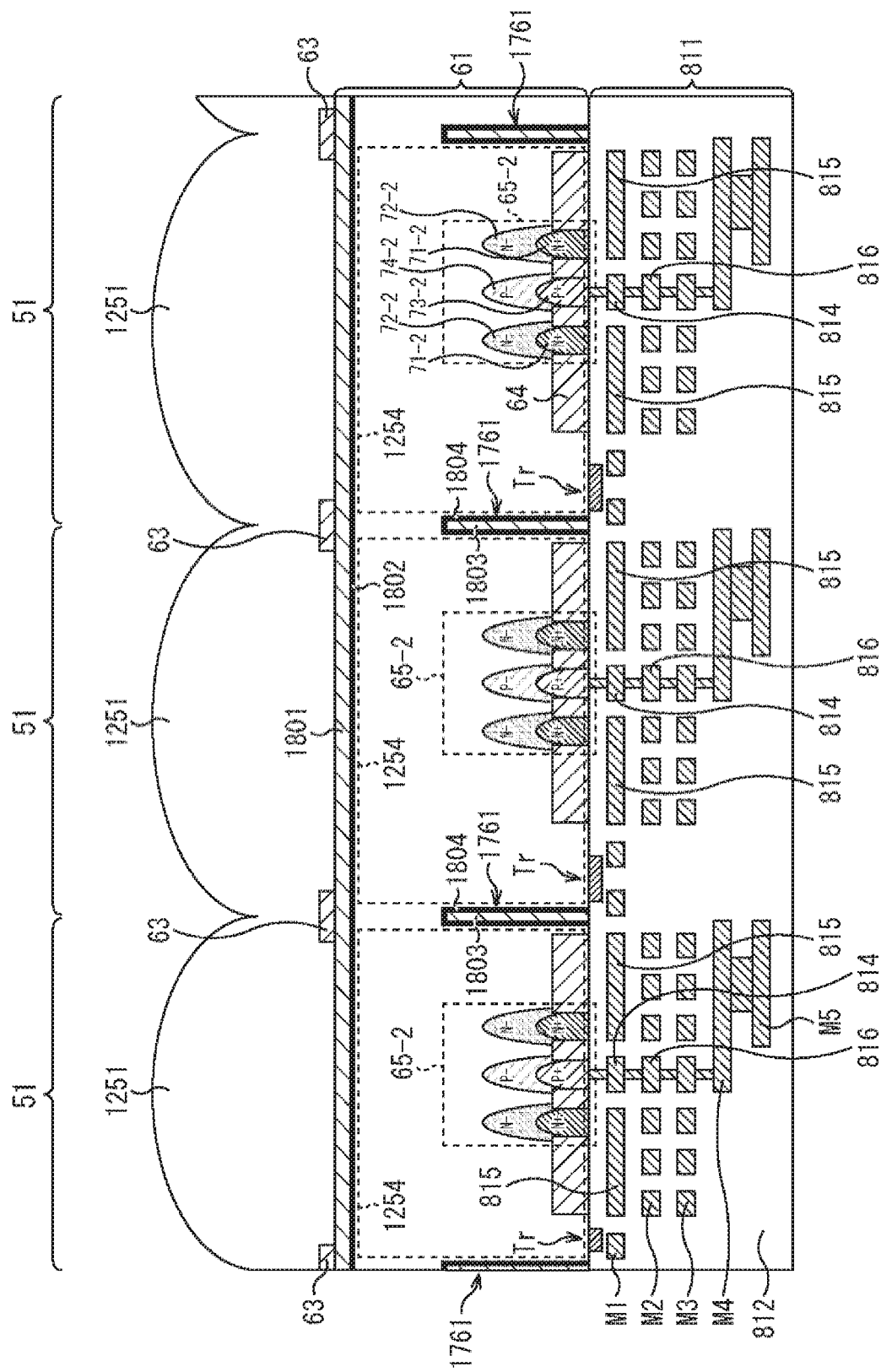
FIG. 92 is a cross-sectional view of the multiple pixels.
Figure 93:
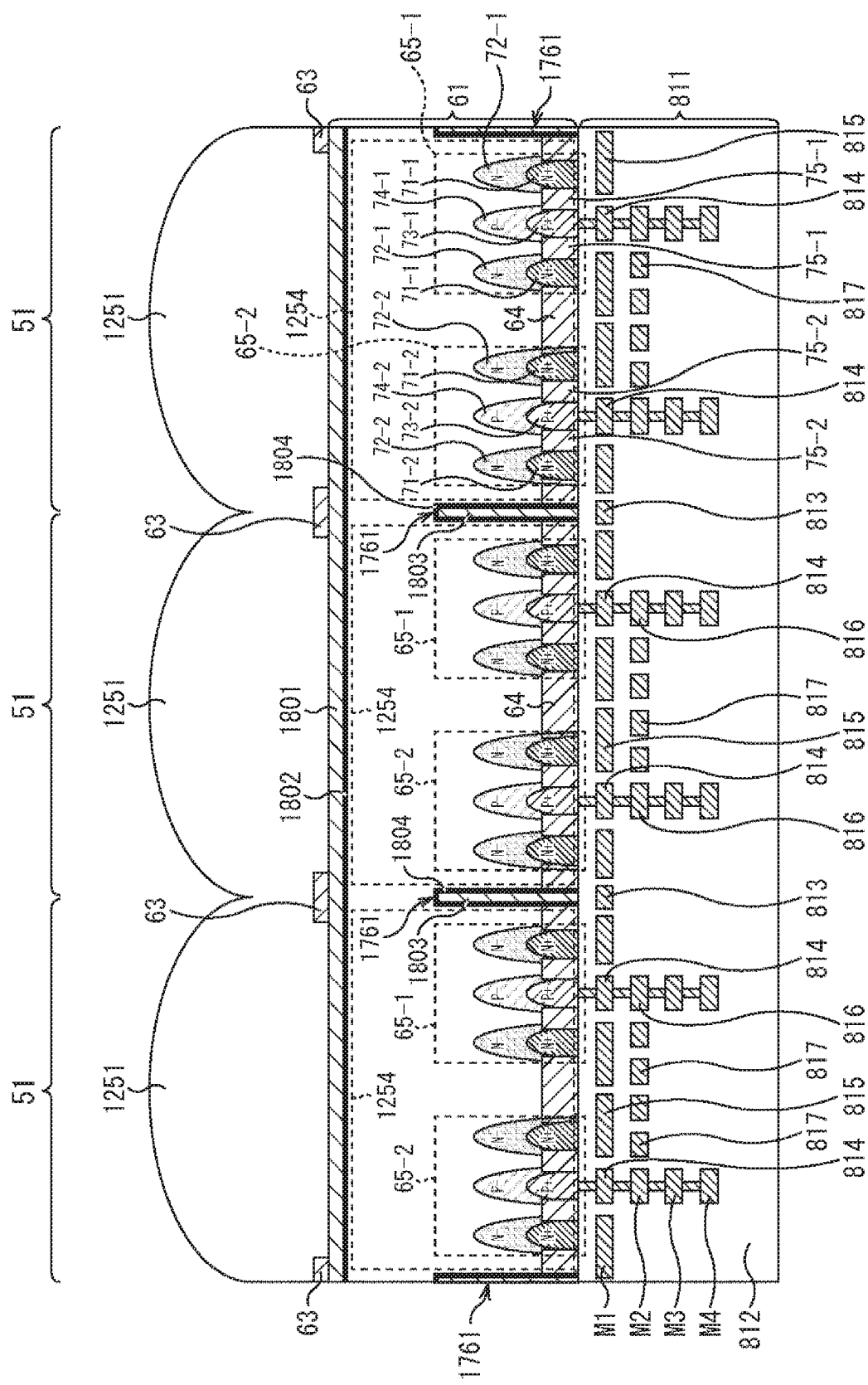
FIG. 93 is a cross-sectional view of the multiple pixels.

A configuration of the pixel 51 according to a thirty second embodiment with reference to FIG. 91 to FIG. 93.

FIG. 91 is a view of the pixels 51 viewed from the direction perpendicular to the surface of the substrate 61.

In this example, a pixel isolation unit 1761 that functions as a pixel isolation region for isolating the regions of the pixels 51 is formed in the boundary part of the pixels 51 adjacent to each other so that the region of each pixel 51 is surrounded by the pixel isolation unit 1761.

Here, a cross section corresponding to the line F12-F12' and a cross section corresponding to the line G12-G12' in FIG. 91 are respectively illustrated in FIG. 92 and FIG. 93.

The configuration of the pixels 51 illustrated in FIG. 92 and FIG. 93 is obtained by providing an oxide film 1801, a fixed charge film 1802, an oxide film 1803, and a fixed charge film 1804 instead of the oxide film 1252 and the fixed charge film 1253 in the configuration of the pixels 51 in FIG. 59 and FIG. 60.

As illustrated in FIG. 92, the oxide film 1801 is provided so as to cover the surface of the substrate 61 on the on-chip lens 1251 side, and the fixed charge film 1802 is formed immediately below the oxide film 1801, i.e., the fixed charge film 1802 is formed so as to cover the surface of the oxide film 1801 on the multilayer interconnection layer 811 side.

Further, at the pixel boundary part of the substrate 61, the oxide film 1803 that isolates the adjacent pixels 51 and the fixed charge film 1804 that covers the surface of the oxide film 1803 are formed from the surface of the substrate 61 on the multilayer interconnection layer 811 side to a predetermined depth.

In FIG. 92, the part that is constituted by the oxide film 1803 and the fixed charge film 1804 and functions as DTI having a trench structure is the pixel isolation unit 1761, and the pixel isolation unit 1761 isolates the light-receiving regions 1254 of the adjacent pixels 51.

Note that although the pixel isolation unit 1761 has been described to be constituted by the oxide film 1803 and the fixed charge film 1804 here, it can also be regarded that the pixel isolation unit 1761 is constituted by only the oxide film 1803.

In addition, the pixel isolation unit 1761 may be formed of a metal material and a fixed charge film, or may be formed of a metal material and an oxide film.

In the example illustrated in FIG. 92, since the pixel isolation unit 1761 is formed in the boundary part of the pixels 51, it is possible to prevent reflected light of infrared light that has entered the substrate 61 from the on-chip lens 1251 from entering adjacent pixel 51, similarly to the example illustrated in FIG. 59.

As a result, it is possible to prevent cross-talk from occurring, suppress reduction in pixel sensitivity, and improve characteristics of the CAPD sensor, such as sensitivity characteristics and distance measurement accuracy (resolution).

Further, in the example illustrated in FIG. 92, since the pixel isolation unit 1761 is formed at a position shifted from the transistor, it is possible to prevent leaked currents from being generated in the P-well part covering the transistor, similarly to the example illustrated in FIG. 59.

Further, in the example illustrated in FIG. 92, similarly to the example in FIG. 59, the interpixel light-shielding film 63 and the on-chip lens 1251 are disposed in accordance with the pixel isolation unit 1761 that is disposed to be shifted.

Therefore, also in the case illustrated in FIG. 92, similarly to the case in FIG. 59, it is possible to increase the amount of light (amount of received light) guided into the light-receiving region 1254 by the on-chip lens 1251, and improve sensitivity characteristics.

Further, a cross-sectional view corresponding to the line G12-G12' of the pixels 51 illustrated in FIG. 91 is as illustrated in FIG. 93. In FIG. 93, the oxide film 1803 and the fixed charge film 1804 constituting the pixel isolation unit 1761 penetrate the oxide film 64 from the surface of the substrate 61 on the multilayer interconnection layer 811 side, and formed to a position at a predetermined depth.

When producing the pixels 51 having the configuration illustrated in FIG. 92 and FIG. 93, the oxide film 64 is formed in the substrate 61 first, and then, a trench is formed in the pixel boundary part of the substrate 61 from the surface side (multilayer interconnection layer 811 side) by dry etching.

Then, after forming the pixel isolation unit 1761 in the trench part formed in the substrate 61, annealing, i.e., defect repair is performed and then the P-well covering the transistor and the signal extraction unit 65 are formed.

Therefore, in the case of producing the substrate 61, the substrate 61 with fewer defects can be obtained by repairing pixel defects by annealing.

Note that if DTI is formed from the light incident surface side (on-chip lens 1251 side) of the substrate 61, annealing cannot be performed because the P-well covering the transistor and the signal extraction unit 65 are already formed at the time when dry etching for forming DTI has been performed on the substrate 61.

Meanwhile, in the configuration illustrated in FIG. 92 or FIG. 93, since annealing can be performed after forming the pixel isolation unit 1761 and before forming the P-well and the signal extraction unit 65, it is possible to obtain the light-receiving element 1 with fewer pixel defects.

Further, also in the example illustrated in FIG. 91 to FIG. 93, the on-chip lens 1251 may be disposed so that the position of the optical axis of the on-chip lens 1251 is located substantially in the middle of the two signal extraction units 65 in the pixel 51. Further, the signal extraction units 65 may be disposed to be shifted so that the position in the middle of the two signal extraction units 65 is located at a position of the optical axis of the on-chip lens 1251.

Note that in the twenty first embodiment to the thirty second embodiment described above, the example in which the reflection member 815 is provided in the multilayer interconnection layer 811 has been described in FIG. 59, FIG. 62, FIG. 65, or FIG. 68, for example. In particular, here, the reflection member 815 is provided so as to overlap the N+ semiconductor region 71 in a plan view, i.e., when viewed from the direction perpendicular to the surface of the substrate 61. However, the light-shielding member 631' may be provided instead of the reflection member 815. Also in such a case, the light-shielding member 631' is provided so as to overlap the N+ semiconductor region 71 in a plan view.

Configuration Example of Distance Measurement Module

Figure 94:
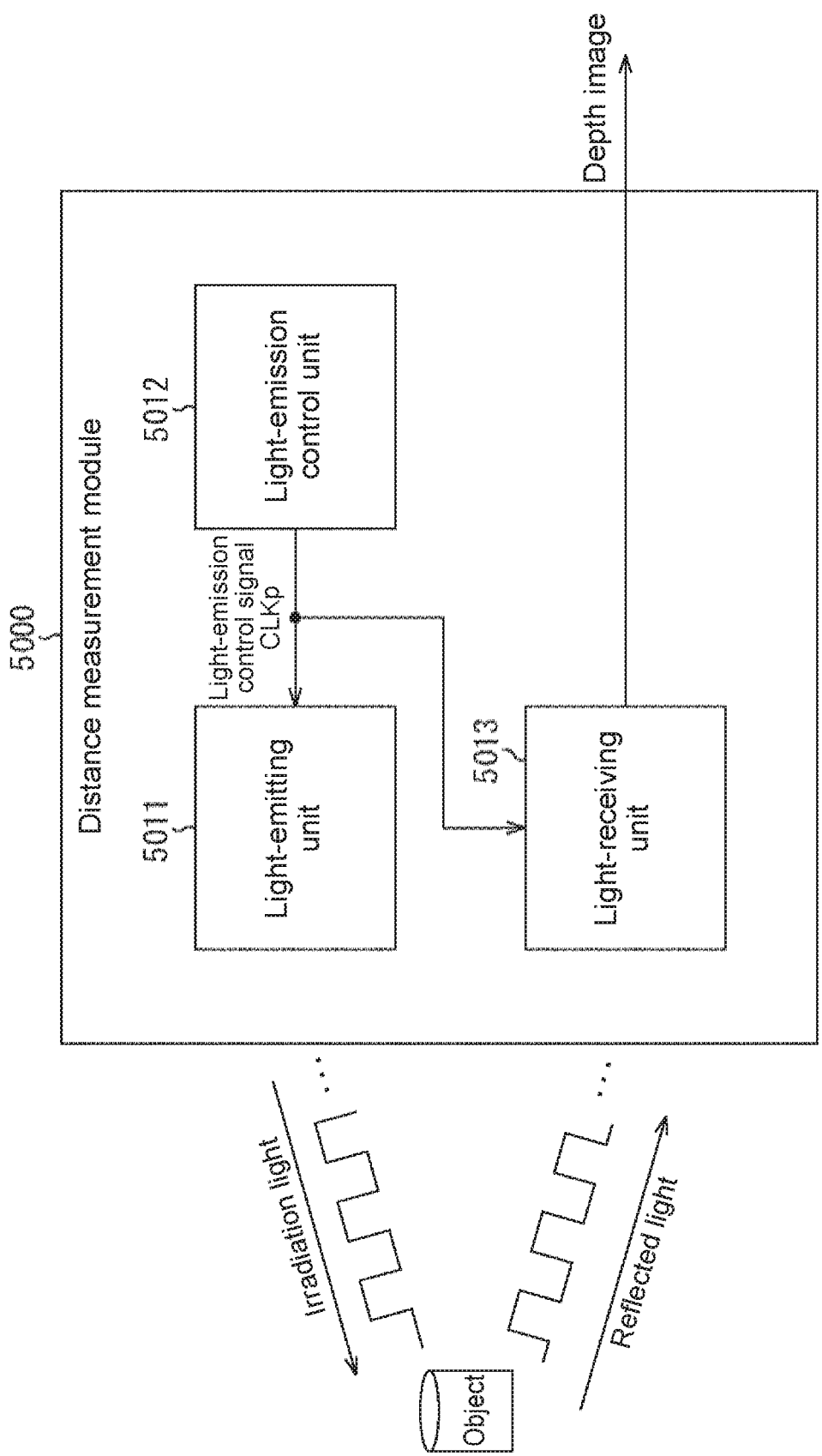
FIG. 94 is a block diagram illustrating a configuration example of a distance measurement module.

FIG. 94 is a block diagram illustrating a configuration example of a distance measurement module that outputs distance measurement information by using the light-receiving element 1 in FIG. 1.

A distance measurement module 5000 includes a light-emitting unit 5011, a light-emission control unit 5012, and a light-receiving unit 5013.

The light-emitting unit 5011 includes a light source that emits light of a predetermined wavelength, and emits irradiation light of which brightness periodically fluctuates to irradiate an object with the irradiation light. For example, the light-emitting unit 5011 includes a light-emitting diode that emits infrared light of a wavelength in a range of 780 nm to 1000 nm as a light source, and emits irradiation light in synchronization with a light-emission control signal CLKp that is a rectangular wave supplied form the light-emission control unit 5012.

Note that the light-emission control signal CLKp is not limited to the rectangular wave as long as the light-emission control signal CLKp is a periodic signal. For example, the light-emission control signal CLKp may be a sinusoidal wave.

After supplying the light-emission control signal CLKp to the light-emitting unit 5011 and the light-receiving unit 5013, the light-emission control unit 5012 controls an irradiation timing of irradiation light. For example, a frequency of the light-emission control signal CLKp is 20 megahertz (MHz). Note that the frequency of the light-emission control signal CLKp is not limited to 20 megahertz (MHz) and may be 5 megahertz (MHz), or the like.

The light-receiving unit 5013 receives reflected light that is reflected from an object, calculates distance information for every pixel in correspondence with a light-reception result, generates a depth image that expresses a distance up to an object by a gradation value for every pixel, and outputs the depth image.

As the light-receiving unit 5013, the above-described light-receiving element 1 is used, and the light-receiving element 1 as the light-receiving unit 5013 calculates distance information for every pixel from signal intensity detected by the charge detection unit (N+ semiconductor region 71) of each the signal extraction units 65-1 and 65-2 of each of the pixels 51 in the pixel array unit 20, for example, on the basis of the light-emission control signal CLKp.

As described above, as the light-receiving unit 5013 of the distance measurement module 5000 that obtains distance information up to a subject by the indirect ToF method, and outputs the distance information, the light-receiving element 1 in FIG. 1 can be combined. As the light-receiving unit 5013 of the distance measurement module 5000, when employing the light-receiving element 1 in the above-described respective embodiments, specifically, the light-receiving element that is set as a back-illuminated type and improves pixel sensitivity, it is possible to improve distance measurement characteristics as the distance measurement module 5000.

Application Example to Moving Body

The technology (the present technology) according to the present disclosure is applicable to various products. For example, the technology according to the present disclosure can be realized as a device that is mounted on a moving body any one kind among an automobile, an electric vehicle, a hybrid electric vehicle, a motorcycle, a bicycle, a personal mobility, an airplane, a drone, a ship, a robot, and the like.

Figure 95:
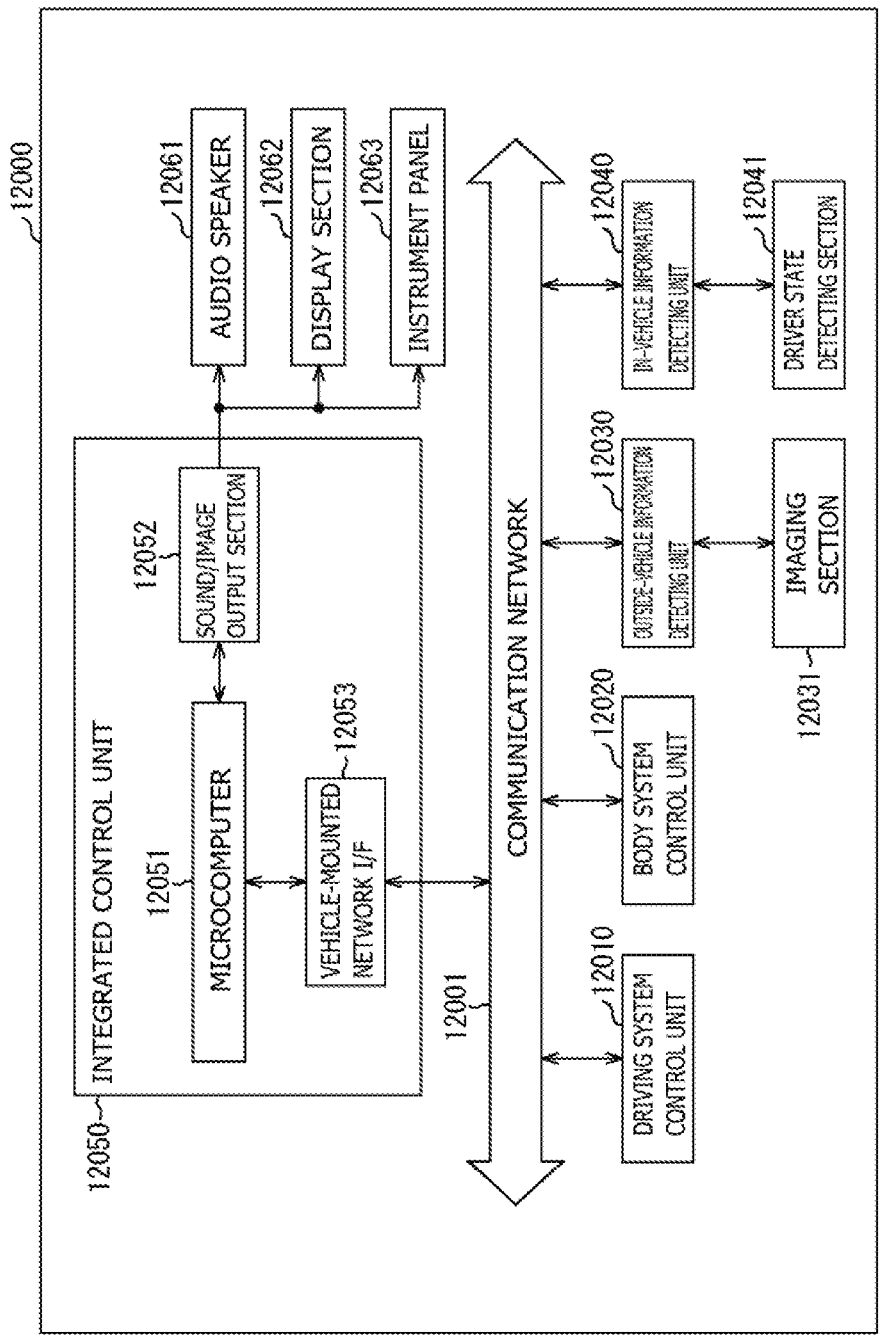
FIG. 95 is a block diagram depicting an example of schematic configuration of a vehicle control system.

FIG. 95 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 95, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 95, an audio speaker 12061, a display section 12062, and an instrument panel 12063 are illustrated as the output device. The display section 12062 may, for example, include at least one of an on-board display and a head-up display.

Figure 96:
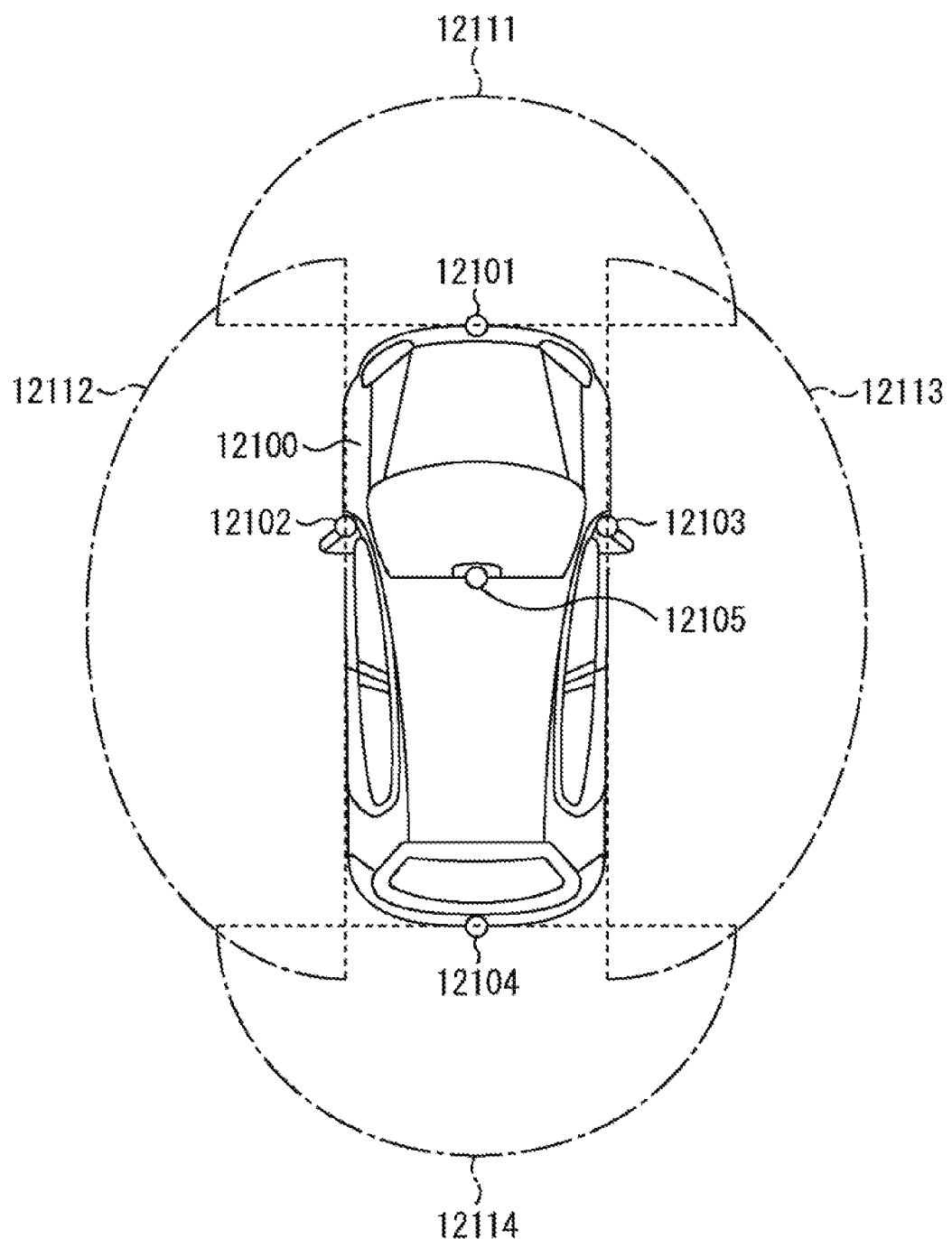
FIG. 96 is a diagram of assistance in explaining an example of installation positions of an outside-vehicle information detecting section and an imaging section.

FIG. 96 is a diagram depicting an example of the installation position of the imaging section 12031.

In FIG. 96, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 96 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinbefore, description has been given of an example of the vehicle control system to which the present technology relating to the present disclosure is applicable. The technology according to the present disclosure is also applicable to the imaging section 12031 among the above-described configurations. Specifically, for example, when the light-receiving element 1 illustrated in FIG. 1 is applied to the imaging section 12031, it is possible to improve characteristics such as sensitivity.

Embodiments of the present technology are not limited to the above-described embodiments, and various modifications can be made in a range not departing from the gist of the present technology.

For example, the above-described two or more embodiments can be appropriately combined with each other. That is, for example, the number of signal extraction units provided in a pixel or an arrangement position thereof, an shape of the signal extraction units or whether or not to employ a sharing structure, presence or absence of an on-chip lens, presence or absence of interpixel light-shielding portion, presence or absence of an isolation region, the thickness of the on-chip lens or a substrate, the kind of the substrate or film design, presence or absence of a bias to a light incident surface, presence or absence of a reflection member, and the like can be appropriately selected in correspondence with a priority given to any characteristic such as pixel sensitivity.

In addition, in the above-described embodiments, description has been given of an example in which electrons are used as signal carriers, but hole generated in photoelectric conversion may be used as the signal carriers. In this case, the charge detection unit that detects the signal carriers may be constituted by a P+ semiconductor region, and the voltage application unit that generates an electric field inside a substrate may be constituted by an N+ semiconductor region so that holes are detected as the signal carriers in the charge detection unit provided in the signal extraction unit.

In accordance with the present technology, when the CAPD sensor is set to a configuration of the back-illuminated type light-receiving element, it is possible to improve distance measurement characteristics.

Note that the above-described embodiments are described as a drive method in which a voltage is directly applied to the P+ semiconductor region 73 formed in the substrate 61, and photoelectrically converted charges are migrated by an electric field that occurs, but the present technology is not limited to the drive method and is also applicable to another drive method. For example, it is possible to employ a drive method in which first and second transfer transistors and first and second floating diffusion regions which are formed in the substrate 61 are used, and a predetermined voltage is applied to gates of the first and second transfer transistors to distribute and accumulate photoelectrically converted charges to the first floating diffusion region through the first transfer transistor, or the second floating diffusion region through the second transfer transistor. In this case, the first and second transfer transistors formed in the substrate 61 respectively function as first and second voltage application unit in which a predetermined voltage is applied to gates thereof, and the first and second floating diffusion regions formed in the substrate 61 respectively functions as first and second charge detection units which detect charges generated due to photoelectric conversion.

In addition, in other words, in the drive method in which a voltage is directly applied to the P+ semiconductor region 73 formed in the substrate 61, and photoelectrically converted charges are migrated by an electric field that occurs, two pieces of the P+ semiconductor regions 73 set as the first and second voltage application units are control nodes to which a predetermined voltage is applied, and two pieces of the N+ semiconductor regions 71 set as the first and second charge detection units are detection nodes which detect charges. In the drive method in which a predetermined voltage is applied to gates of the first and second transfer transistors, and photoelectrically converted charges are accumulated across the first floating diffusion region or the second floating diffusion region, gates of the first and second transfer transistors are control nodes to which a predetermined voltage is applied, and the first and second floating diffusion regions formed in the substrate 61 are detection nodes which detect charges.

In addition, effects described in this specification are illustrative only and are not limited thereto, and other effects may be exhibited.

It should be noted that the present technology can employ the following configurations.

(1)

A light-receiving element, including:

a first voltage application unit to which a voltage is applied;

a first charge detection unit that is disposed at a periphery of the first voltage application unit;

a second voltage application unit to which a voltage is applied;

a second charge detection unit that is disposed at a periphery of the second voltage application unit;

a third voltage application unit to which a first voltage is applied; and a voltage control unit that applies a second voltage to one of the first voltage application unit and the second a voltage application unit and causes the other to be in a floating state, the second voltage being different from the first voltage.

(2)

The light-receiving element according to (1), further including:

an on-chip lens;

an interconnection layer; and a semiconductor layer to be disposed between the on-chip lens and the interconnection layer, in which the first voltage application unit, the first charge detection unit, the second voltage application unit, and the second charge detection unit are formed in the semiconductor layer.

(3)

The light-receiving element according to (2), in which the interconnection layer includes at least one layer including a reflection member, and the reflection member is provided to overlap the first charge detection unit or the second charge detection unit in a plan view.

(4)

The light-receiving element according to according to (2), in which the interconnection layer includes at least one layer including a light-shielding member, and the light-shielding member is provided to overlap the first charge detection unit or the second charge detection unit in a plan view.

(5)

The light-receiving element according to any one of (1) to (4), in which the voltage control unit alternately switches the voltage application unit to which the second voltage is applied and the voltage application unit to be caused to be in a floating state, of the first voltage application unit and the second voltage application unit.

(6)

The light-receiving element according to any one of (1) to (5), in which the voltage control unit switches between a first mode in which the second voltage is applied to one of the first voltage application unit and the second voltage application unit and the other is caused to be in a floating state, and a second mode in which the second voltage is applied to one of the first voltage application unit and the second voltage application unit and a third voltage is applied to the other, the third voltage being different from the second voltage.

(7)

The light-receiving element according to any one of (2) to (4), in which the third voltage application unit is a transparent electrode formed on a surface of the semiconductor layer on a side of the on-chip lens.

(8)

The light-receiving element according to any one of (2) to (4), in which the third voltage application unit is a pixel isolation unit formed at a pixel boundary in the semiconductor layer.

(9)

The light-receiving element according to any one of (2) to (4), further including:

a first pixel isolation unit to which a voltage is applied, the first pixel isolation unit being formed at a pixel boundary on a side of the first voltage application unit in a direction in which the first voltage application unit and the second voltage application unit are arranged in the semiconductor layer; and a second pixel isolation unit to which a voltage is applied, the second pixel isolation unit being formed at a pixel boundary on a side of the second voltage application unit in the direction in the semiconductor layer.

(10)

The light-receiving element according to (9), in which the voltage control unit applies the second voltage to one of both the first voltage application unit and the first pixel isolation unit and both the second voltage application unit and the second pixel isolation unit, and causes the other to be in a floating state.

(11)

The light-receiving element according to (9) or (10), further including a third pixel isolation unit to which a voltage is applied, the third pixel isolation unit being formed at a pixel boundary in a direction perpendicular to the direction in the semiconductor layer.

(12)

The light-receiving element according to (11), in which the first voltage is applied to the third pixel isolation unit.

(13)

The light-receiving element according to (12), in which the third voltage application unit is the third pixel isolation unit.

(14)

The light-receiving element according to any one of (1) to (6), in which the third voltage application unit is connected to a ground line.

(15)

The light-receiving element according to any one of (2) to (4), in which the first voltage application unit and the second voltage application unit are respectively constituted by a first P-type semiconductor region formed in the semiconductor layer and a second P-type semiconductor region formed in the semiconductor layer.

(16)

The light-receiving element according to any one of (2) to (4), in which the first voltage application unit and the second voltage application unit are respectively constituted by a first transistor formed in the semiconductor layer and a second transistor formed in the semiconductor layer.

(17)

A distance measurement module, including:
a light-receiving element including
a first voltage application unit to which a voltage is applied,
a first charge detection unit that is disposed at a periphery of the first voltage application unit,
a second voltage application unit to which a voltage is applied,
a second charge detection unit that is disposed at a periphery of the second voltage application unit,
a third voltage application unit to which a first voltage is applied, and
a voltage control unit that applies a second voltage to one of the first voltage application unit and the second a voltage application unit and causes the other to be in a floating state, the second voltage being different from the first voltage;
a light source that emits irradiation light of which brightness periodically fluctuates; and
a light-emission control unit that controls an irradiation timing of the irradiation light.

REFERENCE SIGNS LIST 1 light-receiving element
20 pixel array unit
21 tap drive unit
22 vertical drive unit
51 pixel
61 substrate
62 on-chip lens
66 fixed charge film
71-1, 71-2, 71 N+ semiconductor region
73-1, 73-2, 73 P+ semiconductor region
441-1, 441-2, 441 isolation region
471-1, 471-2, 471 isolation region
631 reflection member
721 transfer transistor
722 FD
723 reset transistor
724 amplification transistor
725 selection transistor
727 additional capacitance
728 switching transistor
741 voltage supply line
811 multilayer interconnection layer
812 interlayer insulating film
813 power supply line
814 voltage application interconnection
815 reflection member
816 voltage application interconnection
817 control line
M1 to M5 metal film
1001 penetrating electrode
1002 insulation film
1041 transistor
1101-1 to 1101-4, 1101 interpixel light-shielding unit
1071 transparent conductive film
1161-1 to 1161-4, 1161 contact
1221 pixel isolation unit
1254 light-receiving region
1733 oxide film
5000 distance measurement module
5011 light-emitting unit
5012 light-emission control unit
5013 light-receiving unit

What is claimed is:

1. A light-receiving element to measure distance, comprising:
a tap drive unit:
a first signal extraction unit including:
a first voltage application unit wherein the first voltage application unit comprises a first P-type semiconductor region; and
a first charge detection unit wherein the first charge detection unit comprises a first N+ semiconductor region, and wherein the first charge detection unit is disposed at a periphery of the first voltage application unit; and
a second signal extraction unit including:
a second voltage application unit, wherein the second voltage application unit comprises a second P-type semiconductor region; and
a second charge detection unit wherein the second charge detection unit comprises a second N+ semiconductor region, and wherein the second charge detection unit is disposed at a periphery of the second voltage application unit.

2. The light-receiving element according to claim 1, further comprising:
an on-chip lens;
an interconnection layer; and
a semiconductor layer to be disposed between the on-chip lens and the interconnection layer, wherein the first voltage application unit, the first charge detection unit, the second voltage application unit, and the second charge detection unit are formed in the semiconductor layer.

3. The light-receiving element according to claim 2, wherein the interconnection layer includes at least one layer including a reflection member, and wherein the reflection member is provided to overlap the first charge detection unit or the second charge detection unit in a plan view.

4. The light-receiving element according to claim 2, wherein the interconnection layer includes at least one layer including a light-shielding member, and wherein the light-shielding member is provided to overlap the first charge detection unit or the second charge detection unit in a plan view.

5. The light-receiving element according to claim 2, wherein a transparent electrode is formed on a surface of the semiconductor layer on a side of the on-chip lens.

6. The light-receiving element according to claim 5, wherein the transparent electrode is connected to a ground line.

7. The light-receiving element according to claim 2, further comprising:
   a first pixel isolation unit, the first pixel isolation unit formed at a pixel boundary on a side of the first voltage application unit in a direction in which the first voltage application unit and the second voltage application unit are arranged in the semiconductor layer; and
   a second pixel isolation unit, the second pixel isolation unit formed at a pixel boundary on a side of the second voltage application unit in the direction in which the first voltage application unit and the second voltage application unit are arranged in the semiconductor layer.

8. The light-receiving element according to claim 7, further comprising:
   a third pixel isolation unit, the third pixel isolation unit formed at a pixel boundary in a direction perpendicular to the direction in which the first voltage application unit and the second voltage application unit are arranged in the semiconductor layer.

9. The light-receiving element according to claim 1, wherein the first P-type semiconductor region and the second P-type semiconductor region comprise a P+ semiconductor region.

10. The light-receiving element according to claim 2, wherein the first voltage application unit and the second voltage application unit are respectively constituted by a first transistor formed in the semiconductor layer and a second transistor formed in the semiconductor layer.

11. A distance measurement module, comprising:
   a light source;
   a light-emission control unit; and
   a light-receiving element including:
      an on-chip lens;
      an interconnection layer;
      a semiconductor layer to be disposed between the on-chip lens and the interconnection layer;
      a pixel isolation unit formed at a pixel boundary in the semiconductor layer;
      a tap drive unit;
      a first signal extraction unit including:
         a first voltage application unit, wherein the first voltage application unit comprises a first P-type semiconductor region; and
         a first charge detection unit wherein the first charge detection unit comprises a first N+ semiconductor region, and wherein the first charge detection unit is disposed at a periphery of the first voltage application unit; an
      a second signal extraction unit including:
         a second voltage application unit, wherein the second voltage application unit comprises a second P-type semiconductor region; and
         a second charge detection unit, wherein the second charge detection unit comprises a second N+ semiconductor region, and wherein the second charge detection unit is disposed at a periphery of the second voltage application unit.

* * * * *